United States Patent
Kimura

(10) Patent No.: US 8,681,077 B2
(45) Date of Patent: Mar. 25, 2014

(54) SEMICONDUCTOR DEVICE, AND DISPLAY DEVICE, DRIVING METHOD AND ELECTRONIC APPARATUS THEREOF

(75) Inventor: Hajime Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1052 days.

(21) Appl. No.: 11/371,265

(22) Filed: Mar. 9, 2006

(65) Prior Publication Data

US 2006/0208977 A1    Sep. 21, 2006

(30) Foreign Application Priority Data

Mar. 18, 2005  (JP) ................................. 2005-080214

(51) Int. Cl.
*G09G 3/30* (2006.01)
*G09G 3/20* (2006.01)

(52) U.S. Cl.
USPC ................................. 345/77; 345/76; 345/55

(58) Field of Classification Search
USPC ......... 345/55, 76–77, 82–83; 315/168, 169.3, 315/172; 348/800
See application file for complete search history.

(56) References Cited

U.S. PATENT DOCUMENTS

| | | | |
|---|---|---|---|
| 6,410,372 B2 | 6/2002 | Flewitt | |
| 6,483,124 B2 | 11/2002 | Flewitt | |
| 6,753,834 B2 | 6/2004 | Mikami et al. | |
| 6,760,004 B2 | 7/2004 | Koyama | |
| 6,781,152 B2 | 8/2004 | Yamazaki | |
| 6,858,991 B2 | 2/2005 | Miyazawa | |
| 6,876,345 B2 | 4/2005 | Akimoto et al. | |
| 6,950,081 B2 | 9/2005 | Akimoto et al. | |
| 7,015,882 B2 | 3/2006 | Yumoto | |
| 7,023,408 B2 | 4/2006 | Chen et al. | |
| 7,119,364 B2 | 10/2006 | Yamazaki | |

(Continued)

FOREIGN PATENT DOCUMENTS

| | | |
|---|---|---|
| CN | 1312590 | 9/2001 |
| CN | 1312590 A | 9/2001 |

(Continued)

OTHER PUBLICATIONS

Kageyama et al., "51.1: A 2.5-inch OLED Display With a Three-TFT Pixel Circuit for Clamped Inverter Driving," SID 04 Digest, Jan. 1, 2004, pp. 1394-1397.

(Continued)

*Primary Examiner* — Jonathan Horner
(74) *Attorney, Agent, or Firm* — Eric J. Robinson; Robinson Intellectual Property Law Office, P.C.

(57) ABSTRACT

When light emitting elements have the same luminance, luminosity obtained from one pixel can be higher as area of a light emitting region in the pixel (also called an aperture ration) is increased. The aperture ratio of a pixel is low if the number of transistors and wires constituting the pixel is large. Thus, the invention is to decrease the number of transistors and wires constituting a pixel to increase the aperture ratio. Instead of a power supply line to which a certain potential is set, a potential supply line which controls a potential by a signal is provided; supplying an applied voltage to a light emitting element can be controlled by a signal of the potential supply line without providing a switch.

24 Claims, 79 Drawing Sheets

(56) References Cited

U.S. PATENT DOCUMENTS

| | | | |
|---|---|---|---|
| 7,259,737 B2 | 8/2007 | Ono et al. | |
| 7,286,105 B2 | 10/2007 | Akimoto et al. | |
| 7,324,101 B2 | 1/2008 | Miyazawa | |
| 7,379,044 B2 | 5/2008 | Kageyama et al. | |
| 7,436,376 B2 | 10/2008 | Akimoto et al. | |
| 7,468,715 B2 | 12/2008 | Akimoto et al. | |
| 7,760,162 B2 | 7/2010 | Miyazawa | |
| 8,102,387 B2 | 1/2012 | Akimoto et al. | |
| 2001/0038367 A1* | 11/2001 | Inukai | 345/76 |
| 2002/0030647 A1* | 3/2002 | Hack et al. | 345/82 |
| 2002/0125831 A1* | 9/2002 | Inukai et al. | 315/169.3 |
| 2003/0062844 A1* | 4/2003 | Miyazawa | 315/169.3 |
| 2003/0067424 A1* | 4/2003 | Akimoto et al. | 345/55 |
| 2003/0117348 A1 | 6/2003 | Knapp et al. | |
| 2003/0197666 A1* | 10/2003 | Akimoto et al. | 345/82 |
| 2003/0214469 A1 | 11/2003 | Kageyama et al. | |
| 2003/0214493 A1 | 11/2003 | Akimoto et al. | |
| 2004/0041525 A1* | 3/2004 | Park et al. | 315/169.3 |
| 2004/0113875 A1* | 6/2004 | Miller et al. | 345/82 |
| 2004/0180217 A1 | 9/2004 | Inoue et al. | |
| 2004/0207614 A1 | 10/2004 | Yamashita et al. | |
| 2004/0222089 A1 | 11/2004 | Inoue et al. | |
| 2004/0252088 A1* | 12/2004 | Kawachi et al. | 345/76 |
| 2005/0001795 A1* | 1/2005 | Kitahara | 345/76 |
| 2005/0007316 A1* | 1/2005 | Akimoto et al. | 345/76 |
| 2005/0057177 A1 | 3/2005 | Lu et al. | |
| 2005/0078067 A1 | 4/2005 | Akimoto et al. | |
| 2005/0140609 A1 | 6/2005 | Akimoto et al. | |
| 2005/0168457 A1 | 8/2005 | Akimoto et al. | |
| 2006/0119552 A1 | 6/2006 | Yumoto | |
| 2006/0290617 A1 | 12/2006 | Miyazawa | |
| 2007/0082430 A1 | 4/2007 | Yamazaki | |
| 2008/0308774 A1 | 12/2008 | Inoue et al. | |
| 2010/0073267 A1 | 3/2010 | Akimoto et al. | |
| 2012/0068130 A1 | 3/2012 | Inoue et al. | |
| 2012/0086739 A1 | 4/2012 | Akimoto et al. | |

FOREIGN PATENT DOCUMENTS

| | | |
|---|---|---|
| CN | 1386301 | 12/2002 |
| CN | 1412854 | 4/2003 |
| CN | 1494048 | 5/2004 |
| CN | 001545567 | 11/2004 |
| EP | 1122794 A | 8/2001 |
| EP | 1291841 A | 3/2003 |
| EP | 1333422 A | 8/2003 |
| EP | 1422312 A | 5/2004 |
| EP | 1431414 A | 6/2004 |
| EP | 1439520 A | 7/2004 |
| EP | 1622121 A | 2/2006 |
| EP | 2264211 A | 12/2010 |
| EP | 2278041 A | 1/2011 |
| EP | 2280092 A | 2/2011 |
| JP | 2001-202035 A | 7/2001 |
| JP | 2002-297097 | 10/2002 |
| JP | 2003-005709 | 1/2003 |
| JP | 2003-108067 A | 4/2003 |
| JP | 2003-122301 | 4/2003 |
| JP | 2003-173165 A | 6/2003 |
| JP | 2003-195815 A | 7/2003 |
| JP | 2003-223136 | 8/2003 |
| JP | 2003-330415 | 11/2003 |
| JP | 2003-330422 | 11/2003 |
| JP | 2004-246320 A | 9/2004 |
| JP | 2004-287376 A | 10/2004 |
| JP | 2004-341144 | 12/2004 |
| JP | 2004-341359 A | 12/2004 |
| JP | 2005-354035 A | 12/2005 |
| JP | 2005-354036 A | 12/2005 |
| JP | 2006-013433 A | 1/2006 |
| KR | 2001-0110324 A | 12/2001 |
| KR | 2004-0098511 A | 11/2004 |
| TW | 556349 | 10/2003 |
| TW | 571273 | 1/2004 |
| TW | I224295 | 11/2004 |
| WO | WO-02/07207 | 1/2002 |
| WO | WO 02/27700 | 4/2002 |

OTHER PUBLICATIONS

Kageyama et al., "9.1:A3.5-inch OLED Display Using a 4-TFT Pixel Circuit with an Innovative Pixel Driving Scheme," SID 03 Digest, Jan. 1, 2003, pp. 96-99.

Akimoto, H., et al., *49.4: Two TFT Pixel Circuit with Non-Uniformity Suppress-Function for Voltage Programming Active Matrix OLED Displays*, SID Digest '05, SID International Symposium Digest of Technical Papers, pp. 1550-1553.

Office Action (Application No. 200610082029.4) Dated Aug. 28, 2009.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Chinese Office Action (Application No. 200610082029.4; CN08578) Dated Sep. 17, 2010.

Korean Office Action (Application No. 2006-0025258) Dated Apr. 24, 2012.

Taiwanese Office Action (Application No. 95108605; TW08578) Dated Dec. 27, 2012.

Taiwanese Office Action (Application No. 95108605) Dated May 22, 2013.

Taiwanese Office Action (Application No. 99123640) Dated Oct. 30, 2013.

* cited by examiner

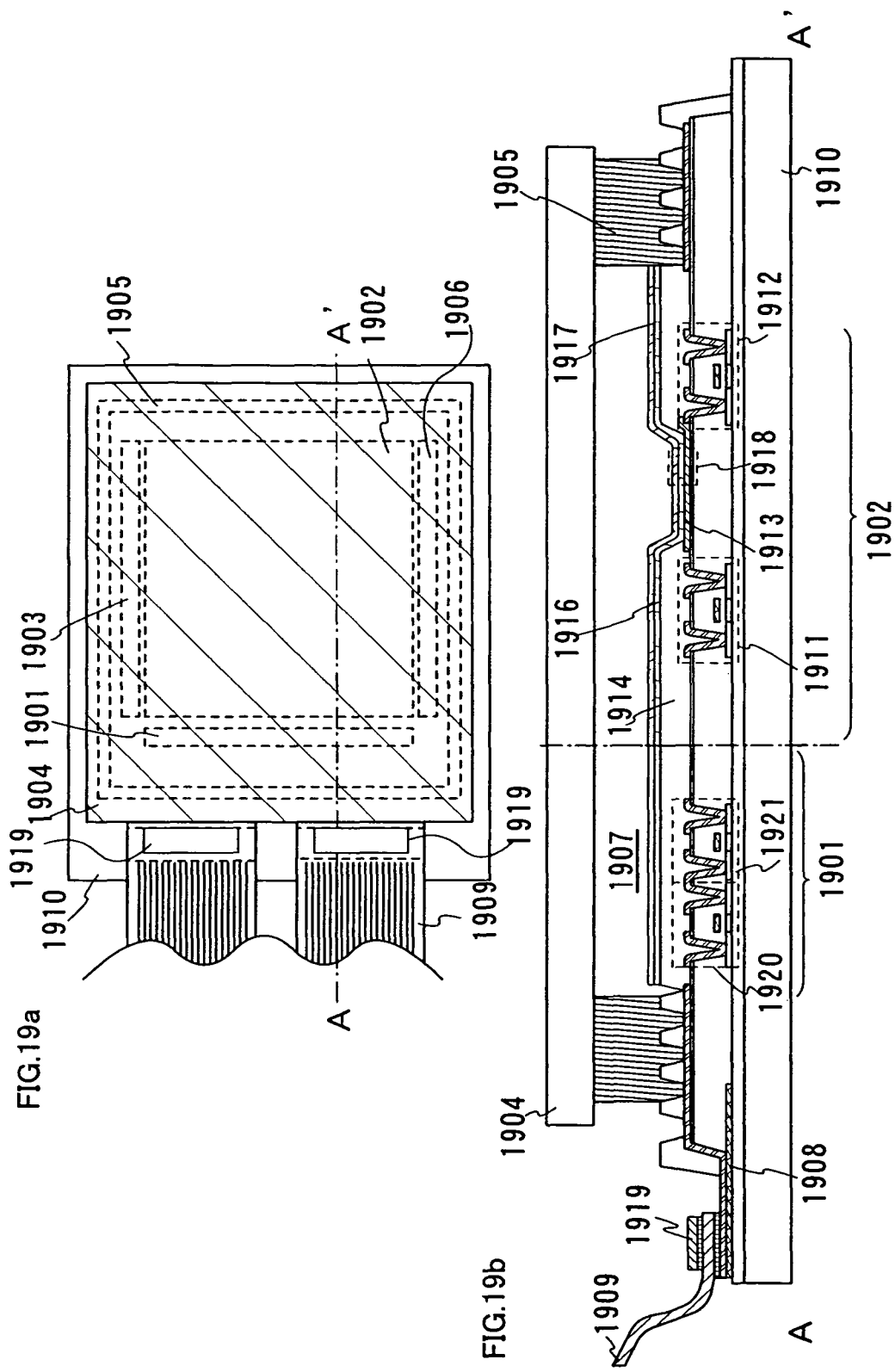

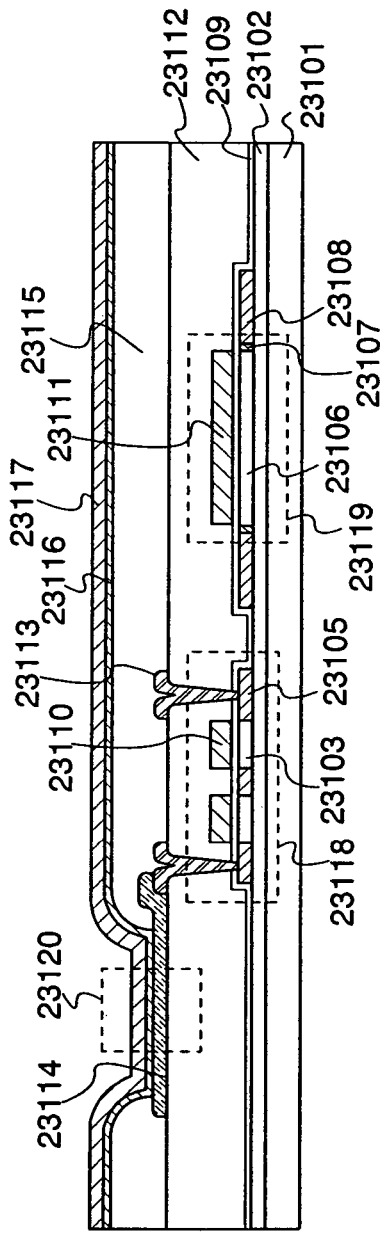
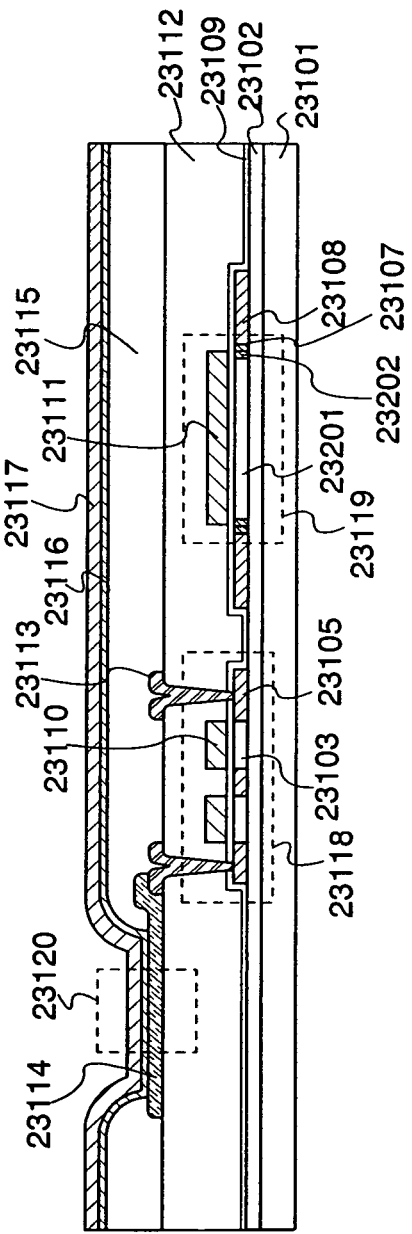
FIG.23a
FIG.23b

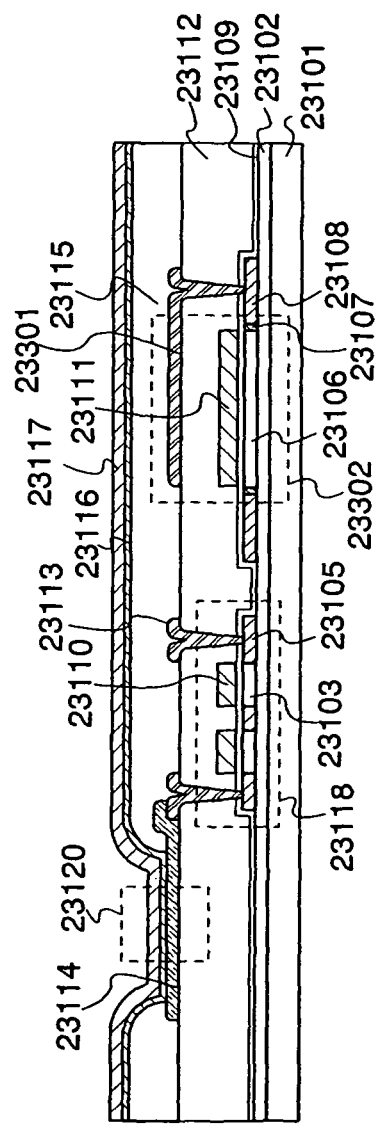
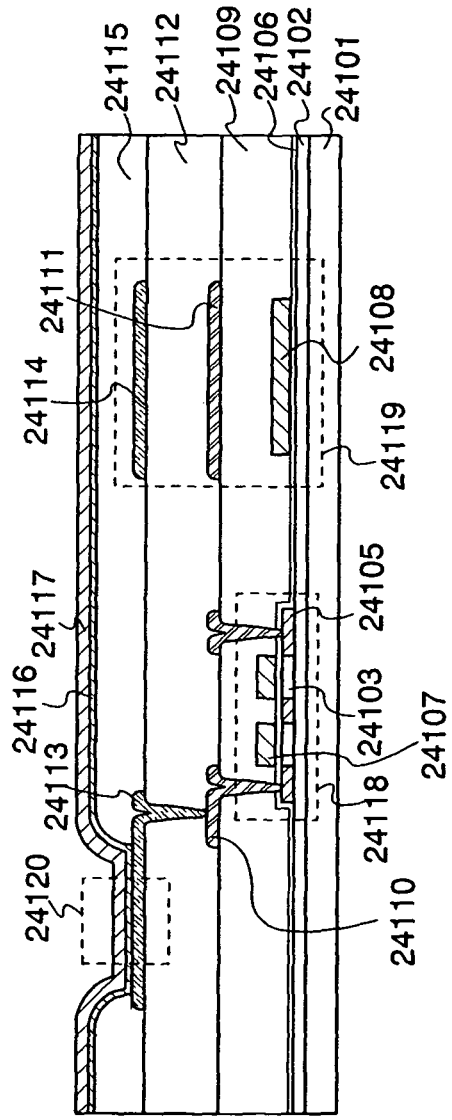
FIG.24a
FIG.24b

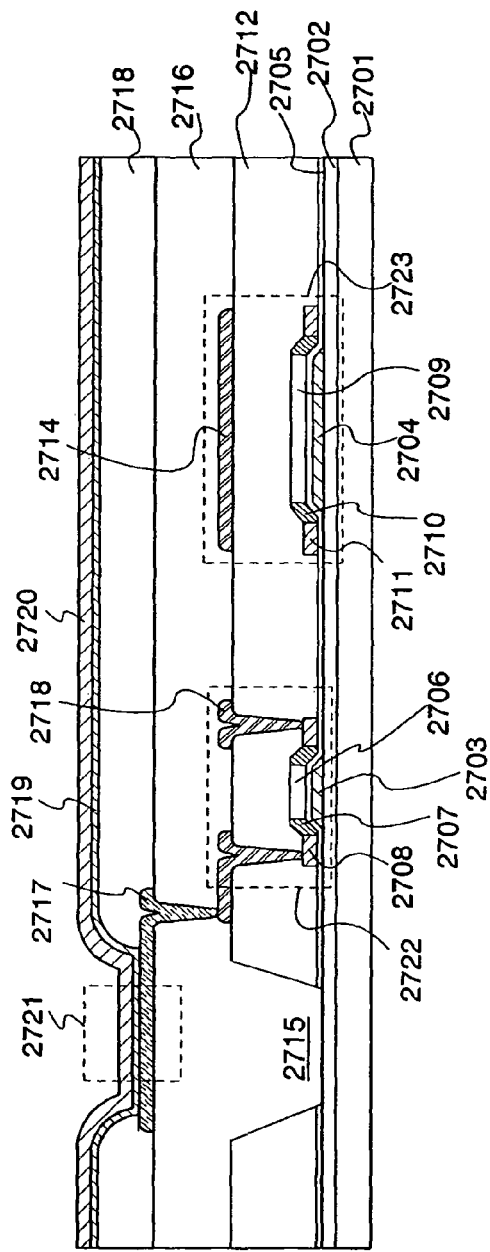
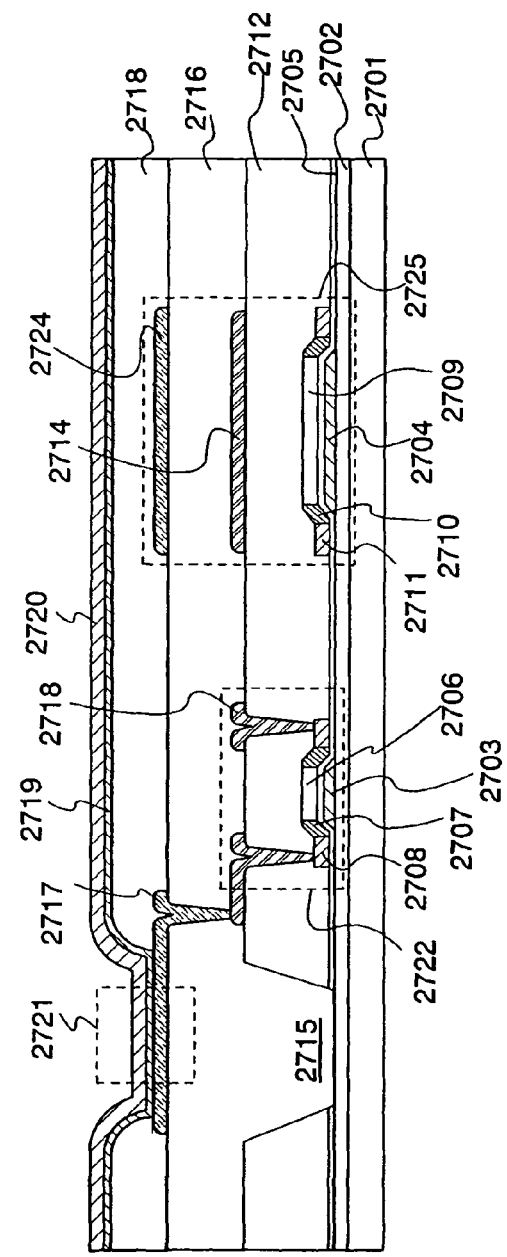
FIG.27a
FIG.27b

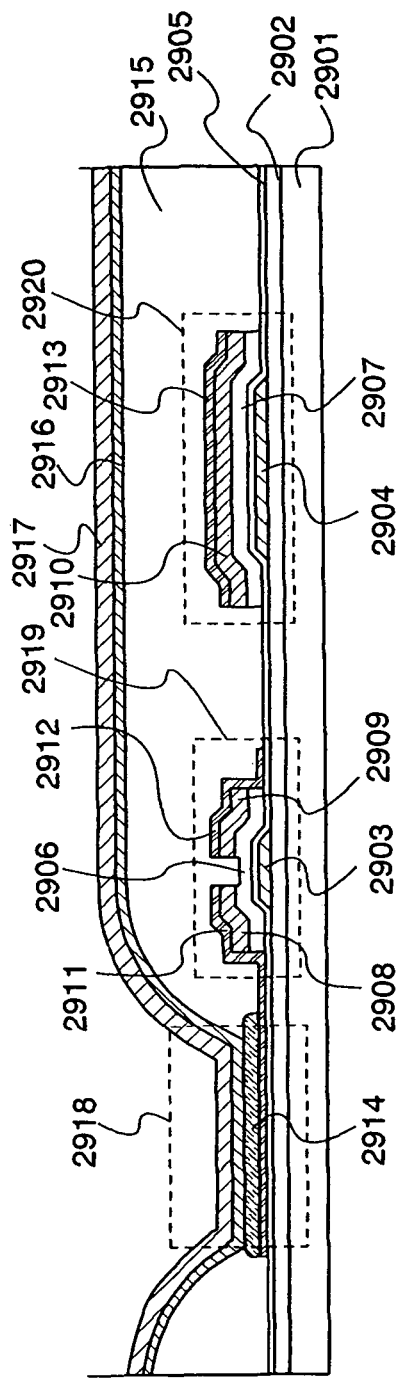
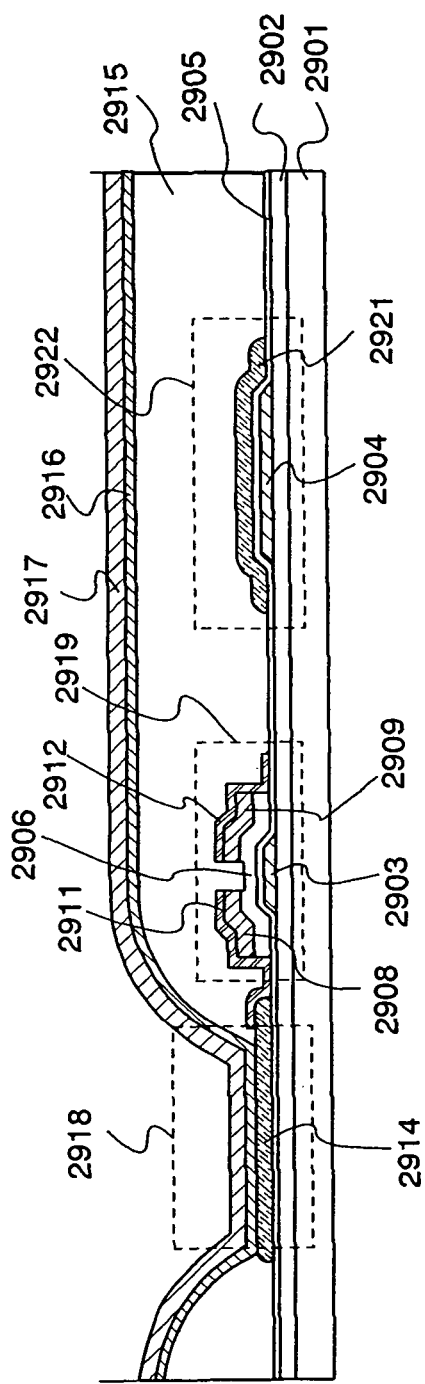
FIG.29a
FIG.29b

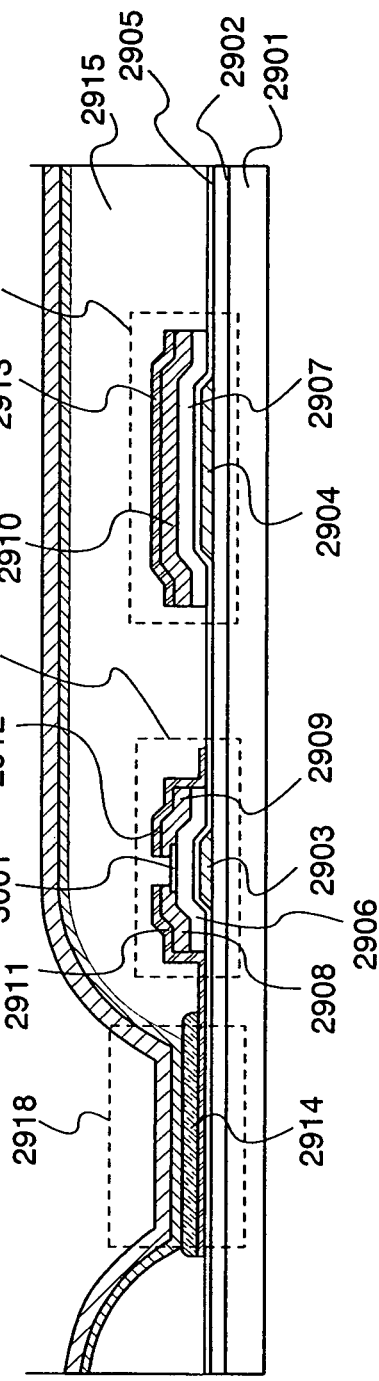
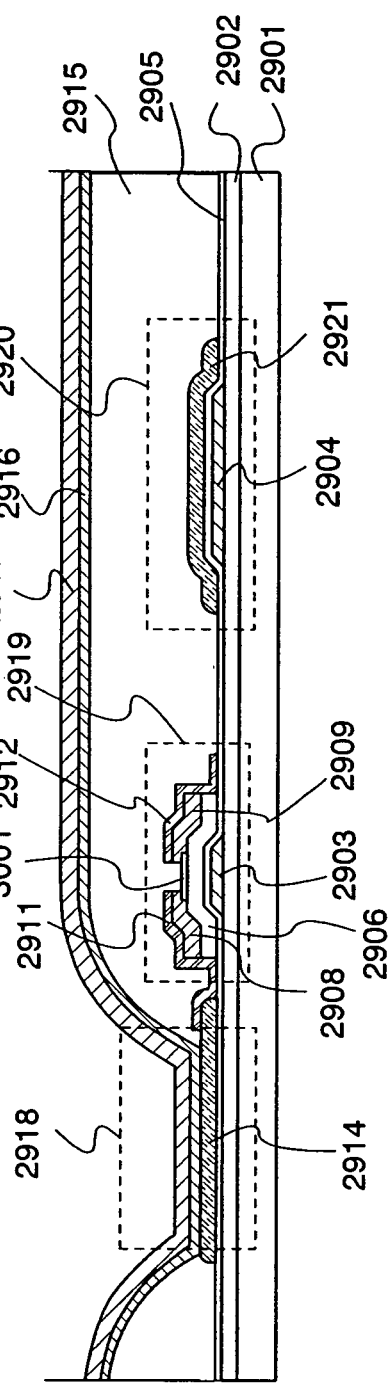
FIG.30a
FIG.30b

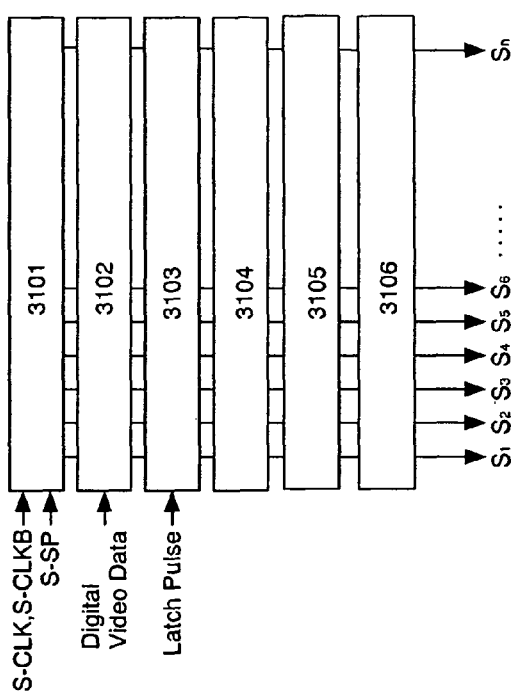
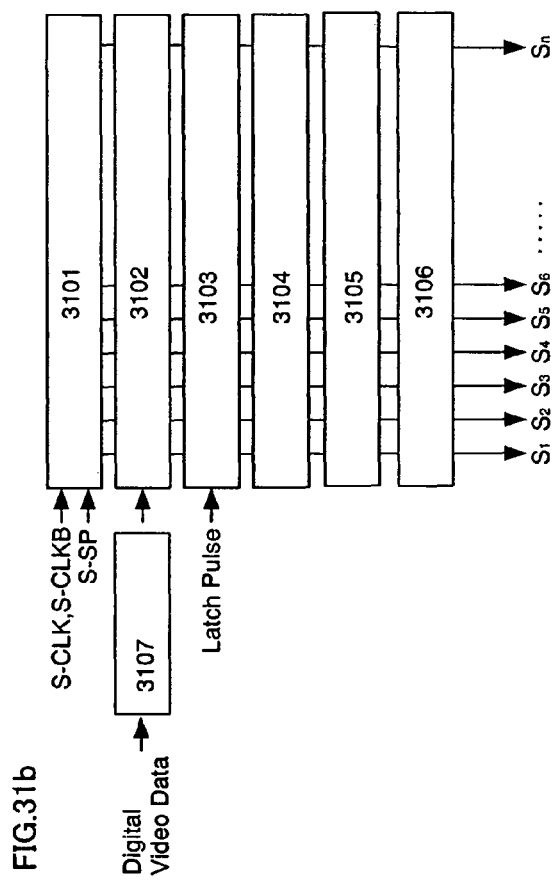
FIG.31a
FIG.31b

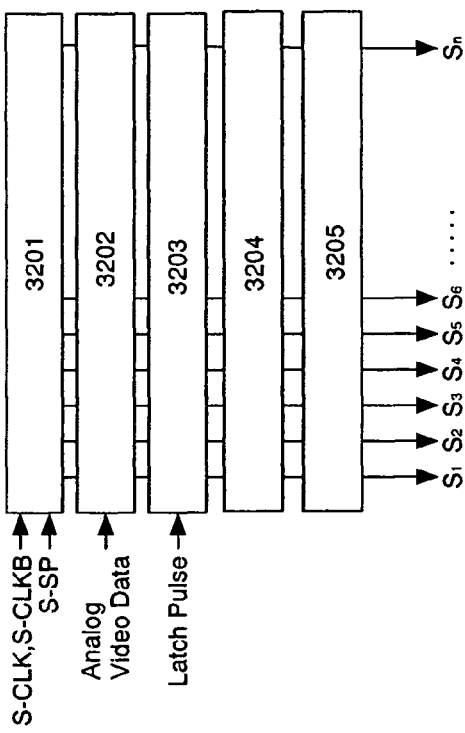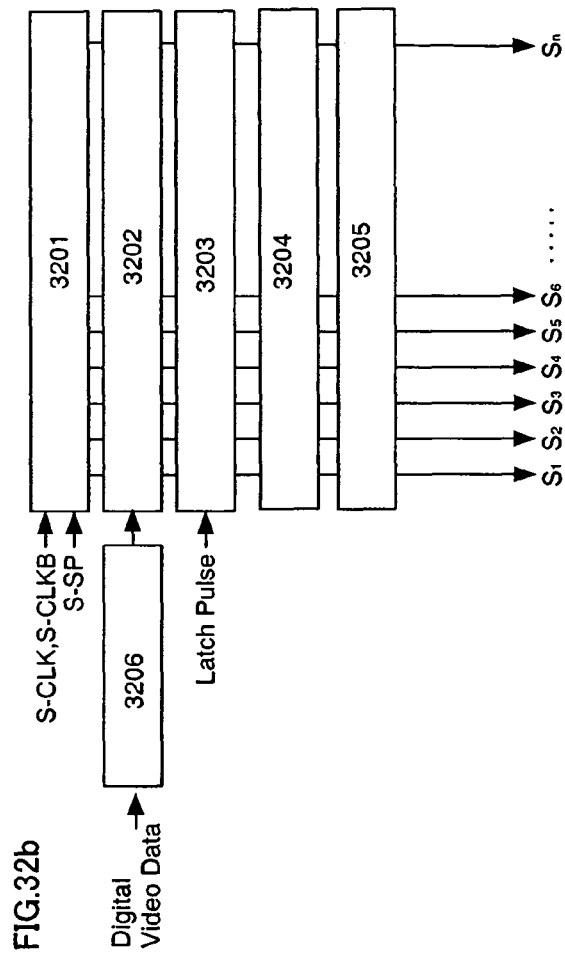

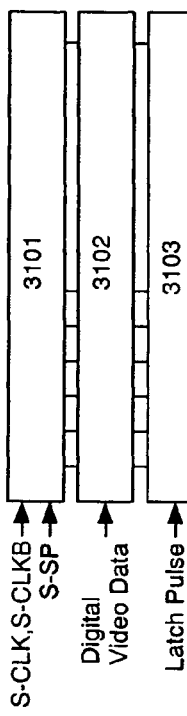
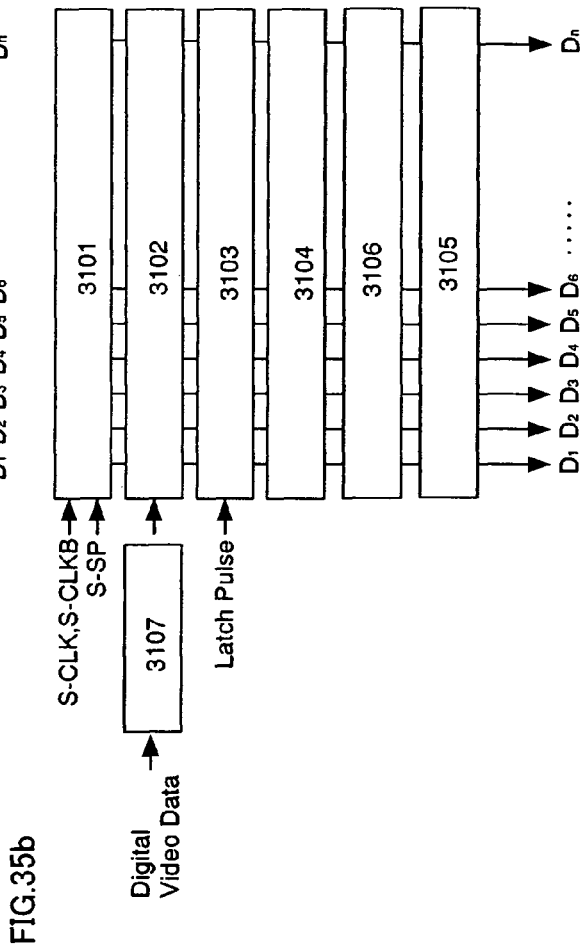
FIG.35a
FIG.35b

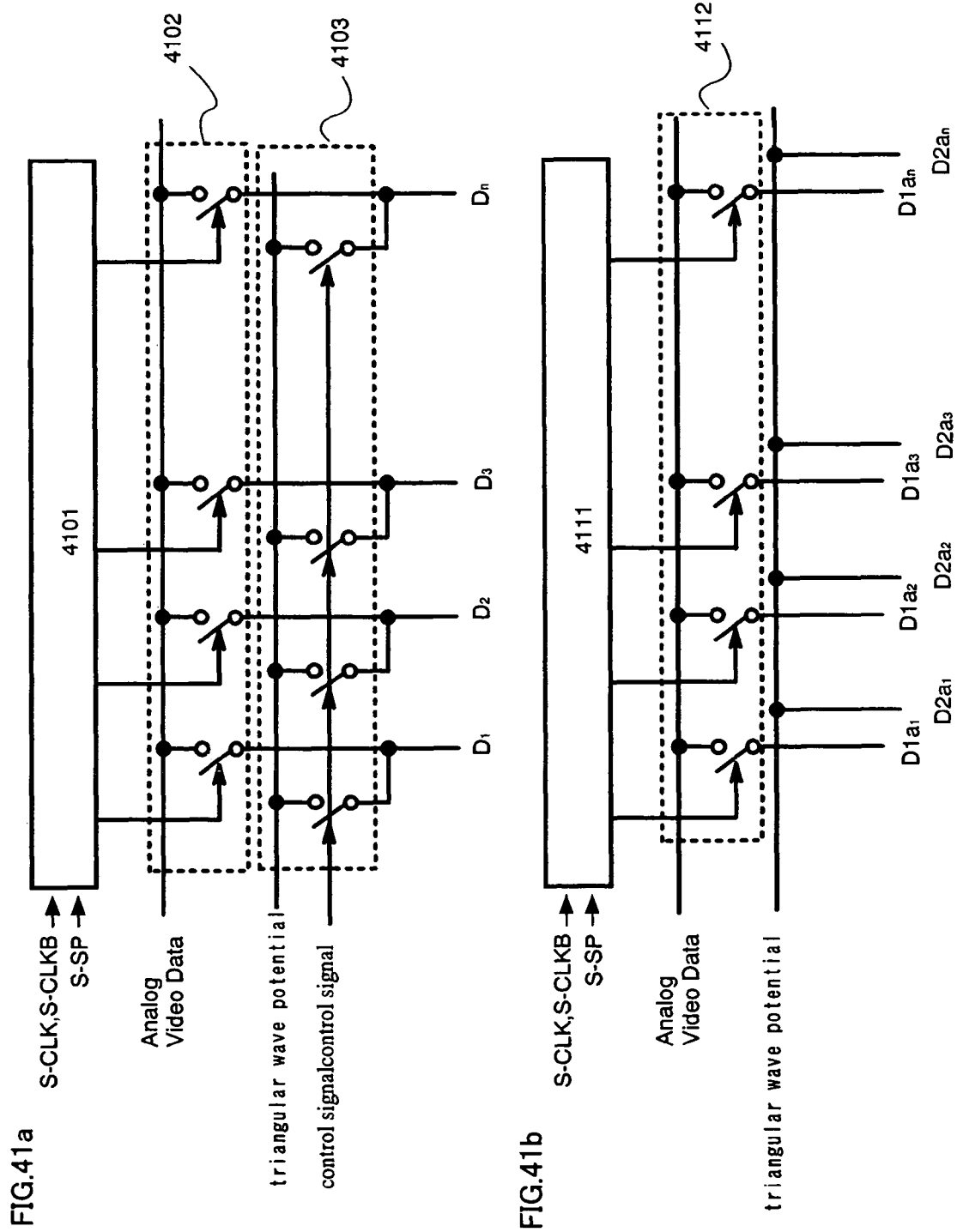

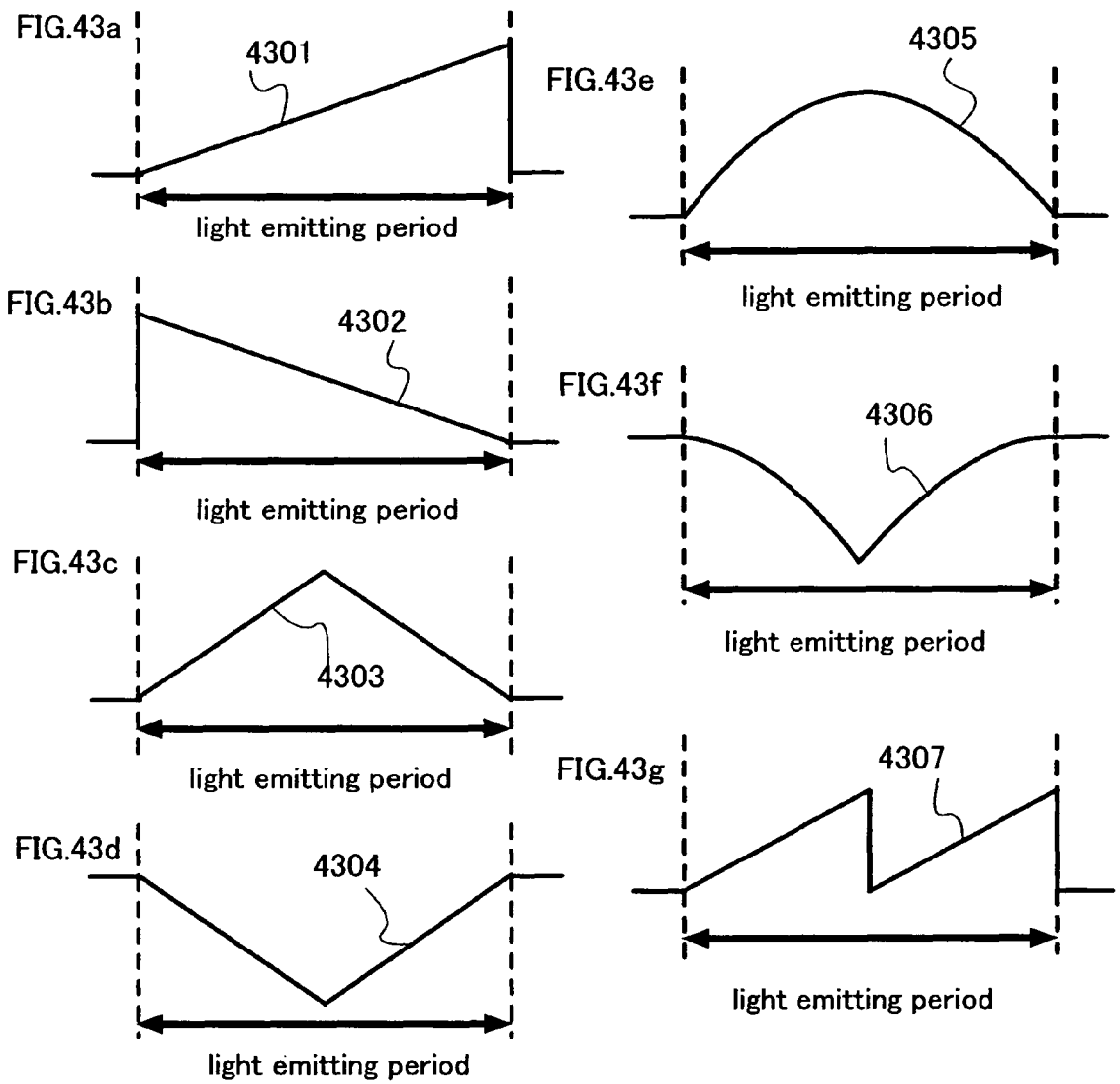

FIG.59a1
FIG.59a2
FIG.59a3

SEMICONDUCTOR DEVICE, AND DISPLAY DEVICE, DRIVING METHOD AND ELECTRONIC APPARATUS THEREOF

BACKGROUND OF THE INVENTION

1. Field of the Invention

The present invention relates to a semiconductor device provided with a function for controlling by a transistor a current supplied to a load, and in particular relates to a display device having a pixel constituted by a current drive type light emitting element of which luminance changes by current, and a signal line driver circuit thereof. In addition, the invention relates to a driving method of the same. Furthermore, the invention relates to an electronic apparatus having a display portion applying the display device.

2. Description of the Related Art

In recent years, a self-luminous type display device of which pixel is constituted by a light emitting element such as a light emitting diode (LED) has attracted attention. As a light emitting element used in such a self-luminous type display device, an organic light emitting diode (OLED (Organic Light Emitting Diode) which is also called an organic EL element, an Electro Luminescence (EL) element, or the like) has attracted attention and become to be used in an EL display or the like. Since the light emitting element such as an OLED is self-luminous type, the visibility of a pixel is higher as compared to a liquid crystal display, a backlight is not required and the response is fast. In addition, the luminance of the light emitting element is controlled by a current value flowing through it.

As a driving method of expressing the gradation of such a display device, there are a digital method and an analog method. In a digital method, the light emitting element is turned on/off by digital control, and a light emitting time is controlled to express gradation; this method is advantageous in that the uniformity of luminance of each pixel is high, while the frequency is required to be increased and power consumption becomes large. On the other hand, an analog method includes a method of controlling a light emission intensity of the light emitting element by analog control and a method of controlling a light emitting time of the light emitting element by analog control. The method of controlling the light emission intensity by analog control is easily affected by variation of characteristics of a thin film transistor (hereinafter also referred to as a TFT) for each pixel and light emission for each pixel is also varied. Meanwhile, the analog time gradation method controls a light emitting time by analog control, so that the uniformity of luminance of each pixel is high; a display device with the analog time gradation method has been described in Non-Patent Document 1 (see Non-Patent Document 1).

Specifically, in a pixel of the display device described in Non-Patent Document 1, an inverter is constituted by a light emitting element and a transistor for driving the light emitting element. A gate terminal of the driving transistor corresponds to an input terminal of the inverter and an anode of the light emitting element corresponds to an output terminal of the inverter. In the case where an image signal voltage is written to the pixel, the inverter is set to be intermediate between on and off. Then, a triangular wave voltage is input to the pixel in a light emitting period to control an output of the inverter. That is, the output of the inverter which is a potential set to the anode of the light emitting element is controlled, so that whether the light emitting element emits light or not is controlled.

[Non-Patent Document 1] SID 04 DIGEST P1394-1397

The luminosity obtained from one pixel is decreased as the definition of a display device is increased. It is to be noted here that luminosity means the amount showing the degree of luminance of a light source obtained from a certain direction, and besides, luminance means the luminosity of a light source per unit area.

Here, in different pixels, in the case where respective light emitting elements therein have the same luminance, the luminosity obtained from one pixel can be higher as an area of a light emitting region in the pixel is increased. That is, if an aperture ratio which is shown by a ratio of an area of a light transmitting region other than a non-light transmitting region (also called a black matrix) in one pixel to an area of the one pixel is high, desired luminosity can be obtained from the one pixel without increasing a driving voltage even if the area of one pixel is decreased by increasing the definition.

Here, an aperture ratio of a pixel is low if the number of transistors and wires constituting the pixel is large. Thus, it is an object of the invention to decrease the number of transistors and wires constituting a pixel to increase the aperture ratio.

SUMMARY OF THE INVENTION

Instead of a power supply line to which a certain potential is set, a potential supply line which controls a potential by a signal is provided. That is, supply of an applied voltage to a light emitting element can be controlled by a signal of the potential supply line without providing a switch.

A structure of a semiconductor device of the invention includes a pixel provided with an electrode, a transistor having a gate terminal, a first terminal and a second terminal, a first wire, a second wire, a holding means for holding a potential difference between a potential of the gate terminal of the transistor and a potential of the first wire, and a switching means for making a portion between the gate terminal and the second terminal of the transistor conductive/non-conductive, in which the first terminal of the transistor is electrically connected to the second wire while the second terminal thereof is connected to the electrode.

A semiconductor device of another structure of the invention includes a pixel provided with an electrode, a transistor having a gate terminal, a first terminal and a second terminal, a first wire, a second wire, a capacitor for holding a potential difference between a potential of the gate terminal of the transistor and a potential of the first wire, and a switch for making a portion between the gate terminal and the second terminal of the transistor conductive/non-conductive, in which the first terminal of the transistor is electrically connected to the second wire while the second terminal thereof is electrically connected to the electrode.

Another structure of a semiconductor device of the invention includes a pixel provided with an electrode, a transistor having a gate terminal, a first terminal and a second terminal, a first wire, a second wire, a capacitor, and a switch, in which the first terminal of the transistor is electrically connected to the second wire while the second terminal thereof is electrically connected to the electrode, the gate terminal and the second terminal of the transistor are electrically connected to each other through the switch, and the gate terminal of the transistor is electrically connected to the first wire through the capacitor.

A display device of the invention includes a pixel provided with a light emitting element, a driving transistor having a gate terminal, a first terminal and a second terminal, a first wire, a second wire, a holding means for holding a potential difference between a potential of the gate terminal of the driving transistor and a potential of the first wire, and a switching means for making a portion between the gate terminal and the second terminal of the driving transistor conductive/non-conductive, in which the first terminal of the driving transistor is electrically connected to the second wire while the second terminal thereof is electrically connected to a pixel electrode of the light emitting element.

A display device of another structure of the invention includes a pixel provided with a light emitting element, a driving transistor having a gate terminal, a first terminal and a second terminal, a first wire, a second wire, a capacitor for holding a potential difference between a potential of the gate terminal of the driving transistor and a potential of the first wire, and a switch for making a portion between the gate terminal and the second terminal of the driving transistor conductive/non-conductive, in which the first terminal of the driving transistor is electrically connected to the second wire while the second terminal thereof is electrically connected to a pixel electrode of the light emitting element.

A display device of another structure of the invention includes a pixel provided with a light emitting element, a driving transistor having a gate terminal, a first terminal and a second terminal and for driving the light emitting element, a first wire, a second wire, a capacitor, and a switch, in which the first terminal of the driving transistor is electrically connected to the second wire while the second terminal thereof is electrically connected to a pixel electrode of the light emitting element, the gate terminal and the second terminal of the driving transistor are electrically connected to each other through the switch, and the gate terminal of the driving transistor is electrically connected to the first wire through the capacitor.

In addition, in a display device of another structure of the invention, a binary potential is applied to the second wire in the above-described structure.

An electronic apparatus of the invention has a display portion applying the display device of the above-described structure.

A driving method of a display device of the invention includes a pixel provided with a light emitting element, a driving transistor having a gate terminal, a first terminal and a second terminal and for driving the light emitting element, a first wire, a second wire, a holding means for holding a potential difference between a potential of the gate terminal of the driving transistor and a potential of the first wire, and a switching means for making a portion between the gate terminal and the second terminal of the driving transistor conductive/non-conductive, in which the first terminal of the driving transistor is electrically connected to the second wire and the second terminal thereof is electrically connected to a pixel electrode of the light emitting element. In a signal writing period to the pixel, the switching means makes a portion between the gate terminal and the second terminal of the driving transistor conductive, a video signal is input to the first wire, and a first potential of which potential difference to an opposing electrode of the light emitting element is equal to or higher than a forward threshold voltage of the light emitting element is input to the second wire in writing a signal to the pixel and when the signal writing to the pixel is completed, the switching means makes the portion between the gate terminal and the second terminal of the driving transistor non-conductive, and a potential of which potential difference to the opposing electrode of the light emitting element is lower than the forward threshold voltage of the light emitting element is input to the second wire. In a light emitting period, a potential varying in an analog manner is input to the first wire while the first potential is input to the second wire.

It is to be noted that a switch described in this specification may be any switch of any mode such as an electrical switch or a mechanical switch. That is, it may be anything as long as it can control a current flow. For example, a transistor, a diode, or a logic circuit configured by them may be used. Therefore, in the case of adopting a transistor as the switch, polarity (conductivity) thereof is not particularly limited because the transistor functions just as a switch. However, when off current is preferred to be small, a transistor of a polarity with a small off-current is favorably used; for example, a transistor provided with an LDD region and the like can be used. Further, it is desirable that an n-type transistor may be used when a potential of a source terminal of the transistor functioning as the switch is closer to a low potential-side power supply (e.g., Vss, GND, or 0V), while a p-type transistor may be used when the potential of the source terminal thereof is closer to a high potential-side power supply (e.g., Vdd). This is because the switch can operate easily since an absolute value of a gate-source voltage of the transistor can be increased. It is to be noted that a CMOS type switch may be used by using both n-type and p-type transistors as well.

It is to be noted in this invention that connection means electrical connection; therefore, another element (e.g., a switch, a transistor, a capacitor, an inductor, a resistor, or a diode) capable of electrical connection may be interposed in the connection.

It is to be noted that various modes of a light emitting element can be used; for example, a display medium of which contrast is changed by electric-magnetic action can be employed such as an EL element (an organic EL element, an inorganic EL element, or an EL element containing organic and inorganic matter), an electron emitter element, a liquid crystal element, electronic ink, a grating light valve (GLV), a plasma display panel (PDP), a digital micromirror device (DMD), a piezoceramic display, and a carbon nanotube. Note that there are an EL display as a display device using an EL element, a field emission display (FED), a surface-condition electron-emitter display (SED), and the like as a display device using an electron emitter element, a liquid crystal display as a display device using a liquid crystal element, and electronic paper as a display device using electronic ink.

It is to be noted that in the invention, various modes of a transistor can be used, therefore, the kind of applicable transistor to use is not limited. Thus, a thin film transistor (TFT) using a non-single crystal semiconductor film typified by amorphous silicon or polycrystalline silicon, a MOS transistor formed using a semiconductor substrate or an SOI substrate, a junction transistor, a bipolar transistor, a transistor using a compound semiconductor such as ZnO or a-InGaZnO, a transistor using an organic semiconductor or a carbon nanotube, or another transistor can be used. In addition, the transistor may be disposed over any kind of substrate and the kind of a substrate is not particularly limited. Therefore, for example, the transistor can be disposed over a single crystalline substrate, an SOI substrate, a glass substrate, a plastic substrate, a paper substrate, a cellophane substrate, a stone substrate, or the like. Further, the transistor may be formed using a substrate, and after that the transistor may be moved to another substrate to provide over the substrate.

It is to be noted that various modes of a structure of a transistor can be used. The structure is not particularly limited. For example, a multi-gate structure having two or more gate electrodes may be employed; by employing the multi-gate structure, reliability of the transistor can be improved since the off-current is reduced or the withstanding pressure is improved, and flat characteristics thereof can be realized since a drain-source current does not change so much even if a drain-source voltage is changed when the transistor is operated in the saturation region. Further, a structure in which a gate electrode is provided above and below a channel may be employed as well; by employing the structure in which a gate electrode is provided above and below a channel, a channel region is increased so that a current value can be increased, an S value can be improved as a depletion layer can be easily formed, and the like. Further alternatively, there may be a structure in which a gate electrode is provided above a channel, a structure in which a gate electrode is provided below a channel, a staggered TFT structure, or an inversely staggered TFT structure. Further, a channel region thereof may be divided into a plurality of regions, and may be connected in parallel or in series. Further, a source electrode or a drain electrode may be overlapped with a channel (or a part thereof); by employing the structure in which a source electrode or a drain electrode is overlapped with a channel (or a part thereof), prevented can be destabilization of an operation due to accumulation of charge in a part of the channel. Further, an LDD region may be provided; by providing the LDD region, reliability of the transistor can be improved since the off-current is reduced or the withstanding pressure is improved, and flat characteristics thereof can be realized since a drain-source current does not change so much even if a drain-source voltage is changed when the transistor is operated in the saturation region.

In this specification, a pixel means one color element. Thus, in the case of a full-color display device having color elements of R (Red), G (Green), and B (Blue), a minimum unit of an image is constituted by three pixels of an R pixel, a G pixel, and a B pixel. It is to be noted that the color elements are not limited to three colors, and more colors may be employed, for example, there may be RGBW (W is white).

A transistor is an element having at least three terminals including a gate electrode, a drain region and a source region, and has a channel forming region between the drain region and the source region. Here, since the source region and the drain region are changed depending on a structure, an operation condition, or the like of a transistor, it is difficult to identify which is a source region or a drain region. Therefore, in this specification, respective regions functioning as the source region and the drain region are referred to as a first terminal and a second terminal.

It is to be noted in this specification that to arrange pixels in matrix means to stripe-arrange pixels in lattice in which a perpendicular stripe and a horizontal stripe are combined with each other, and besides, means to arrange respective pixels of three color elements corresponding to a minimum element for one image in delta when full color display is performed using the three color elements (e.g., RGB). It is to be noted that the color elements are not limited to three colors, and more colors may be employed, for example, there may be RGBW (W is white). In addition, an area of a light emitting region may be different for each pixel of a color element.

It is to be noted in this specification that a semiconductor device means a device having a circuit including a semiconductor element (e.g., a transistor or a diode). Further, the semiconductor device may also mean every device that can function by using semiconductor characteristics. In addition, a display device means a device having a display element (e.g., a liquid crystal element or a light emitting element). Further, the display device may also mean a main body of a display panel in which a plurality of pixels each including the display element such as a liquid crystal element or an EL element and a peripheral driver circuit for driving the pixels are formed over a substrate, which may further include the display panel provided with a flexible printed circuit (FPC) or a printed wiring board (PWB). In addition, a light emitting device means a display device having a self luminous display element such as in particular an EL element or an element used for an FED. A liquid crystal display device means a display device having a liquid crystal element.

It is to be noted in this specification that digital means a state of binary while analog means a state (dispersion) where three or more states are dispersed in addition to a state of continuous. Thus, for example, changing a potential in an analog manner includes a case of changing a potential in succession with time, and besides, a case of sampling a potential changing in succession with time (also called "making a sample" or "dispersion with time") and changing a potential at certain time intervals so as to be the sampled potential. It is to be noted that sampling means, in the case where a data value varies in succession, to get a value thereof at that time at certain time intervals.

A digital signal itself means a signal having a data value for transmitting a state of binary directly while an analog signal means a signal having a data value for directly transmitting itself a state of three or more. In addition, the analog signal includes a signal of which data value (a potential, a voltage, or a current) varies in succession with time, and besides, a signal obtained by sampling the signal changing in succession (also called "making a sample" or "dispersion with time") and taking the sampled data value at certain time intervals. It is to be noted that sampling means, in the case where a data value varies in succession, to get a value thereof at that time at certain time intervals. Note that the digital signal may indirectly transmit a state of three or more. This is because, for example, a digital signal also includes a signal obtained by sampling an analog signal of which data value varies with time and dispersing further the sampled data value. That is, this is because a signal obtained by quantizing an analog signal is also considered as a digital signal.

It is to be noted in this specification that an anode and a cathode of a light emitting element mean respective electrodes when a forward voltage is applied to the light emitting element.

Supply of an applied voltage to the light emitting element can be controlled by a signal of a potential supply line without providing a switch, therefore, the number of transistors can be reduced when a transistor is used as a switch. In addition, the number of wires for inputting a signal for controlling on/off of a transistor can also be reduced. Accordingly, the aperture ratio of a pixel can be improved and a high-definition display device can be provided.

In addition, since the aperture ratio is improved, required luminosity can be obtained even when the luminance is reduced so that reliability of a light emitting element can be improved.

BRIEF DESCRIPTION OF THE DRAWINGS

FIGS. 19a and 19b are views illustrating a display panel having a pixel configuration of the invention.

FIGS. 23a and 23b are partial cross sectional views respectively of a display panel.

FIGS. 24a and 24b are partial cross sectional views respectively of a display panel.

FIGS. 27a and 27b are partial cross sectional views respectively of a display panel.

FIGS. 29a and 29b are partial cross sectional views respectively of a display panel.

FIGS. 30a and 30b are partial cross sectional views respectively of a display panel.

FIGS. 31a and 31b show examples of a signal line driver circuit applicable to a display device of the invention.

FIGS. 32a and 32b show examples of a signal line driver circuit applicable to a display device of the invention.

FIGS. 35a and 35b show examples of a signal line driver circuit applicable to a display device of the invention.

FIGS. 41a and 41b show examples of a signal line driver circuit applicable to a display device of the invention.

FIGS. 43a to 43g are diagrams each illustrating a waveform varying periodically.

FIGS. 59a1 to 59a3 are diagrams each illustrating a relation between a video signal and a triangular wave potential supplied to a signal line.

FIGS. 60a1 to 60a3 are diagrams each illustrating a relation between a video signal and a triangular wave potential supplied to a signal line.

DETAILED DESCRIPTION OF THE INVENTION

Although the invention will be fully described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein.

Embodiment Mode 1

Described in this embodiment mode are a pixel configuration of a display device of the invention, and a principle of operation thereof.

First, a pixel configuration of a display device of the invention is described in detail with reference to FIG. 1. Although only one pixel is illustrated here, a plurality of pixels is arranged in matrix in row and column directions in a pixel region of the display device actually.

The pixel includes a driving transistor 101, a capacitor 102, a switch 103, a light emitting element 104, a potential supply line (Illumination line) 105, a signal line (Data line) 106, and a scan line (Reset line) 107. It is to be noted that the driving transistor 101 is a p-type transistor.

A first terminal (a source terminal or a drain terminal) of the driving transistor 101 is connected to the potential supply line 105, a gate terminal thereof is connected to the signal line 106 through the capacitor 102, and a second terminal (the source terminal or the drain terminal) thereof is connected to an anode (a pixel electrode) of the light emitting element 104. In addition, the gate terminal and the second terminal (the source terminal or the drain terminal) of the driving transistor 101 are connected to each other through the switch 103. Therefore, when the switch 103 is on, a portion between the gate terminal and the second terminal (the source terminal or the drain terminal) of the driving transistor 101 becomes conductive. Then, when the switch 103 is turned off, the portion between the gate terminal and the second terminal (the source terminal or the drain terminal) of the driving transistor 101 becomes non-conductive, and a potential difference (a voltage) between a potential of the gate terminal (or the second terminal) of the driving transistor 101 at this moment and a potential of the signal line 106 can be held in the capacitor 102. Furthermore, to a cathode (Cathode) 108 of the light emitting element 104, a potential Vss is set. It is to be noted that Vss is, taking as a criterion a power supply potential Vdd which is set to the potential supply line 105 in a light emitting period of a pixel, a potential satisfying Vss<Vdd; for example, there may be Vss=GND (a ground potential).

Figure 1:
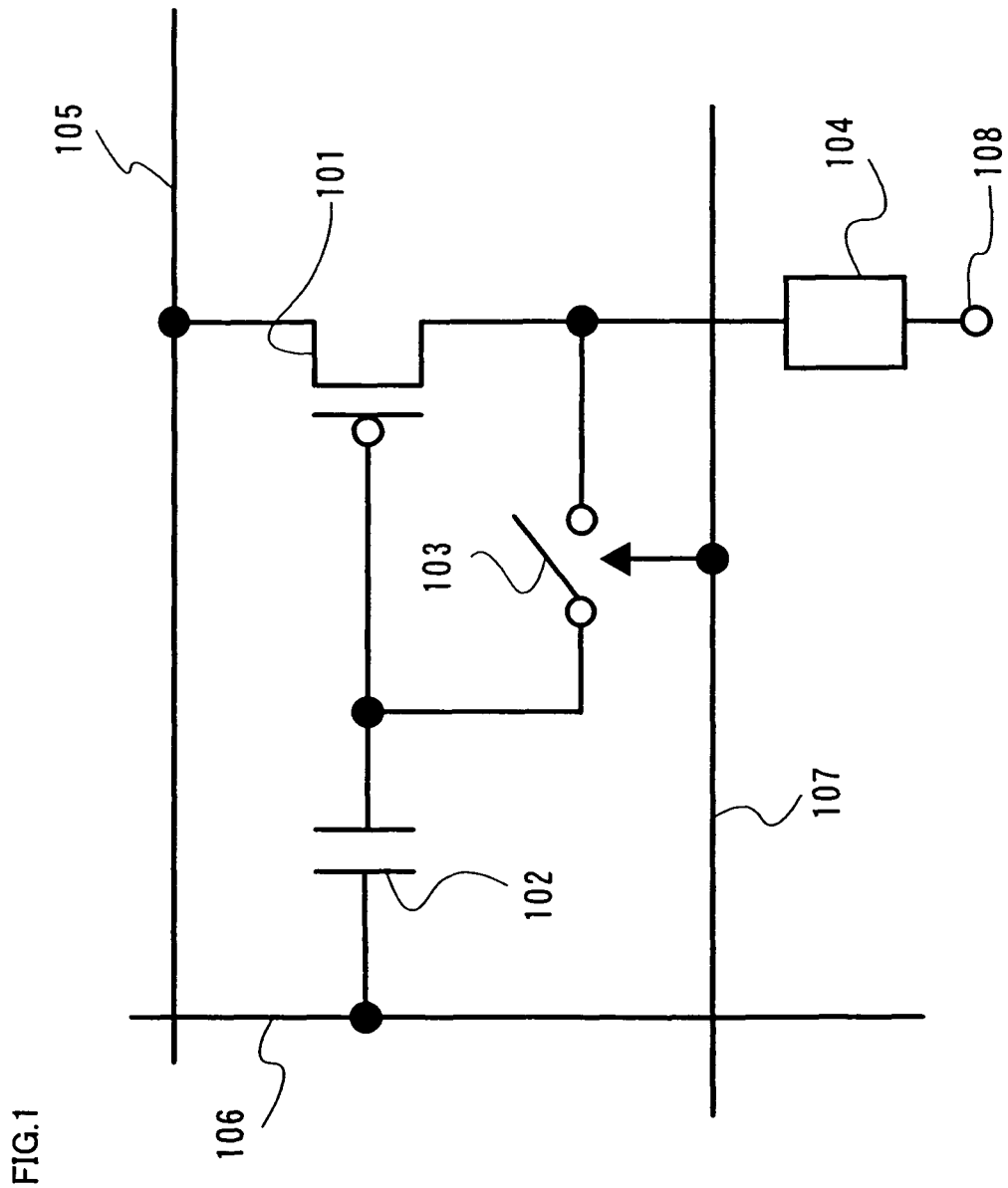
FIG. 1 is a diagram showing a pixel configuration of the invention.

Next, a principle of operation of the pixel configuration shown in FIG. 1 is described in detail.

In a signal writing period to the pixel, an analog signal potential is set to the signal line 106. This analog signal potential corresponds to a video signal. Note that this video signal is a signal expressed by three values or more and the analog signal potential is a potential varying with time and having states of three values or more. When a video signal is written to the pixel, a signal is input to the scan line 107 to turn on the switch 103, and besides, a potential of the potential supply line 105 is set to be the power supply potential Vdd so that the power supply potential Vdd is set to the first terminal of the driving transistor 101. Then, current flows to the driving transistor 101 and the light emitting element 104, and the capacitor 102 stores or discharges charge.

At this time, the first terminal of the driving transistor 101 is a source terminal while the second terminal thereof is a drain terminal. As current flowing to the driving transistor 101 is increased while the switch 103 is on, current flowing to the light emitting element 104 is also increased, so that voltage drop in the light emitting element 104 is increased and a potential difference between the electrodes of the light emitting element 104 is increased. That is, a potential of the anode of the light emitting element 104 becomes close to the potential of the potential supply line 105. As a result of this, a potential of the gate terminal of the driving transistor 101 also becomes close to the potential of the potential supply line 105 so that a potential difference between the gate terminal and the source terminal of the driving transistor 101 is decreased and the current flowing to the driving transistor 101 is decreased. Meanwhile, the current flowing to the light emitting element 104 is decreased, so that the voltage drop in the light emitting element 104 is decreased and the potential difference between the electrodes of the light emitting element 104 is decreased. That is, the potential of the anode of the light emitting element 104 becomes close to a potential of the cathode 108. Then, the potential of the gate terminal of the driving transistor 101 also becomes close to the potential of the cathode 108, so that the potential difference between the gate terminal and the source terminal of the driving transistor 101 is increased and the current flowing to the driving transistor 101 is increased. In this manner, the potential of the gate terminal of the driving transistor 101 is stabilized at a potential to flow a constant current to the driving transistor 101. The capacitor 102 then holds charge corresponding to a potential difference between the potential of the gate terminal of the driving transistor 101 and the potential of the signal line 106 at that time.

In this manner, video signal writing to this pixel is completed.

Reaching a steady state in which current flowing to the driving transistor 101 and the light emitting element 104 is constant as described above, the switch 103 is turned off. Consequently, the capacitor 102 holds a potential difference Vp (a voltage) between the potential of the signal line 106 and the potential of the gate terminal (or the drain terminal) of the driving transistor 101 at the moment when the switch 103 is turned off.

In the signal writing period to pixels, after writing a video signal to the pixel, the potential of the potential supply line 105 in the pixel is set such that a voltage applied to the light emitting element 104 is equal to or lower than a threshold voltage $V_{EL}$ of the light emitting element 104 even if the driving transistor 101 is turned on. For example, the potential of the potential supply line 105 may be equal to or lower than the potential Vss of the cathode 108 of the light emitting element 104. It is to be note that setting this potential to the potential supply line 105 is performed at the simultaneous timing of turning off the switch 103 or after the timing.

It is to be noted that in the case where a video signal has been written to the pixel and the power supply potential Vdd has been set to the potential supply line 105 connected to the first terminal of the driving transistor 101, on/off of the driving transistor 101 is controlled in accordance with change of the potential of the signal line 106, based on the analog signal potential which has been set to the signal line 106 when the video signal has been written to the pixel. That is, in the case where the potential of the signal line 106 is equal to or higher than the analog signal potential when the video signal has been written to the pixel in the signal writing period, the driving transistor 101 is turned off while in the case where the potential of the signal line 106 is lower than the analog signal potential when the video signal has been written to the pixel, the driving transistor 101 is turned on.

This is because since the potential difference (Vp) has been held by the capacitor 102 when a video signal has been written to the pixel, in the case where the potential of the signal line 106 is equal to or higher than the analog signal potential when the video signal has been written to the pixel, the potential of the gate terminal of the driving transistor 101 also becomes equal to or higher than the potential of the gate terminal when the video signal has been written to the pixel, thereby the driving transistor 101 is turned off. On the other hand, in the case where the potential of the signal line 106 is lower than the analog signal potential when the video signal has been written to the pixel in the signal writing period to the pixel, the potential of the gate terminal of the driving transistor 101 also becomes lower than the potential of the gate terminal when the video signal has been written to the pixel, thereby the driving transistor 101 is turned on.

Accordingly, in a light emitting period of the pixel, by changing the potential set to the signal line 106 in an analog manner while with a state in which the power supply potential Vdd has been set to the power supply line 105 connected to the first terminal of the driving transistor and the switch 103 has been turned off, on/off of the driving transistor 101 is controlled. That is, time for flowing current to the light emitting element 104 is controlled in an analog manner to express gradation.

Description is made on the potential which is set to the signal line 106 in the light emitting period of the pixel. As the potential set to the signal line 106, an analog potential which has a waveform varying periodically can be used. Note that this analog potential is a potential varying in succession with time. In addition, this analog potential is, preferably, a potential varying in succession from a minimum potential to a maximum potential in the scope of the analog signal potential corresponding to the video signal, a potential varying in succession from the maximum potential to the minimum potential, or a potential varying in succession repeatedly from the maximum potential to the minimum potential and from the minimum potential to the maximum potential.

For example, a potential varying from low potential to high potential in an analog manner is set to the signal line 106 in the light emitting period. As one example, the potential may be increased linearly as a waveform 4301 shown in FIG. 43a; note that such a waveform is also called a sawtooth waveform.

In addition, a potential varying from high potential to low potential in an analog manner may be set as well. For example, the potential may be decreased linearly as a waveform 4302.

In addition, a waveform combining them may be set as well. That is, as one example, a potential linearly increasing from low potential to high potential and decreasing from the high potential to the low potential as a waveform 4303 may be set. Note that the waveform 4303 is called a triangular wave potential hereinafter. In addition, a potential linearly decreasing from high potential to low potential and linearly increasing from the low potential to the high potential as a waveform 4304 may be set as well.

Furthermore, the potential set to the signal line 106 may not vary linearly; a potential of a waveform corresponding to one cycle of an output waveform of a full-wave rectifier circuit as a waveform 4305 may be set or a potential of a waveform 4306 may be set.

By using the above-described waveforms, a light emitting time for a video signal can be arbitrarily set. Therefore, gamma correction and the like can also be performed.

In the light emitting period of the pixel, a plurality of pulses of the waveform 4301, the waveform 4302, the waveform 4303, the waveform 4304, the waveform 4305, or the waveform 4306 may be set in succession. As one example, as a waveform 4307, a pulse of the waveform 4301 may be supplied twice in succession in the light emitting period of the pixel.

According to this, light emitting time can be dispersed within one frame. Consequently, the frame frequency appears to be improved and screen flicker can be prevented.

Next, a display device including a pixel region having the pixel configuration shown in FIG. 1 is described with reference to FIG. 2. The display device in FIG. 2 includes a potential supply line driver circuit 201, a scan line driver circuit 202, a signal line driver circuit 203, and a pixel region 204 provided with a plurality of pixels 205. The pixels 205 are arranged in matrix corresponding to respective scan lines (Reset lines) R1 to Rm and potential supply lines (Illumination lines) I1 to Im which are arranged in row, and respective signal lines (Data lines) D1 to Dn which are arranged in column.

The pixel 205 includes a driving transistor 206, a capacitor 207, a switch 208, a light emitting element 209, a scan line (one of R1 to Rm), a potential supply line Ii (one of I1 to Im), and a signal line Dj (one of D1 to Dn). Note that the driving transistor 206 is a p-type transistor. In addition, the pixel 205 shows one of the plurality of pixels arranged in the pixel region 204.

A first terminal (a source terminal or a drain terminal) of the driving transistor 206 is connected to the potential supply line Ii, a gate terminal thereof is connected to the signal line Dj through the capacitor 207, and a second terminal (the source terminal or the drain terminal) thereof is connected to an anode (a pixel electrode) of the light emitting element 209. The power supply potential Vdd for flowing a desired current to the light emitting element 209 is set to the potential supply lines (P1 to Pn) in the light emitting period.

In addition, the gate terminal and the second terminal (the source terminal or the drain terminal) of the driving transistor 206 are connected to each other via the switch 208. Therefore, when the switch 208 is on, a portion between the gate terminal and the second terminal (the source terminal or the drain terminal) of the driving transistor 206 becomes conductive. On the other hand, when the switch 208 is turned off, the portion between the gate terminal and the second terminal (the source terminal or the drain terminal) of the driving transistor 206 becomes non-conductive, and a potential difference (a voltage) between a potential of the gate terminal (or the second terminal) of the driving transistor 206 and a potential of the signal line Dj at that moment can be held in the capacitor 207. Furthermore, a low power supply potential Vss is set to a cathode (Cathode) 210 of the light emitting element 209. Note that the low power supply potential is a potential lower than the power supply potential Vdd.

It is to be noted that although the potential supply line driver circuit 201 and the scan line driver circuit 202 are arranged on right and left sides respectively, the invention is not limited to this. They may be collectively arranged on one side.

In addition, the power supply potential set to the potential supply lines I1 to Im is not limited to Vdd. For example, in the case where full color display is performed using color elements of RGB, the power supply potential may be changed per pixel for each color element of RGB.

That is, respective potential supply lines for color elements of RGB are provided for each row of pixels, and in pixels of a column of each color element, the first terminals (the source terminals or the drain terminals) of the driving transistors are connected to the respective potential supply lines for color elements of rows. Here, a case where a voltage applied to a light emitting element is changed per pixels for each color element is described with reference to FIG. 48.

Figure 2:
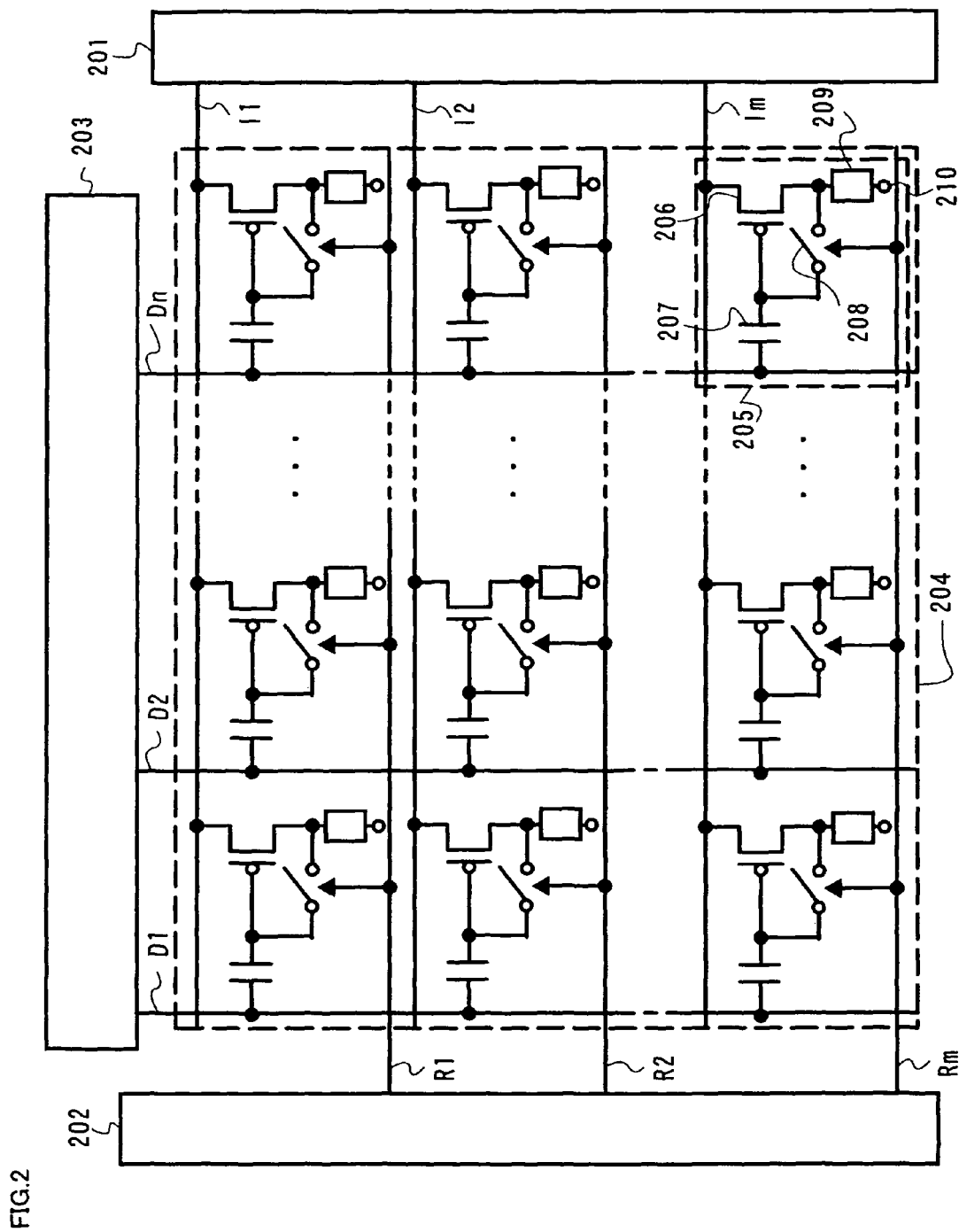
FIG. 2 is a diagram illustrating a display device having a pixel configuration of the invention.
Figure 48:
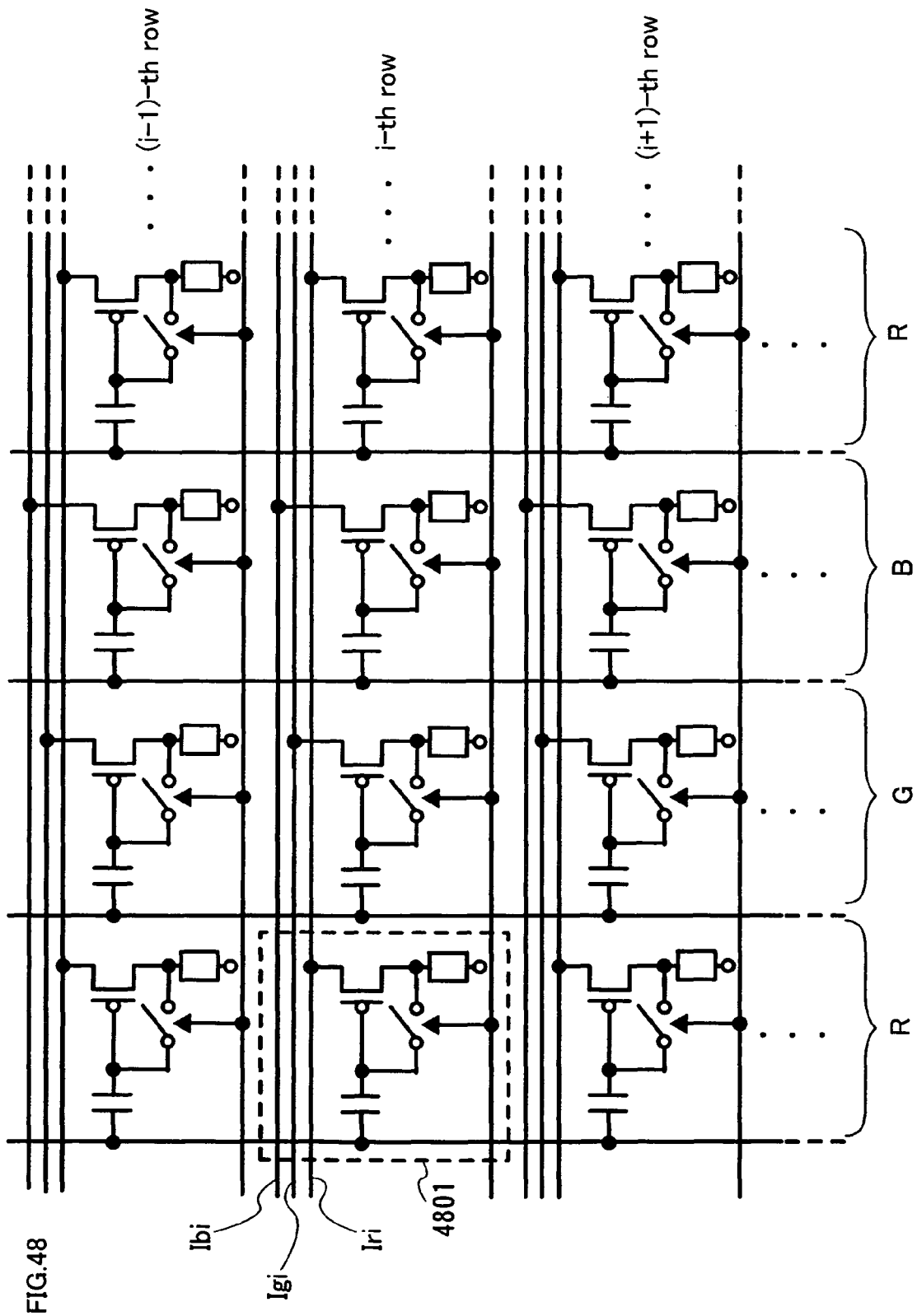
FIG. 48 is a diagram showing a pixel configuration of the invention.

FIG. 48 is a diagram showing a part of the pixel region 204 in FIG. 2. Since a pixel 4801 shown in FIG. 48 has the same configuration as the pixel 205 in FIG. 2 except a potential supply line, reference numerals for a driving transistor, a capacitor, a switch, and a light emitting element of each pixel are omitted. Therefore, as for the reference numerals for these elements of the pixel 4801, refer to FIG. 2 and the description thereof. In FIG. 48, the pixels 4801 of the i-th row (one of 1 to m rows) have potential supply lines Iri, Igi, and Ibi. In the pixels 4801 of a column for a color element of R, the first terminal of the driving transistor 206 is connected to Iri and in the pixels 4801 of a column for a color element of G, the first terminal of the driving transistor 206 is connected to Igi and in the pixels 4801 of a column for a color element of B, the first terminal of the driving transistor 206 is connected to Ibi. To the potential supply line Iri, set is a potential Vdd1 for flowing a desired current to the light emitting elements 209 in the pixels of the column for the color element of R in the light emitting period. To the potential supply line Igi, set is a potential Vdd2 for flowing a desired current to the light emitting elements 209 in the pixels of the column for the color element of G in the light emitting period. To the potential supply line Ibi, set is a potential Vdd3 for flowing a desired current to the light emitting elements 209 in the pixels of the column for the color element of B in the light emitting period. In this manner, the voltage applied to the light emitting element 209 in the pixel 4801 can be set for each color element.

Figure 3:
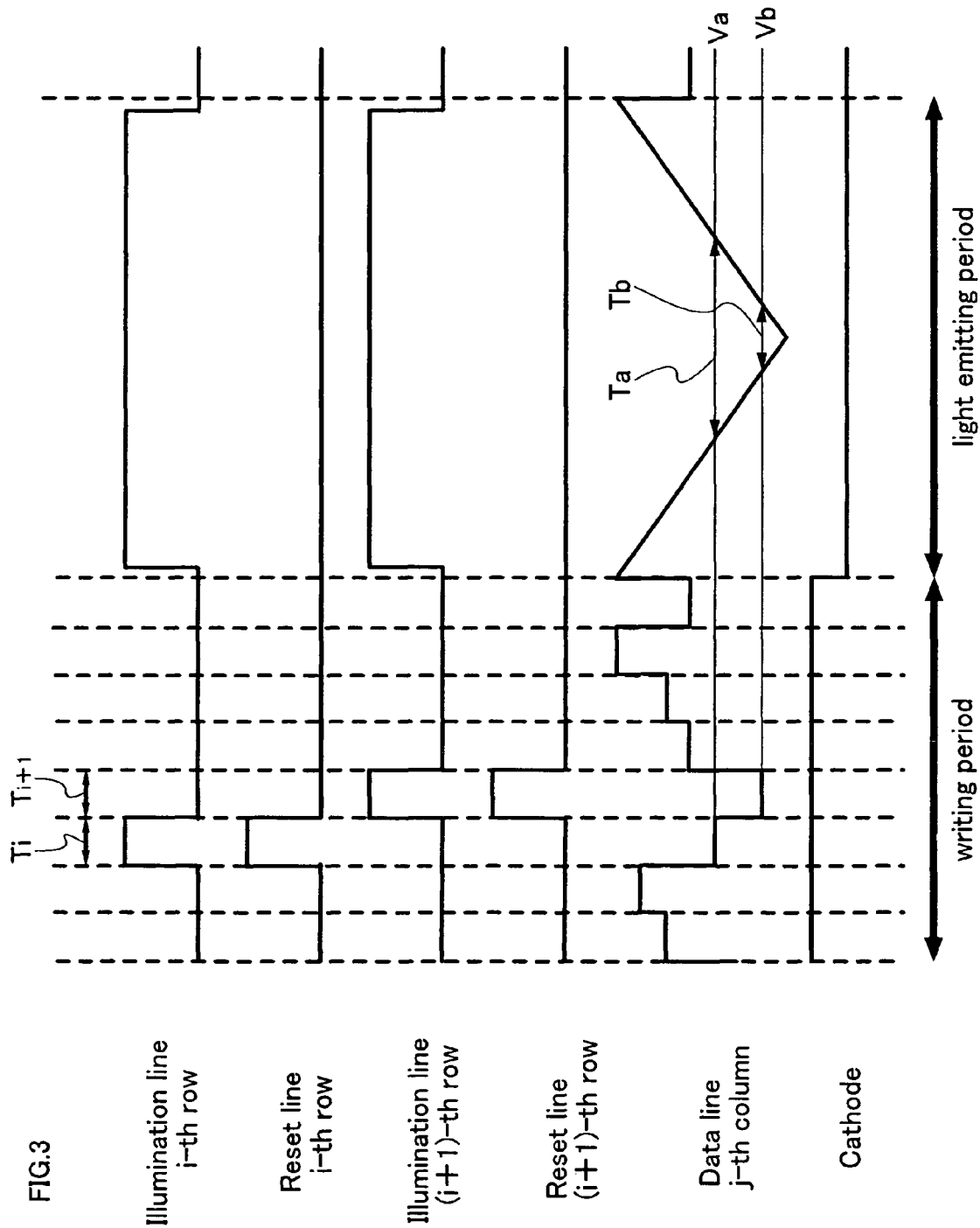
FIG. 3 is a diagram showing a timing chart of a display device having a pixel configuration of the invention.

Next, a principle of operation of the display device of the invention is described with reference to FIGS. 2 and 3. FIG. 3 is a diagram showing a timing chart of one pixel column (the j-th column) in the pixel region 204 of the display device shown in FIG. 2. It is to be noted that a driving transistor, a capacitor, a switch, and a light emitting element of each pixel are denoted by the same reference numerals as the pixel 205 for description since the plurality of pixels arranged in the pixel region 204 have the same configuration as the pixel 205.

As shown in FIG. 3, an analog signal potential is input to a signal line Dj (a signal line of the j-th column) of pixels in the writing period. In a writing period Ti of pixels of the i-th row, when pulse signals are respectively input to a scan line Ri (Reset line of the i-th row) and a potential supply line Ii (Illumination line of the i-th row) to turn on the switch 208 of the pixel of the i-th row, the power supply potential Vdd from the potential supply line Ii is set to the first terminal (the source terminal or the drain terminal) of the driving transistor 206, and current flows to the capacitor 207, the driving transistor 206, and the light emitting element 210.

Then, the capacitor 207 stores or discharges charge; that is, depending on the correlation between charge stored originally in the capacitor 207 and a potential (Va) set to the signal line Dj (Data line), either charge accumulation or discharge is performed.

After a while, current stops flowing to the capacitor 207 and current flowing to the driving transistor 206 and the light emitting element 209 becomes constant. At this time, a complete steady state may not be reached as long as a gate potential necessary to control on/off of the driving transistor 206 can be obtained. Preferably, the driving transistor 206 becomes to be operated in the saturation region at that time.

Subsequently, the second switch 208 is turned off. The capacitor 207 holds a potential difference between a potential of the gate terminal of the driving transistor 206 necessary to control on/off and the analog signal potential set to the signal line Dj (Data line) at the moment when the second switch 208 is turned off.

In addition, at the same time as or after the second switch 208 is turned off, the signal of the potential supply line Ii (Illumination line) is made to fall from H level (the power supply potential Vdd) to L level. In addition, in the following writing periods, the voltage applied to the light emitting element 209 is made to be equal to or lower than the threshold voltage thereof even when the driving transistor 206 is on; that is, it is set that the light emitting elements 209 of the pixels of the i-th row does not emit light in a signal writing period of pixels of another row.

That is, in the writing period Ti of the pixels of the i-th row, signals of the scan line Ri (Reset line) and the potential supply line Ii (Illumination line) are made to be H level until the potential of the gate terminal of the driving transistor 206 necessary to control on/off of the driving transistor 206 is obtained, and after the potential of the gate terminal of the driving transistor 206 necessary to control on/off of the driving transistor 206 is obtained, the signals of the scan line Ri (Reset line) and the potential supply line Ii (Illumination line) are made to fall to L level at the same time or alternatively, after the signal of the scan line Ri (Reset line) falls to L level, the signal of the potential supply line Ii (Illumination line) is made to fall to L level. To be sure, in a signal writing period to pixels before the signal writing period Ti of the pixels of the i-th row, the signals of the scan line Ri (Reset line) and the potential supply line Ii (Illumination line) are made to be L level.

In this manner, a video signal is written to the pixel of the i-th row and the j-th column from the signal line Dj (Data line) in the writing period Ti of the pixels of the i-th row. At this time, in the writing period Ti of the pixels of the i-th row, analog signal potentials are supplied to all pixel columns from the signal lines D1 to Dn (Data lines) respectively and each video signal is written to the pixel of the i-th row of each column.

Next, in a signal writing period Ti+1 of pixels of the (i+1)-th row, pulse signals are input to a scan line Ri+1 (Reset line) and a potential supply line Ii+1 (Illumination line), so that a potential (Vb) is input to the signal line Dj (Data line) of the pixel of the (i+1)-th row and the j-th column and a video signal is written to the pixel. It is to be noted that, at this time, analog signal potentials are input to all pixel columns from the signal lines D1 to Dn (Data lines) respectively and each video signal is written to the pixel of the (i+1)-th row of each column.

In this manner, pulse signals are input to the scan lines R1 to Rm (Reset line) and the potential supply lines I1 to Im (Illumination lines) of all rows of pixels respectively, and a video signal is written to each pixel, so that a signal writing period to the pixel region 204 for one frame period is completed.

Subsequently, in a light emitting period, a signal of H level (Vdd) is input to the potential supply lines I1 to Im (Illumination lines) as shown in FIG. 3 in order to set the power supply potential Vdd to the first terminals (the source terminals or the drain terminals) of the driving transistors 206 of the pixels 205 of all rows. In addition, a triangular wave potential is set to the signal lines D1 to Dn (Data lines). Accordingly, the pixel of the i-th row of the j-th column keeps the non-light emitting state of the light emitting element 209 during a period in which the potential of the signal line Dj (Data line) is higher than Va while the light emitting element 209 emits light during a period (Ta) in which the potential of the signal line Dj (Data line) is lower than the Va. Similarly, in the pixel of the (i+1)-th row and the j-th column, the light emitting element 209 emits light during a period (Tb).

Note that as for the principle that, after the signal writing period is completed, the light emitting element 209 of the pixel does not emit light during a period in which a potential higher than the analog signal potential written the video signal is set to the signal lines D1 to Dn (Data lines) while the light emitting element 209 of the pixel emits light when the potential set to the signal lines D1 to Dn (Data lines) is lower than the written analog signal potential, the above description using the pixel configuration in FIG. 1 can be applied and thus description thereof is omitted here.

As described above, in the light emitting period, a triangular wave potential is set to the signal lines D1 to Dn of all pixels, and respective light emitting times of the light emitting elements 209 are set depending on analog signal potentials when signals are written in the writing periods. Analog time gradation display can be performed in this manner.

It is to be noted that on/off of the driving transistor 206 for controlling light emission/non-light emission of the light emitting element 209 is, as described above, determined by whether the analog signal potential set to the signal lines D1 to Dn (Data lines) in the writing period is higher or lower than the triangular wave potential input to the signal lines D1 to Dn (Data lines) in the light emitting period, which can be controlled in a digital manner. Therefore, on/off of the driving transistor 206 can be controlled with less effect of variations of characteristics of the driving transistor 206; that is, variations of light emission of pixels can be improved.

It is to be noted that as the potential set to the signal lines D1 to Dn (Data lines) in the light emitting period, as shown in FIGS. 43a to 43g, the waveform 4301, the waveform 4302, the waveform 4303, the waveform 4304, the waveform 4305, the waveform 4306, or the waveform 4307 may be set or a plurality of them may be set in succession.

By setting the waveform in succession, light emitting time can be dispersed within one frame. Consequently, the frame frequency appears to be improved and screen flicker can be prevented.

It is to be noted that the low power supply potential set to the cathode 210 (Cathode) may be different between the signal writing period to the pixel and the light emitting period. As shown in FIG. 3, the potential of the cathode 210 (Cathode) in the signal writing period to the pixel may be preferably higher than the potential of the cathode 210 (Cathode) in the light emitting period. That is, where the potential of the cathode 210 (Cathode) in the signal writing period to the pixel is Vss2 and the potential of the cathode 210 (Cathode) in the light emitting period is Vss, Vdd>Vss2>Vss is satisfied at this time; for example, there may be Vss=GND (a ground potential).

As described above, by setting the potential of the cathode 210 (Cathode) in the signal writing period to the pixel higher than a potential in the light emitting period, power consumption in the signal writing period to the pixel can be reduced.

In addition, by setting the potential of the cathode 210 (Cathode) arbitrarily, a gate-source voltage Vgs of the driving transistor 206 in writing a signal to the capacitor 207 can be a threshold voltage Vth in the signal writing period to the pixel. That is, a potential difference between the analog signal potential set to the signal lines D1 to Dn (Data line) and a gate potential such that a gate-source voltage Vgs of the driving transistor 206 is the threshold voltage Vth when the power supply potential Vdd has been set to the first terminal of the driving transistor 206 can be held in the capacitor 207 of each pixel 205. By setting the potential of the cathode 210 (Cathode) as described above, signal writing can be performed while less current flows to the light emitting element 209 in the signal writing period to the pixel. Accordingly, the power consumption can be further reduced.

In addition, the pixel configuration of the invention is not limited to the configuration shown in FIG. 1. Using a light emitting element in which a forward voltage is applied when current flows in a direction reverse to that in the light emitting element 104, a configuration shown in FIG. 4 can be used as well. Note that although only one pixel is illustrated here, a plurality of pixels is arranged in matrix in row and column directions in a pixel region of the display device actually.

The pixel includes a driving transistor 401, a capacitor 402, a switch 403, a light emitting element 404, a potential supply line (Illumination line) 405, a signal line (Data line) 406, and a scan line (Reset line) 407. It is to be noted that the driving transistor 401 is an n-type transistor.

A first terminal (a source terminal or a drain terminal) of the driving transistor 401 is connected to the potential supply line 405, a gate terminal thereof is connected to the signal line 406 through the capacitor 402, and a second terminal (the source terminal or the drain terminal) thereof is connected to a cathode of the light emitting element 404. In addition, the gate terminal and the drain terminal of the driving transistor 401 are connected to each other through the switch 403. Therefore, when the switch 403 is on, a portion between the gate terminal and the second terminal (the source terminal or the drain terminal) of the driving transistor 401 becomes conductive. Then, when the switch 403 is turned off, the portion between the gate terminal and the second terminal (the source terminal or the drain terminal) of the driving transistor 401 becomes non-conductive, and a potential difference (a voltage) between a potential of the gate terminal (or the second terminal) of the driving transistor 401 at this moment and a potential of the signal line 406 can be held in the capacitor 402. It is to be noted that, to an anode (Anode) of the light emitting element 404, a potential Vdd is set. It is to be noted that Vss is a high power supply potential and where a potential which is set to the potential supply line 405 in a light emitting period of a pixel is a low power supply potential Vss, Vss is a potential satisfying Vdd>Vss.

Figure 4:
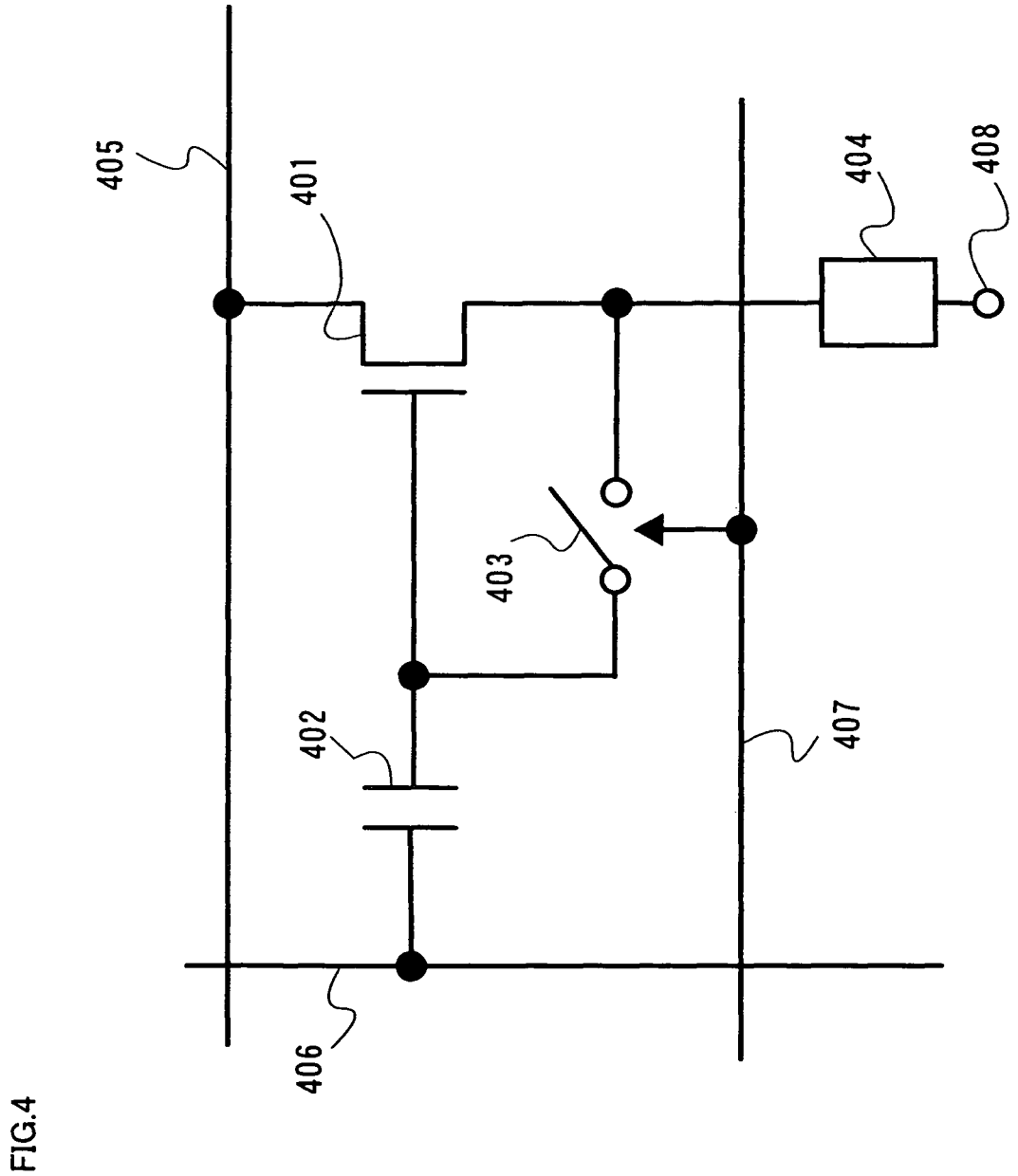
FIG. 4 is a diagram showing a pixel configuration of the invention.
Figure 5:
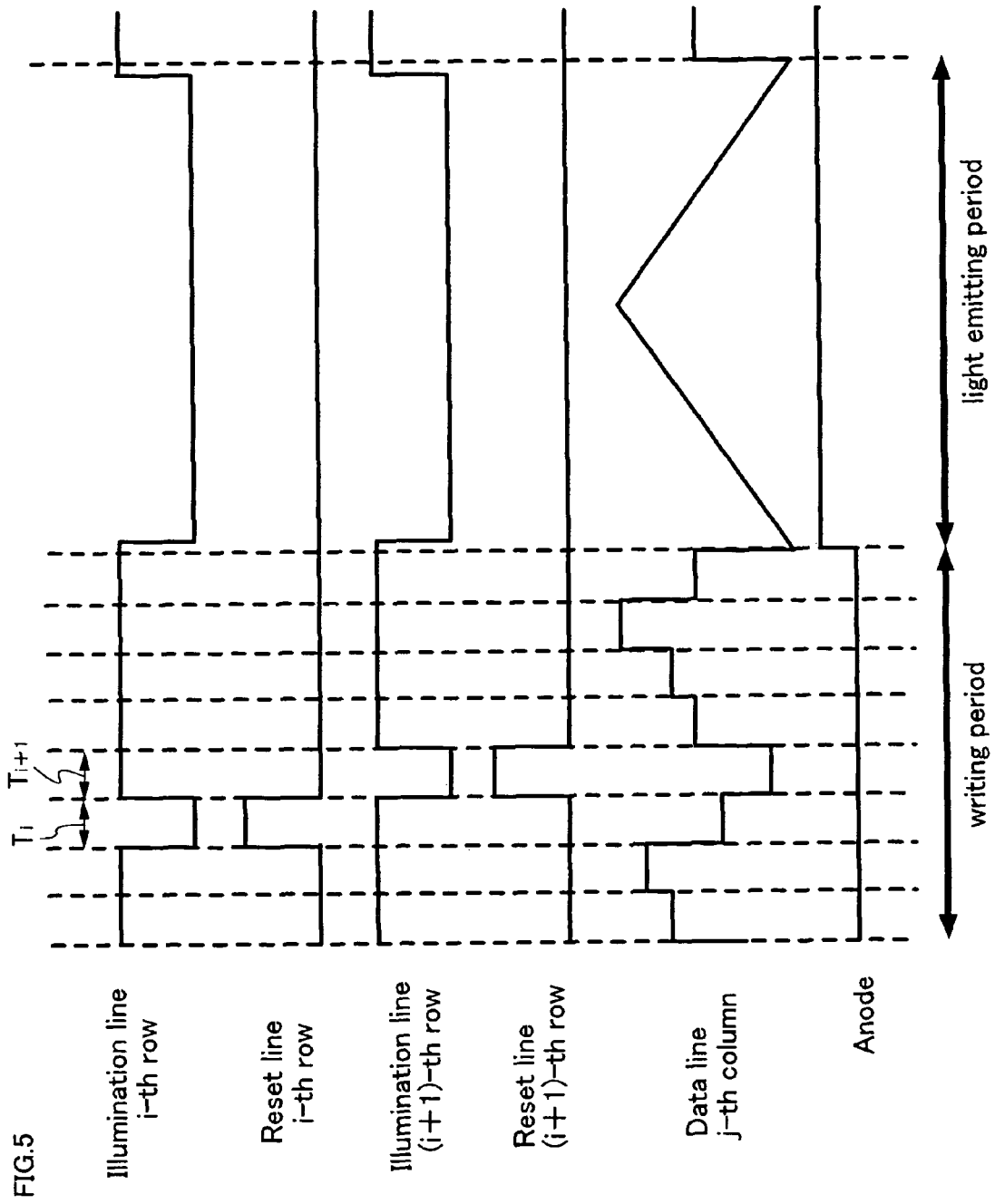
FIG. 5 is a diagram showing a timing chart of a display device having a pixel configuration of the invention.

Next, providing that the pixel shown in FIG. 4 is a pixel of the i-th row and the j-th column of the pixels arranged in matrix in the pixel region, a principle of operation thereof is described arbitrarily using a timing chart shown in FIG. 5.

In a signal writing period to the pixel, an analog signal potential is set to the signal line (Data line) 406 in pixels of the j-th column as shown in FIG. 5. This analog signal potential corresponds to a video signal. When a video signal is written to pixels of the i-th row (a writing time Ti), a signal of H level is input to the scan line (Reset line) 407 to turn on the switch 403, and besides, a potential of the potential supply line 405 is set to be the low power supply potential Vss so that the low power supply potential Vss is set to the first terminal of the driving transistor 401. Then, current flows to the driving transistor 401 and the light emitting element 404, and the capacitor 402 stores or discharges charge.

At this time, the first terminal of the driving transistor 401 is a source terminal while the second terminal thereof is a drain terminal. As current flowing to the driving transistor 401 is increased while the switch 403 is on, current flowing to the light emitting element 404 is also increased, so that voltage drop in the light emitting element 404 is increased and a potential difference between the electrodes of the light emitting element 404 is increased. That is, a potential of the cathode of the light emitting element 104 becomes close to the potential of the potential supply line 405. As a result of this, a potential of the gate terminal of the driving transistor 401 also becomes close to the potential of the potential supply line 405 so that a potential difference between the gate terminal and the source terminal of the driving transistor 401 is decreased and the current flowing to the driving transistor 401 is decreased. Meanwhile, the current flowing to the light emitting element 404 is decreased, so that the voltage drop in the light emitting element 404 is decreased and the potential difference between the electrodes of the light emitting element 404 is decreased. That is, the potential of the cathode of the light emitting element 404 becomes close to a potential of the anode 408. Then, the potential of the gate terminal of the driving transistor 401 also becomes close to the potential of the anode 408, so that the potential difference between the gate terminal and the source terminal of the driving transistor 401 is increased and the current flowing to the driving transistor 401 is increased. In this manner, the potential of the gate terminal of the driving transistor 401 is stabilized at a potential to flow a constant current to the driving transistor 401. The capacitor 402 then holds charge corresponding to a potential difference between the potential of the gate terminal of the driving transistor 401 and the potential of the signal line 406 at that time.

In this manner, video signal writing to the pixel of the i-th row is completed.

Reaching a steady state in which current flowing to the driving transistor 401 and the light emitting element 404 is constant as described above, the signal of the scan line (Reset line) 407 is changed to be L level and the switch 403 is turned off. Consequently, the capacitor 402 holds a potential difference Vp (a voltage) between the potential of the signal line (Data line) 406 and the potential of the gate terminal (or the drain terminal) of the driving transistor 401 at the moment when the switch 403 is turned off.

In the signal writing period to the pixel, after writing a video signal to the pixels of the i-th row, a potential of the potential supply line 405 in the pixels of the i-th row is set such that a voltage applied to the light emitting element 404 is equal to or lower than a threshold voltage $V_{EL}$ of the light emitting element 404 even if the driving transistor 401 is turned on. For example, the potential of the potential supply line 405 may be equal to or higher than the potential Vdd of the anode 408 of the light emitting element 404. It is to be note that setting this potential to the potential supply line 405 is performed at the simultaneous timing of turning the switch 403 off or after the timing.

Subsequently, a writing time $T_{i+1}$ of pixels of the (i+1)-th row is started, and a video signal is written to the pixels of the (i+1)-th row similarly. In this manner, writing times of pixels of all rows are completed to write respective video signals for one frame to the pixels so that a signal writing period to the pixels is completed.

It is to be noted that in the case where a video signal has been written to the pixel and the power supply potential Vss has been set to the potential supply line 405 connected to the first terminal of the driving transistor 401, on/off of the driving transistor 401 is controlled in accordance with change of the potential of the signal line 406, based on the analog signal potential which has been set to the signal line 406 when the video signal has been written to the pixel. That is, in the case where the potential of the signal line 406 is equal to or lower than the analog signal potential when the video signal has been written to the pixel in the signal writing period, the driving transistor 401 is turned off while in the case where the potential of the signal line 406 is higher than the analog signal potential when the analog signal has been written to the pixel, the driving transistor 401 is turned on.

This is because since the potential difference (Vp) has been held by the capacitor 402 when a video signal has been written to the pixel, in the case where the potential of the signal line 406 is equal to or lower than the analog signal potential when the video signal has been written to the pixel, the potential of the gate terminal of the driving transistor 401 also becomes equal to or lower than the potential of the gate terminal when the video signal has been written to the pixel, thereby the driving transistor 401 is turned off. On the other hand, in the case where the potential of the signal line 106 is higher than the analog signal potential when the video signal has been written to the pixel in the signal writing period to the pixel, the potential of the gate terminal of the driving transistor 401 also becomes higher than the potential of the gate terminal when the video signal has been written to the pixel, thereby the driving transistor 401 is turned on.

Accordingly, in a light emitting period of the pixel, as shown in FIG. 5, by setting a triangular wave potential to the signal line (Data line) 406 to control on/off of the driving transistor 401 in a state where Vss is set to the potential supply line (Illumination line) 405 connected to the first terminal of the driving transistor 401 and the scan line (Reset line) 407 is set to be L level to turn off the switch 403. That is, on/off of the driving transistor 401 for controlling light emission/non-light emission of the light emitting element 404 is determined by whether the analog signal potential set to the Data line (the signal line 406) in the writing period is higher or lower than the triangular wave potential input to the Data line (the signal line 406) in the light emitting period, which can be controlled in a digital manner. Therefore, on/off of the driving transistor 401 can be controlled with less effect of variations of characteristics of the driving transistor 401; that is, variations of light emission of pixels can be improved.

It is to be noted that as the potential set to the signal line (Data line) 406 in the light emitting period of the pixel, an analog potential having a waveform varying periodically can be used. For example, as shown in FIGS. 43a to 43g, the waveform 4301, the waveform 4302, the waveform 4303, the waveform 4304, the waveform 4305, the waveform 4306, or the waveform 4307 may be set or a plurality of them may be set in succession.

By setting the waveform in succession, light emitting time can be dispersed within one frame. Consequently, the frame frequency appears to be improved and screen flicker can be prevented.

In addition, as described in FIG. 5, by setting a potential lower than a potential in the light emitting period to the Anode (anode 408) in the signal writing period to the pixel, power consumption in the signal writing period to the pixel can be reduced.

In addition, according to the pixel configurations (FIGS. 1, 2, and 4) described in this embodiment mode, the number of transistors and wires can be reduced, thereby aperture ratio of a pixel can be increased and high definition display can be performed.

In addition, when the same luminosity is obtained in a pixel having a high aperture ratio and a pixel having a low aperture ratio, luminance of the light emitting element can be reduced in the pixel having the high aperture ratio as compared to the pixel having the low aperture ratio so that reliability of the light emitting element can be improved. In particular, in the case where an EL element is used as the light emitting element, reliability of the EL element can be improved.

In addition, mobility u of an n-type transistor is in general higher than that of a p-type transistor. Therefore, for flowing the same current, a ratio W/L of channel width to channel length of the p-type transistor is required to be larger than W/L of the n-type transistor. Therefore, by using an n-type transistor, transistor size can be decreased. Thus, by using the pixel configuration as shown in FIG. 4, the aperture ratio of the pixel is further improved.

Embodiment Mode 2

Described in this embodiment mode is a configuration different from Embodiment Mode 1. In a pixel configuration described in this embodiment mode, an analog signal potential when a video signal is written to the pixel and an analog potential for controlling light emission/non-light emission of the pixel are set to the pixel by different wires respectively.

First, the pixel configuration of a display device of the invention is described in detail with reference to FIG. 56. The pixel includes a driving transistor 5601, a capacitor 5602, a first switch 5603, a light emitting element 5604, a power supply line 5605, a second switch 5606, a third switch 5607, a scan line (Reset line) 5608, a first signal line (Data1 line) 5609, and a second signal line (Data2 line) 5610. It is to be noted that the driving transistor 5601 is a p-type transistor.

A first terminal (a source terminal or a drain terminal) of the driving transistor 5601 is connected to the potential supply line 5605, a gate terminal thereof is connected to one electrode of the capacitor 5602, and the other electrode of the capacitor 5602 is connected to the first signal line 5609 through the second switch 5606 and connected to the second signal line 5610 through the third switch 5607. In addition, a gate terminal and a second terminal (the source terminal or the drain terminal) of the driving transistor 5601 are connected to each other through the first switch 5603. Furthermore, to a cathode (Cathode) 5611 of the light emitting element 5604, a potential Vss is set. It is to be noted that Vss is, taking as a criterion a power supply potential Vdd which is set to the potential supply line 5605, a potential satisfying Vss<Vdd; for example, there may be Vss=GND (a ground potential).

Figure 56:
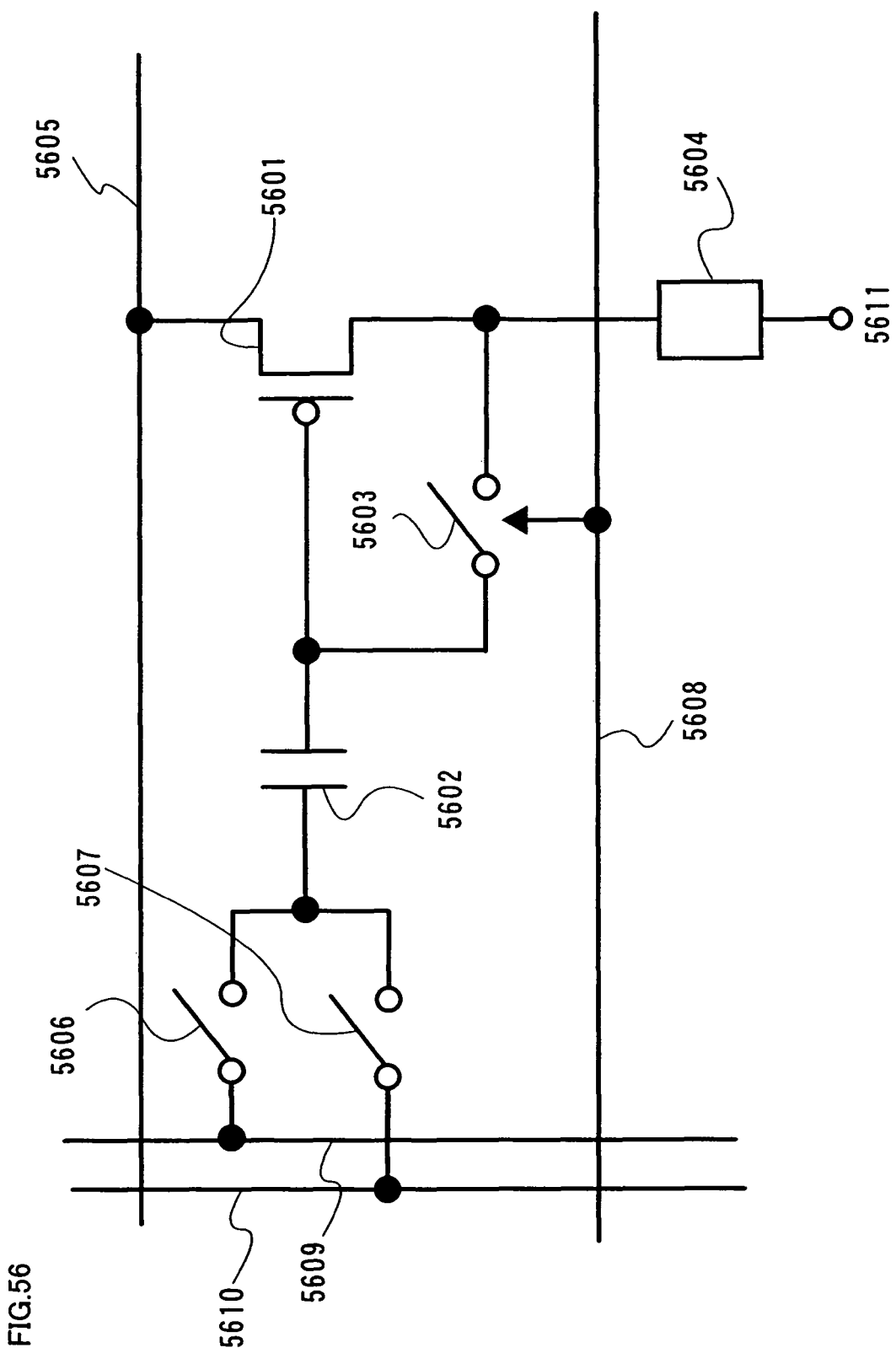
FIG. 56 is a diagram showing a pixel configuration of the invention.
Figure 57:
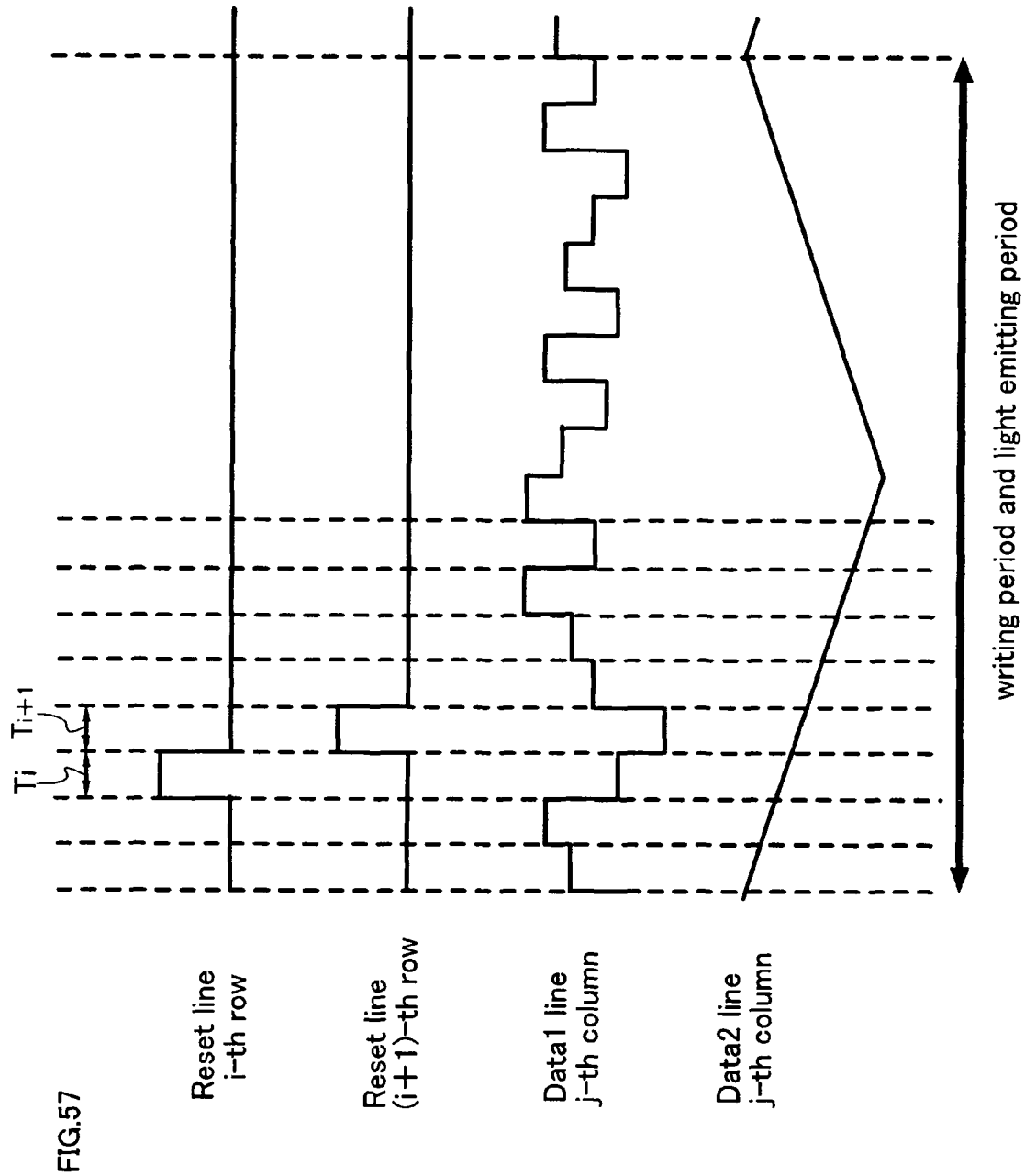
FIG. 57 is a diagram showing a timing chart of a display device having a pixel configuration of the invention.

Next, a principle of operation of the pixel configuration shown in FIG. 56 is briefly described with reference to FIG. 57. Note that FIG. 57 shows a timing chart of a pixel column of the j-th column in a display device in which a plurality of the pixels shown in FIG. 56 is arranged in matrix. In addition, when a signal of the scan line 5608 (Reset line) is H level in the timing chart shown in FIG. 57, the first switch 5603 is turned on while turned off when the signal is L level.

In the pixel shown in FIG. 56, an analog signal potential corresponding to a video signal is set to the first signal line 5609, and an analog potential for controlling a light emitting time is set to the second signal line 5610.

It is to be noted that as the potential set to the second signal line 5310, as shown in FIGS. 43a to 43g in Embodiment Mode 1, the waveform 4301, the waveform 4302, the waveform 4303, the waveform 4304, the waveform 4305, the waveform 4306, or the waveform 4307 may be set or a plurality of them may be set in succession.

By setting the waveform in succession, light emitting time can be dispersed within one frame. Consequently, the frame frequency appears to be improved and screen flicker can be prevented.

It is to be noted that, in the display device having the pixel configuration described in this embodiment mode, a signal writing period and a light emitting period are set for each row of the pixel region. That is, a writing period and a light emitting period coincidental proceed as the pixel region on the whole. Note that the signal writing period to pixels for each row is referred to as a writing time.

A signal writing time of pixels of the i-th row is described here. A period Ti shown in FIG. 5 shows the signal writing period of the pixels of the i-th row. A period other than the period Ti is a light emitting period of the pixels of the i-th row.

First, in the period Ti, the second switch 5606 is turned on and the third switch 5607 is turned off. Then, a signal of H level is input to the scan line 5608 (Reset line) in the period Ti to turn on the first switch 5603. The power supply potential Vdd from the power supply line 5605 is set to the first terminal (the source terminal or the drain terminal) of the driving transistor 5601 of each pixel of the i-th row, and current flows to the capacitor 5602, the driving transistor 5601, and the light emitting element 5604. Then, the capacitor 5602 stores or discharges charge; specifically, depending on the correlation between charge stored originally in the capacitor 5602 and a potential set to the first signal line 5609 (Data1 line), either charge accumulation or discharge is performed. Then, the signal of the scan line 5608 (Reset line) falls from H level to L level, thereby the first switch 5603 is turned off. When the first switch 5603 is turned off, the capacitor 5602 holds a potential difference between a potential of the gate terminal of the driving transistor 5601 at that moment and the potential of the first signal line 5609.

In this manner, a video signal is written to the pixel of the j-th column and the i-th row from the first signal line 5609 (Data1 line). It is to be noted that, at this time, respective analog signal potentials are input to all pixel columns from the first signal lines 5609 (Data1 lines) and each video signal is written to each pixel of the i-th row of each column.

When the signal writing period Ti of the pixels of the i-th row is completed in this manner, a signal writing period $T_{i+1}$ of pixels of the (i+1)-th row is started and a light emitting period starts in the pixels of the i-th row.

In the light emitting period of the pixels of the i-th row, the second switch 5606 of each pixel of the i-th row is turned off and the third switch 5607 thereof is turned on while the first switch 5603 is off.

It is to be noted that a triangular wave potential is set to the second signal line 5610 (Data2 line) as shown in FIG. 57. The pixel of the j-th column and the i-th row keeps the non-light emitting state of the light emitting element 5604 during a period in which the potential of the second signal line (Data2 line) is higher than the analog signal potential set to the first signal line 5609 (Data1 line) in the signal writing period Ti of the pixels of the i-th row, while the light emitting element 5604 emits light during a period in which the potential of the second signal line 5610 (Data2 line) is lower than the analog signal potential set to the first signal line 5609 (Data1 line) in the signal writing period Ti of the pixels of the i-th row. Accordingly, the light emitting time of the light emitting element 5604 is set depending on an analog signal potential when a video signal is written in a writing period of each pixel. Analog time gradation display can be performed in this manner.

As described above, in the display device having the pixel configuration described in this embodiment mode, a signal writing period starts sequentially for each pixel row, and followed by a light emitting period for each pixel row when the signal writing period is completed. In the case where a signal is written to pixels in a line-sequential manner as is in this embodiment mode, the required writing period may be for one pixel, so that a light emitting period can be made long. That is, the duty ratio (the ratio of the light emitting period to one frame period) is high, so that moment luminance of the light emitting element can be reduced. Consequently, reliability of the light emitting element can be improved.

In addition, since the writing period of pixels for each row can be made long, frequency of a signal line driver circuit for inputting an analog signal potential to the first signal line 5609 (Data1 line) can be reduced. Consequently, power consumption can be reduced.

It is to be noted that on/off of the driving transistor 5601 for controlling light emission/non-light emission of the light emitting element 5604 is, as described above, determined by whether the analog signal potential set to the first signal line 5609 (Data1 line) in the writing period is higher or lower than the triangular wave potential input to the second signal line (Data2 line) in the light emitting period, which can be controlled in a digital manner. Therefore, on/off of the driving transistor 5601 can be controlled with less effect of variations of characteristics of the driving transistor 5601; that is, variations of light emission of pixels can be improved.

In addition, although a p-type transistor is used as the driving transistor 5601 in FIG. 56, an n-type transistor can be used as well. In that case, the direction of current flowing from the cathode 5611 to the power supply line 5605 is reversed; that is, the forward voltage in the light emitting element 5604 is reversed. In the pixel configuration of this embodiment mode, an n-type transistor can be used as the driving transistor for controlling light emission/non-light emission of the light emitting element. Mobility μ of an n-type transistor is in general higher than that of a p-type transistor. Therefore, for flowing the same current, the transistor size can be reduced; consequently, the aperture ratio of a pixel can be increased, and high definition display and a display device with the power consumption reduced can be provided.

It is to be noted that in this embodiment mode, the source and drain terminals of the driving transistor for driving the light emitting element, and the anode and cathode of the light emitting element mean terminals and electrodes respectively when a forward voltage is applied to the light emitting element.

Embodiment Mode 3

In this embodiment mode, a case where a transistor is used as the switch in the pixel described in Embodiment Mode 1 is described.

Figure 6:
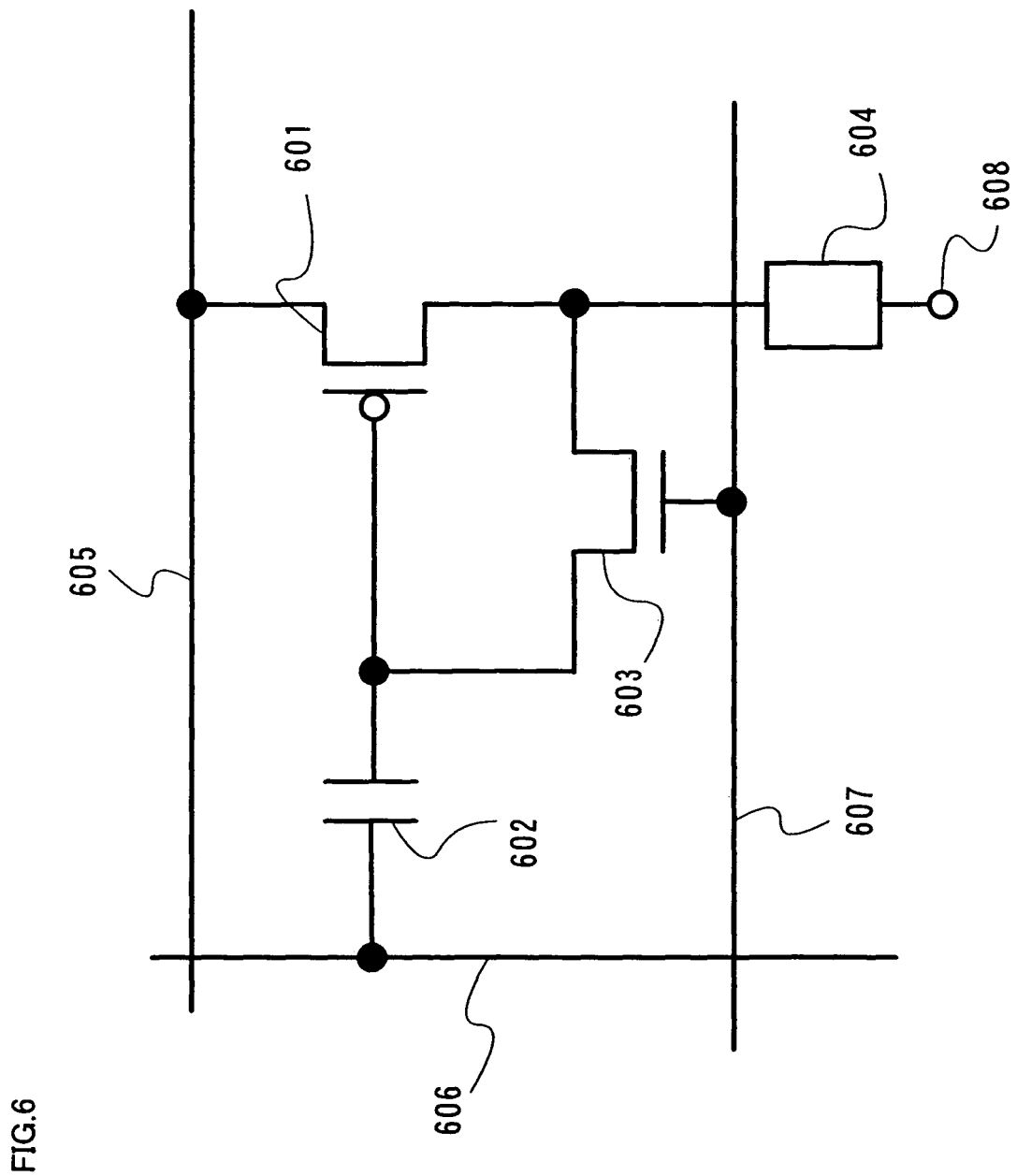
FIG. 6 is a diagram showing a pixel configuration of the invention.

First, shown in FIG. 6 is a pixel configuration in which an n-type transistor is used as the switch 103 in the pixel shown in FIG. 1. The pixel includes a driving transistor 601, a capacitor 602, a switching transistor 603, a light emitting element 604, a potential supply line (Illumination line) 605, a signal line (Data line) 606, and a scan line (Reset line) 607. It is to be noted that the driving transistor 601 is a p-type transistor is used as the driving transistor 601 and an n-type transistor is used as the switching transistor 603.

A first terminal (a source terminal or a drain terminal) of the driving transistor 601 is connected to the potential supply line 605, a gate terminal thereof is connected to the signal line 606 through the capacitor 602, and a second terminal (the source terminal or the drain terminal) thereof is connected to an anode (a pixel electrode) of the light emitting element 604. In addition, the gate terminal of the driving transistor 601 is connected to a first terminal (a source terminal or a drain terminal) of the switching transistor 603 while the second terminal (the source terminal or the drain terminal) of the driving transistor 601 is connected to a second terminal (the source terminal or the drain terminal) of the switching transistor 603. Therefore, when a signal of H level is input to the scan line 607 and the switching transistor 603 is on, a portion between the gate terminal and the second terminal (the source terminal or the drain terminal) of the driving transistor 601 becomes conductive. Then, when a signal of L level is input to the scan line 607 and the switching transistor 603 is turned off, the portion between the gate terminal and the second terminal (the source terminal or the drain terminal) of the driving transistor 601 becomes non-conductive, and a potential difference (a voltage) between a potential of the gate terminal (or the second terminal) of the driving transistor 601 at this moment and a potential of the signal line 606 can be held in the capacitor 602. Furthermore, to a cathode (Cathode) 608 of the light emitting element 604, a potential Vss is set. It is to be noted that Vss is, taking as a criterion a power supply potential Vdd which is set to the potential supply line 605 in a light emitting period of the pixel, a potential satisfying Vss<Vdd; for example, there may be Vss=GND (a ground potential).

Therefore, the switching transistor 603 functions similarly to the switch 103 in the pixel shown in FIG. 1. In addition, the driving transistor 601, the capacitor 602, the switching transistor 603, the light emitting element 604, the potential supply line (Illumination line) 605, the signal line (Data line) 606, and the scan line (Reset line) 607 correspond to the driving transistor 101, the capacitor 102, the switch 103, the light emitting element 104, the potential supply line (Illumination line) 105, the signal line (Data line) 106, and the scan line (Reset line) 107 in the pixel shown in FIG. 1 respectively. Thus, since operation of the pixel shown in FIG. 6 is the same as that of the pixel shown in FIG. 1, description thereof is omitted here.

It is noted that the capacitor 602 is required to keep holding the potential difference which has been held in the writing period during the light emitting period. Therefore, leakage current (which means off current which flows between a source and a drain and gate leakage current which flows between a gate and the source or drain when the transistor is off) of the switching transistor 603 and gate leakage current of the driving transistor 601 are required to be reduced.

Therefore, an n-type transistor is preferably used as the switching transistor 603 as shown in FIG. 6. This is because a low-concentration impurity region (also called a "Lightly Doped Drains: LDD region") can be easily formed in the n-type transistor, which can reduce off current.

In addition, material and thickness of respective gate insulating films of the driving transistor 601 and the switching transistor 603 are preferably selected arbitrarily to reduce gate leakage current. In addition, by forming a gate electrode to have a multi-gate structure, the gate leakage current can be reduced as well.

Alternatively, a p-type transistor can be used for the switching transistor as the switch 103 in the pixel shown in FIG. 1. In that case, H level and L level of a signal for controlling on/off of the switching transistor operate inversely to that in the case of employing an n-type transistor. That is, the switching transistor is turned on when the signal is L level while turned off when the signal is H level.

In addition, by using a p-type transistor for the switching transistor as the switch 103 in the pixel shown in FIG. 1, a circuit constituted only by p-type transistors, including a whole pixel region and sometimes further including a peripheral driver circuit can be provided. Accordingly, a display panel having a single conductivity type can be provided at low cost by a reduced number of steps.

In addition, by using a p-type transistor for the switching transistor as the switch 103 in the pixel shown in FIG. 1, a wire corresponding to the potential supply line 105 shown in FIG. 1 can be omitted. Such the configuration is described with reference to FIG. 8.

The pixel includes a driving transistor 801, a capacitor 802, a switching transistor 803, a light emitting element 804, a signal line (Data line) 806, and a scan line (Reset line) 807. It is to be noted that p-type transistors are used as the driving transistor 801 and the switching transistor 803.

A first terminal (a source terminal or a drain terminal) of the driving transistor 801 in the pixel of the (i+1)-th row is connected to the scan line 807 in the pixel of the i-th row, a gate terminal thereof is connected to the signal line 806 through the capacitor 802, and a second terminal (the source terminal or the drain terminal) thereof is connected to an anode (a pixel electrode) of the light emitting element 804. In addition, the gate terminal of the driving transistor 801 is connected to a first terminal (a source terminal or a drain terminal) of the switching transistor 803 while the second terminal (the source terminal or the drain terminal) of the driving transistor 801 is connected to a second terminal (the source terminal or the drain terminal) of the switching transistor 803. Therefore, when a signal of L level is input to the scan line 807 and the switching transistor 803 is on, a portion between the gate terminal and the second terminal (the source terminal or the drain terminal) of the driving transistor 801 becomes conductive. Then, when a signal of H level is input to the scan line 807 and the switching transistor 803 is turned off, the portion between the gate terminal and the second terminal (the source terminal or the drain terminal) of the driving transistor 801 becomes non-conductive, and a potential difference (a voltage) between a potential of the gate terminal (or the second terminal) of the driving transistor 801 at this moment and a potential of the signal line 806 can be held in the capacitor 802. Furthermore, to a cathode (Cathode) 805 of the light emitting element 804, a potential Vss is set. It is to be noted that Vss is, taking as a criterion a power supply potential Vdd which is set to the first terminal (the source terminal or the drain terminal) of the driving transistor 801 in a light emitting period of the pixel, a potential satisfying Vss<Vdd; for example, there may be Vss=GND (a ground potential).

Figure 8:
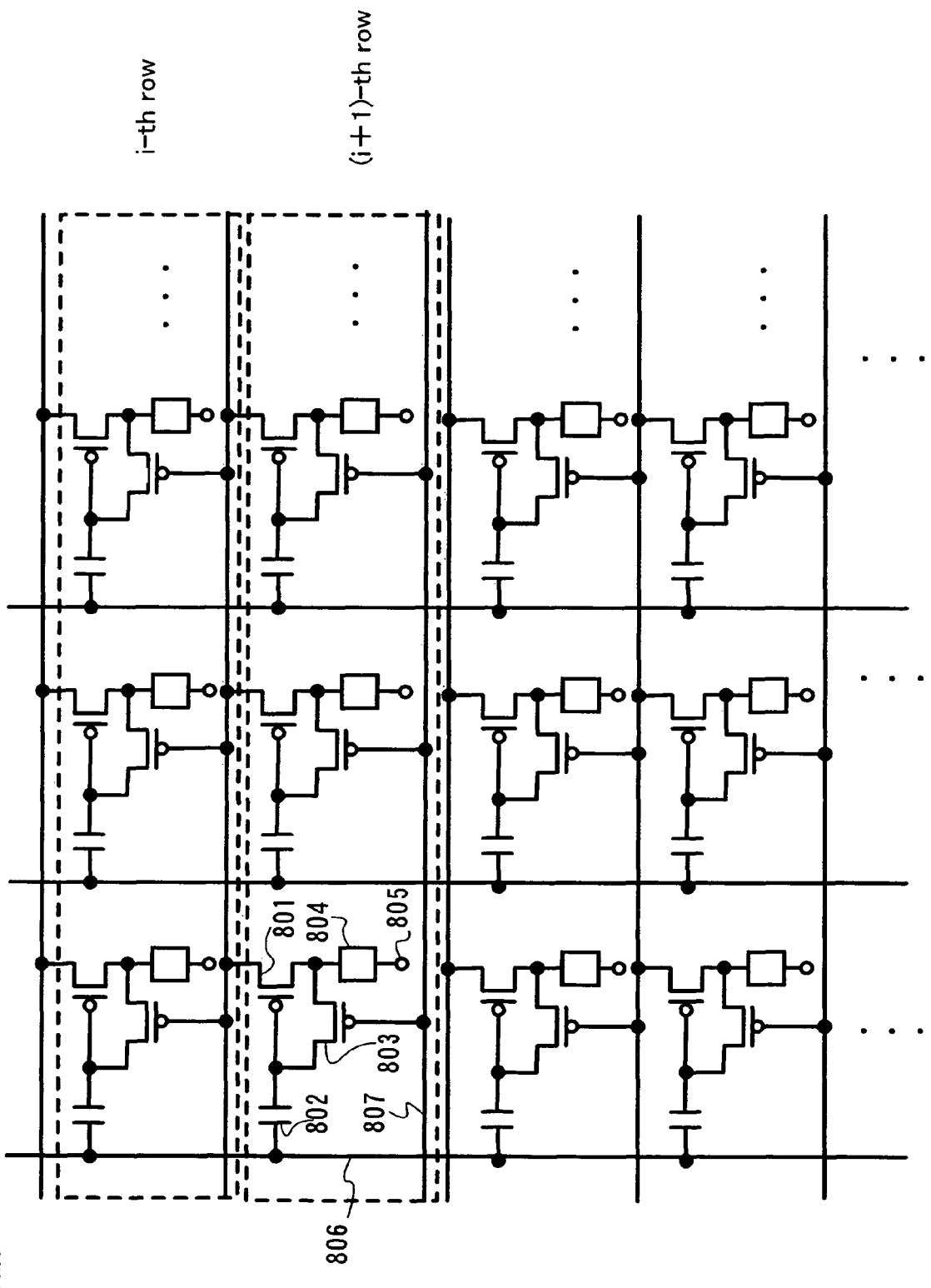
FIG. 8 is a diagram showing a pixel configuration of the invention.
Figure 9:
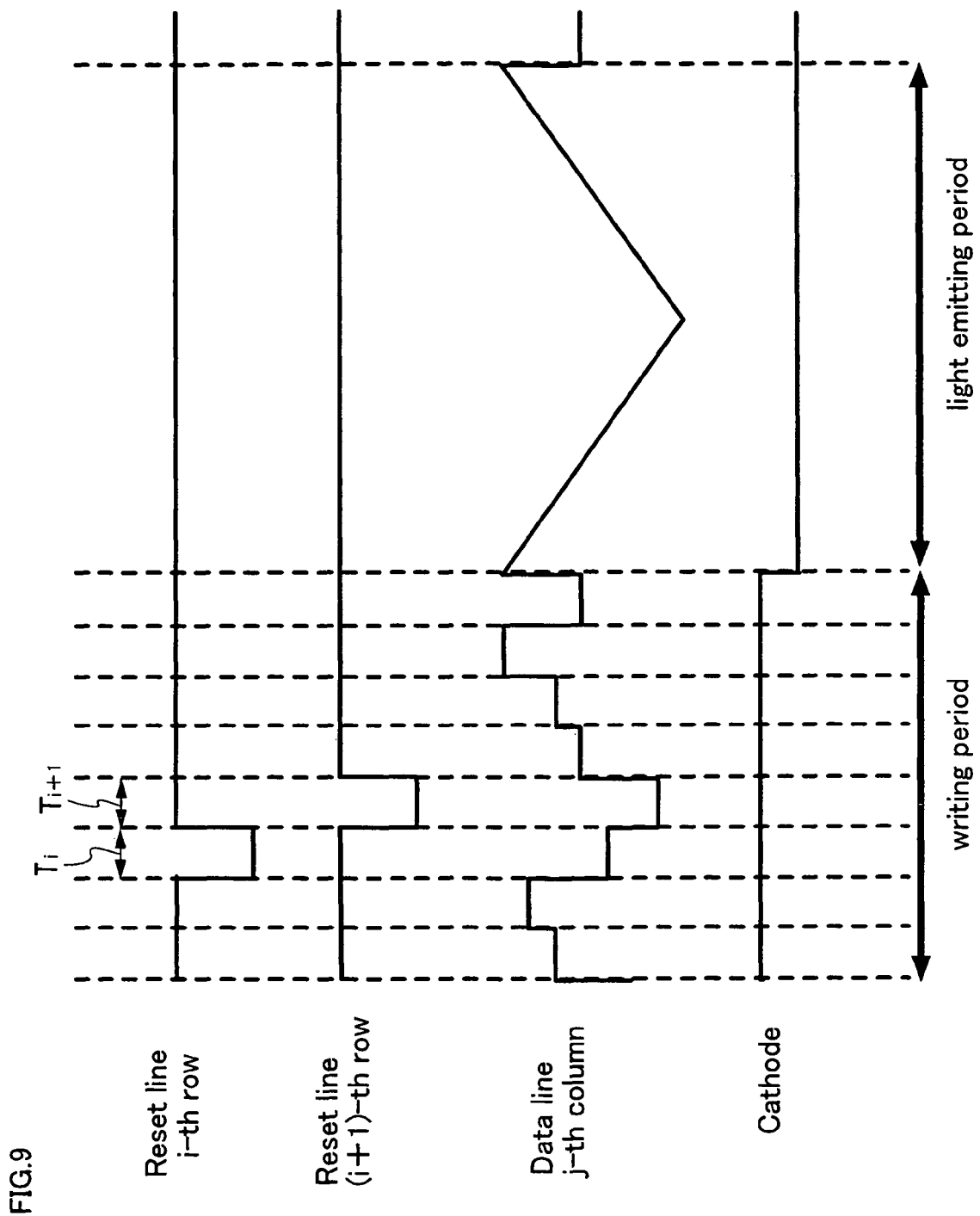
FIG. 9 is a diagram showing a timing chart of a display device having a pixel configuration of the invention.

A timing chart of a display device having the pixel configuration shown in FIG. 8 is shown in FIG. 9. A signal of the scan line 807 of each pixel row is fallen from H level to L level when a writing time starts and the signal is risen from the L level to the H level when the writing time is completed. A period Ti and a period Ti+1 are respective writing times of pixels of the i-th row and the (i+1)-th row, during which a signal of the scan line 807 is L level.

Therefore, since the signal of the scan line 807 is H level in the light emitting period, by increasing the current supply capability of a circuit for outputting a signal to the scan line 807, the scan line 807 can be used as a potential supply line for setting a voltage to be applied to the light emitting element 804. Note that the scan line 807 of the next row is used as the potential supply line in the configuration shown in FIG. 8, however, the invention is not limited thereto as long as the scan line 807 is that of another row.

It is to be noted that in the configuration shown in FIG. 8, in the writing period, the light emitting element 804 may emit light also in a writing time of pixels of another row, therefore, a potential of the Cathode (the cathode 805) is preferably set to be higher as compared to that in the light emitting period. More preferably, as described in Embodiment Mode 1, it is set such that a gate-source voltage Vgs of the driving transistor 801 is equal to a threshold voltage when writing a signal to the pixel. That is, such that a voltage applied to the light emitting element 804 at this time is equal to or lower than a forward threshold voltage $V_{EL}$ of the light emitting element 804, the potential of the Cathode (the cathode 805) may be set.

According to the configuration as shown in FIG. 8, the number of wires can be reduced so that the aperture ratio can be further improved.

Figure 7:
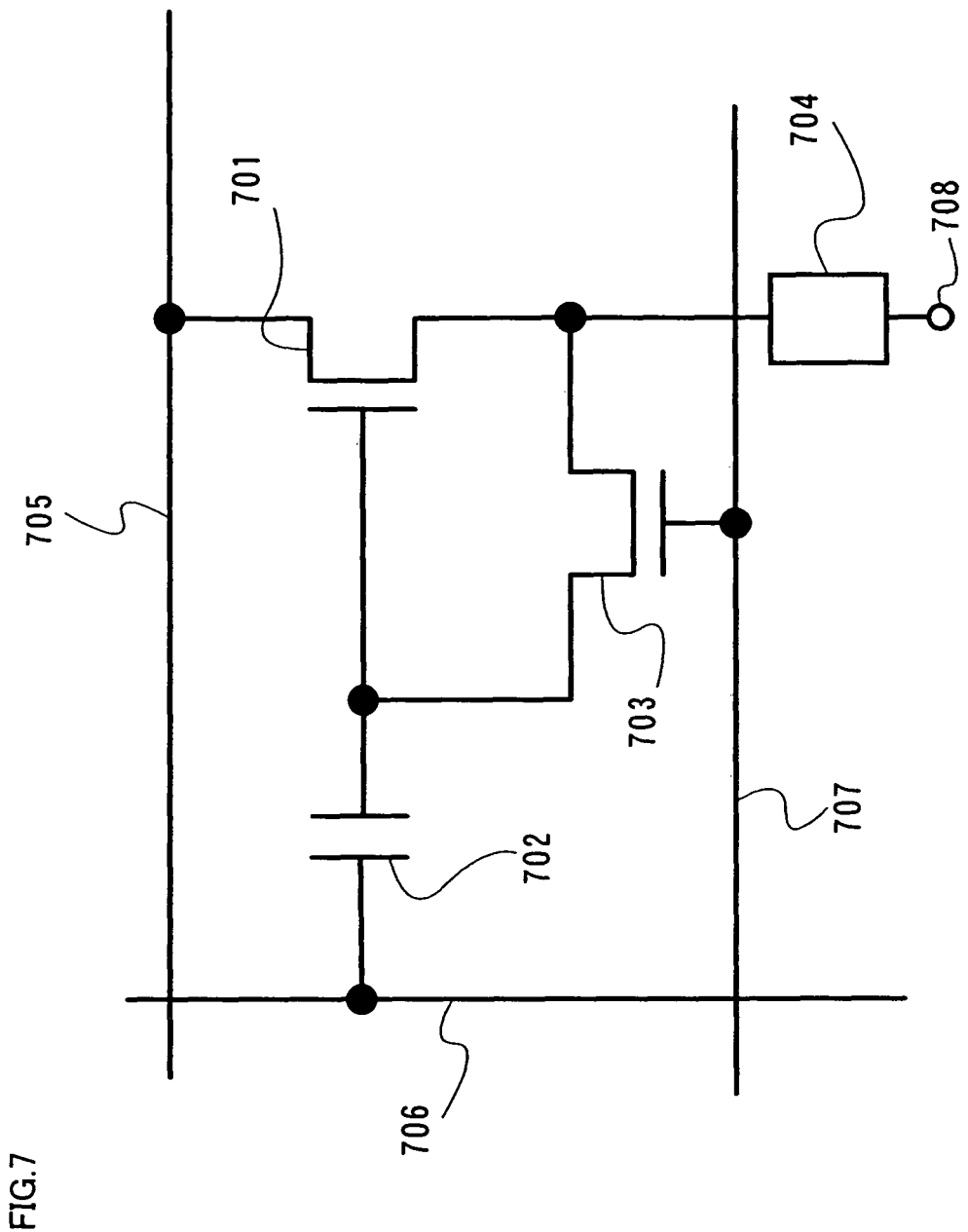
FIG. 7 is a diagram showing a pixel configuration of the invention.

Next, shown in FIG. 7 is a configuration in which an n-type transistor is used as the switch 403 in the pixel configuration shown in FIG. 4.

The pixel shown in FIG. 7 includes a driving transistor 701, a capacitor 702, a switching transistor 703, a light emitting element 704, a potential supply line (Illumination line) 705, a signal line (Data line) 706, and a scan line (Reset line) 707. It is to be noted that n-type transistors are used as the driving transistor 701 and the switching transistor 703.

A first terminal (a source terminal or a drain terminal) of the driving transistor 701 is connected to the potential supply line 705, a gate terminal thereof is connected to the signal line 706 through the capacitor 702, and a second terminal (the source terminal or the drain terminal) thereof is connected to a cathode of the light emitting element 704. In addition, the gate terminal of the driving transistor 701 is connected to a first terminal (a source terminal or a drain terminal) of the switching transistor 703 while the second terminal (the source terminal or the drain terminal) of the driving transistor 701 is connected to a second terminal (the source terminal or the drain terminal) of the switching transistor 703. Therefore, when a signal of H level is input to the scan line 707 and the switching transistor 703 is on, a portion between the gate terminal and the second terminal (the source terminal or the drain terminal) of the driving transistor 701 becomes conductive. Then, when a signal of L level is input to the scan line 707 and the switching transistor 703 is turned off, the portion between the gate terminal and the second terminal (the source terminal or the drain terminal) of the driving transistor 701 becomes non-conductive, and a potential difference (a voltage) between a potential of the gate terminal (or the second terminal) of the driving transistor 701 at this moment and a potential of the signal line 706 can be held in the capacitor 702. Furthermore, to an anode (Anode) 708 of the light emitting element 704, a potential Vdd is set. It is to be noted that Vdd is, taking as a criterion a low power supply potential Vss which is set to the potential supply line 705 in a light emitting period of the pixel, a potential satisfying Vdd>Vss.

Therefore, the switching transistor 703 functions similarly to the switch 403 in the pixel shown in FIG. 4. In addition, the driving transistor 701, the capacitor 702, the switching transistor 703, the light emitting element 704, the potential supply line (Illumination line) 705, the signal line (Data line) 706, and the scan line (Reset line) 707 correspond to the driving transistor 401, the capacitor 402, the switch 403, the light emitting element 404, the potential supply line (Illumination line) 405, the signal line (Data line) 406, and the scan line (Reset line) 407 in the pixel shown in FIG. 4 respectively. Thus, since operation of the pixel shown in FIG. 7 is the same as that of the pixel shown in FIG. 4, description thereof is omitted here.

It is noted that the capacitor 702 is required to keep holding the potential difference which has been held in the writing period during the light emitting period. Therefore, leakage current (which means off current which flows between a source and a drain and gate leakage current which flows between a gate and the source or drain when the transistor is off) of the switching transistor 703 and gate leakage current of the driving transistor 701 are required to be reduced.

Therefore, an n-type transistor is preferably used as the switching transistor 703 as shown in FIG. 7. This is because a low-concentration impurity region (also called a "Lightly Doped Drains: LDD region") can be easily formed in the n-type transistor, which can reduce off current.

In addition, material and thickness of respective gate insulating films of the driving transistor 701 and the switching transistor 703 are preferably selected arbitrarily to reduce gate leakage current. In addition, by forming a gate electrode to have a multi-gate structure, the gate leakage current can be reduced as well.

Note that the mobility u of an n-type transistor is in general higher than that of a p-type transistor. Therefore, for flowing the same current, the transistor size can be reduced. Consequently, aperture ratio of a pixel can be increased according to the pixel configuration as show in FIG. 7.

In addition, according to the configuration shown in FIG. 7, a circuit constituted only by n-type transistors, including a whole pixel region and sometimes further including a peripheral driver circuit can be provided. Accordingly, a display panel having a single conductivity type can be provided at low cost by a reduced number of steps.

In addition, since thin film transistors used in a circuit included in the display panel can be formed only by n-type transistors, an amorphous semiconductor or a semi-amorphous semiconductor (also called a microcrystalline semiconductor) can be used in a semiconductor layer thereof. For example, amorphous silicon (a-Si:H) may be used as an amorphous semiconductor. Therefore, the number of steps can be further reduced.

In addition, by using an n-type transistor for the switching transistor as the switch 403 in the pixel shown in FIG. 4, a wire corresponding to the potential supply line 405 shown in FIG. 4 can be omitted. Such the configuration is described with reference to FIG. 10.

The pixel includes a driving transistor 1001, a capacitor 1002, a switching transistor 1003, a light emitting element 1004, a signal line (Data line) 1006, and a scan line (Reset line) 1007. It is to be noted that n-type transistors are used as the driving transistor 1001 and the switching transistor 1003.

A first terminal (a source terminal or a drain terminal) of the driving transistor 1001 in the pixel of the (i+1)-th row is connected to the scan line 1007 in the pixel of the i-th row, a gate terminal thereof is connected to the signal line 1006 through the capacitor 1002, and a second terminal (the source terminal or the drain terminal) thereof is connected to a cathode of the light emitting element 1004. In addition, the gate terminal of the driving transistor 1001 is connected to a first terminal (a source terminal or a drain terminal) of the switching transistor 1003 while the second terminal (the source terminal or the drain terminal) of the driving transistor 1001 is connected to a second terminal (the source terminal or the drain terminal) of the switching transistor 1003. Therefore, when a signal of H level is input to the scan line 1007 and the switching transistor 1003 is on, a portion between the gate terminal and the second terminal (the source terminal or the drain terminal) of the driving transistor 1001 becomes conductive. Then, when a signal of L level is input to the scan line 1007 and the switching transistor 1003 is turned off, the portion between the gate terminal and the second terminal (the source terminal or the drain terminal) of the driving transistor 1001 becomes non-conductive, and a potential difference (a voltage) between a potential of the gate terminal (or the second terminal) of the driving transistor 1001 at this moment and a potential of the signal line 1006 can be held in the capacitor 1002. Furthermore, to an anode (Anode) 1005 of the light emitting element 1004, a potential Vdd is set. It is to be noted that Vdd is, taking as a criterion a low power supply potential Vss which is set to the first terminal (the source terminal or the drain terminal) of the driving transistor 1001 in a light emitting period of the pixel, a potential satisfying Vdd>Vss.

Figure 10:
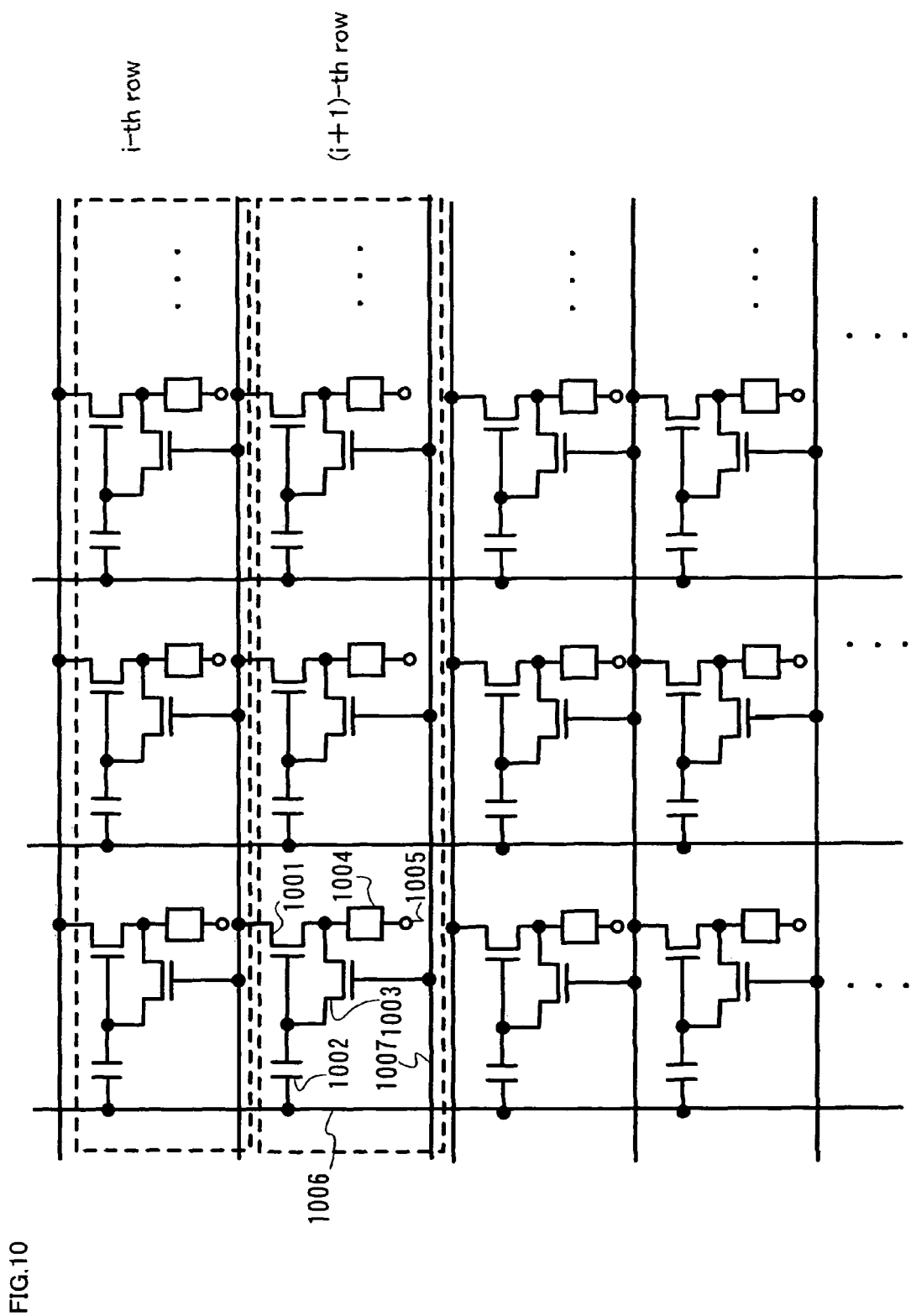
FIG. 10 is a diagram showing a pixel configuration of the invention.
Figure 11:
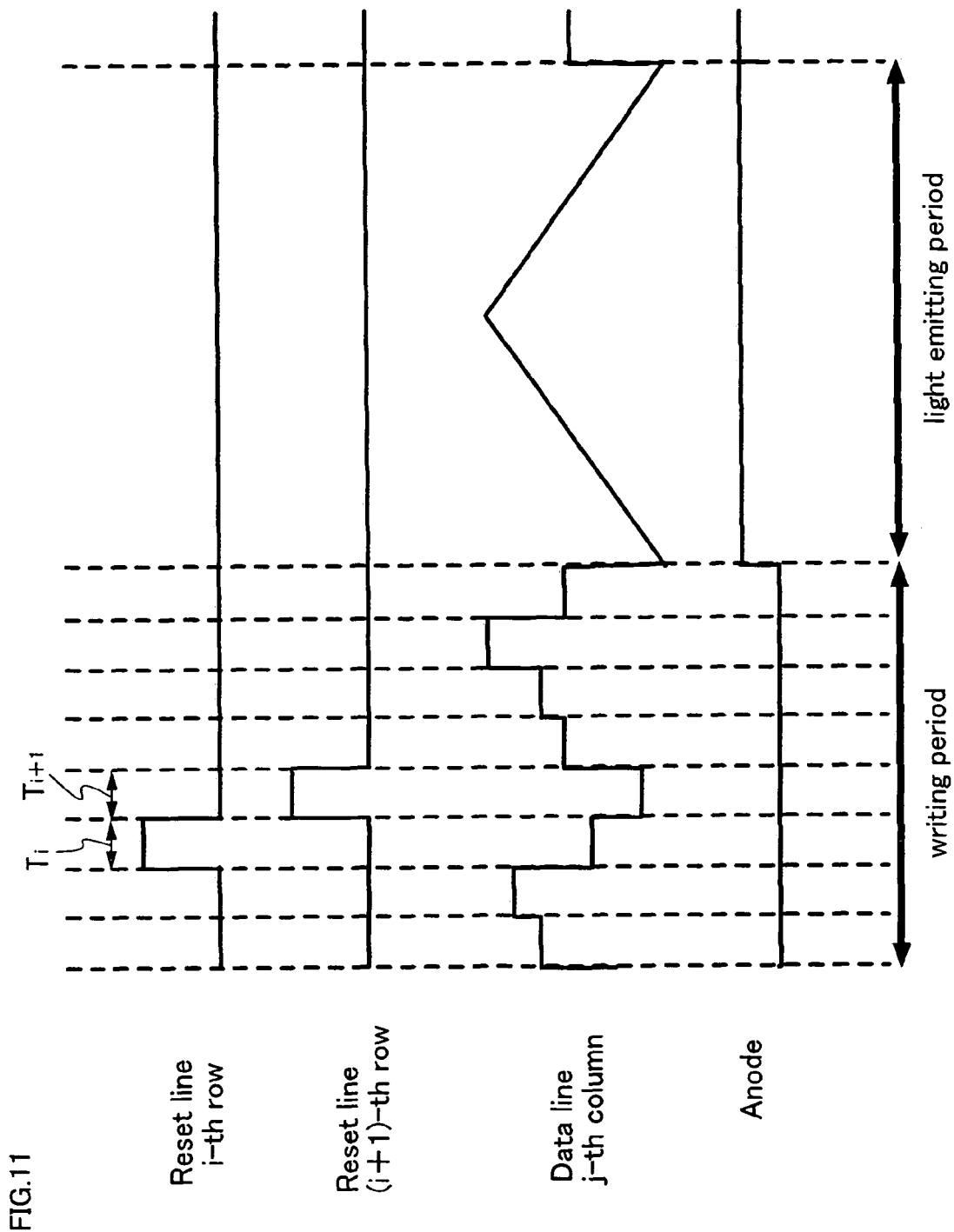
FIG. 11 is a diagram showing a timing chart of a display device having a pixel configuration of the invention.

A timing chart of a display device having the pixel configuration shown in FIG. 10 is shown in FIG. 11. A signal of the scan line 1007 of each pixel row is risen from L level to H level when a writing time starts and the signal is fallen from the H level to the L level when the writing time is completed. A period Ti and a period Ti+1 are respective writing times of pixels of the i-th row and the (i+1)-th row, during which a signal of the scan line 1007 is H level.

Therefore, since the signal of the scan line 1007 is L level in the light emitting period, by increasing the current supply capability of a circuit for outputting a signal to the scan line 1007, the scan line 1007 can be used as a potential supply line for setting a voltage to be applied to the light emitting element 1004. Note that the scan line 1007 of the next row is used as the potential supply line in the configuration shown in FIG. 10, however, the invention is not limited thereto as long as the scan line 1007 is that of another row.

It is to be noted that in the configuration shown in FIG. 10, in the writing period, the light emitting element 1004 may emit light also in a writing time of pixels of another row, therefore, a potential of the anode 1005 (Anode) is preferably set to be low as compared to that in the light emitting period. More preferably, as described in Embodiment Mode 1, it is set such that a gate-source voltage Vgs of the driving transistor 1001 is equal to a threshold voltage when writing a signal to the pixel. That is, such that a voltage applied to the light emitting element 1004 at this time is equal to or lower than a forward threshold voltage $V_{EL}$ of the light emitting element 1004, the potential of the anode 1005 (Anode) may be set.

According to the configuration as shown in FIG. 10, the number of wires can be reduced so that the aperture ratio can be further improved.

Note that to be sure a p-type transistor may be used for the switch 403 in FIG. 4 as well.

Embodiment Mode 4

In this embodiment mode, described are a driving method which further improves reliability of the light emitting element of the pixel configuration described in Embodiment Mode 1, and a pixel configuration which further improves the reliability of the light emitting element than the pixel configuration described in Embodiment Mode 1 and a driving method thereof.

First, using the pixel configuration shown in FIG. 1 described in Embodiment Mode 1, a driving method of this embodiment mode is described.

In this embodiment mode, one frame period includes a forward bias period (a writing period and a light emitting period) and a reverse bias period. Operation in the writing period and the light emitting period in the forward bias period is the same as that described in Embodiment Mode 1, and thus description thereof is omitted here.

Figure 51:
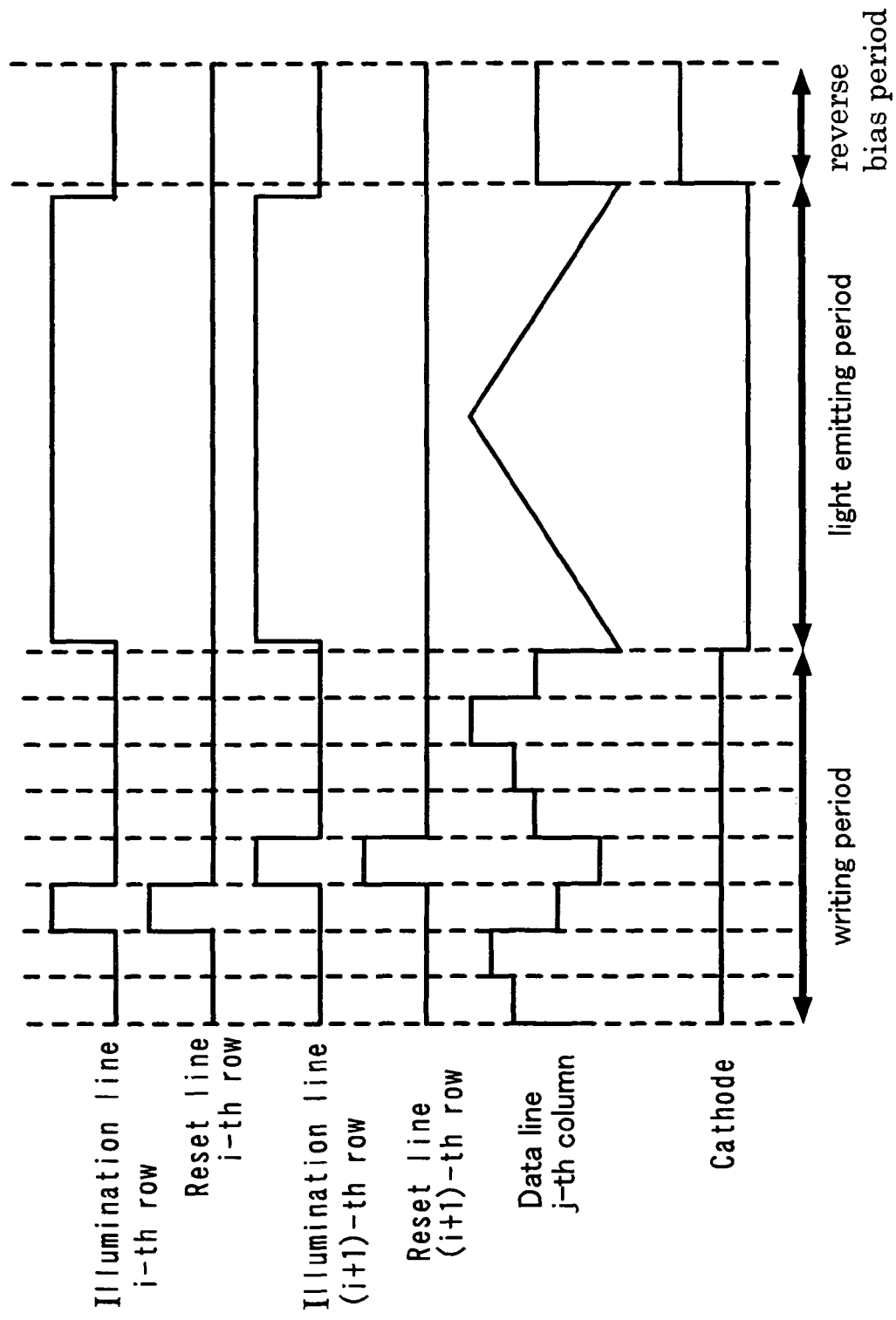
FIG. 51 is a diagram showing a timing chart of a display device having a pixel configuration of the invention.

In the reverse bias period, the potential Vdd set to the potential supply line (Illumination line) 105 and the potential Vss set to the cathode (Cathode) 108 in the light emitting period are reversed to each other as shown in FIG. 51; that is, the low power supply potential Vss is set to the potential supply line (Illumination line) 105 and the power supply potential Vdd is set to the cathode (Cathode) 108 in the reverse bias period. In addition, the switch 103 is turned off. As a result of this, the source terminal and the drain terminal of the driving transistor 101 become opposite to those in the forward bias period respectively; that is, the first terminal of the driving transistor 101 functions as a source terminal while the second terminal thereof functions as a drain terminal in the forward bias period whereas in the reverse bias period, the first terminal of the driving transistor 101 functions as a drain terminal while the second terminal thereof functions as a source terminal. In addition, the anode and the cathode of the light emitting element 105 become opposite as well. At this time, a potential is set to the signal line 106 such that the driving transistor 101 is sufficiently turned on.

Figure 52:
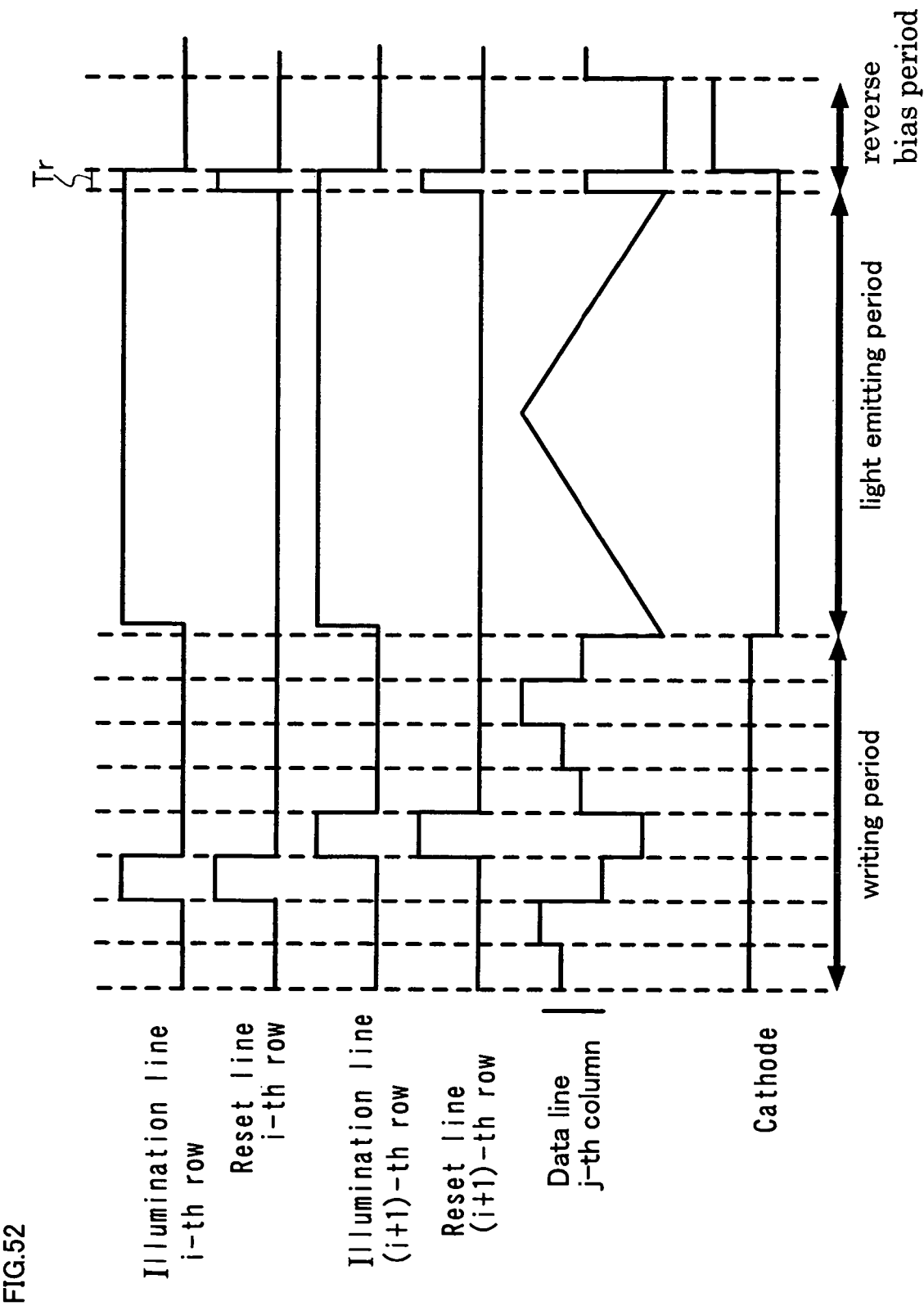
FIG. 52 is a diagram showing a timing chart of a display device having a pixel configuration of the invention.

It is to be noted that the potential of the gate terminal of the driving transistor 101 may be set in the beginning of the reverse bias period. That is, as shown in FIG. 52, a gate potential setting period Tr may be provided in the beginning of the reverse bias period. At this time, a signal of H level is set to the scan line 107 (Reset line) to turn on the switch 103. Then, the potential of the potential supply line 105 (Illumination line) is set to be H level (Vdd) and a potential of H level (the H level here means a potential higher than the lowest potential of a triangular wave potential and is preferably a potential higher than the middle potential of the triangular wave potential) is set to the signal line 106. Consequently, a potential difference between the potential of the gate terminal necessary to control on/off of the driving transistor 101 and the potential of H level of the signal line 106 is held in the capacitor 102.

In the reverse bias period, when the gate potential setting period Tr is completed, the potential of the scan line 107 is changed to L level, thereby the switch 103 is turned off. Then, the potential of the signal line 106 is changed from the H level to L level (the L level here means a potential lower than the potential of the H level set to the signal line 106 and is preferably a potential lower than the middle potential of the triangular wave potential). As a result of this, the potential of the signal line 106 is decreased while the capacitor 102 keeps holding the potential difference. Therefore, by arbitrarily setting respective potentials of H level and L level which are set to the signal line 106 in the reverse bias period, the driving transistor 101 can be sufficiently turned on.

Accordingly, the driving transistor 101 is turned on and a voltage reverse to that in the forward bias period can be applied to the light emitting element 104.

Even when the voltage reverse to that in the forward bias period is applied to the light emitting element 105 in the reverse bias period as described above, current does not flow to the normal light emitting element 104 (or may be flow very little). On the other hand, if there is a short-circuit portion in the light emitting element 104, current flows to the short-circuit portion and then the short-circuit portion is isolated. Therefore, in the reverse bias period, the reverse voltage is applied to the light emitting element 104 such that current flows enough to isolate the short-circuit portion.

Therefore, as described above, the potential set to the potential supply line 105 in the reverse bias period is not limited to Vss. Similarly, the potential set to the cathode 108 is not limited to Vdd. That is, it is necessary that current enough to isolate a short-circuit portion of the light emitting element 104 can flow in the reverse bias period.

By isolating the short-circuit portion of the light emitting element 104 as described above, a display defect of the pixel can be improved. Furthermore, lifetime of the light emitting element 104 can be lengthened.

Next, a pixel which improves the reliability of the light emitting element using a pixel configuration different from FIG. 1 described in Embodiment Mode 1 is described with reference to FIG. 53. Note that according to this configuration also, a forward bias period (a writing period and a light emitting period) and a reverse bias period are included.

The pixel includes a driving transistor 5301, a capacitor 5302, a switch 5303, a light emitting element 5304, a potential supply line (Illumination line) 5305, a signal line (Data line) 5306, a scan line (Reset line) 5307, a reverse bias switch 5309, and a wire 5310. It is to be noted that the driving transistor 5301 is a p-type transistor.

A first terminal (a source terminal or a drain terminal) of the driving transistor 5301 is connected to the potential supply line 5305, a gate terminal thereof is connected to the signal line 5306 through the capacitor 5302, and a second terminal (the source terminal or the drain terminal) thereof is connected to an anode (pixel electrode) of the light emitting element 5304. In addition, the gate terminal and the second terminal (the source terminal or the drain terminal) of the driving transistor 5301 are connected to each other through the switch 5303. Therefore, when the switch 5303 is on, a portion between the gate terminal and the second terminal (the source terminal or the drain terminal) of the driving transistor 5301 becomes conductive. Then, when the switch 5303 is turned off, the portion between the gate terminal and the second terminal (the source terminal or the drain terminal) of the driving transistor 5301 becomes non-conductive, and a potential difference (a voltage) between a potential of the gate terminal (or the second terminal) of the driving transistor 5301 at this moment and a potential of the signal line 5306 can be held in the capacitor 5302. Furthermore, to a cathode (Cathode) 5308 of the light emitting element 5304, a potential Vss is set. It is to be noted that Vss is, taking as a criterion a power supply potential Vdd which is set to the potential supply line 5305 in a light emitting period of the pixel, a potential satisfying Vss<Vdd; for example, there may be Vss=GND (a ground potential). In addition, the anode of the light emitting element 5304 is connected to the wire 5310 to which a potential Vss3 has been set, through the reverse bias switch 5309. It is to be noted that Vss3 is a potential satisfying Vss3<Vss, and when the reverse bias switch 5309 is turned on in the reverse bias period, voltage reverse to that in the forward bias period is applied to the light emitting element 5304. Therefore, the height of the respective potentials of the anode and the cathode of the light emitting element 5304 are reversed at that time.

Figure 53:
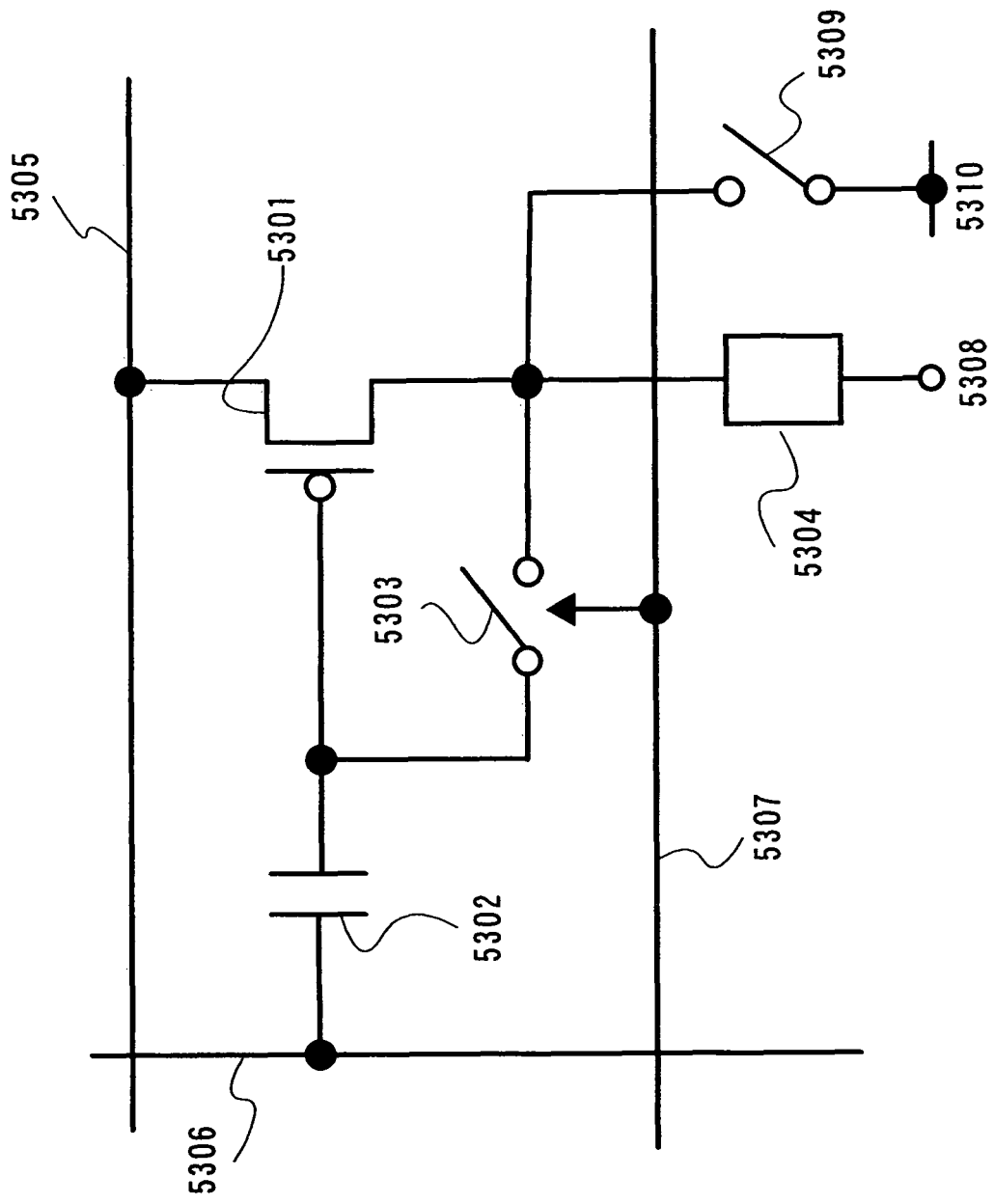
FIG. 53 is a diagram showing a pixel configuration of the invention.

Next, a principle of operation of the pixel configuration shown in FIG. 53 is described in detail.

In a signal writing period of the pixel, the reverse bias switch 5309 is turned off and an analog signal potential is set to the signal line 5306. This analog signal potential corresponds to a video signal. Then, when writing the video signal to the pixel, a signal is input to the scan line 5307 to turn on the switch 5303, and besides, the power supply potential Vdd is set to the potential supply line 5305 so that power supply potential Vdd is set to the first terminal of the driving transistor 5301. As a result of this, current flows to the driving transistor 5301 and the light emitting element 5304, and the capacitor 5302 stores or discharges charge.

It is to be noted that the reverse bias switch 5309 may be on at this time; thereby the current can be prevented from flowing to the light emitting element 5304 when writing.

At this time, the first terminal of the driving transistor 5301 is a source terminal while the second terminal thereof is a drain terminal. As current flowing to the driving transistor 5301 is increased while the switch 5303 is on, current flowing to the light emitting element 5304 is also increased, so that voltage drop in the light emitting element 5304 is increased and a potential difference between the electrodes of the light emitting element 5304 is increased. That is, the potential of the anode of the light emitting element 5304 becomes close to the potential of the potential supply line 5305. As a result of this, a potential of the gate terminal of the driving transistor 5301 also becomes close to the potential of the potential supply line 5305 so that a potential difference between the gate terminal and the source terminal of the driving transistor 5301 is decreased and current flowing to the driving transistor 5301 is decreased. Meanwhile, the current flowing to the light emitting element 5304 is decreased, so that the voltage drop in the light emitting element 5304 is decreased and the potential difference between the electrodes of the light emitting element 5304 is decreased. That is, the potential of the anode of the light emitting element 5304 becomes close to the potential of the cathode 5308. Then, the potential of the gate terminal of the driving transistor 5301 also becomes close to the potential of the cathode 5308, so that the potential difference between the gate terminal and the source terminal of the driving transistor 5301 is increased and the current flowing to the driving transistor 5301 is increased. In this manner, the potential of the gate terminal of the driving transistor 5301 is stabilized at a potential to flow a constant current to the driving transistor 5301. The capacitor 5302 then holds charge corresponding to a potential difference between the potential of the gate terminal of the driving transistor 5301 and the potential of the signal line 5306 at that time.

In this manner, video signal writing to this pixel is completed.

Reaching a steady state in which current flowing to the driving transistor 5301 and the light emitting element 5304 is constant as described above, the switch 5303 is turned off. Consequently, the capacitor 5302 holds a potential difference Vp (voltage) between the potential of the signal line 5306 and the potential of the gate terminal (or the drain terminal) of the driving transistor 5301 at the moment when the switch 5303 is turned off.

After writing the video signal to the pixel, the potential of the potential supply line 5305 is set such that a voltage applied to the light emitting element 5304 is equal to or lower than a threshold voltage $V_{EL}$ of the light emitting element 5304 even if the driving transistor 5301 is turned on. For example, the potential of the potential supply line 5305 may be equal to or lower than the potential Vss of the cathode 5308 of the light emitting element 5304. It is to be note that setting this potential to the potential supply line 5305 is performed at the simultaneous timing of turning the switch 5303 off or after the timing.

It is to be noted that in the case where a video signal has been written to the pixel and the power supply potential Vdd has been set to the potential supply line 5305 connected to the first terminal of the driving transistor 5301, on/off of the driving transistor 5301 is controlled in accordance with change of the potential of the signal line 5306, based on the analog signal potential which has been set to the signal line 5306 when the video signal has been written to the pixel. That is, in the case where the potential of the signal line 5306 is equal to or higher than the analog signal potential when the video signal has been written to the pixel in the signal writing period, the driving transistor 5301 is turned off while in the case where the potential of the signal line 5306 is lower than the analog signal potential when the analog signal has been written to the pixel, the driving transistor 5301 is turned on.

This is because since the potential difference (Vp) has been held by the capacitor 5302 when a video signal has been written to the pixel, in the case where the potential of the signal line 5306 is equal to or higher than the analog signal potential when the video signal has been written to the pixel, the potential of the gate terminal of the driving transistor 5301 also becomes equal to or higher than the potential of the gate terminal when the video signal has been written to the pixel, thereby the driving transistor 5301 is turned off. On the other hand, in the case where the potential of the signal line 5306 is lower than the analog signal potential when the video signal has been written to the pixel in the signal writing period to the pixel, the potential of the gate terminal of the driving transistor 5301 also becomes lower than the potential of the gate terminal when the video signal has been written to the pixel, thereby the driving transistor 5301 is turned on.

Accordingly, in a light emitting period of the pixel, by setting Vdd to the potential supply line 5305 connected to the first terminal of the driving transistor 5301 while the reverse bias switch 5309 is on, and by changing the potential set to the signal line 5306 in an analog manner in a state where the switch 5303 is off, on/off of the driving transistor 5301 is controlled. That is, time for flowing current to the light emitting element 5304 is controlled in an analog manner to express gradation.

Description is made on the potential which is set to the signal line 5306 in the light emitting period of the pixel. As the potential set to the signal line 5306, an analog potential which has a waveform varying periodically can be used.

It is to be noted that as the potential set to the signal line 5306 in the light emitting period, as described in Embodiment Mode 1, the waveform 4301, the waveform 4302, the waveform 4303, the waveform 4304, the waveform 4305, the waveform 4306, or the waveform 4307 may be set or a plurality of them may be set in succession.

By setting the waveform in succession, light emitting time can be dispersed within one frame. Consequently, the frame frequency appears to be improved and screen flicker can be prevented.

In the reverse bias period, the switch 5303 is turned off and the potential of the potential supply line 5305 is made to be L level to turn off the driving transistor 5301. Then, the reverse bias switch 5309 is turned on.

In addition, the electrode functioning as the anode of the light emitting element 5304 in the forward bias period (means a writing period and a light emitting period) is connected to the wire 5310. Therefore, the height of the respective potentials set to the electrodes of the anode and the cathode of the light emitting element 5304 in the forward bias period become reverse in the reverse bias period; that is, in the reverse bias period, a voltage reverse to that in the forward bias period is applied to the light emitting element 5304.

Even when the voltage reverse to that in the forward bias period is applied to the light emitting element 5304 in the reverse bias period as described above, current does not flow to the normal light emitting element 5304. On the other hand, if there is a short-circuit portion in the light emitting element 5304, current flows to the short-circuit portion and then the short-circuit portion is isolated. Therefore, in the reverse bias period, the reverse voltage is applied to the light emitting element 5304 such that current flows enough to isolate the short-circuit portion.

By isolating the short-circuit portion of the light emitting element 5304 as described above, a display defect of the pixel can be improved. Furthermore, lifetime of the light emitting element 5304 can be lengthened.

It is to be noted that the potential set to the cathode (Cathode) 5308 in the reverse bias period may be preferably set higher than that in the forward bias period. In this manner, a voltage for obtaining an enough current to isolate the short-circuit portion of the light emitting element 5304.

Embodiment Mode 5

Described in this embodiment mode is a display device having a pixel configuration which lengthens a writing time for each pixel.

Figure 12:
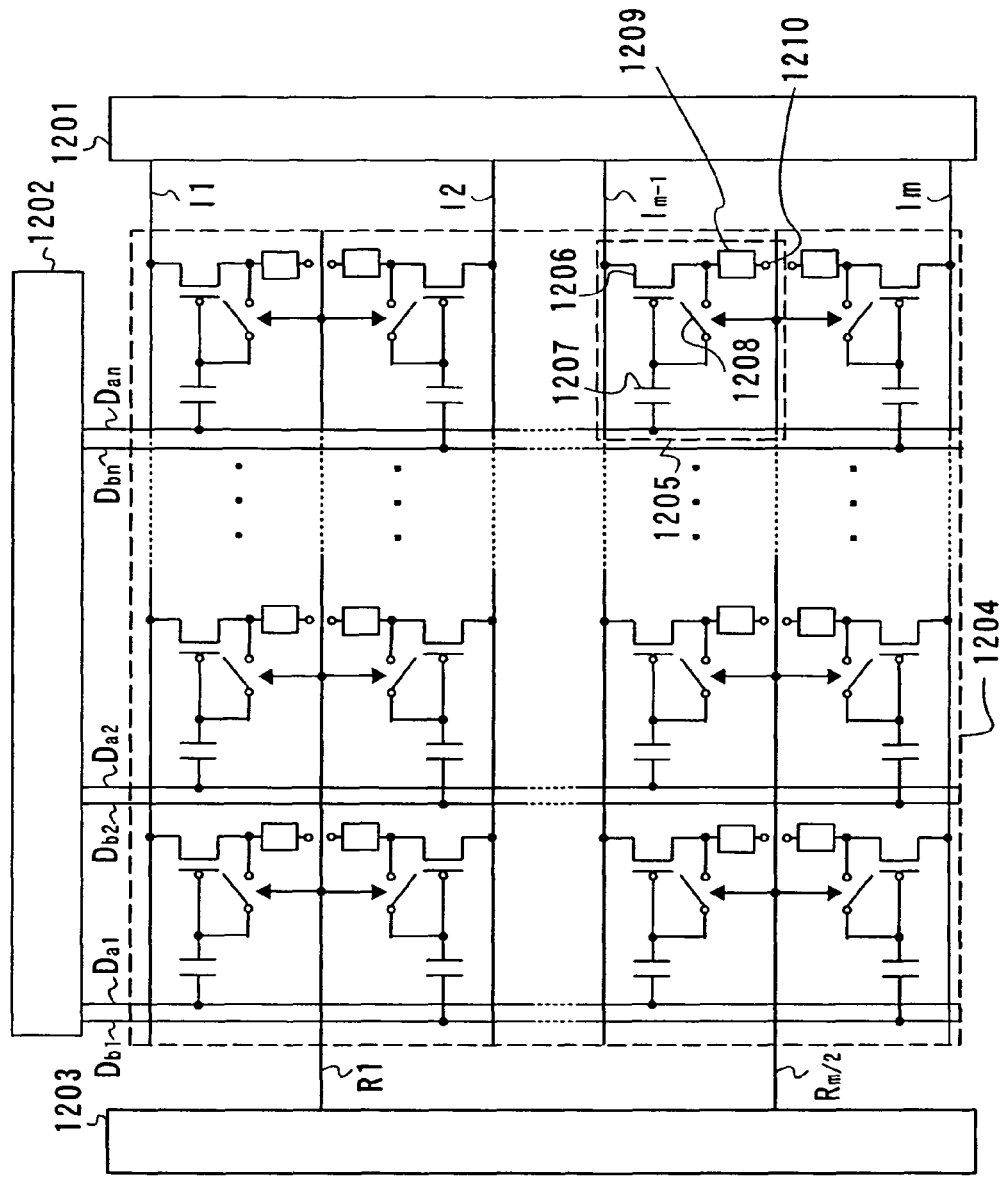
FIG. 12 is a diagram illustrating a display device having a pixel configuration of the invention.

The display device shown in FIG. 12 includes a potential supply line driver circuit 1201, a signal line driver circuit 1202, a scan line driver circuit 1203, and a pixel region 1204 in which a plurality of pixels 1205 is provided. The pixels 1205 are arranged in matrix corresponding to potential supply lines (Illumination lines) I1 to Im arranged in row and signal lines (Data lines) Da1 to Dan and Db1 to Dbn arranged in column respectively. Scan lines (Reset lines) R1 to $R_{m/2}$ arranged in row each shares as a wire for controlling on/off of switches of pixels of two rows.

For example, each of the pixels 1205 of the (m−1)-th row includes a driving transistor 1206, a capacitor 1207, a switch 1208, a light emitting element 1209, a potential supply line $I_{m-1}$, a signal line (one of Da1 to Dan), and a scan line $R_{m/2}$. It is to be noted that a p-type transistor is used as the driving transistor 1206. The pixel 1205 shows one pixel of the plurality of pixels arranged in the pixel region 1204.

A first terminal (a source terminal or a drain terminal) of the driving transistor 1206 is connected to the potential supply line Im−1, a gate terminal thereof is connected to each of the signal lines (Da1 to Dan) through the capacitor 1207, and a second terminal (the source terminal or the drain terminal) thereof is connected to an anode (pixel electrode) of the light emitting element 1209. In addition, the gate terminal and the second terminal (the source terminal or the drain terminal) of the driving transistor 1206 are connected to each other through the switch 1208. Therefore, when a signal is input to the scan line $R_{m/2}$ and the switch 1208 is on, a portion between the gate terminal and the second terminal (the source terminal or the drain terminal) of the driving transistor 1206 becomes conductive. Then, when the switch 1208 is turned off, the portion between the gate terminal and the second terminal (the source terminal or the drain terminal) of the driving transistor 1206 becomes non-conductive, and a potential difference (a voltage) between a potential of the gate terminal (or the drain terminal) of the driving transistor 1206 and a potential of the signal line (one of Da1 to Dan) at this moment can be held in the capacitor 1207. Furthermore, to a cathode (Cathode) 1210 of the light emitting element 1209, a potential Vss is set. It is to be noted that Vss is, taking as a criterion a power supply potential Vdd which is set to the potential supply lines I1 to Im 5305 in a light emitting period of the pixel, a potential satisfying Vss<Vdd; for example, there may be Vss=GND (a ground potential).

That is, the switch 1208 in each pixel 1205 of the (m−1)-th row is controlled to be on/off by a signal set to the scan line $R_{m/2}$. Furthermore, the switch 1208 in each pixel 1205 of the m-th row is also controlled to be on/off by the signal set to the scan line $R_{m/2}$. In addition, the gate terminal of the driving transistor 1206 in each pixel 1205 of the m-th row is connected to each of the signal lines (Db1 to Dbn) through the capacitor 1207.

Accordingly, by the signal set to the scan line $R_{m/2}$, a writing time starts at the same time in pixels of the (m−1)-th row and pixels in the m-th row. Then, respective analog signal potentials are set to the pixels of the (m−1)-th row from the signal lines (Da1 to Dan) so that a video signal writing is performed. In addition, respective analog signal potentials are set to the pixels of the m-th row from the signal lines (Db1 to Dbn) so that a video signal writing is performed.

Although the description is made on the case of pixels of the $(m^{-1})$-th row and pixels of the m-th row, in the other rows similarly, pixels of two rows are selected by one scan line Ri (one of R1 to $R_{m/2}$) to start a writing time at the same time. Thus, if a display device has the same resolution as the display device shown in FIG. 2, a writing time of pixels can be twice faster than that in FIG. 2.

It is to be noted that FIG. 12 shows a configuration in which pixels of two rows can be written at the same time, however, the invention is not limited to two rows and a writing time can be arbitrarily lengthened as well by sharing a scan line with pixels of a plurality of rows and providing scan lines of the number of rows to be shared.

Therefore, the writing time is decreased as the resolution is increased in the conventional configuration, meanwhile sufficient writing time can be obtained according to the display device of this embodiment mode.

In addition, since the writing time can be lengthened according to the display device described in this embodiment mode, operating frequency can be reduced and low power consumption can be achieved.

It is to be noted that the constitution of the display device shown in FIG. 12 is not limited to this. For example, the pixel of FIG. 4, FIG. 6, FIG. 7, or the like may be employed for the pixel 1205 of the display device of this constitution as well.

Embodiment Mode 6

In this embodiment mode, described is constitution of a preferable display device for full color display having the pixel configuration of the invention.

In the case of full dolor display, as described in Embodiment Mode 1, a potential supply line (Illumination line) is provided per pixel for each color, and a potential of a signal level of the potential supply line is set for each color, so that luminance of the light emitting element can be adjusted for each color. Accordingly, even if the light emitting element for each color has a different luminance characteristic, color tone can be adjusted. For example, in the case of having the pixel shown in FIG. 48, respective potentials of H level can be determined to be input to Iri for setting a potential to the anodes of the light emitting elements of pixels of R, Igi for setting a potential to the anodes of the light emitting elements of pixels of G, and Ibi for setting a potential to the anodes of the light emitting elements of pixels of B, in accordance with the respective luminous characteristics for colors.

However, three wires are required for each pixel row in the case of full color display using color elements of RGB and four wires are required for each pixel row in the case of full color display using color elements of RGBW.

Described in this embodiment mode below is a display device which further improves the aperture ratio of the pixel, employs color elements of two or more, and can perform high-definition full color display.

As the first constitution, a light emitting element for white (W) is employed for a light emitting element of a pixel for example, and a color filter is used to perform full color display, thereby luminance obtained from a pixel for each color can be approximately equivalent.

Figure 58:
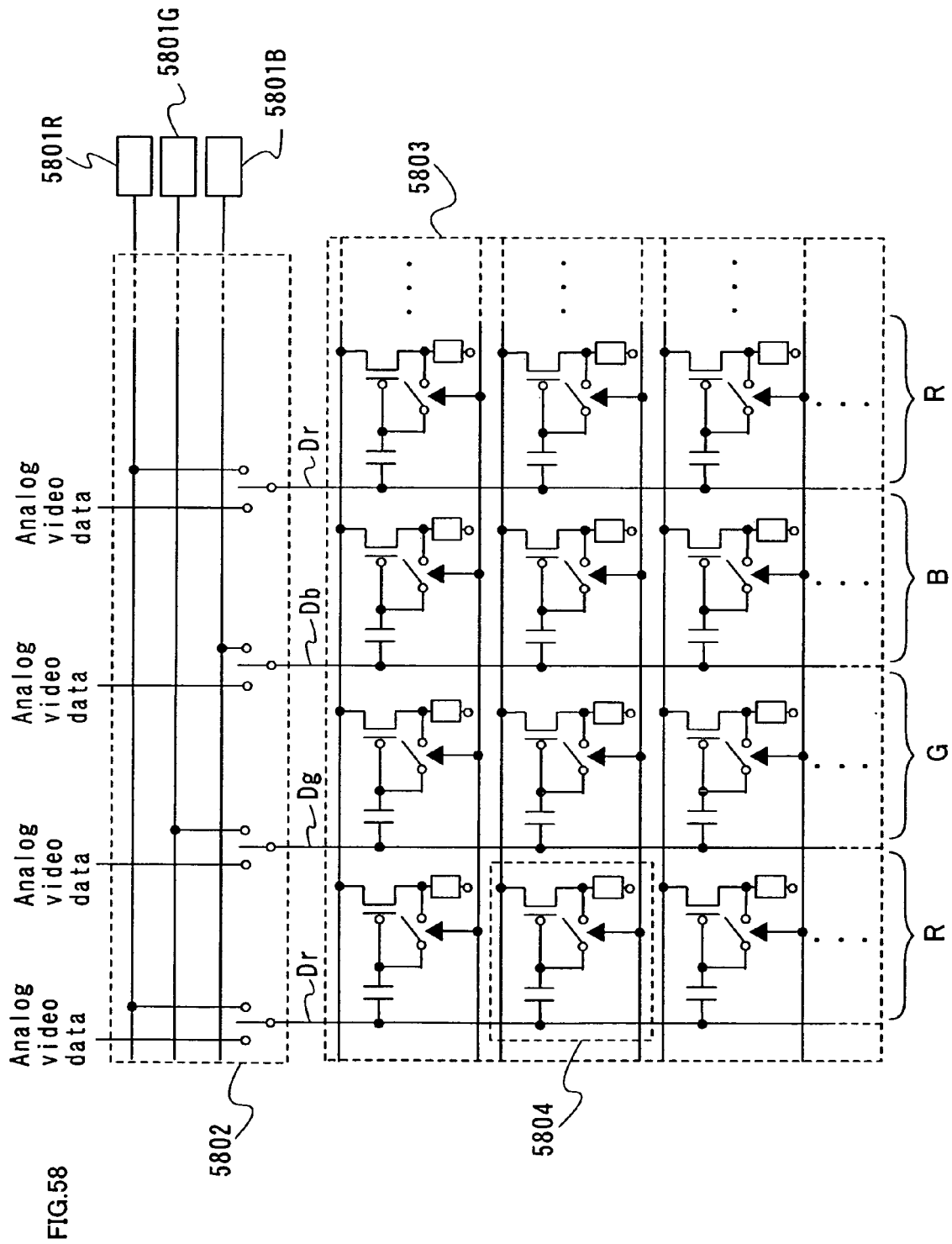
FIG. 58 is a pattern diagram of a display device of the invention.
Figure 59:
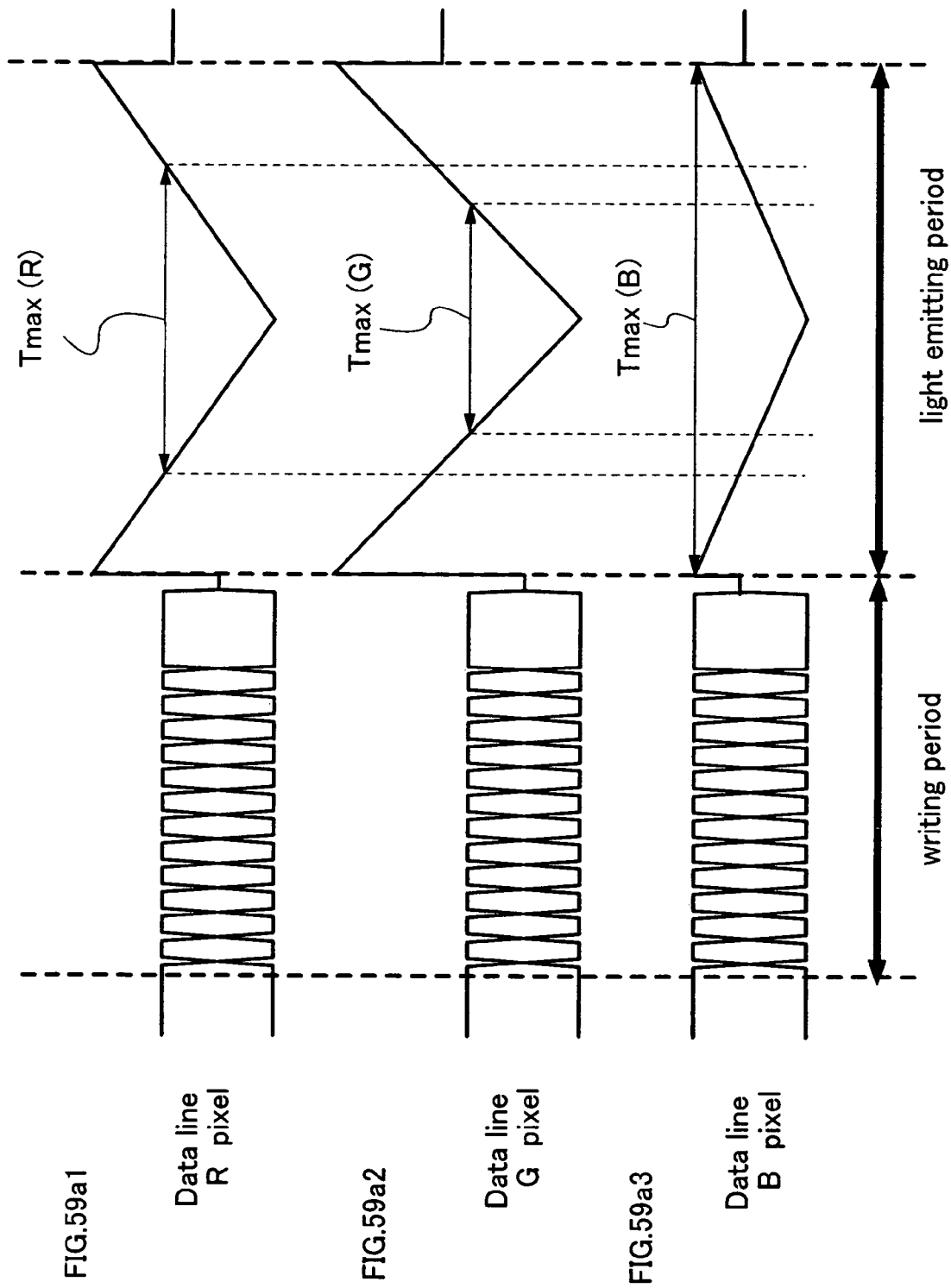
Figure 60:
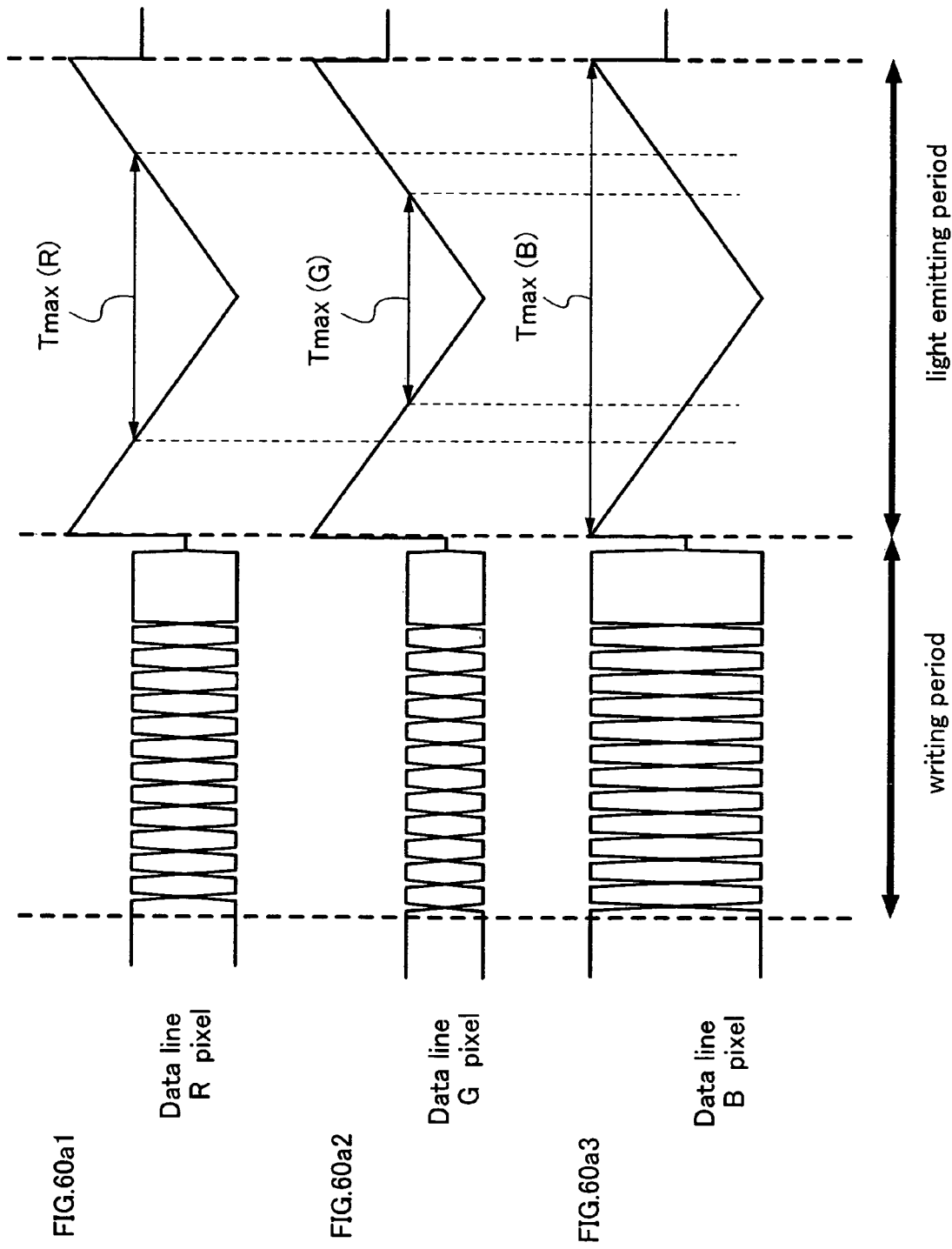

In addition, as the second constitution, a pattern diagram of a display device of this embodiment mode is shown in FIG. 58. It is to be noted that FIG. 58 is a pattern diagram of a full-color display device which includes pixels for each color using each light emitting element of RGB as an example. The display device includes a triangular wave potential generating circuits 5801R, 5801G, and 5801B, a switching circuit 5802, and a pixel region 5803. A plurality of pixels 5804 is arranged in matrix in the pixel region 5803. A signal is input from a signal line Dr to a pixel column of R, from a signal line Dg to a pixel column of G, and from a signal line Db to a pixel column of B.

In addition, the triangular wave potential generating circuit 5801R generates a triangular wave potential for the pixel column of R. The triangular wave potential generating circuit 5801G generates a triangular wave potential for the pixel column of G, and the triangular wave potential generating circuit 5801B generates a triangular wave potential for the pixel column of B.

In a signal writing period of the pixel, terminals to which a video signal (Analog video data) is input and the signal lines Dr, Dg, and Db are connected respectively by the switching circuit 5802. Then, in a light emitting period, a terminal to which a triangular wave is input from the triangular wave potential generating circuit 5801R is connected to the signal line Dr, a terminal to which a triangular wave is input from the triangular wave potential generating circuit 5801G is connected to the signal line Dg, and a terminal to which a triangular wave is input from the triangular wave potential generating circuit 5801B is connected to the signal line Db by the switching circuit 5802.

In this manner, a different triangular wave can be set for pixels of each color. Accordingly, a light emitting time can be controlled in accordance with the luminance characteristic of a light emitting element for each color, thereby high-definition full color display can be performed. Furthermore, there is no need to provide a wire for pixels of each color in the pixel 5804, thereby the aperture ratio can be increased.

It is to be noted that the pixel configuration shown in FIG. 1 is employed for the pixel 5804, however, the invention is not limited to this as long as a pixel configuration can control a light emitting time of a pixel by whether a triangular wave potential input in a light emitting period is higher or lower than a potential of a video signal input in a signal writing period to the pixel. Therefore, the pixels described in Embodiment Modes 1 to 5 can be arbitrarily employed as well, and for example, pixel configurations shown in FIGS. 66 to 78 described below may also be employed.

Figure 66:
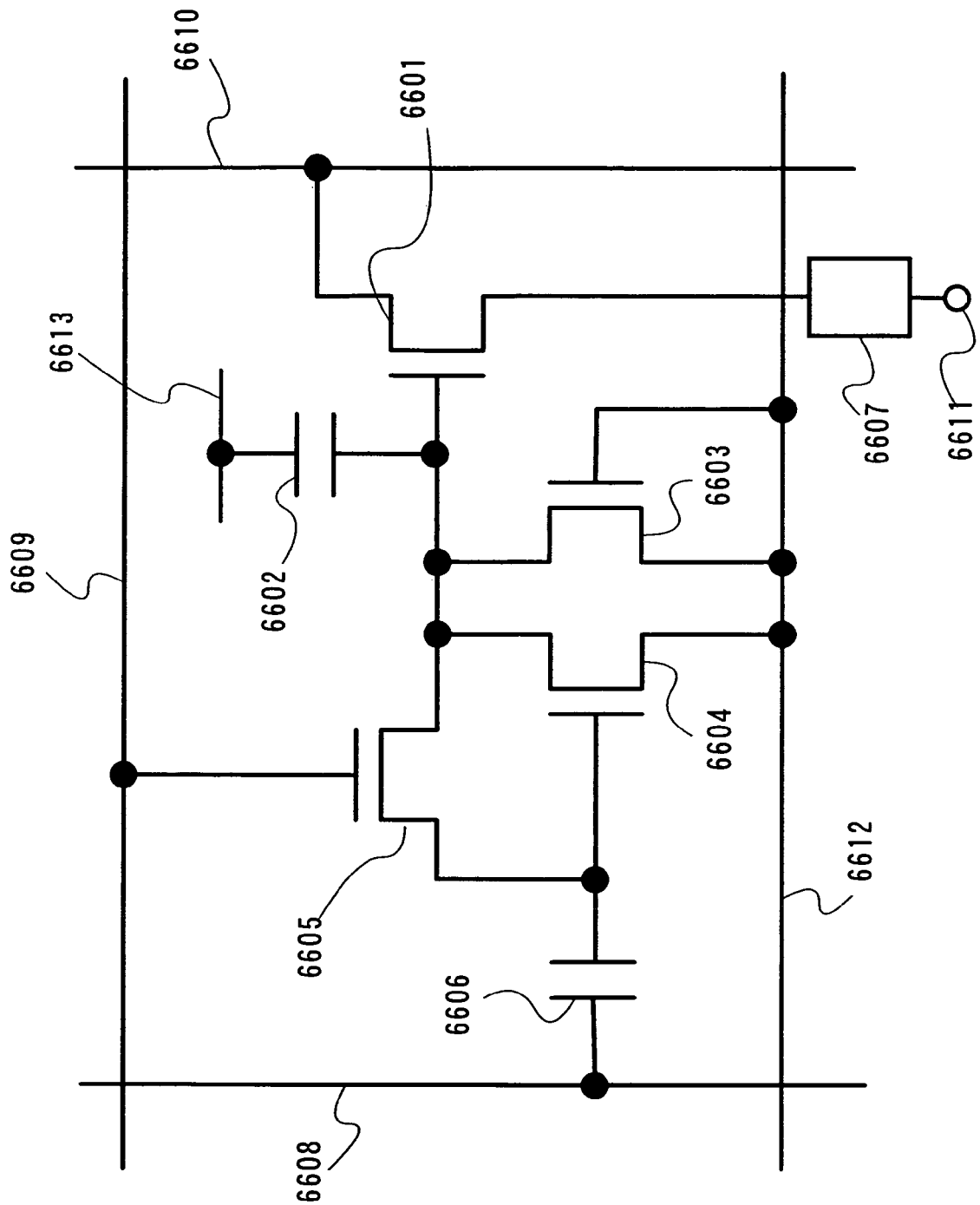
FIG. 66 is a diagram showing a pixel configuration of the invention.

A pixel shown in FIG. 66 includes a transistor 6601, a capacitor 6602, a transistor 6603, a transistor 6604, a transistor 6605, a capacitor 6606, a light emitting element 6607, a signal line 6608, a scan line 6609, and a power supply line 6610.

A first terminal (a source terminal or a drain terminal) of the transistor 6601 is connected to a pixel electrode of the light emitting element 6607 and a second terminal (the source terminal or the drain terminal) thereof is connected to the power supply line 6610. In addition, a gate terminal thereof is connected to a wire 6613 through the capacitor 6602. A first terminal (a source terminal or a drain terminal) of the transistor 6603 is connected to the gate terminal of the transistor 6601 and a second terminal (the source terminal or the drain terminal) and a gate thereof are connected to a wire 6612. A first terminal (a source terminal or a drain terminal) of the transistor 6604 is connected to the gate electrode of the transistor 6601, a second terminal (the source terminal or the drain terminal) thereof is connected to the wire 6612, and a gate terminal thereof is connected to the signal line 6608 through the capacitor 6606. A gate terminal of the transistor 6605 is connected to the scan line 6609, a first terminal (a source terminal or a drain terminal) thereof is connected to the gate electrode of the transistor 6601, and a second terminal (the source terminal or the drain terminal) thereof is connected to the gate terminal of the transistor 6604. It is to be noted that respective predetermined potentials have been supplied to the wire 6613 and an opposing electrode 6611.

Operation of the pixel is briefly described. First, a potential of the signal line 6612 is changed from L level to H level. Then, current flows to the transistor 6603 from the signal line 6612. In addition, a potential of the scan line 6609 is changed from L level to H level to turn on the transistor 6605. In this manner, the gate terminal of the transistor 6604 has a potential to turn on sufficiently, which is applied also to one electrode of the capacitor 6606. After that, the potential of the signal line 6612 is changed from the H level to the L level so that charge stored in the capacitor 6606 flows to the wire 6612 through the transistor 6604 and a voltage of the transistor 6604 reaches a threshold voltage. The potential of the electrode of the capacitor 6606 reaches a gate potential of the transistor 6604 at that time. At that time, an analog potential corresponding to a video signal is supplied to the signal line 6608. Consequently, the capacitor 6606 holds charge corresponding to a potential difference between the gate potential when the transistor 6604 has the threshold voltage and the analog signal potential corresponding to the video signal. Then, by changing the potential of the scan line 6609 from the H level to L level, the potential difference is held in the capacitor 6606.

After that, the potential of the wire 6612 is changed from the L level to the H level. Then, current flows to the transistor 6603 and a potential to turn on the transistor 6601 sufficiently is input to the gate terminal of the transistor 6601. The potential is also applied to the electrode of the capacitor 6602. In thus manner, current flows to the transistor 6606 and the light emitting element 6607. Then, the potential of the wire 6612 is changed from the H level to the L level and to the signal line 6608, a potential varying in succession from the minimum potential to the maximum potential in a range of the analog signal potential corresponding to the video signal, a potential varying in succession from the maximum potential to the minimum potential, or a potential varying in succession from the minimum potential to the maximum potential and from the maximum potential to the minimum potential is input. As a result of this, in the case where the potential supplied to the signal line 6608 in succession in the light emitting period is higher than the analog signal potential corresponding to the video signal which has been written to the pixel in the writing period, the transistor 6604 is turned on. Therefore, the charge which has been stored in the capacitor 6602 is discharged to the wire 6612 through the transistor 6604. The transistor 6601 is turned off in this manner. Accordingly, the light emitting element 6607 can emit light during arbitrary time within the light emitting period, thereby gradation display can be performed.

Figure 67:
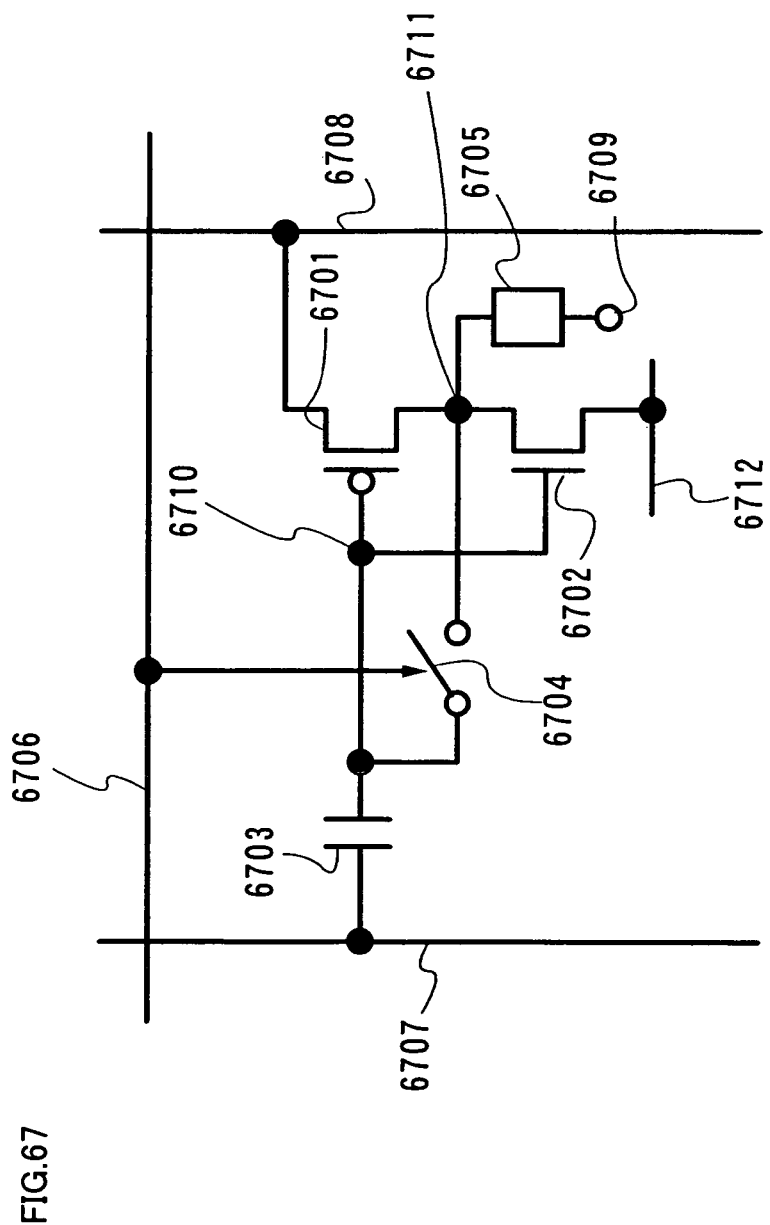
FIG. 67 is a diagram showing a pixel configuration of the invention.

A pixel shown in FIG. 67 includes a driving transistor (a first transistor) 6701, a complementary transistor (a second transistor) 6702, a capacitor 6703, a switch 6704, a light emitting element 6705, a scan line 6706, a signal line 6707, and a power supply line 6708. It is to be noted that a p-type transistor is used as the driving transistor 6701 and an n-type transistor is used as the complementary transistor 6702.

A first terminal (a source terminal or a drain terminal) of the driving transistor 6701 is connected to the power supply line 6708, a second terminal (the source terminal or the drain terminal) thereof is connected to a second terminal (a source terminal or a drain terminal) of the complementary transistor 6702, and a gate terminal thereof is connected to a gate terminal of the complementary transistor 6702. In addition, the gate terminals of the driving transistor 6701 and the complementary transistor 6702 are connected to the signal line 6707 through the capacitor 6703 and to the second terminals (each of those is the source terminal or the drain terminal) of the driving transistor 6701 and the complementary transistor 6702 through the switch 6704. That is, by turning on/off the switch 6704, respective portions between the gate terminal and the second terminal (the source terminal or the drain terminal) of the driving transistor 6701 and the complementary transistor 6702 can be made conductive or non-conductive. On/off of the switch 6704 is controlled by inputting a signal to the scan line 6706. In addition, the second terminals (each of those is the source terminal or the drain terminal) of the driving transistor 6701 and the complementary transistor 6702 are connected to a pixel electrode of the light emitting element 6705. To an opposing electrode 6709 of the light emitting element 6705, a low power supply potential Vss is supplied. It is to be noted that Vss is, taking as a criterion a power supply potential Vdd which is supplied to the power supply line 6708, a potential satisfying Vss<Vdd; for example, there may be Vss=GND (a ground potential). In addition, a first terminal of the complementary transistor 6702 is connected to a wire 6712. A potential supplied to the wire 6712 is applied to the pixel electrode of the light emitting element 6705 when the complementary transistor 6702 is turned on, which is not limited as long as the light emitting element 6705 does not emit light at that time. Thus, Vss may be supplied as well.

Next, a principle of operation of the pixel configuration shown in FIG. 67 is described in detail.

In a signal writing period to the pixel, an analog signal potential is supplied to the signal line 6707. This analog signal potential corresponds to a video signal. Then, when writing the video signal to the pixel, a signal of H level is input to the scan line 6706 to turn on the switch 6704. It is to be noted that the driving transistor 6701 and the complementary transistor 6702 function as an inverter. When operating as an inverter, a connection point between the gate terminals of the driving transistor 6701 and the complementary transistor 6702 is an input terminal 6710 of the inverter while a connection point between the second terminals of the driving transistor 6701 and the complementary transistor 6702 is an output terminal 6711 of the inverter. When operating as an inverter also, the first terminals of the driving transistor 6701 and the complementary transistor 6702 are source terminals while the second terminals thereof are drain terminals respectively.

When the switch 6704 is turned on in this manner, a portion between the input terminal 6710 of the inverter and the output terminal 6711 thereof is made conductive, current flows to the driving transistor 6701, the complementary transistor 6702, and the light emitting element 6705, and the capacitor 6703 stores or discharges charge.

In this manner, offset cancellation of the inverter is performed. It is to be noted that offset cancellation means that a portion between the input terminal 6710 and the output terminal 6711 is made conductive, an input potential and an output potential is made equivalent, and a potential of the input terminal 6710 is made to be a logic threshold potential Vinv of the inverter. Therefore, this logic threshold value Vinv is ideally a potential of the middle between L level and H level of an output of the inverter.

It is to be noted that a potential of H level of an output of the inverter is the power supply potential Vdd of the power supply line 6708 while a potential of L level of the inverter is the potential supplied to the wire 6712. The power supply potential Vdd which is the output of H level of the inverter and the potential supplied to the wire 6712 which is the output of L level of the inverter are set taking as a criterion the potential of the opposing electrode 6709. Then, it is set that the light emitting element 6705 emits light when an output of the inverter is H level while does not emit light when the output of the inverter is L level.

That is, where a voltage when the light emitting element 6705 starts emitting light is $V_{EL}$, the potential of L level of the inverter (the potential supplied to the wire 6712) is required to be lower than VSS+$V_{EL}$. Meanwhile, the potential of H level of the inverter is required to be higher than VSS+$V_{EL}$.

It is to be noted that in the case where the potential of L level of the inverter is lower than the potential supplied to the opposing electrode 6709, a reverse bias voltage is applied to the light emitting element 6705. Therefore, deterioration of the light emitting element 6705 can be suppressed, which is desirable.

It is to be noted that either discharge or accumulation of charge in the capacitor 6703 is determined depending on the correlation between the charge stored originally in the capacitor 6703 and a potential supplied to the signal line 6707. Then, when the discharge or accumulation of charge in the capacitor 6703 is completed, a charge for a potential difference between (a voltage Vp) between the potential of the signal line 6707 and the logic threshold value Vinv has been stored in the capacitor 6703. Then, by changing the signal of the scan line 6706 to be L level, the switch 6704 is turned off to hold this voltage Vp in the capacitor 6703.

It is to be noted that in the writing period, the potential of the opposing electrode (Cathode) 6709 may be set to be Vss2. This Vss2 is a potential satisfying Vss<Vss2 and is set such that a voltage applied to the light emitting element 6705 is lower than a forward threshold voltage $V_{EL}$ of the light emitting element 6705 in performing the offset cancellation of the inverter. That is, Vss2 is set to satisfy Vinv−Vss2<$V_{EL}$. According to this, it is possible to prevent display defect from occurring due to light emission of the light emitting element 6705 in the writing period. Furthermore, it is possible to flow less current to the light emitting element in the writing period, thereby power consumption can be reduced.

In addition, Vss2 may be increased such that a reverse bias voltage is applied to the light emitting element 6705. By applying the reverse bias voltage, reliability of the light emitting element 6705 can be improved, a defective portion of the light emitting element 6705 can be burned off, and the like.

Figure 68A:
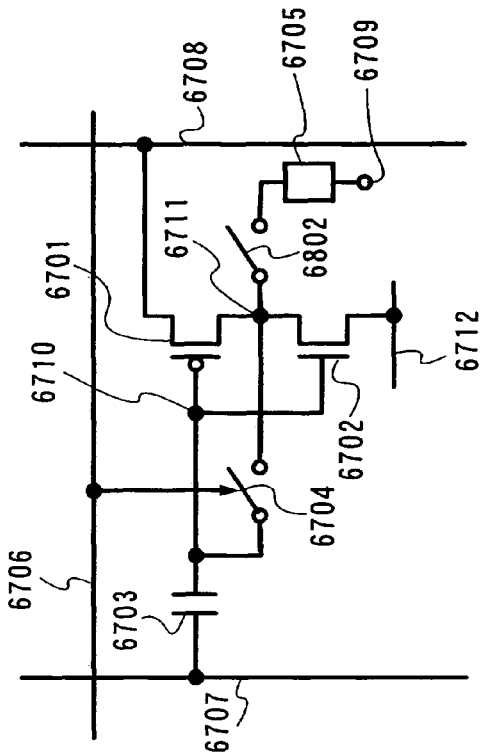
FIGS. 68a to 68c are diagrams each showing a pixel configuration of the invention.
Figure 68B:
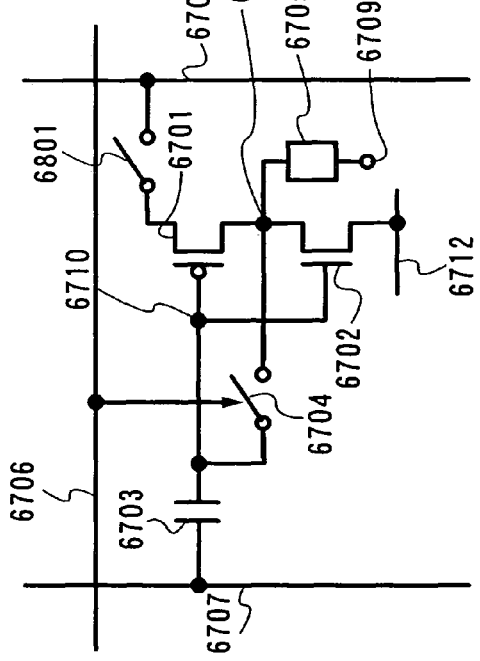
Figure 68C:
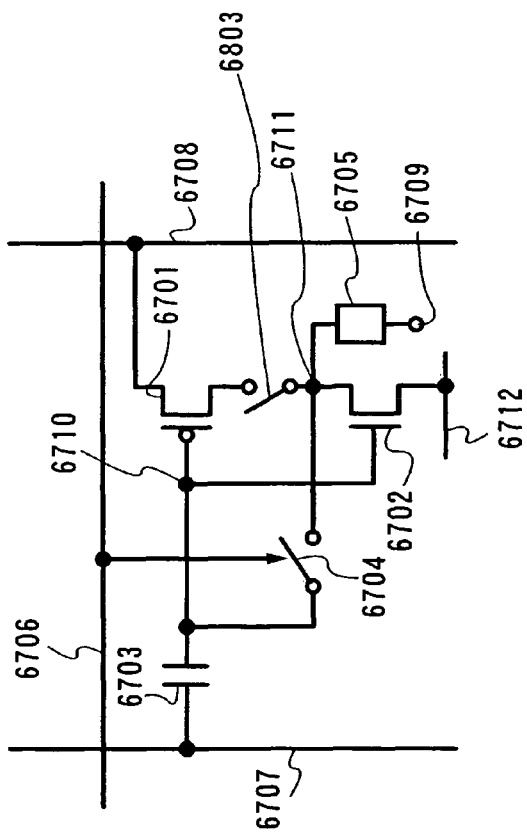

It is to be noted that another method may be employed as well, as long as current does not flow to the opposing electrode 6709. For example, the opposing electrode 6709 may be in a floating state; consequently, current does not flow to the light emitting element 6705. Alternatively, a switch may be provided between the power supply line 6708 and the pixel electrode of the light emitting element 6705 through the transistor 6701. By controlling this switch, current can be prevented from flowing to the light emitting element 6705. That is, as shown in FIG. 68a, a switch 6801 may be connected between the first terminal of the transistor 6701 and the power supply line 6708. Alternatively, as shown in FIG. 68b, a switch 6802 may be connected between the node 6711 and the pixel electrode of the light emitting element 6705. Further alternatively, a switch 6803 may be connected between the second terminal of the transistor 6701 and the node 6711. According to this, in the signal writing period of pixels, light emission of the light emitting element 6705 can be prevented in a signal writing period to pixels of another row after signal writing to the pixel is completed.

In this manner, video signal writing to this pixel is completed.

It is to be noted that after the video signal is written to the pixel, level of an output of the inverter is controlled in accordance with change of the potential of the signal line 6707, based on the analog signal potential which has been supplied to the signal line 6707 when the video signal has been written to the pixel. That is, in the case where the potential of the signal line 6707 is higher than the analog signal potential when the video signal has been written to the pixel in the signal writing period to the pixel, the output of the inverter becomes L level while in the case where the potential of the signal line 6707 is lower than the analog signal potential when the video signal has been written to the pixel, the output of the inverter becomes H level.

This is because since the potential difference (Vp) has been held by the capacitor 6703 when a video signal has been written to the pixel, in the case where the potential of the signal line 6707 is higher than the analog signal potential when the video signal has been written to the pixel, the potential of the input terminal 6710 of the inverter also becomes higher than the potential of the input terminal 6710 when the video signal has been written to the pixel, thereby the driving transistor 6701 is turned off, the complementary transistor 6702 is turned on, and the output of the inverter becomes L level. On the other hand, in the case where the potential of the signal line 6707 is lower than the analog signal potential when the video signal has been written to the pixel in the signal writing period to the pixel, the potential of the input terminal 6710 of the inverter also becomes lower than the potential of the input terminal 6710 when the analog signal has been written to the pixel, thereby the driving transistor 6701 is turned on, the complementary transistor 6702 is turned off, and the output of the inverter becomes H level.

Accordingly, in a light emitting period of the pixel, by changing the potential supplied to the signal line 6707 in an analog manner, the level of the output of the inverter in the pixel is controlled. Thus, time for flowing current to the light emitting element 6705 is controlled in an analog manner to express gradation.

Figure 69:
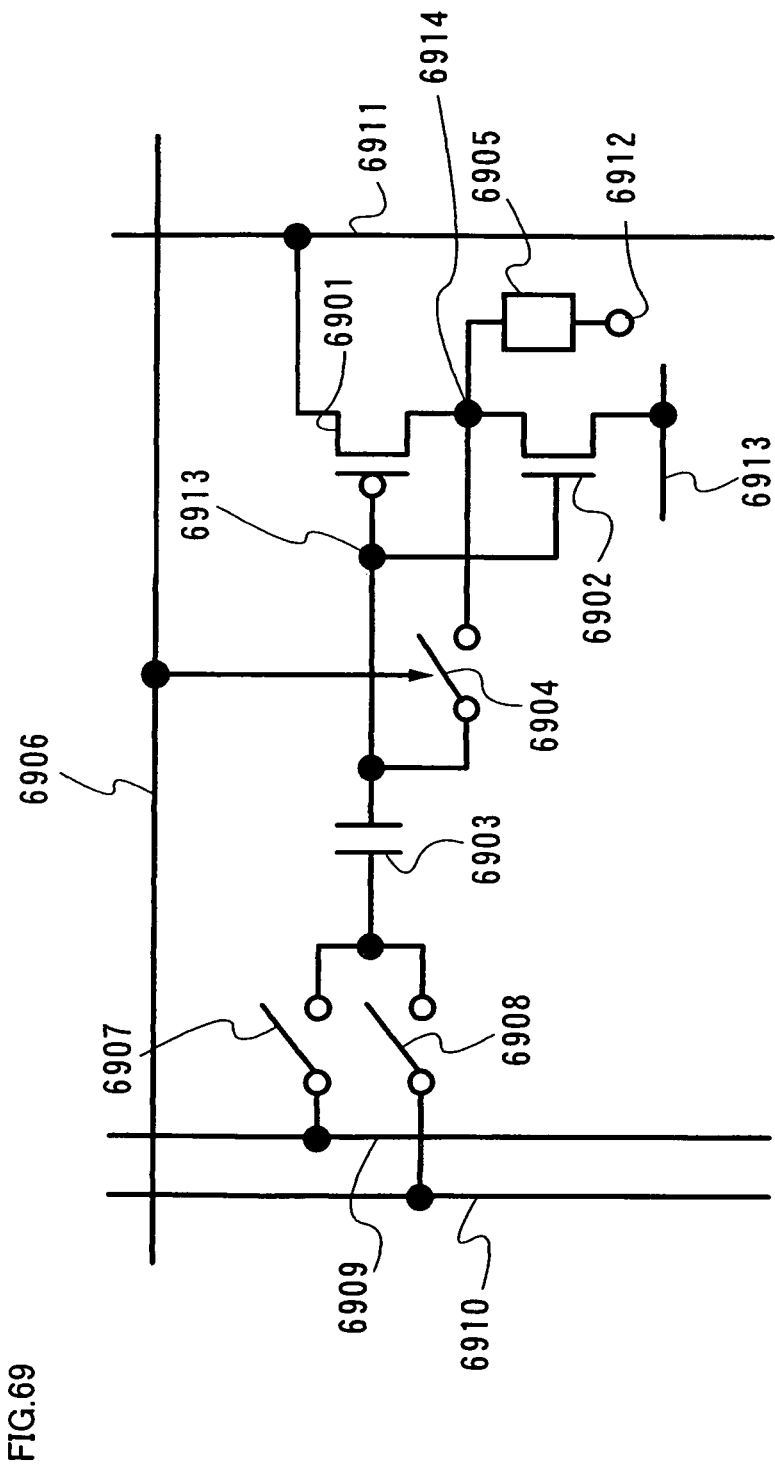
FIG. 69 is a diagram showing a pixel configuration of the invention.

A pixel shown in FIG. 69 includes a driving transistor (a first transistor) 6901, a complementary transistor (a second transistor) 6902, a capacitor 6903, a switch 6904, a light emitting element 6905, a scan line 6906, a first switch 6907, a second switch 2908, a first signal line 6909, a second signal line 6910, and a power supply line 6911. It is to be noted that a p-type transistor is used as the driving transistor 6901 and n-type transistors are used as the complementary transistor 6902 and the switch 6904.

A first terminal (a source terminal or a drain terminal) of the driving transistor 6901 is connected to the power supply line 6910, a second terminal (the source terminal or the drain terminal) thereof is connected to a second terminal (a source terminal or a drain terminal) of the complementary transistor 6902, and a gate terminal thereof is connected to a gate terminal of the complementary transistor 6902. In addition, the gate terminals of the driving transistor 6901 and the complementary transistor 6902 are connected to one electrode of the capacitor 6903 and to the second terminals (each of those is the source terminal or the drain terminal) of the driving transistor 6901 and the complementary transistor 6902 through the switch 6904. That is, by turning on/off the switch 6904, respective portions between the gate terminal and the second terminal (the source terminal or the drain terminal) of the driving transistor 6901 and the complementary transistor 6902 can be made conductive or non-conductive. On/off of the switch 6904 is controlled by inputting a signal to the scan line 6906. Note that the other electrode of the capacitor 6903 is connected to the first signal line 6909 through the first switch 6907 and to the second signal line 6910 through the second switch 6908. In addition, the second terminals (each of those is the source terminal or the drain terminal) of the driving transistor 6901 and the complementary transistor 6902 are connected to a pixel electrode of the light emitting element 6905. To an opposing electrode 6912 of the light emitting element 6905, a low power supply potential Vss is supplied. It is to be noted that Vss is, taking as a criterion a power supply potential Vdd which is supplied to the power supply line 6911, a potential satisfying Vss<Vdd; for example, there may be Vss=GND (a ground potential). It is to be noted that the potential of the power supply line 6911 is not limited to this. A value of the power supply potential may be changed for each color of a pixel; that is, a potential of the power supply line may be supplied for each pixel of RGB in the case of full-color display using pixels of color elements of RGB and for each pixel of RGBW in the case of full-color display using pixels of color elements of RGBW.

Next, a principle of operation of the pixel configuration shown in FIG. 69 is described in detail.

First, in a signal writing operation to the pixel, the first switch 6907 is turned on while the second switch 6908 is turned off. The driving transistor 6901 and the complementary transistor 6902 function as an inverter. Therefore, a connection point between the gate terminals of the driving transistor 6901 and the complementary transistor 6902 is an input terminal 6913 of the inverter while a connection point between the second terminals of the driving transistor 6901 and the complementary transistor 6902 is an output terminal 6914 of the inverter.

In addition, a signal of H level is input to the scan line 6906 to turn on the switch 6904. Thus, a portion between the input terminal 6913 and the output terminal 6914 of the inverter becomes conductive and offset cancellation is performed. That is, the input terminal 6913 of the inverter has a logic threshold potential Vinv of the inverter. Therefore, the potential of the input terminal 6913 of the inverter is at this time a potential required for controlling level of an output of the inverter.

Then, the capacitor 6903 stores a charge for a potential difference (a voltage Vp) between the logic threshold potential Vinv of the inverter and a potential Va supplied to the first signal line 6909 in the writing operation.

Subsequently, the first switch 6907 is turned off while the second switch 6908 is turned on. In addition, the level of the scan line 6906 is changed to be L level. As a result of this, the switch 6904 is turned off and the voltage Vp is held in the capacitor 6903. In this manner, an analog signal is written to the pixel from the first signal line 6909.

It is to be noted that a triangular wave potential has been supplied to the second signal line 6910. The pixel keeps the non-light emitting state of the light emitting element 6905 during a period in which the potential of the second signal line 6910 is higher than the analog signal potential supplied to the first signal line 6909 in the signal writing operation of the pixel, while the light emitting element 6905 emits light during a period in which the potential of the second signal line 6910 is lower than the analog signal potential supplied to the first signal line 6909 in the signal writing operation of the pixel. Accordingly, light emitting time of the light emitting element 6905 is controlled depending on an analog signal potential when an analog signal is written in a signal writing period to the pixel. Analog time gradation display can be performed in this manner.

Figure 70:
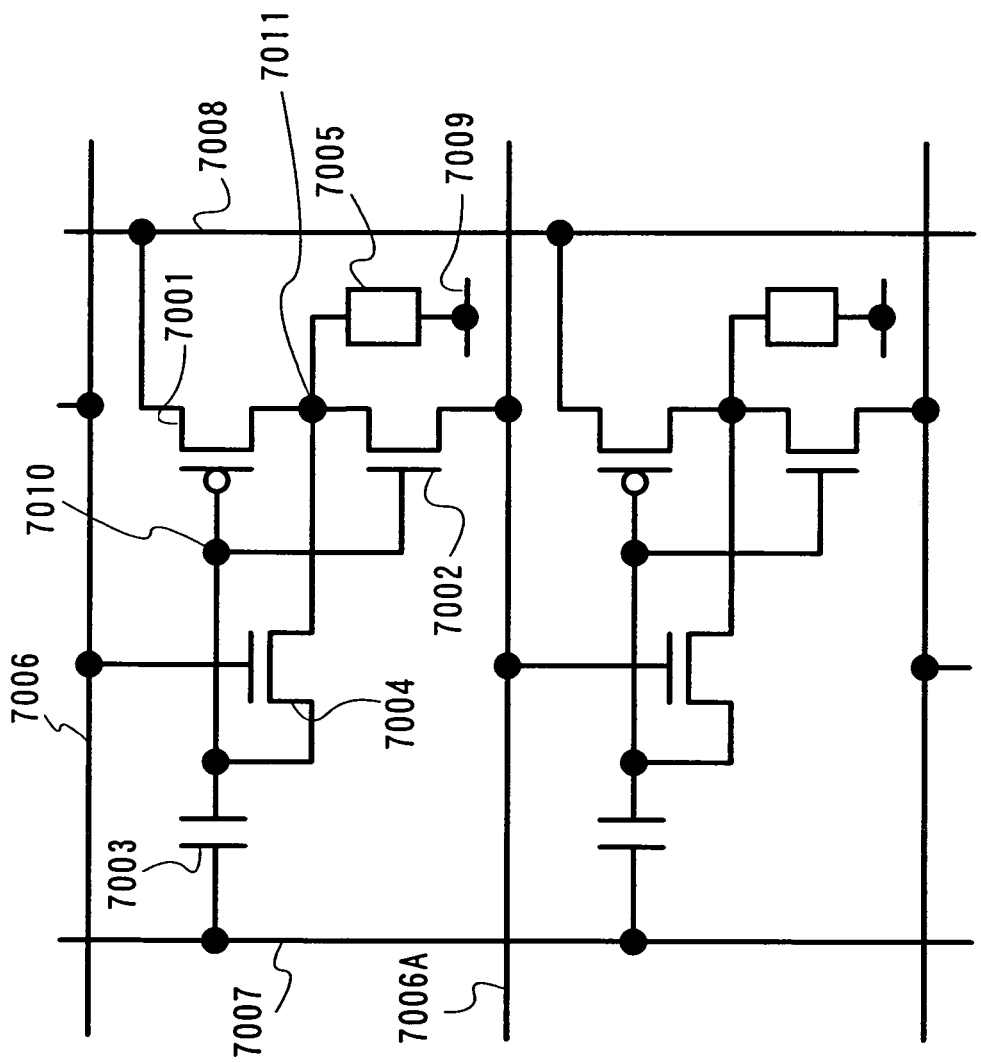
FIG. 70 is a diagram showing a pixel configuration of the invention.

A pixel shown in FIG. 70 includes a driving transistor (a second transistor) 7001, a complementary transistor (a third transistor) 7002, a capacitor 7003, a switching transistor (a first transistor) 7004, a light emitting element 7005, a scan line 7006, a signal line 7007, and a power supply line 7008. It is to be noted that a p-type transistor is used as the driving transistor 7001 and n-type transistors are used as the complementary transistor 7002 and the switching transistor 7004.

A first terminal (a source terminal or a drain terminal) of the driving transistor 7001 is connected to the power supply line 7008, a second terminal (the source terminal or the drain terminal) thereof is connected to a second terminal (a source terminal or a drain terminal) of the complementary transistor 7002, and a gate terminal thereof is connected to a gate terminal of the complementary transistor 7002. In addition, the gate terminals of the driving transistor 7001 and the complementary transistor 7002 are connected to the signal line 7007 through the capacitor 7003 and to the second terminals (each of those is the source terminal or the drain terminal) of the driving transistor 7001 and the complementary transistor 7002 through the switching transistor 7004. That is, since a first terminal (a source terminal or a drain terminal) of the switching transistor 7004 is connected to the second terminals (each of those is the source terminal or the drain terminal) of the driving transistor 7001 and the complementary transistor 7002 while a second terminal (the source terminal or the drain terminal) thereof is connected to the gate terminals of the driving transistor 7001 and the complementary transistor 7002, by turning on/off the switching transistor 7004, respective portions between the gate terminal and the second terminal (the source terminal or the drain terminal) of the driving transistor 7001 and the complementary transistor 7002 can be made conductive or non-conductive. On/off of the switching transistor 7004 is controlled by inputting a signal to the scan line 7006 which is connected to a gate terminal of the switching transistor 7004. In addition, the second terminals (each of those is the source terminal or the drain terminal) of the driving transistor 7001 and the complementary transistor 7002 are connected to a pixel electrode of the light emitting element 7005. To an opposing electrode 7009 of the light emitting element 7005, a low power supply potential Vss is supplied. It is to be noted that Vss is, taking as a criterion a power supply potential Vdd which is supplied to the power supply line 7008, a potential satisfying Vss<Vdd; for example, there may be Vss=GND (a ground potential).

Furthermore, a first terminal (a source terminal or a drain terminal) of the complementary transistor 7002 is connected to a scan line 7006A of pixels of another row. Here, the driving transistor 7001 is a transistor for driving the light emitting element 7005 and the complementary transistor 7002 is a transistor of which polarity is reverse to the driving transistor 7001. That is, when a signal of the scan line 7006A is L level, the driving transistor 7001 and the complementary transistor 7002 are turned on/off complementary in the inverter.

Next, a principle of operation of the pixel configuration shown in FIG. 70 is described in detail.

In a signal writing period to the pixel, an analog signal potential is supplied to the signal line 7007. This analog signal potential corresponds to a video signal. Then, when writing the video signal to the pixel, a signal of H level is input to the scan line 7006 to turn on the switching transistor 7004. At that time, a signal of L level is supplied to the scan line 7006A which selects another pixel row. Therefore, when writing a signal to the pixel, the driving transistor 7001 and the complementary transistor 7002 function as an inverter. When operating as an inverter, a connection point between the gate terminals of the driving transistor 7001 and the complementary transistor 7002 is an input terminal 7010 of the inverter while a connection point between the second terminals of the driving transistor 7001 and the complementary transistor 7002 is an output terminal 7011 of the inverter. When operating as an inverter also, the first terminals of the driving transistor 7001 and the complementary transistor 7002 are source terminals while the second terminals thereof are drain terminals respectively.

When the switching transistor 7004 is turned on in this manner, a portion between the input terminal 7010 and the output terminal 7011 of the inverter is made conductive, current flows to the driving transistor 7001, the complementary transistor 7002, and the light emitting element 7005, and the capacitor 7003 stores or discharges charge.

In this manner, offset cancellation of the inverter is performed. Note that offset cancellation means that a portion between the input terminal 7010 and the output terminal 7011 is made conductive, an input potential and an output potential is made equivalent, and a potential of the input terminal 7010 is made to be a logic threshold potential Vinv of the inverter. Therefore, this logic threshold value Vinv is ideally a potential of the middle between L level and H level of an output of the inverter.

It is to be noted that a potential of H level of an output of the inverter is the power supply potential Vdd of the power supply line 7008 while a potential of L level of the inverter is the potential of L level supplied to the scan line 7006A. The power supply potential Vdd which is the output of H level of the inverter and the potential of L level of a signal which is supplied to the scan line 7006A are set taking as a criterion the potential of the opposing electrode 7009. Then, it is set that the light emitting element 7005 emits light when an output of the inverter is H level while does not emit light when the output of the inverter is L level.

That is, where a voltage when the light emitting element 7005 starts emitting light is $V_{EL}$, the potential of L level of the inverter (the potential of L level of a signal supplied to the scan line 7006 or the scan line 7006A) is required to be lower than VSS+$V_{EL}$. Meanwhile, the potential of H level of the inverter is required to be higher than VSS+$V_{EL}$.

It is to be noted that in the case where the potential of L level of the inverter is lower than the potential of the opposing electrode 7009, a reverse bias voltage is applied to the light emitting element 7005. Therefore, deterioration of the light emitting element 7005 can be suppressed, which is desirable.

It is to be noted that either discharge or accumulation of charge in the capacitor 7003 is determined depending on the correlation between the charge stored originally in the capacitor 7003 and a potential supplied to the signal line 7007. Then, when the discharge or accumulation of charge in the capacitor 7003 is completed, a charge for a potential difference (a voltage Vp) between the potential of the signal line 7007 and the logic threshold value Vinv has been stored in the capacitor 7003. Then, by changing the signal of the scan line 7006 to be L level, the switching transistor 7004 is turned off to hold this voltage Vp in the capacitor 7003.

It is to be noted that in the writing period, the potential of the opposing electrode (Cathode) 7009 may be set to be Vss2. This Vss2 is a potential satisfying Vss<Vss2 and is set such that a voltage applied to the light emitting element 7005 is lower than a forward threshold voltage $V_{EL}$ of the light emitting element 7005 in performing the offset cancellation of the inverter. That is, Vss2 is set to satisfy Vinv−Vss2<$V_{EL}$. According to this, it is possible to prevent display defect from occurring due to light emission of the light emitting element 7005 in the writing period. Furthermore, it is possible to flow less current to the light emitting element in the writing period, thereby power consumption can be reduced.

In addition, Vss2 may be increased such that a reverse bias voltage is applied to the light emitting element 7005. By applying the reverse bias voltage, reliability of the light emitting element 7005 can be improved, a defective portion of the light emitting element 7005 can be burned off, and the like.

Figure 71:
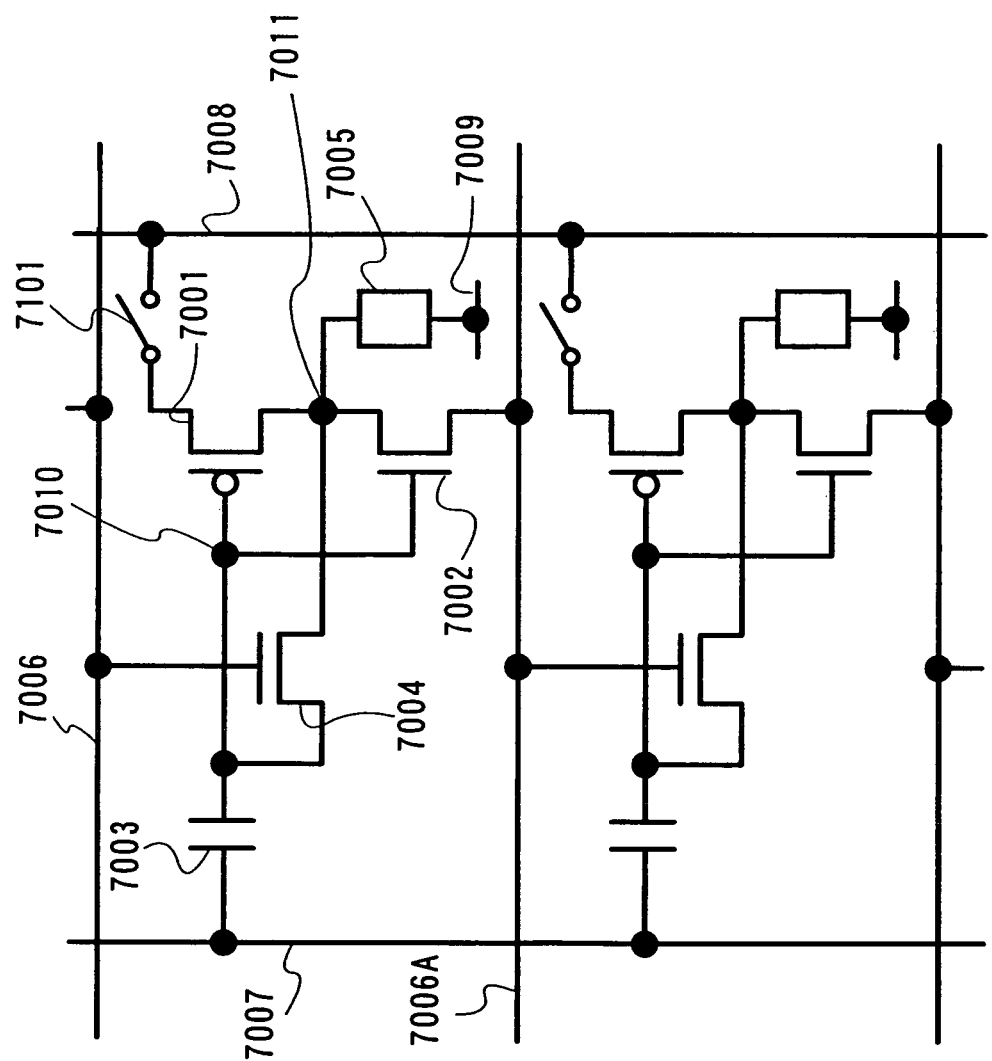
FIG. 71 is a diagram showing a pixel configuration of the invention.

It is to be noted that another method may be employed as well as long as current does not flow to the opposing electrode 7009. For example, the opposing electrode 7009 may be in a floating state; consequently, current does not flow to the light emitting element 7005. Alternatively, a switch may be provided between the power supply line 7008 and the pixel electrode of the light emitting element 7005 through the transistor 7001. By controlling this switch, current can be prevented from flowing to the light emitting element 7005. That is, as shown in FIG. 71, a switch 7101 may be connected between the first terminal of the transistor 7001 and the power supply line 7008. Alternatively, a switch may be connected between the node 7011 and the pixel electrode of the light emitting element 7005. Further alternatively, a switch may be connected between the second terminal of the transistor 7001 and the node 7011. According to this, in the signal writing period of pixels, light emission of the light emitting element 7005 can be prevented in a signal writing period to pixels of another row after signal writing to the pixel is completed.

In this manner, video signal writing to this pixel is completed.

It is to be noted that after the video signal is written to the pixel, level of an output of the inverter is controlled in accordance with change of the potential of the signal line 7007, based on the analog signal potential which has been supplied to the signal line 7007 when the video signal has been written to the pixel. That is, in the case where the potential of the signal line 7007 is higher than the analog signal potential when the video signal has been written to the pixel in the signal writing period to the pixel, the output of the inverter becomes L level while in the case where the potential of the signal line 7007 is lower than the analog signal potential when the video signal has been written to the pixel, the output of the inverter becomes H level.

This is because since the potential difference (Vp) has been held by the capacitor 7003 when a video signal has been written to the pixel, in the case where the potential of the signal line 7007 is higher than the analog signal potential when the video signal has been written to the pixel, the potential of the input terminal 7010 of the inverter also becomes higher than the potential of the input terminal 7010 when the video signal has been written to the pixel, thereby the driving transistor 7001 is turned off, the complementary transistor 7002 is turned on, and the output of the inverter becomes L level. On the other hand, in the case where the potential of the signal line 7007 is lower than the analog signal potential when the video signal has been written to the pixel in the signal writing period to the pixel, the potential of the input terminal 7010 of the inverter also becomes lower than the potential of the input terminal 7010 when the analog signal has been written to the pixel, thereby the driving transistor 7001 is turned on, the complementary transistor 7002 is turned off, and the output of the inverter becomes H level.

Accordingly, in a light emitting period of the pixel, by changing the potential supplied to the signal line 7007 in an analog manner in a state where the potential of the scan line (the scan line 7006, the scan line 7006A, or the like) is L level, the level of the output of the inverter in the pixel is controlled. In this manner, time for flowing current to the light emitting element 7005 is controlled in an analog manner to express gradation.

Furthermore, since the first terminal (the source terminal or the drain terminal) of the complementary transistor 7002 is connected to the scan line 7006A, the number of wires can be reduced to improve the aperture ratio. Therefore, reliability of a light emitting element can be improved. In addition, yield can be improved and the cost of a display panel can be suppressed.

Figure 72:
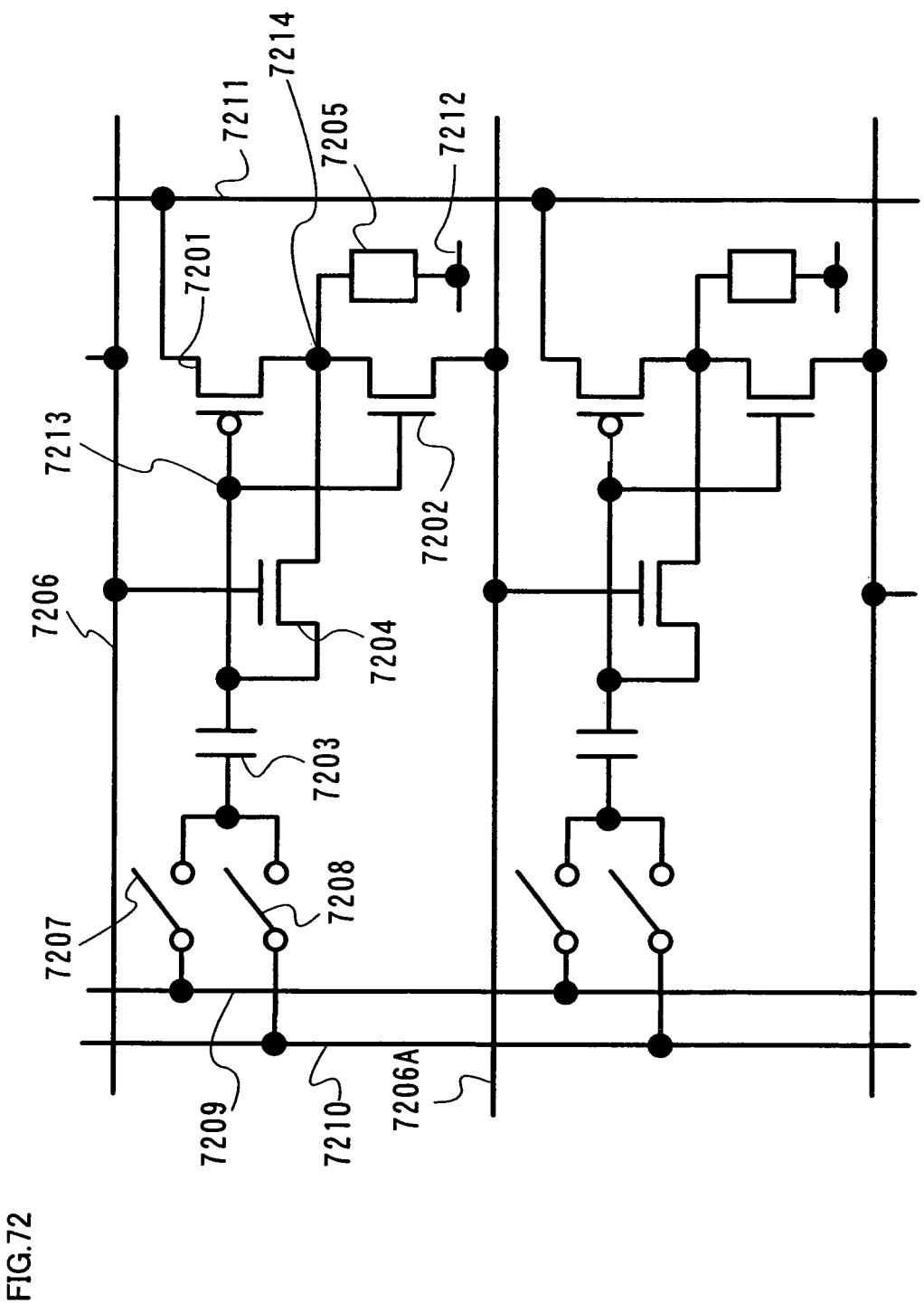
FIG. 72 is a diagram showing a pixel configuration of the invention.

A pixel shown in FIG. 72 includes a driving transistor (a second transistor) 7201, a complementary transistor (a third transistor) 7202, a capacitor 7203, a switching transistor (a first transistor) 7204, a light emitting element 7205, a scan line 7206, a first switch 7207, a second switch 7208, a first signal line 7209, a second signal line 7210, and a power supply line 7211. It is to be noted that a p-type transistor is used as the driving transistor 7201 and n-type transistors are used as the complementary transistor 7202 and the switching transistor 7204.

A first terminal (a source terminal or a drain terminal) of the driving transistor 7201 is connected to the power supply line 7211, a second terminal (the source terminal or the drain terminal) thereof is connected to a second terminal (a source terminal or a drain terminal) of the complementary transistor 7202, and a gate terminal thereof is connected to a gate terminal of the complementary transistor 7202. In addition, the gate terminals of the driving transistor 7201 and the complementary transistor 7202 are connected to one electrode of the capacitor 7203 and to connected to the second terminals (each of those is the source terminal or the drain terminal) of the driving transistor 7201 and the complementary transistor 7202 through the switching transistor 7204. That is, since a first terminal (a source terminal or a drain terminal) of the switching transistor 7204 is connected to the second terminals (each of those is the source terminal or the drain terminal) of the driving transistor 7201 and the complementary transistor 7202 while a second terminal (the source terminal or the drain terminal) thereof is connected to the gate terminals of the driving transistor 7201 and the complementary transistor 7202, by turning on/off the switching transistor 7204, respective portions between the gate terminal and the second terminal (the source terminal or the drain terminal) of the driving transistor 7201 and the complementary transistor 7202 can be made conductive or non-conductive. On/off of the switching transistor 7204 is controlled by inputting a signal to the scan line 7206 which is connected to a gate terminal of the switching transistor 7204. In addition, the other electrode of the capacitor 7203 is connected to the first signal line 7209 through the first switch 7207 and to the second signal line 7210 through the second switch 7208. In addition, the second terminals (each of those is the source terminal or the drain terminal) of the driving transistor 7201 and the complementary transistor 7202 are connected to an anode (a pixel electrode) of the light emitting element 7205. A cathode of the light emitting element 7205 is connected to a wire (Cathode) 7212 to which a low power supply potential Vss is supplied. It is to be noted that Vss is, taking as a criterion a power supply potential Vdd which is supplied to the power supply line 7211, a potential satisfying Vss<Vdd; for example, there may be Vss=GND (a ground potential). It is to be noted that the potential of the power supply line 7211 is not limited to this. A value of the power supply potential may be changed for each color of a pixel; that is, a potential of the power supply line may be supplied for each pixel of RGB in the case of full-color display using pixels of color elements of RGB and for each pixel of RGBW in the case of full-color display using pixels of color elements of RGBW.

Furthermore, a first terminal (the source terminal or the drain terminal) of the complementary transistor 7202 is connected to a scan line 7206A of pixels of another row. Here, the driving transistor 7201 is a transistor for driving the light emitting element 7205 and the complementary transistor 7202 is a transistor of which polarity is reverse to the driving transistor 7201. That is, when a signal of the scan line 7006A is L level, the driving transistor 7201 and the complementary transistor 7202 are turned on/off complementary in the inverter.

A principle of operation of the pixel shown in FIG. 72 is the same as the operation of the pixel shown in FIG. 70, and as for the operation in the case where a wire for inputting a video signal to the pixel in the writing operation and a wire for supplying a potential varying in succession to the pixel in the light emitting period are provided separately, refer to Embodiment Mode 2 and the description of the operation of FIG. 69.

Figure 73:
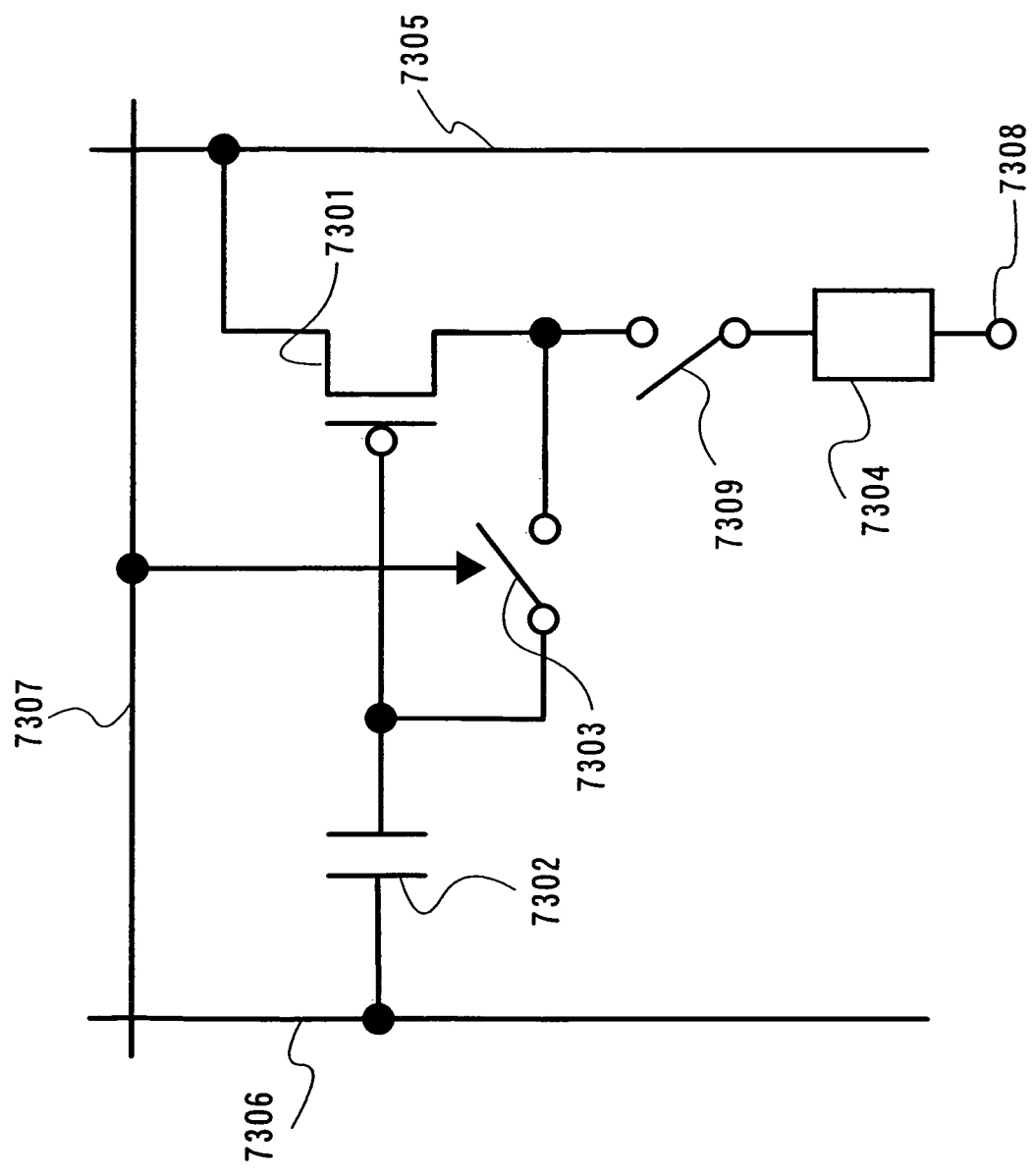
FIG. 73 is a diagram showing a pixel configuration of the invention.

A pixel shown in FIG. 73 includes a driving transistor 7301, a capacitor 7302, a switch 7303, a light emitting element 7304, a power supply line 7305, a signal line 7306, a scan line 7307, and a switch 7309. It is to be noted that a p-type transistor is used as the driving transistor 7301.

A first terminal (a source terminal or a drain terminal) of the driving transistor 7301 is connected to the power supply line 7305, a gate terminal thereof is connected to the signal line 7306 through the capacitor 7303, and a second terminal (the source terminal or the drain terminal) thereof is connected to an anode (a pixel electrode) of the light emitting element 7304 through the switch 7309. In addition, the gate terminal and the second terminal (the source terminal or the drain terminal) of the driving transistor 7301 are connected to each other through the switch 7303. Therefore, when the switch 7303 is on, a portion between the gate terminal and the second terminal (the source terminal or the drain terminal) of the driving transistor 7301 becomes conductive. Then, when the switch 7303 is turned off, the portion between the gate terminal and the second terminal (the source terminal or the drain terminal) of the driving transistor 7301 becomes nonconductive, and a potential difference (a voltage) between a potential of the gate terminal (or the second terminal) of the driving transistor 7301 at this moment and a potential of the signal line 7306 can be held in the capacitor 7302. Furthermore, to an opposing electrode 7308 of the light emitting element 7304, a potential Vss is set. It is to be noted that Vss is, taking as a criterion a power supply potential Vdd which is set to the potential supply line 7305 in a light emitting period of a pixel, a potential satisfying Vss<Vdd; for example, there may be Vss=GND (a ground potential).

Next, a principle of operation of the pixel configuration shown in FIG. 73 is described.

In a signal writing period to the pixel, an analog signal potential is supplied to the signal line 7306. This analog signal potential corresponds to a video signal. Note that this video signal is a signal expressed by three values or more and the analog signal potential is a potential varying with time and having states of three values or more. When a video signal is written to the pixel, a signal is input to the scan line 7307 to turn on the switch 7303. In addition, the switch 7309 is turned on. Then, current flows to the driving transistor 7301 and the light emitting element 7304, and the capacitor 7302 stores or discharges charge.

At this time, the first terminal of the driving transistor 7301 is a source terminal while the second terminal thereof is a drain terminal. As current flowing to the driving transistor 7301 is increased while the switch 7303 is on, current flowing to the light emitting element 7304 is also increased, so that voltage drop in the light emitting element 7304 is increased and a potential difference between the electrodes of the light emitting element 7304 is increased. That is, a potential of the anode of the light emitting element 7304 becomes close to the potential of the potential supply line 7305. As a result of this, a potential of the gate terminal of the driving transistor 7301 also becomes close to the potential of the potential supply line 7305 so that a potential difference between the gate terminal and the source terminal of the driving transistor 7301 is decreased and current flowing to the driving transistor 7301 is decreased. Meanwhile, the current flowing to the light emitting element 7304 is decreased, so that the voltage drop in the light emitting element 7304 is decreased and the potential difference between the electrodes of the light emitting element 7304 is decreased. That is, the potential of the anode of the light emitting element 704 becomes close to a potential of the cathode 7308. Then, the potential of the gate terminal of the driving transistor 7301 also becomes close to the potential of the cathode 7308, so that the potential difference between the gate terminal and the source terminal of the driving transistor 7301 is increased and the current flowing to the driving transistor 7301 is increased. In this manner, the potential of the gate terminal of the driving transistor 7301 is stabilized at a potential to flow a constant current to the driving transistor 7301. The capacitor 7302 then holds charge corresponding to a potential difference between the potential of the gate terminal of the driving transistor 7301 and the potential of the signal line 7306 at that time.

In this manner, video signal writing to this pixel is completed.

Reaching a steady state in which current flowing to the driving transistor 7301 and the light emitting element 7304 is constant as described above, the switch 7303 is turned off. Consequently, the capacitor 7302 holds a potential difference Vp (voltage) between the potential of the signal line 7306 and the potential of the gate terminal (or the drain terminal) of the driving transistor 7301 at the moment when the switch 7303 is turned off.

In the signal writing period to pixels, after writing a video signal to the pixel and during signal writing to pixels of another row is performed, the switch 7309 is turned off. It is to be note that the switch 7309 is turned off at the simultaneous timing of turning the switch 303 off or after the timing.

It is to be noted that in the case where a video signal has been written to the pixel, on/off of the driving transistor 7301 is controlled in accordance with change of the potential of the signal line 7306, based on the analog signal potential which has been set to the signal line 7306 when the video signal has been written to the pixel. That is, in the case where the potential of the signal line 7306 is equal to or higher than the analog signal potential when the video signal has been written to the pixel in the signal writing period, the driving transistor 7301 is turned off while in the case where the potential of the signal line 7306 is lower than the analog signal potential when the video signal has been written to the pixel, the driving transistor 7301 is turned on.

This is because since the potential difference (Vp) has been held by the capacitor 7302 when a video signal has been written to the pixel, in the case where the potential of the signal line 7306 is equal to or higher than the analog signal potential when the video signal has been written to the pixel, the potential of the gate terminal of the driving transistor 7301 also becomes equal to or higher than the potential of the gate terminal when the video signal has been written to the pixel, thereby the driving transistor 7301 is turned off. On the other hand, in the case where the potential of the signal line 7306 is lower than the analog signal potential when the video signal has been written to the pixel in the signal writing period to the pixel, the potential of the gate terminal of the driving transistor 7301 also becomes lower than the potential of the gate terminal when the video signal has been written to the pixel, thereby the driving transistor 7301 is turned on.

Accordingly, in a light emitting period of the pixel, by changing the potential set to the signal line 7306 in an analog manner while with a state in which the switch 7303 has been turned off and the switch 7309 has been turned on, on/off of the driving transistor 7301 is controlled. That is, time for flowing current to the light emitting element 7304 is controlled in an analog manner to express gradation.

Figure 79:
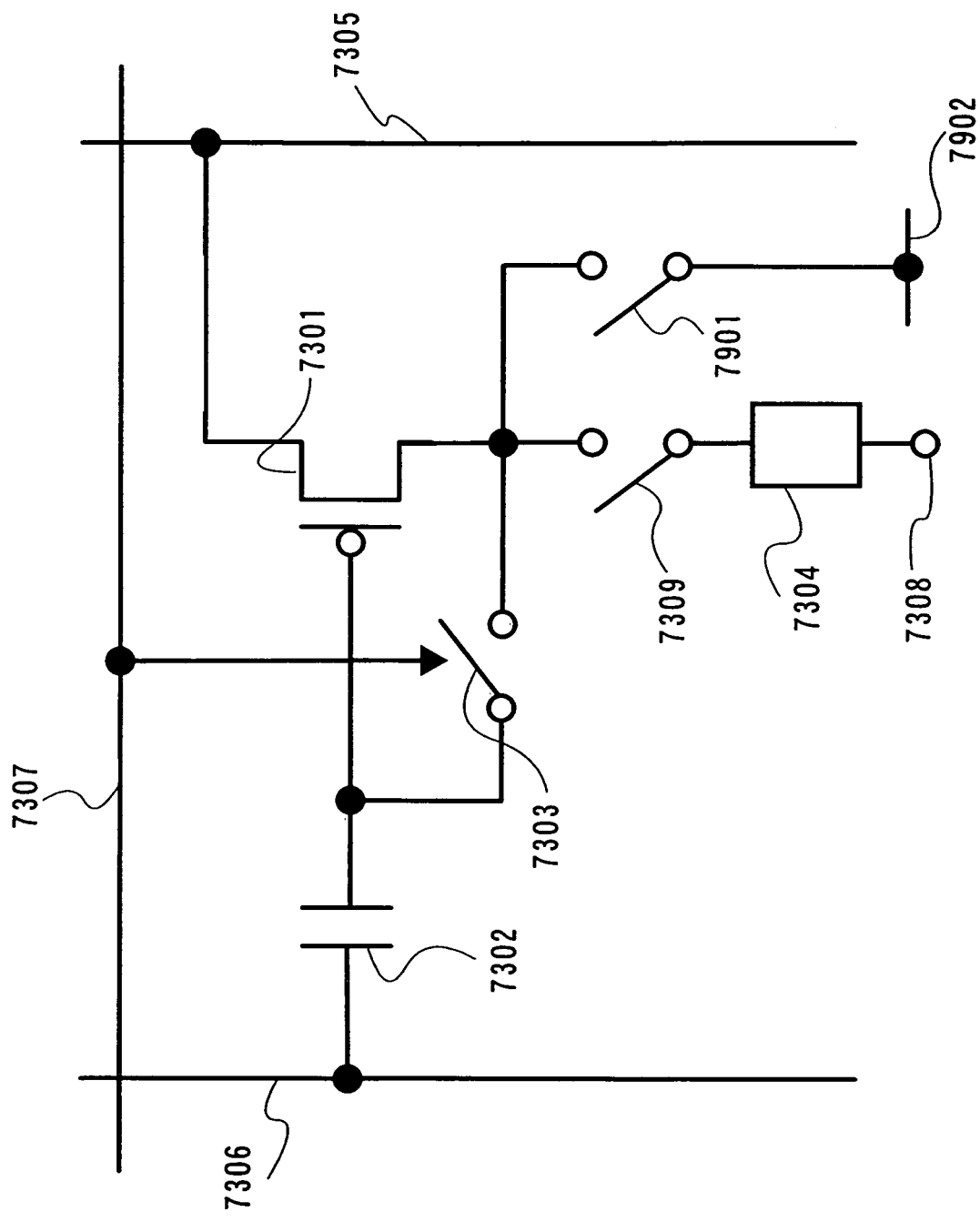
FIG. 79 is a diagram showing a pixel configuration of the invention.

In addition, the second terminal of the driving transistor 7301 may be connected to a wire to which a potential equivalent to the opposing electrode 7308 through a switch as well. That is, as shown in FIG. 79, the second terminal of the driving transistor 7301 may be connected to a wire 7902 through a switch 7901. The switch 7901 is turned on when a signal is written to the pixel and then turned off when the writing is completed. Then, in a signal writing period and a light emitting period to pixels of another row, the switch 7901 is turned off. As a result of this, light emission of the pixel can be prevented in writing the signal to the pixel. As for the other, refer to the operation of FIG. 73.

Figure 74:
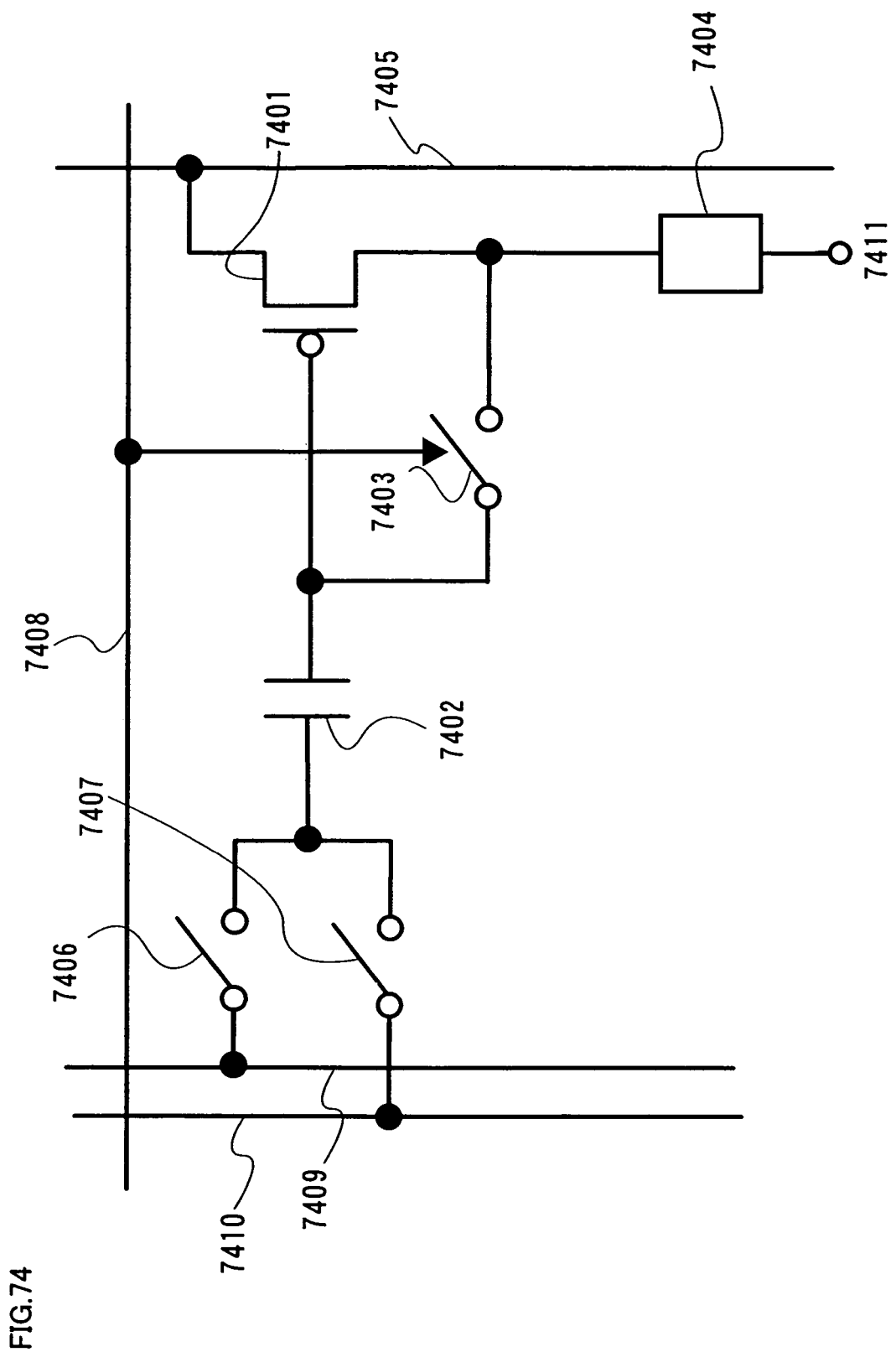
FIG. 74 is a diagram showing a pixel configuration of the invention.

A pixel shown in FIG. 74 includes a driving transistor 7401, a capacitor 7402, a first switch 7403, a light emitting element 7404, a power supply line 7405, a second switch 7406, a third switch 7407, a scan line 7408, a first signal line 7409, and a second signal line 7410. It is to be noted that a p-type transistor is used as the driving transistor 7401.

A first terminal (a source terminal or a drain terminal) of the driving transistor 7401 is connected to the power supply line 7405 and a gate terminal thereof is connected to one electrode of the capacitor 7402. The other electrode of the capacitor 7402 is connected to the first signal line 7409 through the second switch 7406 and to the second signal line 7410 through the third switch 7407. In addition, the gate terminal and a second terminal (the source terminal or the drain terminal) of the driving transistor 7401 are connected to each other through the switch 7403. Furthermore, to a cathode 7411 of the light emitting element 7404, a potential Vss is set. It is to be noted that Vss is, taking as a criterion a power supply potential Vdd which is set to the power supply line 7405, a potential satisfying Vss<Vdd; for example, there may be Vss=GND (a ground potential).

Next, operation of the pixel of FIG. 74 is described. In a signal writing operation to the pixel, the second switch 7406 is turned on while the third switch 7407 is turned off. Then, a signal of H level is input to the scan line 7408 to turn on the first switch 7403. As a result, current flows to the capacitor 7402, the driving transistor 7401, and the light emitting element 7404. Then, the signal of the scan line 7408 falls from the H level to L level, thereby the first switch 7403 is turned off. When the first switch 7403 is turned off, the capacitor 7402 holds a potential difference between a potential of the gate terminal of the driving transistor 7401 at that moment and the potential of the first signal line 7409.

In this manner, a video signal is written to the pixel from the first signal line 7409.

It is to be noted that a potential varying in an analog manner is supplied to the second signal line 7410 in a light emitting period. The pixel keeps the non-light emitting state of the light emitting element 7404 during a period in which the potential of the second signal line 7410 is higher than the analog signal potential set to the first signal line 7409 in the signal writing period Ti of the pixels of the i-th row, while the light emitting element 7404 emits light during a period in which the potential of the second signal line 7410 is lower than the analog signal potential set to the first signal line 7409 in the signal writing period of the pixels of the i-th row. Accordingly, the light emitting time of the light emitting element 7404 is set depending on an analog signal potential when a video signal is written in a writing period of each pixel. Analog time gradation display can be performed in this manner.

Figure 75:
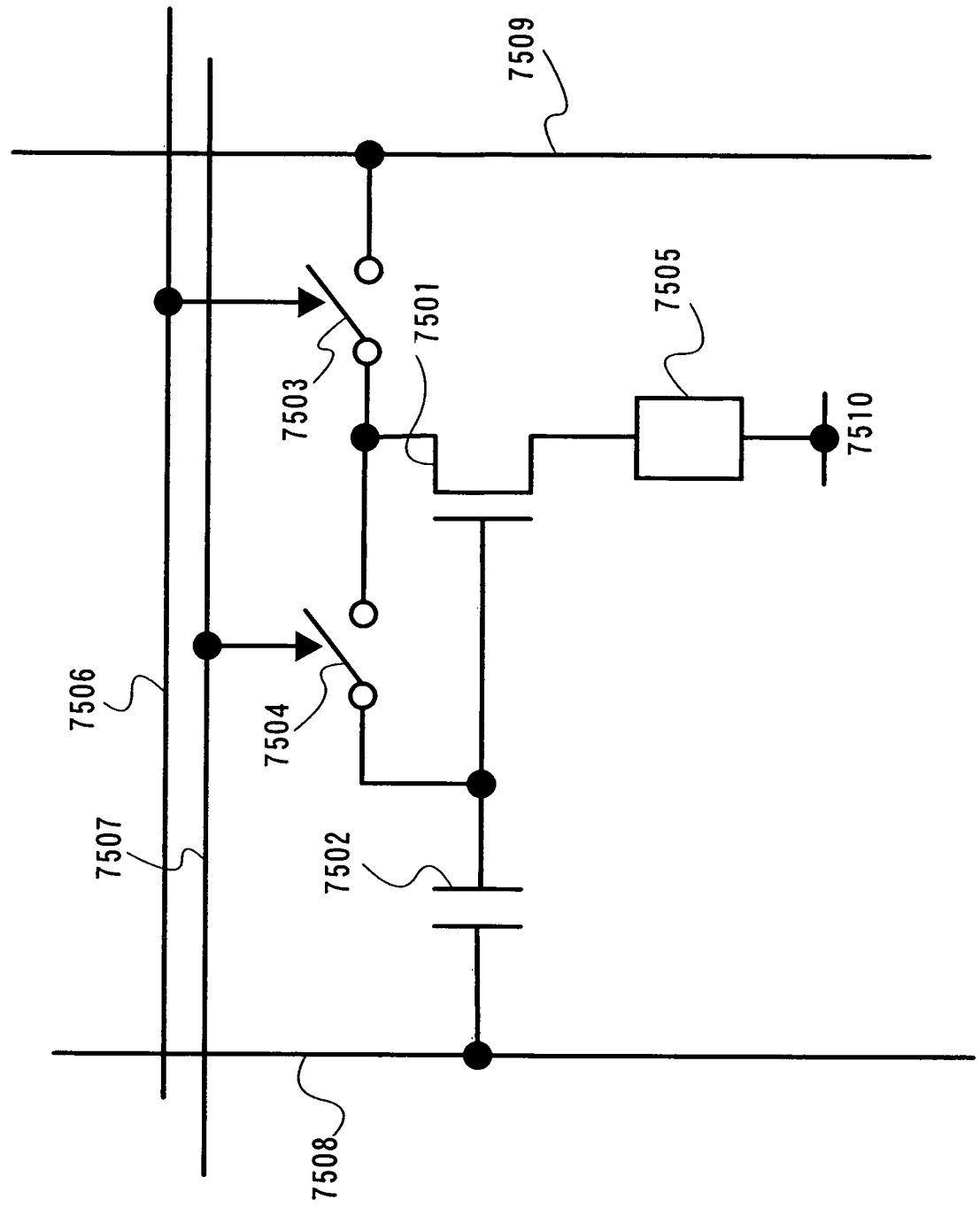
FIG. 75 is a diagram showing a pixel configuration of the invention.

A pixel shown in FIG. 75 includes a driving transistor 7501, a capacitor 7502, a first switch 7503, a second switch 7504, a light emitting element 7505, a first scan line 7506, a second scan line 7507, a signal line 7508, a power supply line 7509, and a wire 7510. It is to be noted that an n-type transistor is used as the driving transistor 7501.

A source terminal of the driving transistor 7501 is connected to an anode (a pixel electrode) of the light emitting element 7504, a gate terminal thereof is connected to the signal line 7508 through the capacitor 7502, and a drain terminal thereof is connected to the power supply line 7509 through the first switch 7503. Note that to the power supply line 7509, a power supply potential Vdd is set. In addition, the gate terminal and the drain terminal of the driving transistor 7501 are connected to each other through the second switch 7504. Therefore, when the second switch 7504 is on, a portion between the gate terminal and the drain terminal of the driving transistor 7501 becomes conductive. Then, when the second switch 7504 is turned off, the portion between the gate terminal and the drain terminal of the driving transistor 7501 becomes non-conductive, and a potential difference (a voltage) between a potential of the gate terminal (or the drain terminal) of the driving transistor 7501 at this moment and a potential of the signal line 7508 can be held in the capacitor 7502. Furthermore, a cathode of the light emitting element 7505 is connected to the wire 7510 to which a potential Vss is set. It is to be noted that Vss is a potential satisfying Vss<Vdd; for example, there may be Vss=GND (a ground potential).

Next, a principle of operation of the pixel shown in FIG. 75 is described.

In a signal writing period of the pixel, a signal is input to the first scan line 7506 and the second scan line 7507 to turn on the first switch 7503 and the second switch 7504. Thus, a power supply potential (Vdd) of the power supply line 7509 is set to the drain terminal and the gate terminal of the driving transistor 7501. As a result, current flows to the capacitor 7502, the driving transistor 7501, and the light emitting element 7505, and the capacitor 7502 stores or discharges charge. It is to be noted that in the signal writing period of the pixel, an analog signal potential is set to the signal line 7508. This analog signal potential corresponds to a video signal.

After a while, the current stops flowing to the capacitor 7502 and the current flows to the driving transistor 7501 and the light emitting element 7505. This is because, since a portion between the gate terminal of the driving transistor

7501 and the drain terminal thereof is conductive by the second switch 7504, thereby a potential of the gate terminal becomes the power supply potential (Vdd) to turn on the driving transistor 7501.

In this state, when the first switch 7503 is turned off, current flows to the driving transistor 7501 and the capacitor 7502 and then stops flowing thereto. In this manner, the driving transistor 7501 is turned off. At this time, a gate-source voltage Vgs of the driving transistor 7501 is approximately equivalent to a threshold voltage Vth.

Reaching this state, the second switch 7504 is turned off. The capacitor 7502 holds a potential difference (Vp) between a potential of the gate terminal of the driving transistor 7501 necessary to turn off the driving transistor 7501 and the analog signal potential set to the signal line 7508 at the moment when the second switch 7504 is turned off. In this manner, an analog signal is written to the pixel.

It is to be noted that on/off of the first switch 7503 and the second switch 7504 as described above are controlled by inputting pulse signals to the first scan line 7506 and the second scan line 7507 respectively.

After an analog signal is written to the pixel, on/off of the driving transistor 7501 is controlled in accordance with change of a potential of the signal line 7508, based on the analog signal potential which has been supplied to the signal line 7508 when the analog signal is written. That is, in the case where the potential of the signal line 7508 is equal to or lower than the analog signal potential when the analog signal is written to the pixel in the signal writing period, the driving transistor 7501 is turned off while in the case where the potential of the signal line 7508 is higher than the analog signal potential when the analog signal is written to the pixel, the driving transistor 7501 is turned on.

The potential difference (Vp) has been held by the capacitor 7502 when an analog signal has been written to the pixel; therefore, in the case where a potential of the signal line 7508 is equal to or lower than an analog signal potential when the analog signal has been written to the pixel, a potential of the gate terminal of the driving transistor 7501 also becomes equal to or lower than a potential of the gate terminal when the analog signal has been written to the pixel, thereby the driving transistor 7501 is turned off. On the other hand, in the case where a potential of the signal line 7508 is higher than the analog signal potential when the analog signal has been written to the pixel in a writing period, the potential of the gate terminal of the driving transistor 7501 also becomes higher than the potential of the gate terminal when the analog signal has been written to the pixel, thereby the driving transistor 7501 is turned on.

Accordingly, in a light emitting period of the pixel, by changing the potential set to the signal line 7508 in an analog manner while with a state in which the second switch 7504 has been turned off and the first switch 7503 has been turned on, on/off of the driving transistor 7501 is controlled so that time for supplying current to the light emitting element 7505 is controlled in an analog manner to express gradation.

Figure 76:
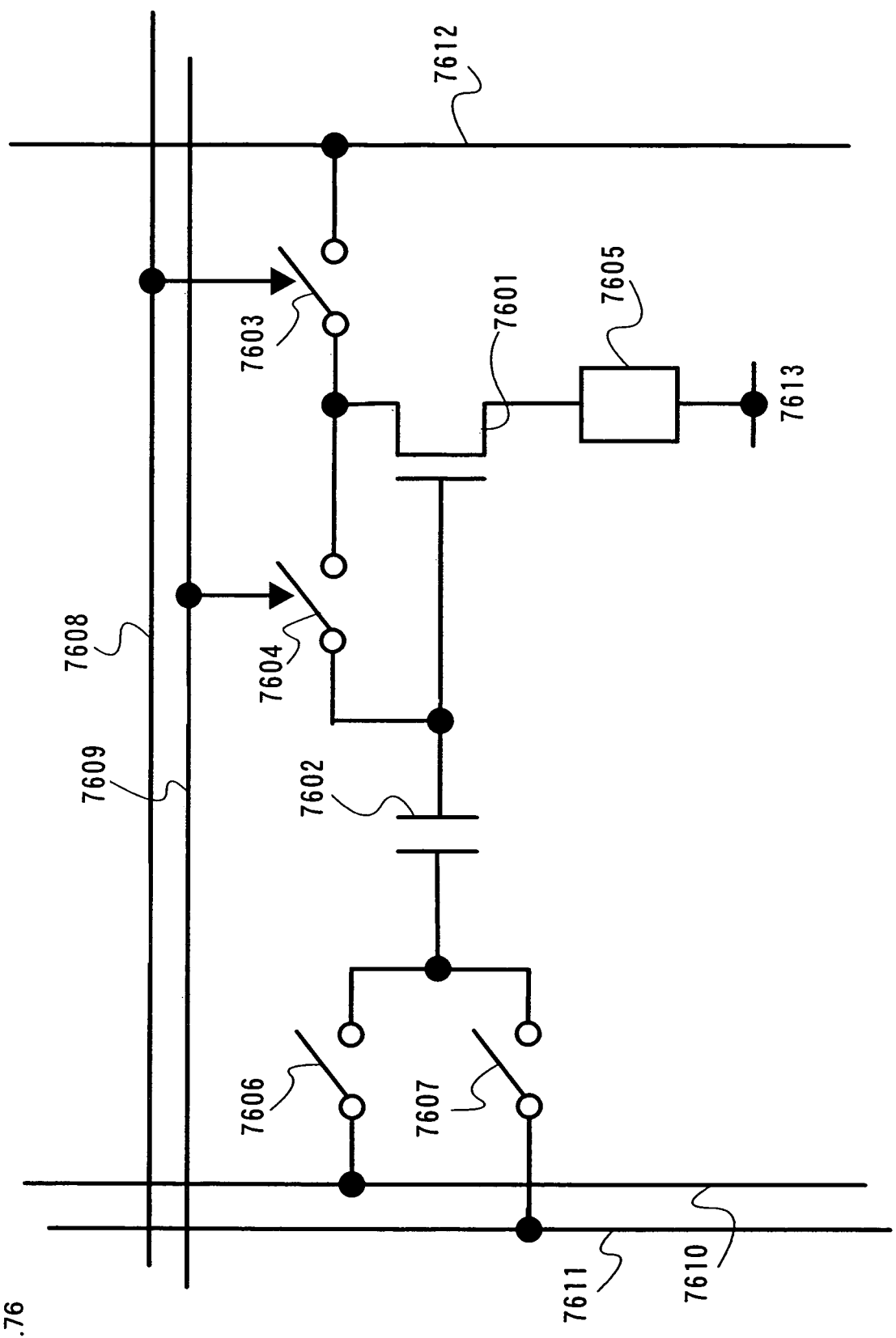
FIG. 76 is a diagram showing a pixel configuration of the invention.

A pixel shown in FIG. 76 includes a driving transistor 7601, a capacitor 7602, a first switch 7603, a second switch 7604, a light emitting element 7605, a third switch 7606, a fourth switch 7607, a first scan line 7608, a second scan line 7609, a first signal line 7610, a second signal line 7611, and a power supply line 7612. It is to be noted that an n-type transistor is used as the driving transistor 7601.

A source terminal of the driving transistor 7601 is connected to an anode (a pixel electrode) of the light emitting element 7605, and a gate terminal thereof is connected to one electrode of the capacitor 7602. The other electrode of the capacitor 7602 is connected to the first signal line 7610 through the third switch 7606 and to the second signal line 7611 through the fourth switch 7607. A drain terminal of the driving transistor 7601 is connected to the power supply line 7612 through the first switch 7603. Note that to the power supply line 7612, a power supply potential Vdd is set. A potential set to the power supply line is not limited to Vdd, and for example, in the case of full color display using color elements of RGB, a value of the potential of the power supply line may be changed for each pixel of colors of RGB.

In addition, the gate terminal and the drain terminal of the driving transistor 7601 are connected to each other through the second switch 7604. Therefore, when the second switch 7604 is on, a portion between the gate terminal and the drain terminal of the driving transistor 7601 becomes conductive. Then, when the second switch 7604 is turned off, the portion between the gate terminal and the drain terminal of the driving transistor 7601 becomes non-conductive, and a potential difference (a voltage) between a potential of the gate terminal (or the drain terminal) of the driving transistor 7601 at this moment and an analog signal potential set by the first signal line 7610 can be held in the capacitor 7602. Furthermore, a cathode of the light emitting element 7605 is connected to a wire 7613 to which a potential Vss is set. It is to be noted that Vss is a potential satisfying Vss<Vdd; for example, there may be Vss=GND (a ground potential).

Figure 77:
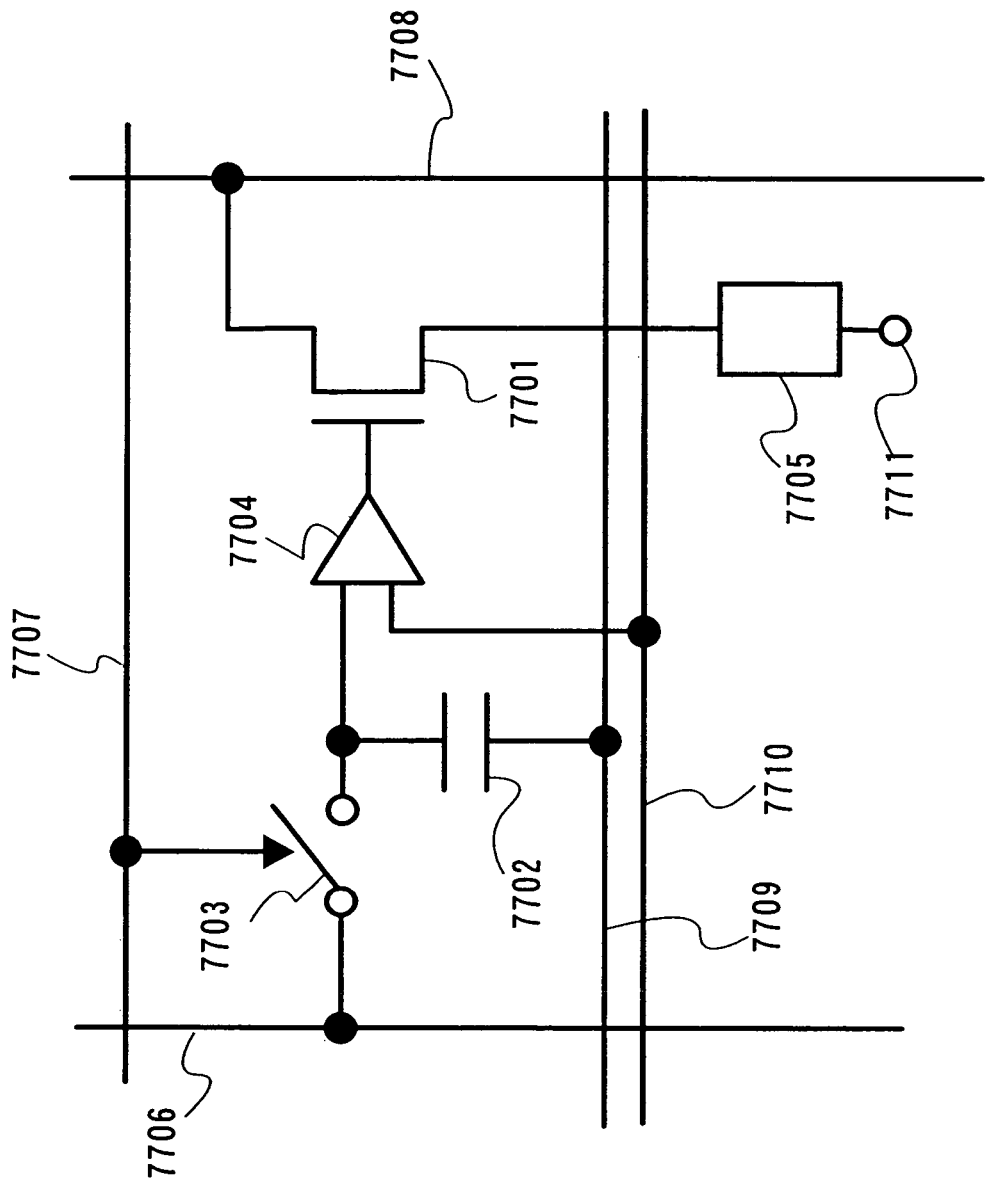
FIG. 77 is a diagram showing a pixel configuration of the invention.

A pixel shown in FIG. 77 includes a transistor 7701, a capacitor 7702, a switch 7703, an amplifier 7704, a light emitting element 7705, a signal line 7706, a scan line 7707, a power supply line 7708, a wire 7709, and a wire 7710.

A first terminal (a source terminal or a drain terminal) of the driving transistor 7701 is connected to a pixel electrode of the light emitting element 7705, a second terminal (the source terminal or the drain terminal) thereof is connected to the power supply line 7708, and a gate terminal thereof is connected to an output terminal of the comparator circuit 7704. A first input terminal of the comparator circuit 7704 is connected to the signal line 7706 through the switch 7703 while a second input terminal thereof is connected to the wire 7710. The first input terminal of the comparator circuit 7704 is also connected to the wire 7709 through the capacitor 7702. Note that on/off of the switch 7703 is controlled by inputting a signal to the scan line 7707.

Described below is operation of the pixel. In a signal writing period to the pixel, the switch 7703 is turned on. Then, a potential corresponding to a video signal is applied to one electrode of the capacitor 7702 from the signal line 7706. Then, the switch 7703 is turned off and the analog potential corresponding to this video signal is held in the capacitor 7702. In this case, a potential of the wire 7709 is preferably set to be a predetermined potential. In this manner, signal writing to the pixel is completed.

Subsequently, in a light emitting operation of the pixel, a potential varying in succession from a minimum potential to a maximum potential in the scope of the analog potential corresponding to the video signal, a potential varying in succession from the maximum potential to the minimum potential, or a potential varying in succession repeatedly from the maximum potential to the minimum potential and from the minimum potential to the maximum potential is input to the wire 7710. Consequently, the analog potential held in the capacitor 7702 is input to the first input terminal of the comparator circuit 7704 while the potential varying in succession in the scope of the analog potential is input to the second input terminal thereof. Then, height of respective potentials input to the first input terminal and the second input terminal are compared with each other in the comparator circuit 7704 and by a result of this, an output potential thereof is determined. By the output potential of the comparator circuit 7704, on/off of the transistor 7701 is controlled.

Accordingly, a period during which the transistor 7701 is on corresponds to a light emitting period of the light emitting element 7705, therefore, the light emitting element 7705 can emit light during arbitrary time within a light emitting period so that gradation display can be performed.

Figure 78:
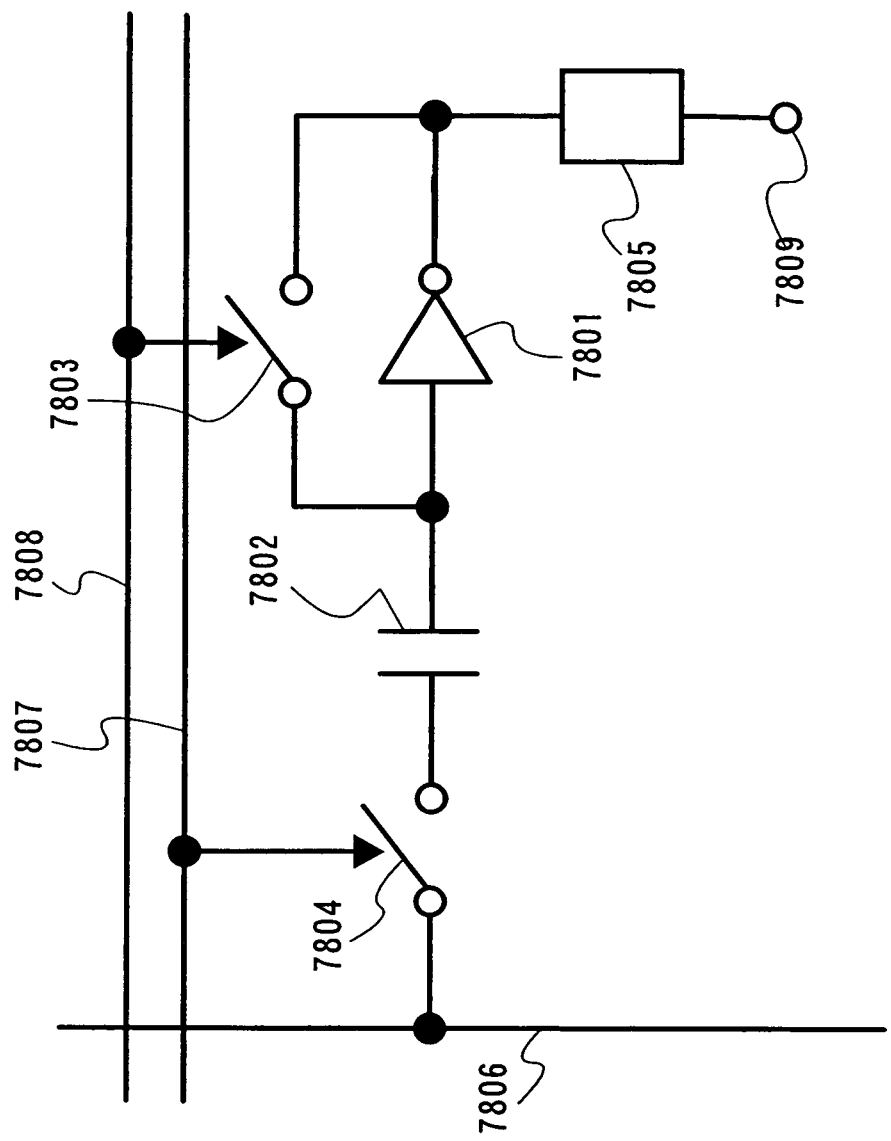
FIG. 78 is a diagram showing a pixel configuration of the invention.

A pixel shown in FIG. 78 includes an inverter 7801, a capacitor 7802, a switch 7803, a switch 7804, a light emitting element 7805, a signal line 7806, a first scan line 7807, and a second scan line 7808.

An input terminal of the inverter 7801 is connected to one electrode of the capacitor 7802 and an output terminal thereof is connected to a pixel electrode of the light emitting element 7805. The other electrode of the capacitor 7802 is connected to the signal line 7806 through the switch 7804. In addition, the input terminal and the output terminal of the inverter 7801 are connected to each other through the switch 7803. Note that on/off of the switch 7804 is controlled by a signal input to the first scan line 7807 and on/off of the switch 7803 is controlled by a signal input to the second scan line 7808.

In a writing operation of the pixel, the switch 7804 and the switch 7803 are turned on. Then, an analog potential corresponding to a video signal is supplied to the signal line 7806. Consequently, a potential corresponding to a logic threshold value of the inverter 7801 is input to the one electrode of the capacitor 7802 while the analog potential corresponding to the video signal is input to the other electrode thereof. Then, the switches 7803 and 7804 are turned off so that the capacitor 7802 holds a potential difference between the logic threshold potential of the inverter 7801 and the analog potential corresponding to the video signal. In this manner, signal writing to the pixel is completed.

Subsequently, in a light emitting operation of the pixel, a potential varying in succession from a minimum potential to a maximum potential in the scope of the analog potential corresponding to the video signal, a potential varying in succession from the maximum potential to the minimum potential, or a potential varying in succession repeatedly from the maximum potential to the minimum potential and from the minimum potential to the maximum potential is input to the signal line 7806. Consequently, a potential applied to the pixel electrode of the light emitting element 7805 is changed depending on whether the potential supplied in succession to the signal line 7806 in the light emitting period is higher or lower than the analog potential corresponding to the video signal which has been written to the pixel in the writing period, therefore, the light emitting element 7805 can emit light during arbitrary time within a light emitting period so that gradation display can be performed.

Next, described is correlation between a luminance characteristic of a light emitting element and an analog potential input to the signal line. For example, in the case where a triangular wave is input as the analog potential in the light emitting period, correlation between a luminance characteristic of a light emitting element and the triangular wave is shown in FIGS. 59*a*1, 59*a*2, and 59*a*3. As one example, the description is made on a case where luminance obtained from a light emitting element of a pixel of G is high while luminance obtained from a light emitting element of a pixel of B is low, taking a luminance characteristic of a light emitting element of a pixel of R as a criterion.

In this case, when a triangular wave potential input to a signal line Dr (Data line R pixel) is taken as a criterion, a triangular wave potential input to a signal line Dg (Data line G pixel) is sloped sharply; that is, the amplitude of the triangular wave potential is increased. On the other hand, a triangular wave potential input to a signal line Db (Data line B pixel) is sloped gently; that is, the amplitude of the triangular wave potential is decreased.

As a result of this, a light emitting time can be changed for a pixel for each color when the same gradation is displayed. For example, a display period for the highest gradation within one frame period of a pixel for R is Tmax(R), a display period for the highest gradation within one frame period of a pixel for G is Tmax(G), and a display period for the highest gradation within one frame period of a pixel for B is Tmax(B).

Alternatively, as the third constitution, the width of a potential of a video signal may be changed for a pixel for each color. That is, as shown in FIGS. 60*a*1, 60*a*2, and 60*a*3, taking a pixel of R as a criterion, potentials corresponding to respective gradations of a video signal of G are shifted to the lower side in the case where the luminance obtained from a light emitting element of a pixel of G is high. Meanwhile, potentials corresponding to respective gradations of a video signal of B are shifted to the higher side in the case where the luminance obtained from a light emitting element of a pixel of B is low. In this manner, a light emitting time can be changed for a pixel for each color when the same gradation is expressed. For example, a display period for the highest gradation within one frame period of the pixel of R is Tmax(R), a display period for the highest gradation within one frame period of the pixel of G is Tmax(G), and a display period for the highest gradation within one frame period of the pixel of B is Tmax(B).

Alternatively, as the fourth constitution, a structure for shifting for each color respective potentials corresponding to gradations of a video signal and a structure for changing for each color the amplitude of a triangular wave potential may be combined with each other. As a result of this, amplitude can be reduced and reduction in power consumption can be achieved.

Alternatively, as the fifth constitution, to a power supply line connected to a first terminal of a driving transistor, a different potential is set for each color of a pixel. For example, to the power supply line 6610 in FIG. 66, the power supply line 6708 in FIG. 67, the power supply lines 6708 in FIGS. 68*a*, 68*b*, and 68*c*, the power supply line 6911 in FIG. 69, the power supply line 7008 in FIG. 70, the power supply line 7008 in FIG. 71, the power supply line 7211 in FIG. 72, the power supply line 7305 in FIG. 73, the power supply line 7405 in FIG. 74, the power supply line 7509 in FIG. 75, the power supply line 7612 in FIG. 76, the power supply line 7708 in FIG. 77, the power supply line 7305 in FIG. 79, and the like, a potential may be changed for a pixel for each color.

Alternatively, as the sixth constitution, a structure for shifting for each color of a pixel respective potentials corresponding to gradations of a video signal or a structure for changing for each color the amplitude of a triangular wave potential, and a structure for changing for each color a potential of a power supply line connected to a first terminal of a driving transistor may be combined with each other.

Embodiment Mode 7

In this embodiment mode, described is a configuration in the case where a CMOS inverter is employed as an inverter for controlling light emission/non-light emission of a light emitting element within a pixel.

A configuration in which a CMOS inverter is employed within a pixel in the pixel configuration shown in FIG. 1 is described with reference to FIG. 61.

The pixel includes a driving transistor 6101, a complementary transistor 6108, a capacitor 6102, a switch 6903, a light emitting element 6104, a potential supply line (Illumination line) 6105, a signal line (Data line) 6106, a scan line (Reset line) 6107, and a wire 6110. It is to be noted that the driving transistor 6101 is a p-type transistor is used as the driving transistor 6101 and an n-type transistor is used as the complementary transistor 6108.

A first terminal (a source terminal or a drain terminal) of the driving transistor 6101 is connected to the potential supply line 6105, a second terminal (the source terminal or the drain terminal) thereof is connected to a second terminal (a source terminal or a drain terminal) of the complementary transistor 6108, and a gate terminal thereof is connected to a gate terminal of the complementary transistor 6108. In addition, the gate terminals of the driving transistor 6101 and the complementary transistor 6108 are connected to the signal line 6106 through the capacitor 6102 and to connected to the second terminals (each of those is the source terminal or the drain terminal) of the driving transistor 6101 and the complementary transistor 6108 through the switch 6103. That is, by turning on/off the switch 6103, respective portions between the gate terminal and the second terminal (the source terminal or the drain terminal) of the driving transistor 6101 and the complementary transistor 6108 can be made conductive or non-conductive. On/off of the switch 6103 is controlled by inputting a signal to the scan line 6107. In addition, the second terminals (each of those is the source terminal or the drain terminal) of the driving transistor 6101 and the complementary transistor 6108 are connected to an anode (a pixel electrode) of the light emitting element 6104. To a cathode (Cathode) 6109 of the light emitting element 6104, a low power supply potential Vss is supplied. It is to be noted that Vss is, taking as a criterion a signal of H level (a power supply potential Vdd) which is input to the potential supply line 6105 in a light emitting period, a potential satisfying Vss<Vdd; for example, there may be Vss=GND (a ground potential).

In addition, a first terminal of the complementary transistor 6108 is connected to the wire 6110. Here, the driving transistor 6101 is a transistor for driving the light emitting element 6104 and the complementary transistor 6108 is a transistor of which polarity is reverse to the driving transistor 6101. That is, when a signal of the potential supply line 6105 is H level (the power supply potential Vdd), the driving transistor 6101 and the complementary transistor 6108 function as an inverter while turning on/off complementary. It is to be noted that a potential of the wire 6110 is set such that a voltage applied to the light emitting element 6104 when the complementary transistor 6108 is turned on is equal to or lower than a forward threshold voltage $V_{EL}$ of the light emitting element 6104.

Operation thereof is briefly described. In writing a signal to the pixel, a signal is input to the scan line 6107 to turn on the switch 6103. In addition, a potential of the potential supply line 6105 is made to be H level so that a potential of the first terminal of the driving transistor 6101 becomes the power supply potential Vdd. Consequently, the driving transistor 6101 and the complementary transistor 6108 function as a CMOS inverter in which they are turned on/off complementary. Therefore, a portion between the second terminals of the driving transistor 6101 and the complementary transistor 6108 which corresponds to an output terminal of the CMOS inverter, and the gate terminals of the driving transistor 6101 and the complementary transistor 6108 which correspond to an input terminal of the CMOS inverter becomes conductive, and offset cancellation is performed. That is, the input terminal of the CMOS inverter has a logic threshold potential of the CMOS inverter. Then, the capacitor 6102 stores a charge corresponding to a potential difference (Vp) between the potential of the input terminal and an analog signal potential input to the signal line 6106. In this manner, signal writing to the pixel is completed and the signal of the scan line 6107 is changed to turn off the switch 6103. The voltage Vp is thus held in the capacitor 6102. In addition, the potential supply line 6105 is changed to be L level so that a voltage applied to the light emitting element 6104 is equal to or lower than the forward threshold voltage even if the driving transistor 6101 is turned on.

Subsequently, in a light emitting period, the potential of the potential supply line 6105 is changed to be H level while the switch 6103 is off. In addition, by changing the potential set to the signal line 6106 in an analog manner, level of an output of the CMOS inverter is controlled. In this manner, time for flowing current to the light emitting element 6104 can be controlled in an analog manner to express gradation. Note that in the case where the light emitting element 6104 is to emit light, the driving transistor 6101 is turned on and the complementary transistor 6108 is turned off so that the output of the CMOS inverter becomes H level. This potential of H level is the power supply potential Vdd of H level of the potential supply line 6105. On the other hand, in the case where the light emitting element 6104 is not to emit light, the driving transistor 6101 is turned off and the complementary transistor 6108 is turned on so that the output of the CMOS inverter becomes L level. This L level is a potential which has been set to the wire 6110.

Description is made on the potential which is set to the signal line 6106 in the light emitting period of the pixel. As the potential set to the signal line 6106, an analog potential which has a waveform varying periodically can be used.

It is to be noted that as the potential set to the signal line 6106 in the light emitting period, as described in Embodiment Mode 1, the waveform 4301, the waveform 4302, the waveform 4303, the waveform 4304, the waveform 4305, the waveform 4306, or the waveform 4307 may be set or a plurality of them may be set in succession.

By setting the waveform in succession, light emitting time can be dispersed within one frame. Consequently, the frame frequency appears to be improved and screen flicker can be prevented.

Note that specific operation thereof is the same as that of FIG. 1 described in Embodiment Mode 1, therefore, description thereof is omitted here.

By controlling on/off of the light emitting element by an output of the CMOS inverter as described in this embodiment mode, reduced can be variations of the pixel luminance due to variations of transistor characteristics within the pixel. This is because since the inverter is formed by an n-type transistor and a p-type transistor, the level of the output is changed rapidly, being bounded by the logic threshold voltage of the inverter, even if variations occur in transistor characteristics.

In addition, in this pixel configuration, the wire 6110 and the cathode 6109 of the light emitting element 6104 are preferably connected to each other.

Figure 61:
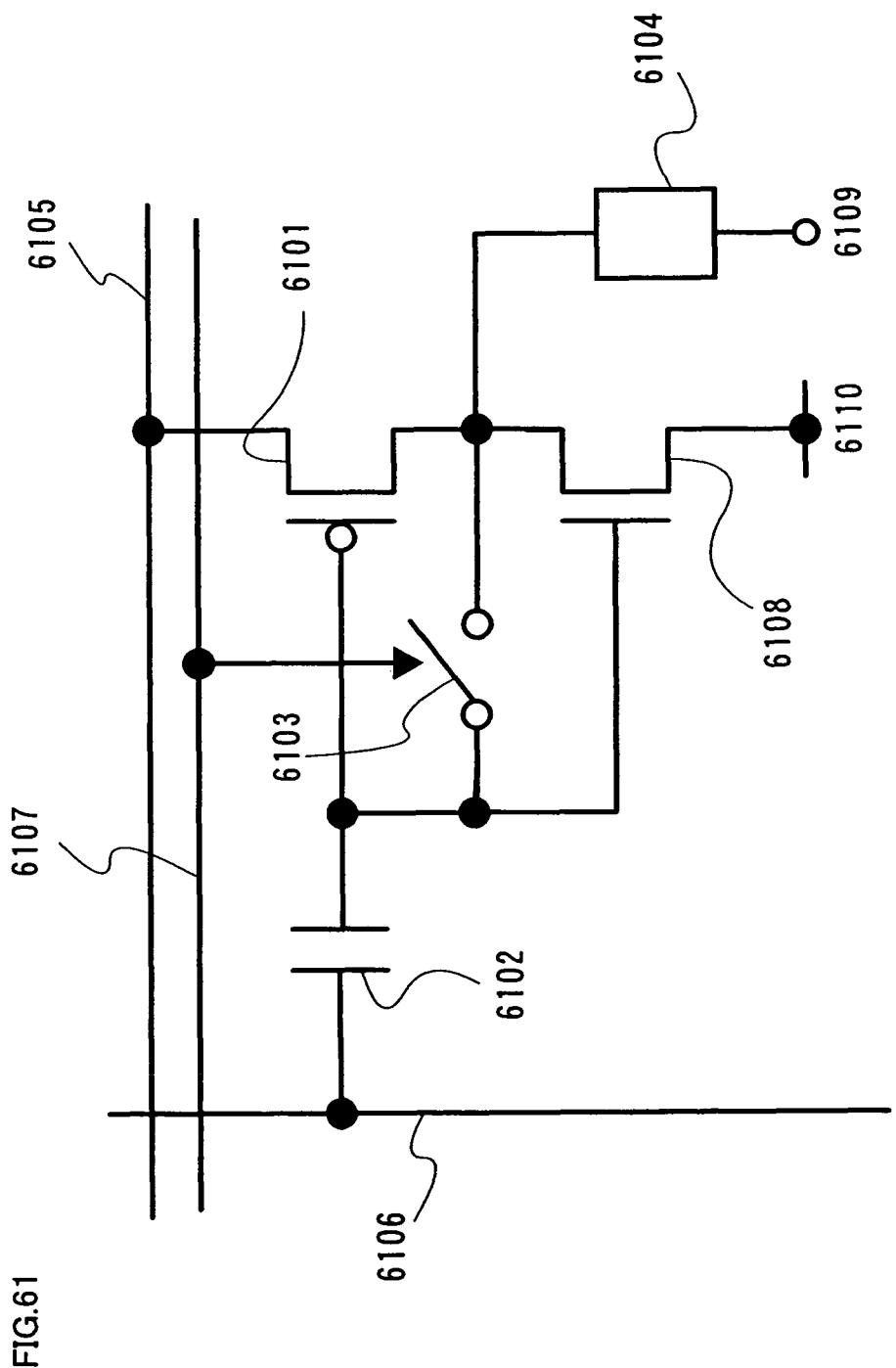
FIG. 61 is a diagram showing a pixel configuration of the invention.

Next, an example of a cross sectional structure of a display panel having the pixel of FIG. 61 is described with reference to a cross sectional view of FIG. 62.

A base film 6202 is formed on a substrate 6201. As the substrate 6201, an insulating substrate such as a glass substrate, a quartz substrate, a plastic substrate, and a ceramic substrate, a metal substrate, a semiconductor substrate, or the like can be used. The base film 6202 can be formed by CVD or sputtering. For example, a silicon oxide film, a silicon nitride film, a silicon oxynitride film, or the like formed by CVD using $SiH_4$, $N_2O$, $NH_3$, or the like as a source material can be used. Alternatively, these films may be stacked. It is to be noted that the base film 6202 is provided to prevent an impurity from diffusing into a semiconductor layer from the substrate 6201; therefore, the base film 6202 may not be provided when a glass substrate or a quartz substrate is used as the substrate 6201.

An island-shaped semiconductor layer is formed on the base film 6202. In the semiconductor layer, a channel forming region 6203 to form a p-channel, an impurity region 6204 to form a source region or a drain region, a channel forming region 6205 to form an n-channel, an impurity region 6220 to form a source region or a drain region, and a low-concentration impurity region (an LDD region) 6221 are formed. A gate electrode 6207 is formed above the channel forming region 6203 and the channel forming region 6205 respectively with a gate insulating film 6206 interposed therebetween. The gate insulating film 6206 can be formed using a silicon oxide film, a silicon nitride film, a silicon oxynitride film, or the like formed by CVD or sputtering. In addition, the gate electrode 6207 can be formed using an aluminum (Al) film, a copper (Cu) film, a thin film containing aluminum or copper as its main component, a chromium (Cr) film, a tantalum (Ta) film, a tantalum nitride (TaN) film, a titanium (Ti) film, a tungsten (W) film, a molybdenum (Mo) film, or the like.

Sidewalls 6222 are formed on the sides of the gate electrode 6207. The sidewalls 6222 can be formed by forming a silicon compound such as a silicon oxide film, a silicon nitride film, or a silicon oxynitride film to cover the gate electrode 6207, and etching back it.

It is to be noted that the LDD region 6221 is provided below the sidewall 6222. That is, the LDD region 6221 is formed in a self-aligned manner. It is to be noted that the sidewall 6222 is provided to form the LDD region 6221 in a self-aligned manner, and it may not be provided.

A first interlayer insulating film is formed on the gate electrode 6207, the sidewall 6222, and the gate insulating film 6206. The first interlayer insulating film is structured by a lower layer of an inorganic insulating film 6218 and an upper layer of a resin film 6208. As the inorganic insulating film 6218, a silicon nitride film, a silicon oxide film, a silicon oxynitride film, or a film obtained by stacking them can be used. The resin film 6208 can be formed of polyimide, polyamide, acrylic, polyimide-amide, epoxy, or the like.

A first electrode 6209 and a second electrode 6224 are formed on the first interlayer insulating film. The first electrode 6209 is electrically connected to the impurity region 6204 and the impurity region 6220 through contact holes, and the second electrode 6224 is electrically connected to the impurity region 6220 through contact holes. As the first electrode 6209 and the second electrode 6224, a titanium (Ti) film, an aluminum (Al) film, a copper (Cu) film, an aluminum film containing Ti, or the like can be used. It is to be noted that in the case where a wire such as a signal line is provided in the same layer as that of the first electrode 6209 and the second electrode 6224, copper which has low resistance is preferably used.

On the first electrode 6209, the second electrode 6224 and the first interlayer insulating film, a second interlayer insulating film 6210 is formed. As the second interlayer insulating film, an inorganic insulating film, a resin film, or a layer obtained by stacking them can be used. As the inorganic insulating film, a silicon nitride film, a silicon oxide film, or a silicon oxynitride film, or a layer obtained by stacking them can be used. As the resin film, polyimide, polyamide, acrylic, polyimide-amide, epoxy, or the like can be used.

On the second interlayer insulating film 6210, a pixel electrode 6211 and a wire 6219 are formed, which are formed of the same material; that is, they are formed in the same layer at the same time. The material of the pixel electrode 6211 and the wire 6219 has preferably a large work function. For example, a single-layer film such as a titanium nitride (TiN) film, a chromium (Cr) film, a tungsten (W) film, a zinc (Zn) film, or a platinum (Pt) film, a stacked layer of a titanium nitride film and a film containing aluminum as its main component, a three-layer structure of a titanium nitride film, a film containing aluminum as its main component and a titanium nitride film, or the like can be used. It is to be noted that if a stacked-layer structure is employed here, the resistance as the wire can be low, a good ohmic contact can be obtained, and besides, it can function as an anode. By using a light-reflective metal film, an anode which does not transmit light can be formed.

An insulator 6212 is provided so as to cover respective end portions of the pixel electrode 6211 and the wire 6219. For example, a positive type photosensitive acrylic resin film can be used as the insulator 6212.

On the pixel electrode 6211, a layer containing an organic compound 6213 is formed and partially overlaps the insulator 6212. It is to be noted that the layer containing an organic compound 6213 is not formed on the wire 6219.

On the layer containing an organic compound 6213, the insulator 6212 and the wire 6219, an opposing electrode 6214 is provided. The material of the opposing electrode 6214 has preferably a low work function. For example, a metal thin film of aluminum (Al), silver (Ag), lithium (Li), calcium (Ca) or of an alloy thereof, or of MgAg, MgIn, AlLi, $CaF_2$, CaN, or the like can be used. By using the thin metal film as described above, a cathode which can transmit light can be formed.

A light emitting element 6216 is formed in a region where the layer containing an organic compound 6213 is sandwiched between the opposing electrode 6214 and the pixel electrode 6211.

In a region where the layer containing an organic compound 6213 is separated by the insulator 6212, a junctional region 6217 is formed in which the opposing electrode 6214 and the wire 6219 contact each other. Therefore, the wire 6219 functions as an auxiliary electrode of the opposing electrode 6214, and the resistance of the opposing electrode 6214 can be reduced. Consequently, the thickness of the opposing electrode 6214 can be made thin and the light transmission can be increased. Accordingly, in a top emission structure of taking out light of the light emitting element 6212 from the top surface, high luminance can be obtained.

It is to be noted that the opposing electrode 6214 may be formed of a stacked layer of a metal thin film and a transparent conductive film (indium tin oxide (ITO), indium zinc oxide (IZO), zinc oxide (ZnO), or the like) in order to further reduce the resistance thereof. By using the thin metal film and the transparent conductive film as described above, a cathode which can transmit light can be formed.

It is to be noted that the impurity region 6204 is doped with a p-type impurity while the impurity region 6220 is doped with an n-type impurity. Therefore, a transistor 6215 is a p-type transistor and a transistor 6223 is an n-type transistor.

That is, the transistor 6215 corresponds to the driving transistor 6101 of the pixel shown in FIG. 61, and the transistor 6223 corresponds to the complementary transistor 6108 of the pixel in FIG. 61. In addition, the wire 6219 corresponds to the wire 6110 of the pixel in FIG. 61, and the opposing electrode 6214 corresponds to the cathode 6109 of the light emitting element 6104 of the pixel in FIG. 61. Thus, the wire 6110 and the cathode 6109 of the light emitting element 6104 are connected to each other in the pixel shown in FIG. 61.

Figure 62:
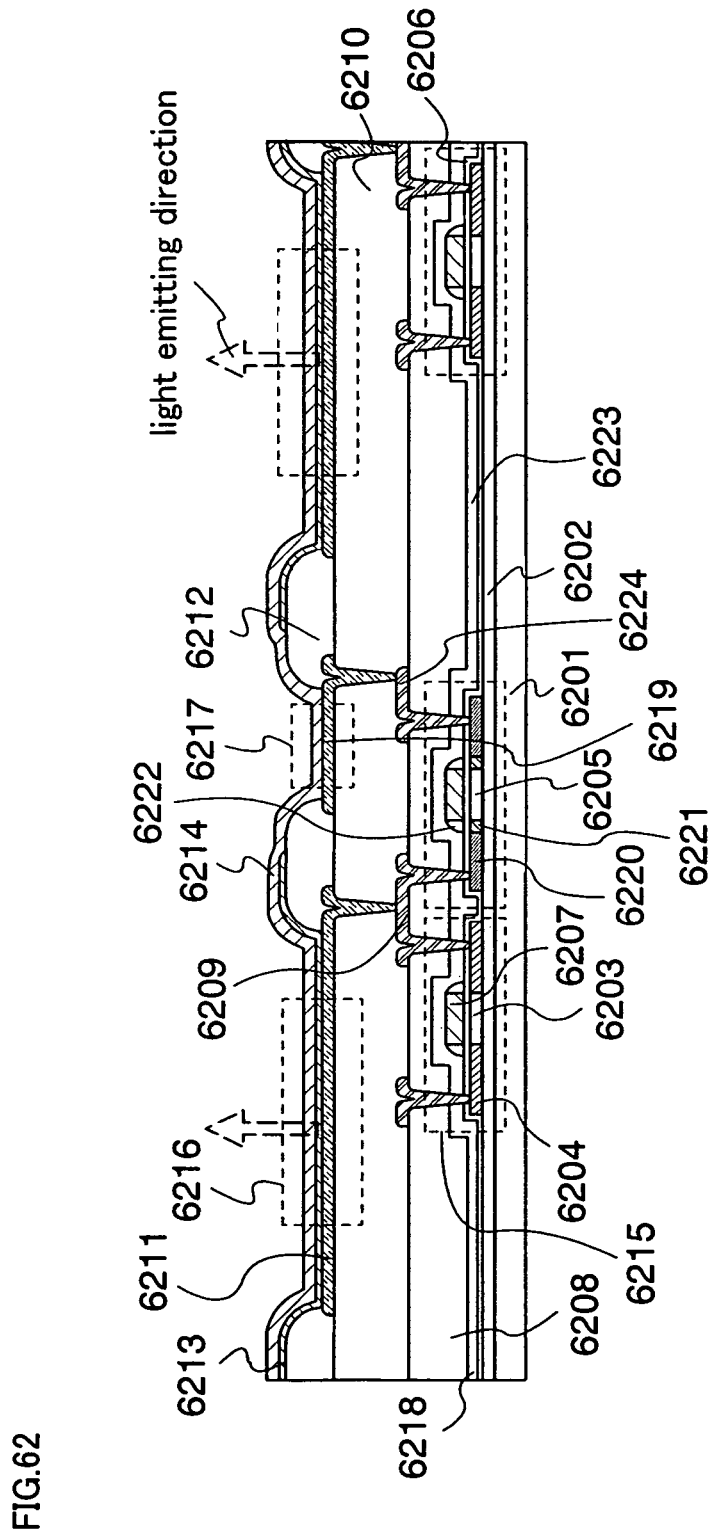
FIG. 62 is a cross sectional view of a display panel of the invention.

It is to be noted that the thickness of the opposing electrode 6214 can be made thin in the display panel illustrated in FIG. 62, thereby the translucency of light emitted from the top surface is high. Accordingly, the luminance of the top emission can be increased. In addition, by connecting the opposing electrode 6214 and the wire 6219 to each other, the resistance of the opposing electrode 6214 and the wire 6219 can be reduced, thereby reduction in power consumption can be achieved. Therefore, for example, the wire 7902 and the opposing electrode 7308 of the light emitting element 7304 may be connected to each other in the pixel shown in FIG. 79.

Next, constitution of a display panel is described with reference to pattern diagrams of FIGS. 63*a* and 63*b*. A signal line driver circuit 6301, a scan line driver circuit 6302, and a pixel region 6303 are formed on a substrate 6300. It is to be noted that the substrate 6300 is connected to an FPC (Flexible Printed Circuit) 6304, and signals such as a video signal, a clock signal, and a start signal input to the signal line driver circuit 6301 and the scan line driver circuit 6302 are supplied through the FPC 6304 which is an external input terminal. Onto a junctional region between the FPC 6304 and the substrate 6300, an IC chip (a semiconductor chip provided with a memory circuit, a buffer circuit, or the like) 6305 is mounted by COG (Chip On Glass) or the like. It is to be noted that although only the FPC 6304 is illustrated here, a printed wiring board (PWB) may be attached to the FPC 6304. A display device in this specification includes not only a main body of a display panel, but also the main body of the display panel provided with an FPC or a PWB, and besides, the main body of the display panel mounted with an IC chip or the like.

Figure 63B:
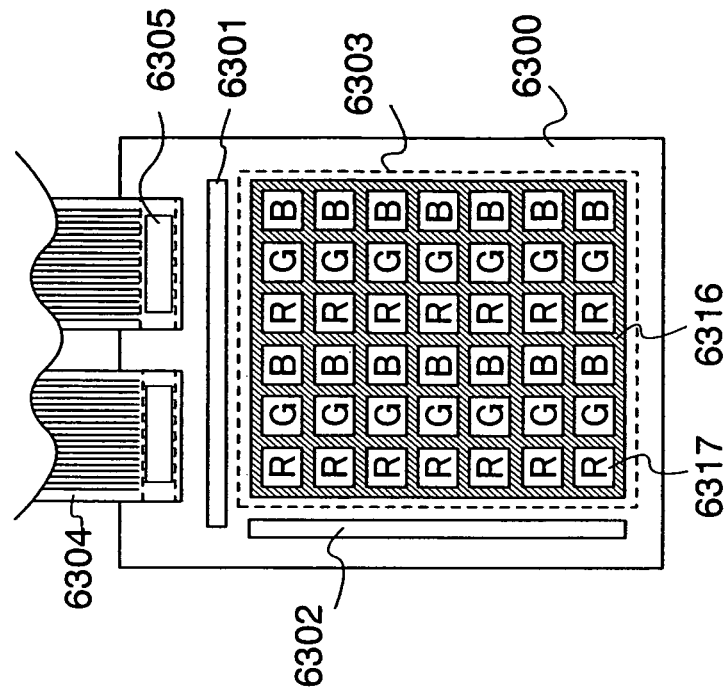
FIGS. 63a and 63b are pattern diagrams respectively showing constitution of a display panel of the invention.
Figure 63A:
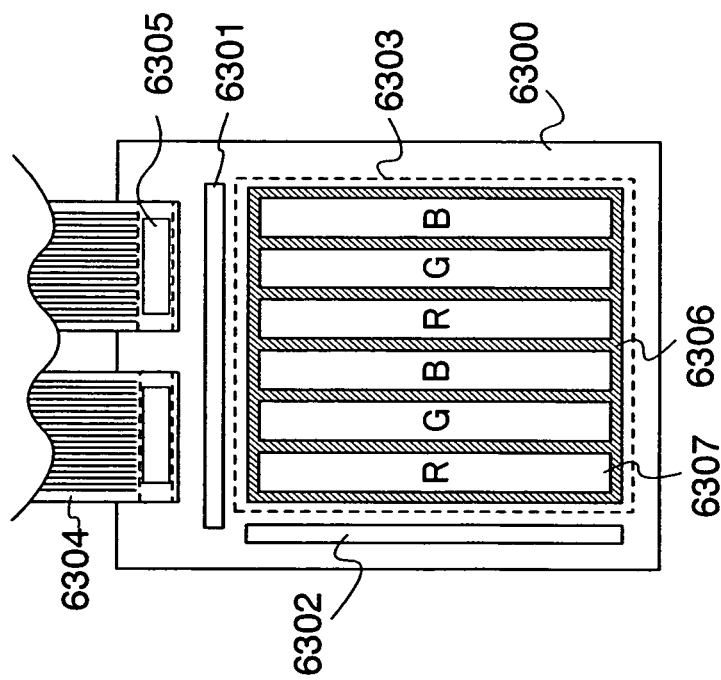
Figure 64:
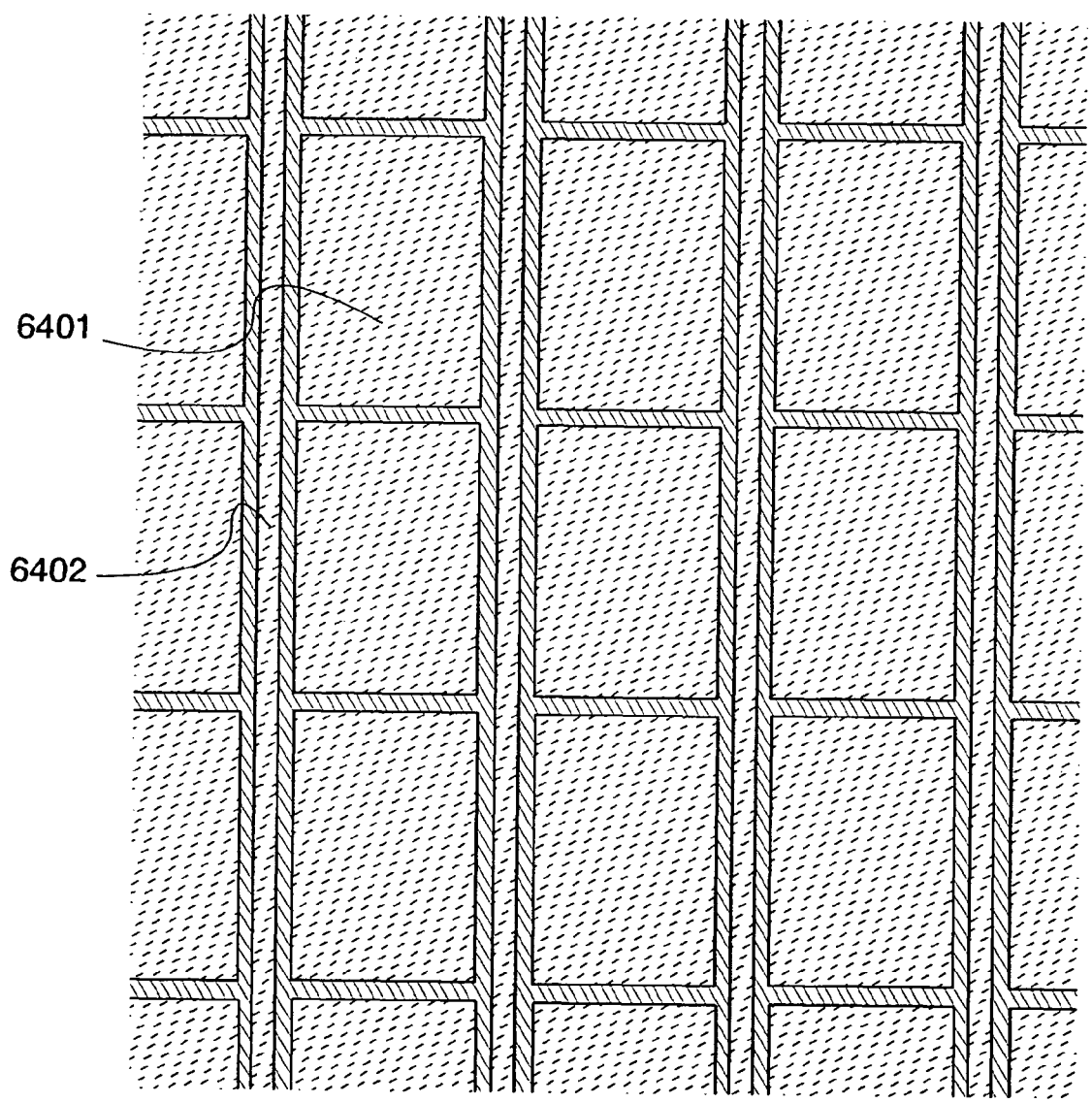
FIG. 64 is a pattern diagram of a pixel region of a display panel of the invention.

Pixels are arranged in matrix in the pixel region 6303 of the display panel shown in FIG. 63*a* so as to form a pixel column for each color. A layer containing an organic compound 6307 is provided for pixels of one column for each color. In addition, in a region 6306 other than the region where the layers containing an organic compound 6307 are provided, a junctional region between a wire formed of the same material as a pixel electrode and an opposing electrode is formed in the pixel region. That is, the junction region 6217 shown in the cross sectional view of FIG. 62 is formed in the region 6306 in FIG. 63*a*. FIG. 64 is a top pattern diagram of the pixel region. In FIG. 64, a wire 6402 is formed of the same material as a pixel electrode 6401. In addition, the pixel electrode 6401 corresponds to the pixel electrode 6211 in FIG. 62 and the wire 6402 corresponds to the wire 6219 in FIG. 62. A layer containing an organic compound is formed for the pixel electrodes 6401 of one column, and a light emitting element is formed in a region where the layer containing an organic compound is sandwiched between the pixel electrode 6401 and an opposing electrode. In a junctional region where the opposing electrode and the wire 6402 contact each other, the resistance of the opposing electrode can be reduced. That is, the wire 6402 functions as an auxiliary electrode of the opposing electrode. It is to be noted that by applying the configuration of a pixel region as shown in FIG. 64, a display panel which has a high opening ratio and reduces the resistance of the opposing electrode can be provided.

Figure 65:
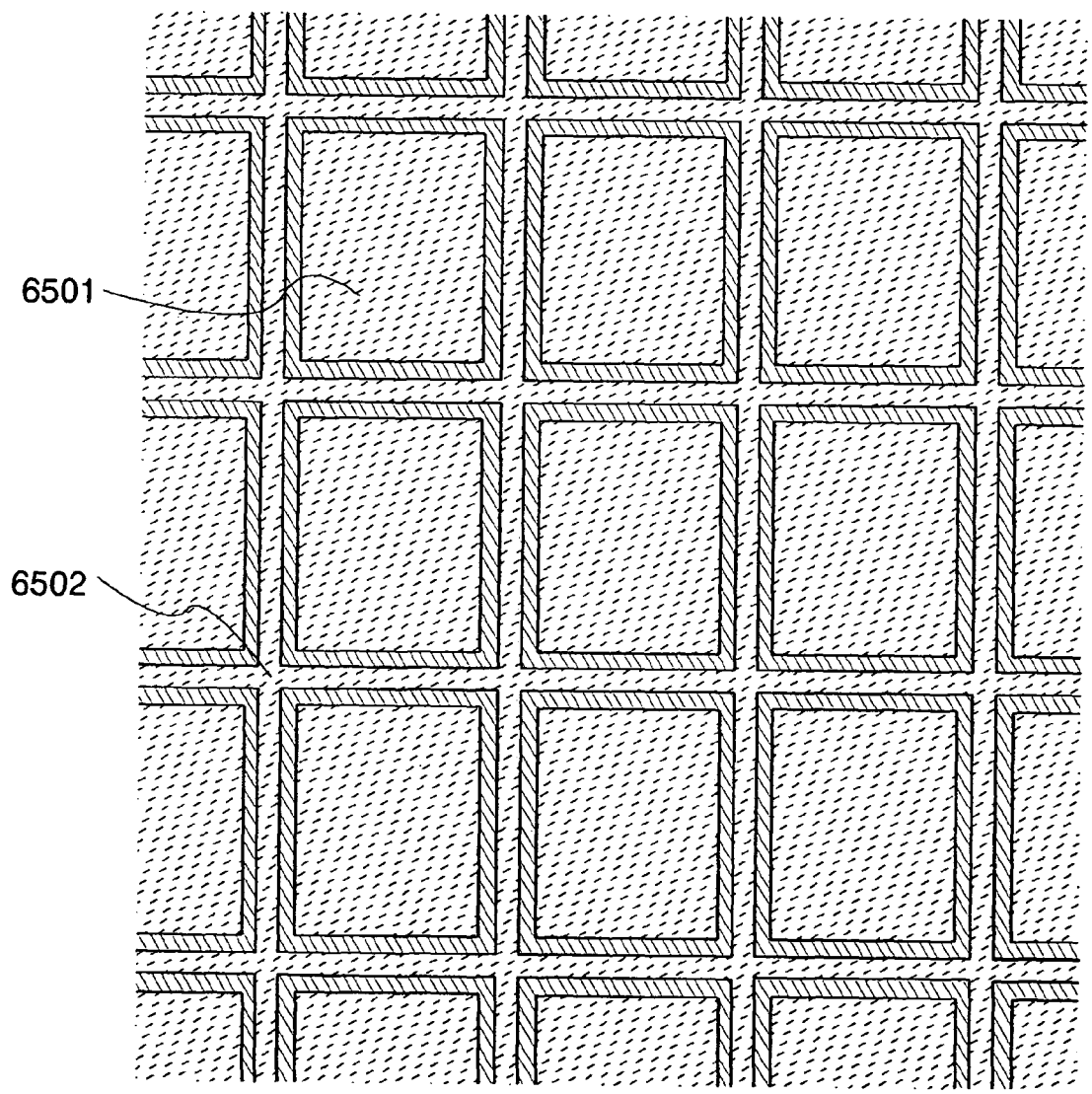
FIG. 65 is a pattern diagram of a pixel region of a display panel of the invention.

Pixels are arranged in matrix in the pixel region 6303 of the display panel shown in FIG. 63*b* so as to form a pixel column for each color. A layer containing an organic compound 6317 is provided for each pixel of one column for each color. In addition, in a region 6316 other than the region where the layers containing an organic compound 6317 are provided, a junctional region between a wire formed of the same material as a pixel electrode and an opposing electrode is formed in the pixel region. That is, the junctional region 6217 in the cross sectional diagram of FIG. 62 is formed in the region 6316 in FIG. 63*b*. FIG. 65 is a top pattern diagram of the pixel region. In FIG. 65, a wire 6502 is formed of the same material as a pixel electrode 6501. In addition, the pixel electrode 6501 corresponds to the pixel electrode 6221 in FIG. 62 and the wire 6502 corresponds to the wire 6219 in FIG. 62. A layer containing an organic compound is formed for each pixel electrode 6401, and a light emitting element is formed in a region where the layer containing an organic compound is sandwiched between the pixel electrode 6501 and an opposing electrode. In a junctional region where the opposing electrode and the wire 6502 contact each other, the resistance of the opposing electrode can be reduced. That is, the wire 6502 functions as an auxiliary electrode of the opposing electrode. It is to be noted that by applying the configuration of a pixel region as shown in FIG. 65, a display panel which reduces the resistance of the opposing electrode can be provided.

The display panel described in this embodiment mode has high translucency of the opposing electrode and a high opening ratio of the pixel, so that necessary luminosity can be obtained even if the luminance is reduced. Therefore, the reliability of the light emitting element can be improved. In addition, reduction in resistance of the opposing electrode can be achieved as well, thereby power consumption can be reduced.

Embodiment Mode 8

In this embodiment mode, more preferable constitution of a display device having the pixel configuration described in Embodiment Mode 1, Embodiment Mode 2, Embodiment Mode 3, Embodiment Mode 4, Embodiment Mode 5, or Embodiment Mode 6 is described.

According to a display device in this embodiment mode, a buffer circuit is provided in the scan line, the signal line, and the potential supply line. That is, a signal from the scan line driver circuit is input to the buffer circuit, and a signal is output from the buffer circuit to the scan line. In addition, a signal from the signal line driver circuit is input to the buffer circuit, and a signal is output from the buffer circuit to the signal line. In addition, a signal from the potential supply line driver circuit is input to the buffer circuit, and a signal is output from the buffer circuit to the potential supply line. In this manner, impedance transformation of an output signal of the scan line driver circuit, the signal line driver circuit, or the potential supply line driver circuit is performed to improve the current supply capability.

It is to be noted that instead of providing a buffer circuit in the scan line, the signal line or the potential supply line, a buffer circuit may be provided in the scan line driver circuit, the signal line driver circuit, or the potential supply line driver circuit so that the current supply capability of an output of such driver circuit may be improved.

Basic constitution of the display device described in this embodiment mode is described with reference to FIG. 13. In Embodiment Mode 8, the same reference numerals are used for the potions same as those in the display device described with reference to FIG. 2.

Each of the scan lines R1 to Rm controls the switches of pixels of one row. For example, in the case where a transistor is used as the switch, gate terminals of the switching transistors of the pixels of respective rows are connected to the scan lines R1 to Rm. In addition, the switching transistors of one row are required to be turned on all at once. In particular, as the resolution is increased, the number of transistors to be turned on all at once is increased. Therefore, a buffer circuit used in this embodiment mode preferably has high current supply capability.

In addition, signals set to the first terminals of the driving transistors 206 from the potential supply lines I1 to Im are required to supply current to the driving transistors 206 and the light emitting elements 209 of the pixels of respective rows. Therefore, a signal input to in particular the potential supply lines I1 to Im preferably has high current supply capability.

Figure 13:
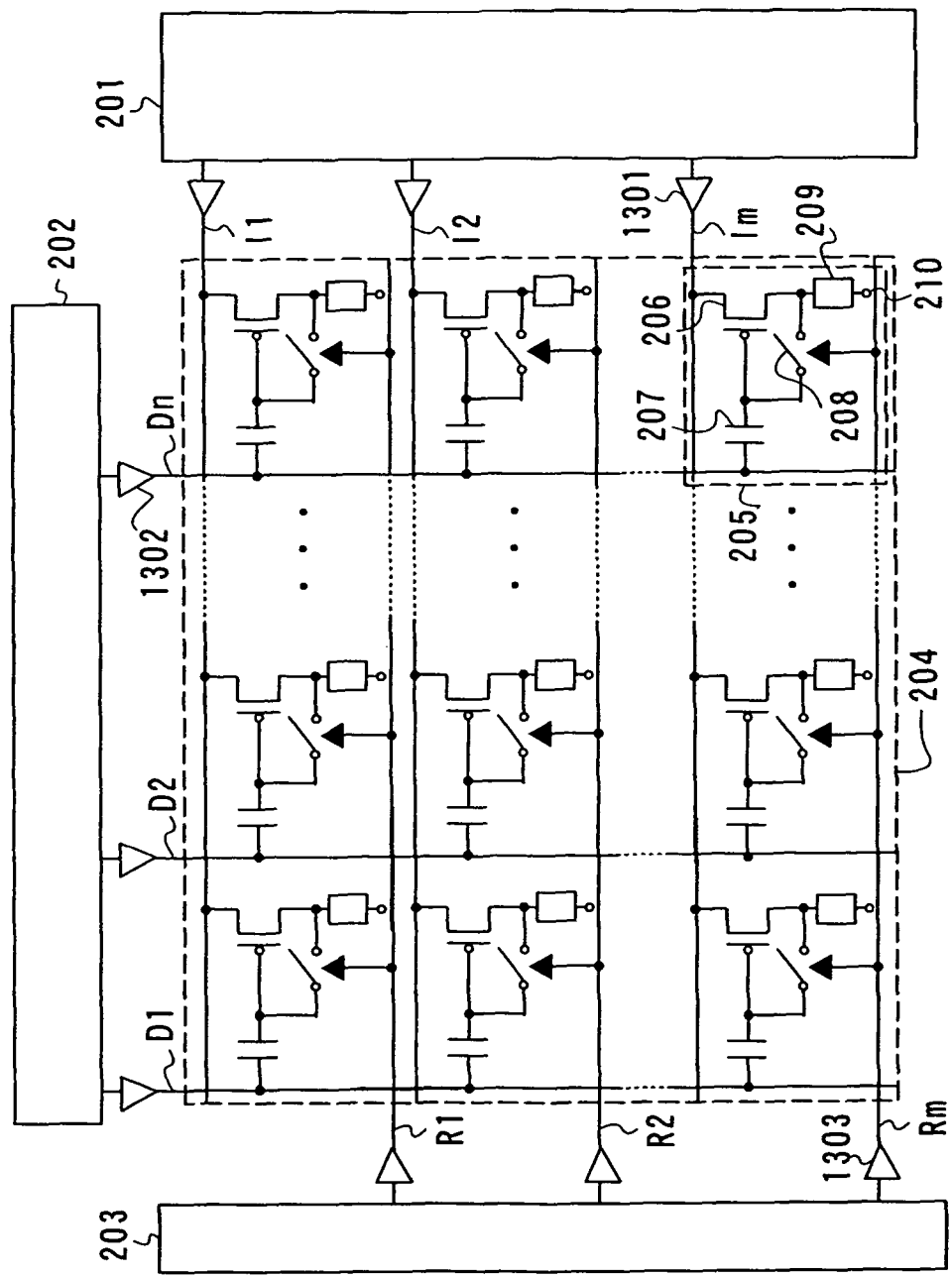
FIG. 13 is a diagram illustrating a display device having a pixel configuration of the invention.
Figure 14:
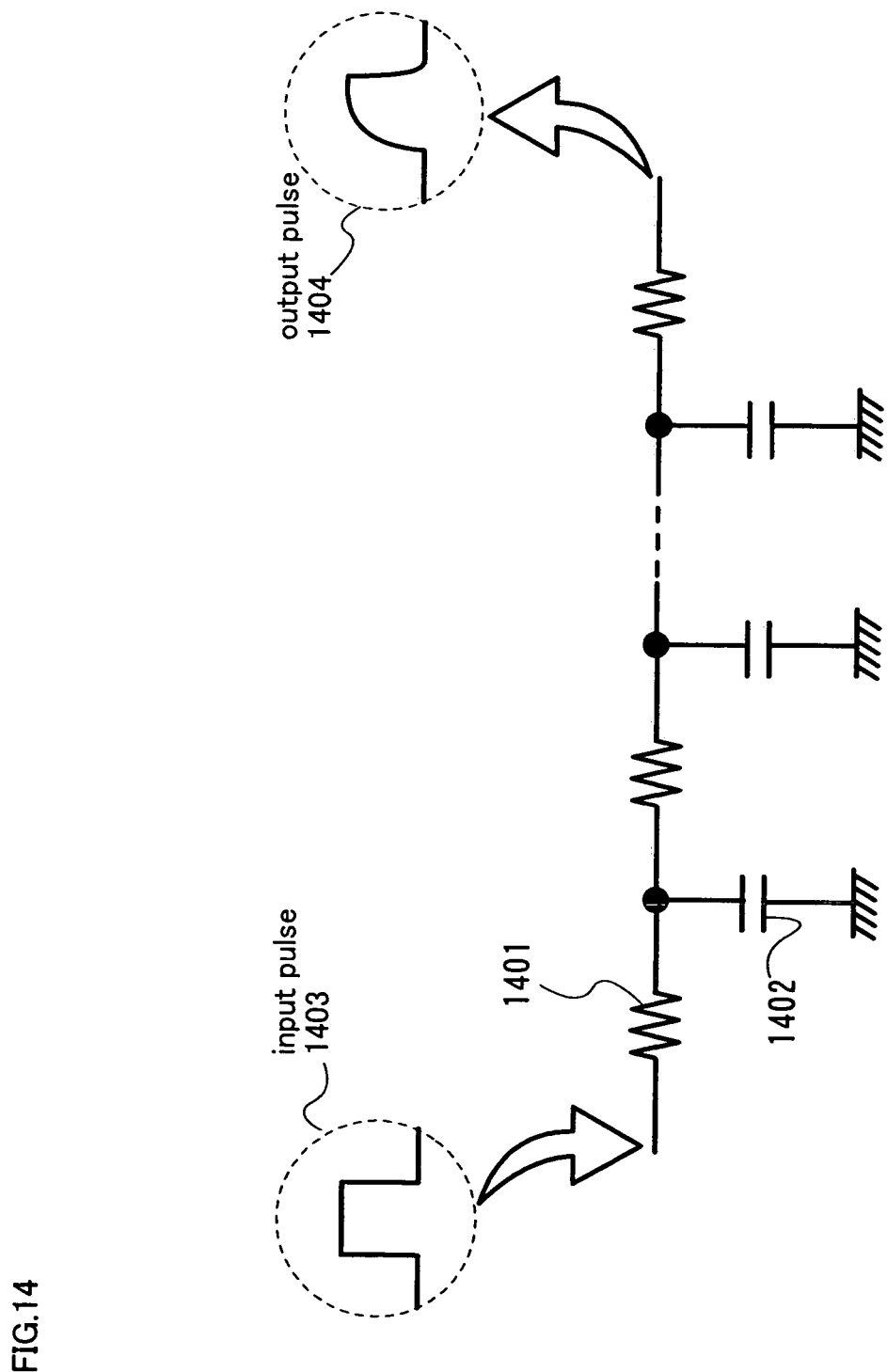
FIG. 14 is a diagram illustrating generation of signal delay in rising and falling.

In addition, each of the scan lines R1 to Rm and the potential supply lines I1 to Im of the display device shown in FIG. 13 has wire resistance, and parasitic capacitance (intersection capacitance) is formed at an intersection between the signal lines D1 to Dn and the scan lines R1 to Rm or the potential supply lines I1 to Im. Therefore, each of the scan lines R1 to Rm can be expressed by an equivalent circuit as shown in FIG. 14 using a resistor 1401 and a capacitor 1402.

If an input pulse 1403 having a rectangular waveform is input to this equivalent circuit, a response wave thereof has a waveform having the dullness as an output pulse 1404. That is, rising and falling of the pulse are delayed. Consequently, the switch 208 does not turn on at the normal timing, so that accurate writing of a video signal to the pixel cannot be performed. In the display device in this embodiment mode, therefore, by improving the current supply capability through a buffer circuit, of a signal output from the scan line, the dullness of the signal output can be reduced. Similarly, the same can be applied to the potential supply lines I1 to Im. In particular, each of the potential supply lines I1 to Im is required to have the current supply capability enough that the light emitting elements 210 of the pixels 205 of one row emit light, therefore, impedance transformation of a signal thereof is performed by a buffer circuit to improve the current supply capability.

Similarly, if parasitic capacitance is formed in the signal lines D1 to Dn, setting of an analog signal potential corresponding to a video signal is delayed, so that accurate writing of a signal to the pixel cannot be performed. Therefore, in the display device described in this embodiment mode, it is preferable to supply the signal output from the signal line through a buffer circuit as well so that the current supply capability is improved.

In the display device shown in FIG. 13, signals output from the potential supply line driver circuit 201 are input to the potential supply lines I1 to Im through respective buffer circuits 1301 provided in the potential supply lines I1 to Im. That is, by inputting through the buffer circuit 1301, current supply capability of the signal output from the potential supply line driver circuit 201 is increased. Similarly, buffer circuits 1302 are provided in the scan lines R1 to Rm respectively. In addition, buffer circuits 1303 are provided in the signal lines D1 to Dn respectively. It is to be noted that analog buffer circuits are used as the buffer circuits 803.

Consequently, signals output from each driver circuit have high current supply capability, so that the dullness of a pulse signal as described above can be reduced. As a result, switching transistors of pixels of one row can be turned on quickly and video signal writing can be performed quickly. Accordingly, a writing period of pixels can be shortened.

Described next is an example of a buffer circuit which can be used in this embodiment mode. Hereinafter, as for a buffer circuit, a terminal to which an input potential Vin is input is called an input terminal while a terminal from which an output potential Vout is output is called an output terminal.

Figure 15A:
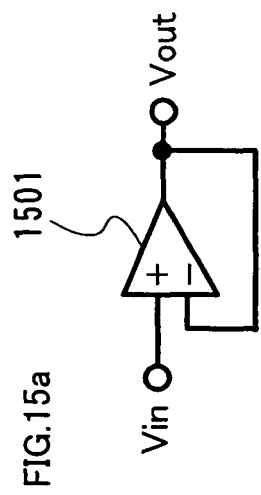
FIGS. 15a to 15d are diagrams each showing a buffer circuit applicable to a display device having a pixel configuration of the invention.

For example, an input terminal of a voltage follower circuit 1501 as shown in FIG. 15a is connected to an output terminal of the signal line driver circuit while an output terminal of the voltage follower circuit 1501 is connected to the signal line. The voltage follower circuit used as a buffer circuit is preferably formed on an IC chip which can form transistors having less variation of the characteristics. It is to be noted in this specification that an IC chip means a separated integrated circuit on a chip after being formed over a substrate. In particular, an IC chip is preferably formed by forming a circuit over a single-crystalline silicon wafer used as a substrate, by element separation and the like, and then cutting the single-crystalline silicon wafer in an arbitrary shape.

Accordingly, when the voltage follower circuit 1501 is adopted as a buffer circuit, an IC chip provided with the buffer circuit in addition to the scan line driver circuit, the signal line driver circuit and the potential supply line driver circuit is preferably mounted onto a display panel by COG (Chip On Glass) or the like. It is to be noted that although the voltage follower circuit can be applied to the buffer circuit 1301, the buffer circuit 1302 and the buffer circuit 1303 in the display device shown in FIG. 13, the voltage follower circuit which functions as an analog buffer circuit is particularly suitable for the buffer circuit 1302.

Figure 15B:
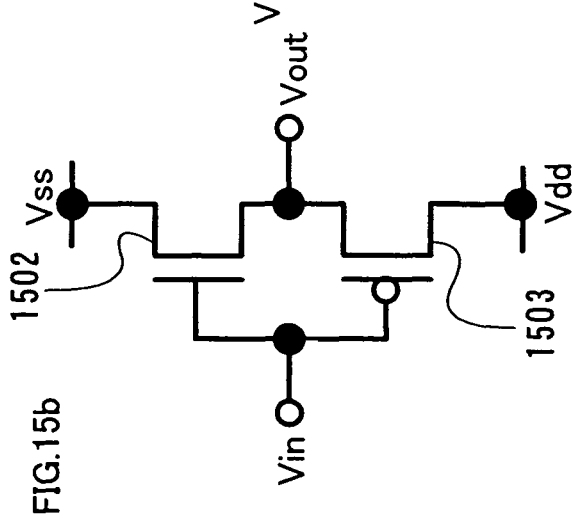

Alternatively, an inverter which is constituted by an n-type transistor 1502 and a p-type transistor 1503 as shown in FIG. 15b may be used as a buffer circuit. A gate terminal of the n-type transistor 1502 and a gate terminal of the p-type transistor 1503 are both connected to an input terminal, to which an input potential Vin is input. A source terminal of the n-type transistor 1502 is connected to a power supply potential Vss, and a drain terminal thereof and a drain terminal of the p-type transistor 1503 are connected to an output terminal. The output terminal outputs an output potential Vout. A plurality of inverters connected in series can be used as a buffer circuit. In this case, the current supply capability of the inverter in the next stage to which the output potential Vout output from the inverter is preferably about three times, thereby current supply capability can be improved efficiently; that is, in the case where a potential output from an inverter input first is input to an inverter of the next stage, an inverter having the current supply capability which is three times larger is connected in series. Even numbers of inverters connected in this manner can be used as a buffer circuit. It is to be noted that the current supply capability can be controlled by controlling the ratio of the channel width W to the channel length L, W/L when the n-type transistor 1502 and the p-type transistor 1503 are designed. It is to be noted that a buffer circuit using the inverter as shown in FIG. 15b can be applied to the buffer circuit 1301 and the buffer circuit 1303 in the display device in FIG. 13. Such a buffer circuit using the inverter can be structured simply, and the buffer circuit can be provided over the same substrate as well in the case where the scan line driver circuit and the signal line driver circuit are formed over the same substrate in addition to pixels to manufacture a display panel having thin film transistors. By forming the buffer circuit over the same substrate, cost reduction can be realized. In addition, in a CMOS inverter constituted by the n-type transistor 1502 and the p-type transistor 1503 as shown in FIG. 15b, current flows through the n-type transistor 1502 and the p-type transistor 1503 when a potential near a logic threshold value Vinv of the inverter is input to the input terminal; however, one transistor of them is turned off when a potential of H level or L level is input to the input terminal, so that wasteful consumption of power can be prevented. Accordingly, reduction of power consumption can be realized by using a CMOS inverter as shown in FIG. 15b.

Figure 15C:
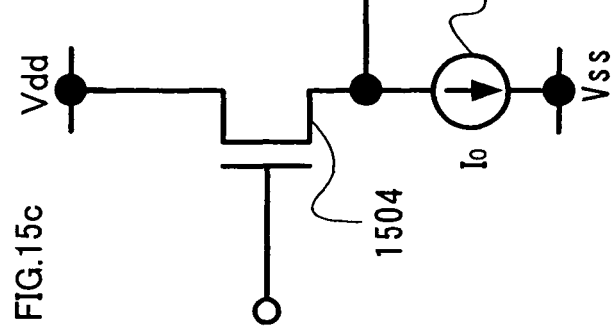

Further alternatively, a buffer circuit can be formed using a source follower circuit as shown in FIG. 15c. It is constituted by a source follower transistor 1504 and a current source 1505, in which a gate terminal of the source follower transistor 1504 is connected to an input terminal, a drain terminal thereof is connected to a wire to which a power supply potential Vdd is set, and a source terminal thereof is connected to one terminal of the current source 1505 and an output terminal. The other terminal of the current source 1505 is connected to a wire to which a low power supply potential Vss is set. An output voltage Vout can be expressed by the following formula (1), using a gate-source voltage Vgs of the source follower transistor 1504.

$$Vout=Vin-Vgs \tag{1}$$

Here, Vgs is a voltage required for flowing a current $I_0$ by the source follower transistor 1504.

Therefore, the output voltage Vout is lower than the input potential Vin by Vgs. However, if a signal input to an input potential Vin is a digital signal, the source follower circuit can be used as a buffer circuit even when there are variations of the gate-source voltage Vgs of the source follower transistor 1504. Accordingly, the source follower circuit can be used as the buffer circuit 1301 or the buffer circuit 1303 in the display device shown in FIG. 13.

Such a source follower circuit as shown in FIG. 15c has a simple structure and can be manufactured easily using a thin film transistor. Therefore, the buffer circuit can be provided over the same substrate in the case where the scan line driver circuit and the signal line driver circuit are formed over the same substrate in addition to pixels to manufacture a display panel having thin film transistors. By forming the buffer circuit over the same substrate, cost reduction can be realized.

Furthermore, by using an n-type transistor as the source follower transistor 1504 as shown in FIG. 15c, in the case of forming a display panel provided with the pixels, the scan line driver circuit, the signal line driver circuit, the potential supply line driver circuit, and the buffer circuit over the same substrate, a display panel of a single conductivity type which is constituted only by n-type transistors can be manufactured.

Figure 15D:
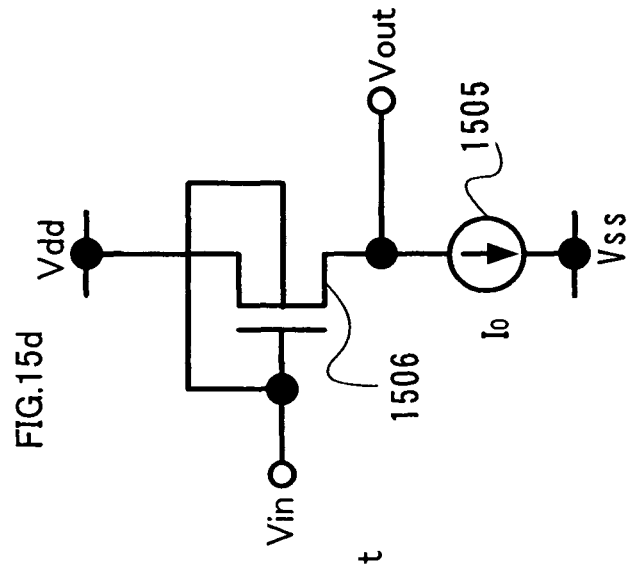

In the case where a source follower circuit is used as a buffer circuit also, by forming a source follower transistor 1506 to have a dual gate as shown in FIG. 15d, the threshold voltage of the transistor can be reduced. Note that constitution other than the source follower transistor 1506 is the same as FIG. 15c, and therefore, they are denoted by the same reference numerals and description thereof is omitted here.

If the threshold voltage Vth is reduced according to the source follower transistor circuit as shown in FIG. 15d, and variations of transistors each constituting a source follower transistor are reduced, the source follower circuit can also be used as an analog buffer circuit. Therefore, the source follower circuit as shown in FIG. 15d can be applied not only to the buffer circuit 1301 and the buffer circuit 1303, but also to the buffer circuit 1302 in the display device shown in FIG. 13.

Alternatively, a configuration shown in FIG. 116b can be applied to a buffer circuit. A source follower circuit is constituted by a source follower transistor 1604, a capacitor 1605, a first switch 1606, a second switch 1607, a third switch 1608, a current source 1609, and a voltage source 1610. A drain terminal of the source follower transistor 1604 is connected to a wire to which a power supply potential Vdd is set, and a source terminal thereof is connected to an output terminal, a wire to which a low power supply potential Vss is set through the current source 1609, and one terminal of the first switch 1606. The other terminal of the first switch 1606 is connected to one terminal of the capacitor, and to an input terminal through the third switch 1608. The other terminal of the capacitor 1605 is connected to a gate terminal of the source follower transistor 1604, and to the wire to which the low power supply potential Vss is set through the second switch 1607 and the voltage source 1610.

Figure 16B:
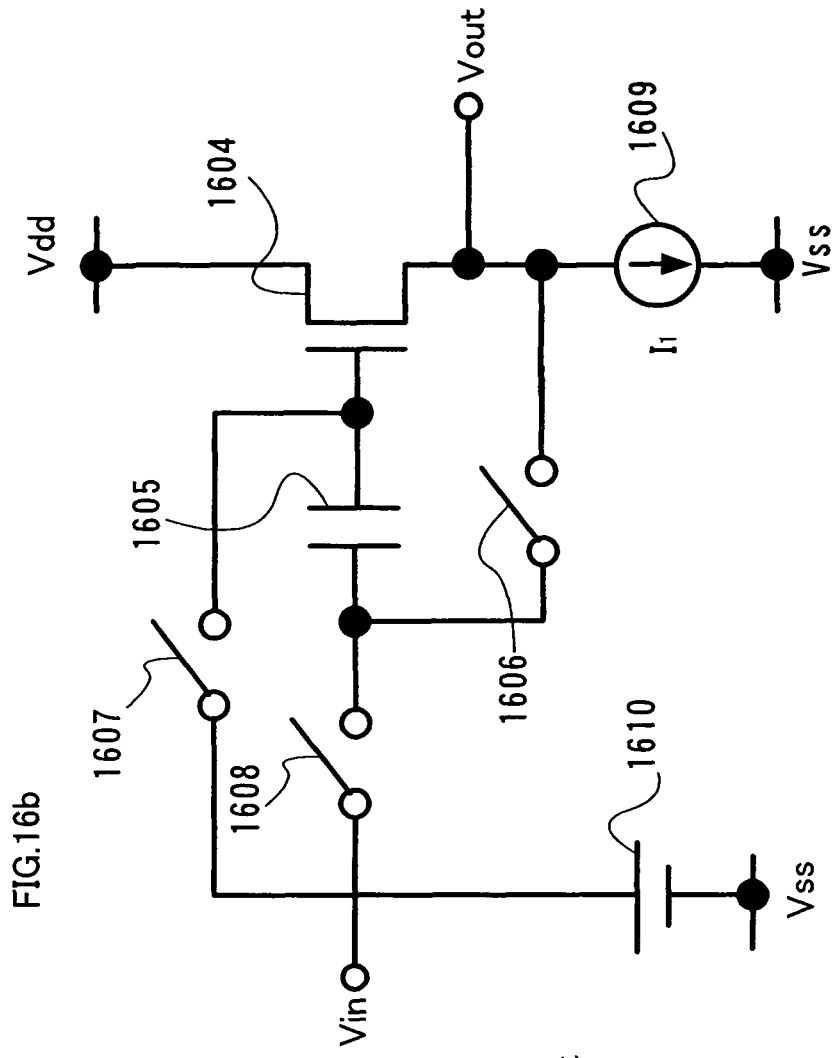
FIGS. 16a and 16b are diagrams each showing a buffer circuit applicable to a display device having a pixel configuration of the invention.

Operation of the source follower circuit shown in FIG. 16b is described briefly. The first switch 1606 and the second switch 1607 are turned on in a precharging period. Then, the capacitor 1605 stores charge such that the source follower transistor 1604 has a gate-source voltage Vgs required for flowing a current $I_0$. Then, the first switch 1606 and the second switch 1607 are turned off, thereby the capacitor 1605 holds the gate-source voltage Vgs of the source follower transistor 1604. Then, the third switch 1608 is turned on, so that an input potential Vin is input to the input terminal while the capacitor 1605 holds the gate-source voltage Vgs. Accordingly, to the gate terminal of the source follower transistor 1604 which is connected to the other terminal of the capacitor 1605, a potential obtained by adding the gate-source voltage Vgs to the input potential Vin is set. On the other hand, an output potential Vout output from the output terminal is a potential obtained by subtracting the gate-source voltage Vgs from a potential of the gate terminal of the source follower transistor 1604. Consequently, the potential output from the output terminal and the potential input to the input terminal become equal to each other, namely Vin=Vout.

Therefore, the source follower circuit shown in FIG. 16b can be applied not only to the buffer circuit 1301 and the buffer circuit 1303, but also to the buffer circuit 1302 which improves the current supply capability of a video signal in the display device shown in FIG. 13.

In addition, the source follower circuit shown in FIG. 16b can be structured more simply than a voltage follower circuit, so that in the case of forming a display panel having a thin film transistor provided with the pixels, the scan line driver circuit, the signal line driver circuit, and the potential supply line driver circuit over the same substrate, it can be formed over the same substrate as a buffer circuit. Furthermore, the source follower circuit shown in FIG. 16b can be configured by transistors having the same conductivity type, and therefore, a display panel of a single conductivity type can be manufactured.

It is to be noted that as the current sources 1505 shown in FIGS. 15c and 15d and the current source 1609 shown in FIG. 16b, a transistor which operates in a saturation region, a resistor, or a rectifying element can be used. As the rectifying element, specifically, a pn junction diode or a diode connected transistor can be used as well.

Figure 16A:
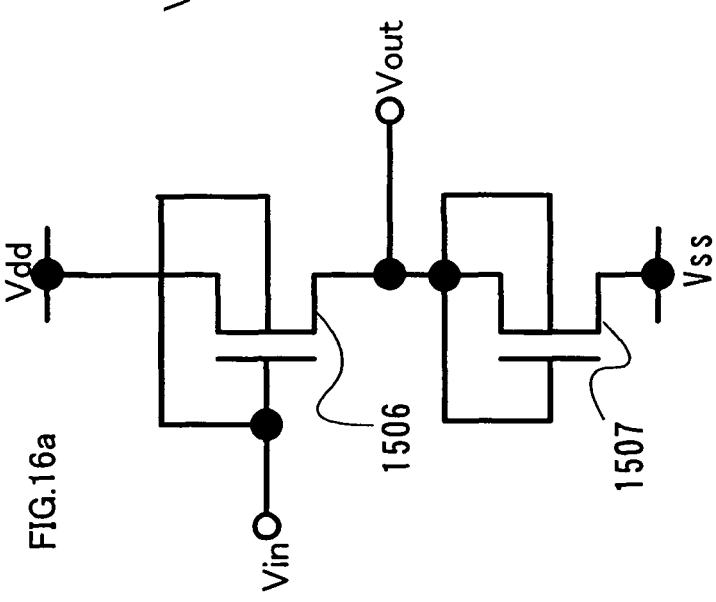

Here, the case where a diode connected transistor is applied to the current source 1505 in FIG. 15d is described with reference to FIG. 16a. It is constituted by the source follower transistor 1506 and a diode connected transistor 1507. A drain terminal of the source follower transistor 1506 is connected to the wire to which the power supply potential Vdd is set, and a source terminal thereof is connected to a drain terminal of the diode connected transistor 1507 and the output terminal. In addition, the drain terminal and a gate terminal of the diode connected transistor 1507 are connected to each other, and a source terminal thereof is connected to the wire to which the low potential Vss is set.

The pixel configuration applicable to the display device in this embodiment mode is not limited to the configuration shown in FIG. 13, and various pixel configurations described in Embodiment Mode 2, Embodiment Mode 3, Embodiment Mode 4, and Embodiment Mode 5 can be applied. In addition, a buffer circuit may not be provided in all of scan lines, signal lines, or potential supply lines to which an output of a scan line driver circuit, a signal line driver circuit, or a potential supply line driver circuit is input, and can be provided arbitrarily. Since the signal output from the potential supply line driver circuit is required to have a current for flowing current to the light emitting elements of pixels of one row in particular, only the buffer circuits 1303 on the potential supply line driver circuit side may be provided in the configuration shown in FIG. 13 for example.

Embodiment Mode 9

Described in this embodiment mode are a scan line driver circuit, a signal line driver circuit, and a potential supply line driver circuit of a display device having the pixel configuration of the invention. That is, a scan line driver circuit, a signal line driver circuit, and a potential supply line driver circuit described in this embodiment mode can be arbitrarily used in a display device having the pixel configuration described in Embodiment Mode 1, Embodiment Mode 2, Embodiment Mode 3, Embodiment Mode 4, or Embodiment Mode 5, or the display device described in Embodiment Mode 6 or Embodiment Mode 7.

Figure 25A:
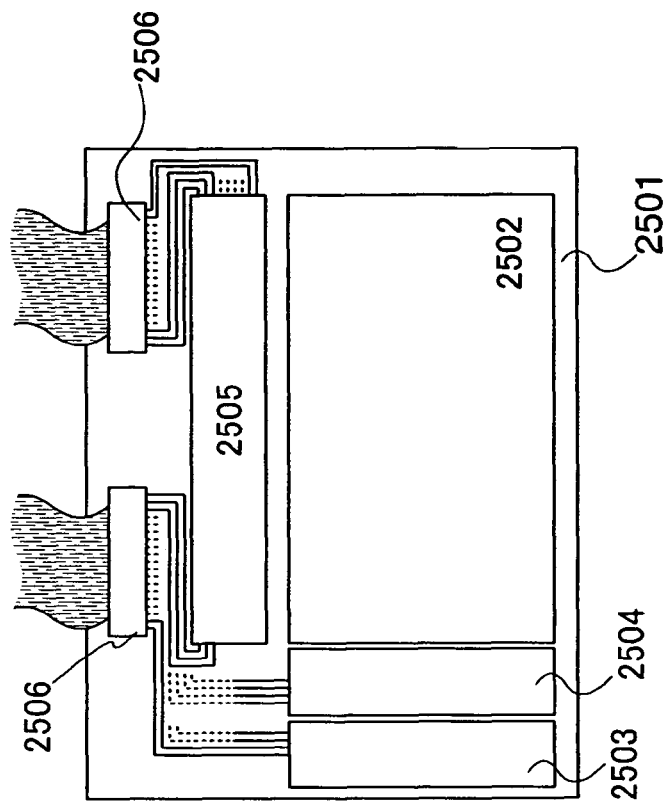
FIGS. 25a and 25b are pattern diagrams respectively of a display device of the invention.

In a display device shown in FIG. 25*a*, a pixel region 2502 provided with a plurality of pixels is formed over a substrate 2501, and a potential supply line driver circuit 2503, a scan line driver circuit 2504, and a signal line driver circuit 2505 are formed in the periphery of the pixel region 2502. The potential supply line driver circuit 2503 corresponds to the potential supply line driver circuit 201 in FIG. 2, the scan line driver circuit 2504 corresponds to the scan line driver circuit 202 in FIG. 2, and the signal line driver circuit 2505 corresponds to the signal line driver circuit 203 in FIG. 2.

Signals are input to the potential supply line driver circuit 2503, the scan line driver circuit 2504, and the signal line driver circuit 2505 externally through FPCs (Flexible Print Circuits) 2506.

It is to be noted that an IC chip may be mounted onto the FPCs 2506 by COG (Chip On Glass), TAB (Tape Automated Bonding), or the like, although not shown. That is, a part of memory circuits, buffer circuits, or the like of the potential supply line driver circuit 2503, the scan line driver circuit 2504, and the signal line driver circuit 2505 which are difficult to be formed over the same substrate as the pixel region 2502 may be formed on an IC chip to be mounted in a display device.

Figure 25B:
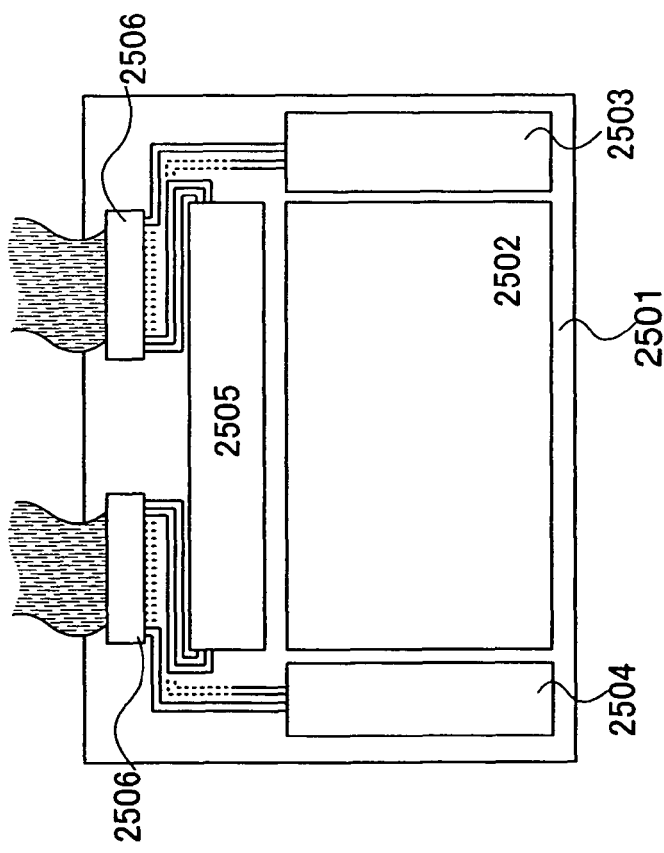

In addition, as shown in FIG. 25*b*, the potential supply line driver circuit 2503 and the scan line driver circuit 2504 may be provided on one side of the pixel region 2502. It is to be noted that the display device shown in FIG. 25*b* is different from the display device shown in FIG. 25*a* only in the arrangement of the potential supply line driver circuit 2503, therefore, the same reference numerals are used. In addition, constitution in which one driver circuit performs a function of the potential supply line driver circuit 2503 and the scan line driver circuit 2504 may be adopted.

Subsequently, constitution examples of the signal line driver circuit 2505 of the display devices shown in FIGS. 25*a* and 25*b* are described. The signal line driver circuit is a driver circuit for setting signals to the signal lines (D1 to Dn) of the display device shown in FIG. 2. A signal line driver circuit shown in FIG. 31*a* includes a pulse output circuit 3101, a first latch circuit 3102, a second latch circuit 3103, a D/A converter circuit (a digital/analog converter circuit) 3104, a writing period/light emitting period selection circuit 3105, and an analog buffer circuit 3106.

Figure 33:
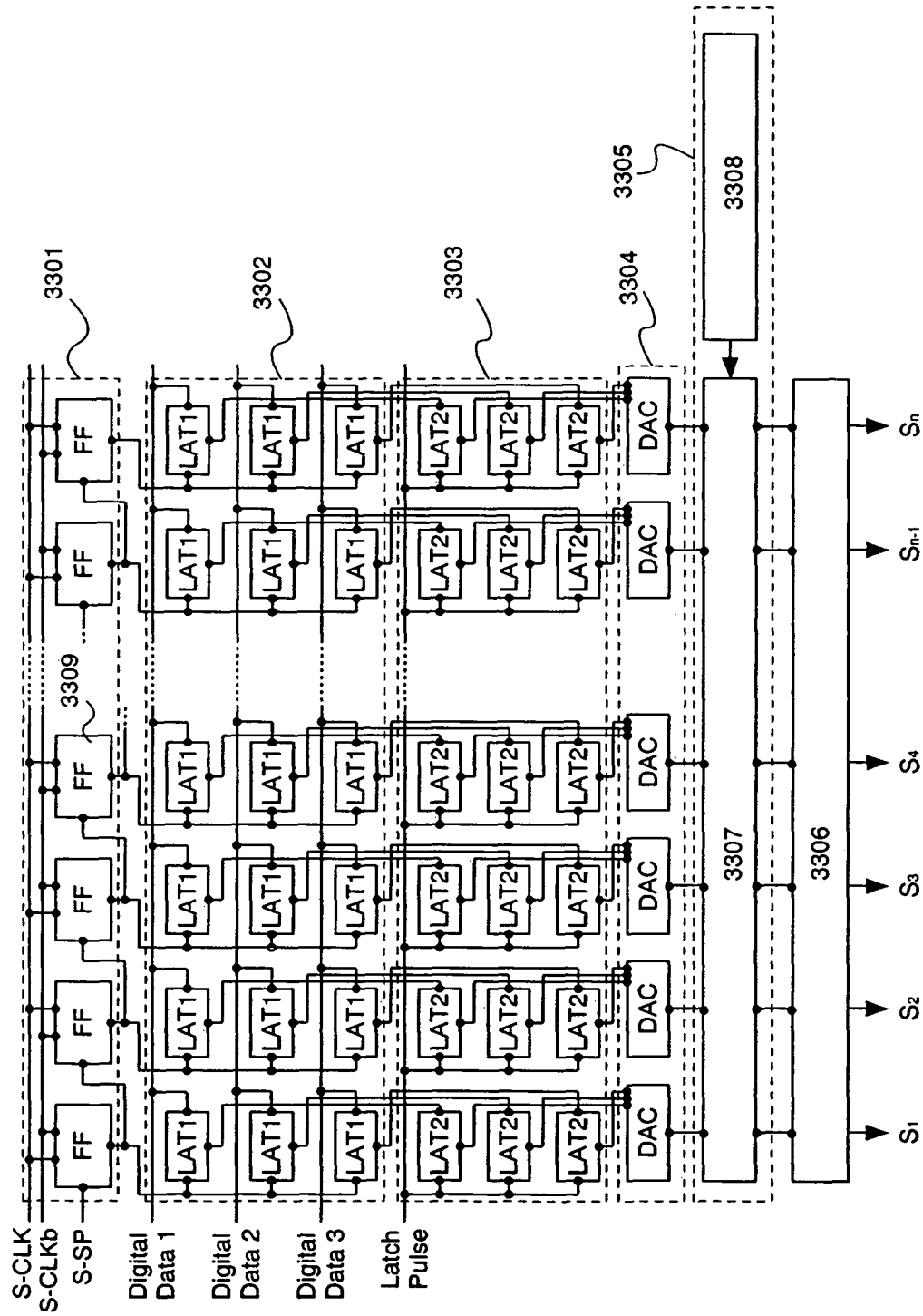
FIG. 33 shows an example of a signal line driver circuit applicable to a display device of the invention.

Operation of the signal line driver circuit shown in FIG. 31*a* is described using specific constitution shown in FIG. 33.

A pulse output circuit 3301 is constituted by a plurality of stages of flip-flop circuits (FFs) 3309 or the like, to which a clock signal (S-CLK), a clock inverted signal (S-CLKB), and a start pulse signal (S-SP) are input. A sampling pulse is output sequentially in accordance with the timing of these signals.

The sampling pulse output from the pulse output circuit 3301 is input to a first latch circuit 3302. A digital video signal is input to the first latch circuit 3302, and held in each stage at the timing that the sampling pulse is input. Here, the digital video signals are input by three bits for each stage. The video signal of each bit is held in the first latch circuit 3302. Three latch circuits of each stage of the first latch circuit 3302 are operated in parallel by one sampling pulse.

When the first latch circuit 3302 finishes to hold the digital video signals up to the last stage, a latch pulse (Latch Pulse) is input to a second latch circuit 3303 in a horizontal retrace period, and the digital video signals which has been held in the first latch circuit 3302 are transferred to the second latch circuit 3303 all at once. After that, the digital video signals held in the second latch circuit 3303 for one row are input to a DAC (a D/A converter circuit) 3304 simultaneously.

The DAC 3304 converts the input digital video signals to video signals having analog potential, and inputs them to a switching circuit 3307 included in a writing period/light emitting period selection circuit 3305.

While the digital video signals which have been held in the second latch circuit 3303 are being input to the DAC 3304, the pulse output circuit 3301 again outputs sampling pulses. The above-described operation is repeated in a writing period to process video signals for one frame.

The writing period/light emitting period selection circuit 3305 also includes a triangular wave potential generating circuit 3308. In a light emitting period, a triangular wave potential generated by the triangular wave potential generating circuit 3308 is input to the switching circuit 3307.

In this manner, the switching circuit 3307 is input with the video signal from the DAC 3304 in the writing period and input with the triangular wave potential from the triangular wave potential generating circuit 3308 in the light emitting period. Then, the switching circuit 3307 inputs the video signal in the writing period and inputs the triangular wave potential in the light emitting period to an analog buffer circuit 3306.

The analog buffer circuit 3306 performs impedance transformation so that the same potential as the input potential is set to signal lines D1 to Dn. That is, the current supply capability of the video signal is improved in the analog buffer circuit 3306, and then set to the signal lines D1 to Dn as an analog signal potential. Note that the signal lines D1 to Dn correspond to, for example, the signal lines D1 to Dn of the display device shown in FIG. 2 or 13.

In FIG. 31*a*, the input digital video signal (Digital Video Data) is preferable to be corrected prior to being converted to an analog video signal (Analog Video Data) in some cases. Therefore, as shown in FIG. 31*b*, it is preferable that the digital video signal (Digital Video Data) be input to the first latch circuit 3102 after being corrected by a correction circuit 3107. For example, gamma correction or the like can be performed in the correction circuit 3107.

Figure 37:
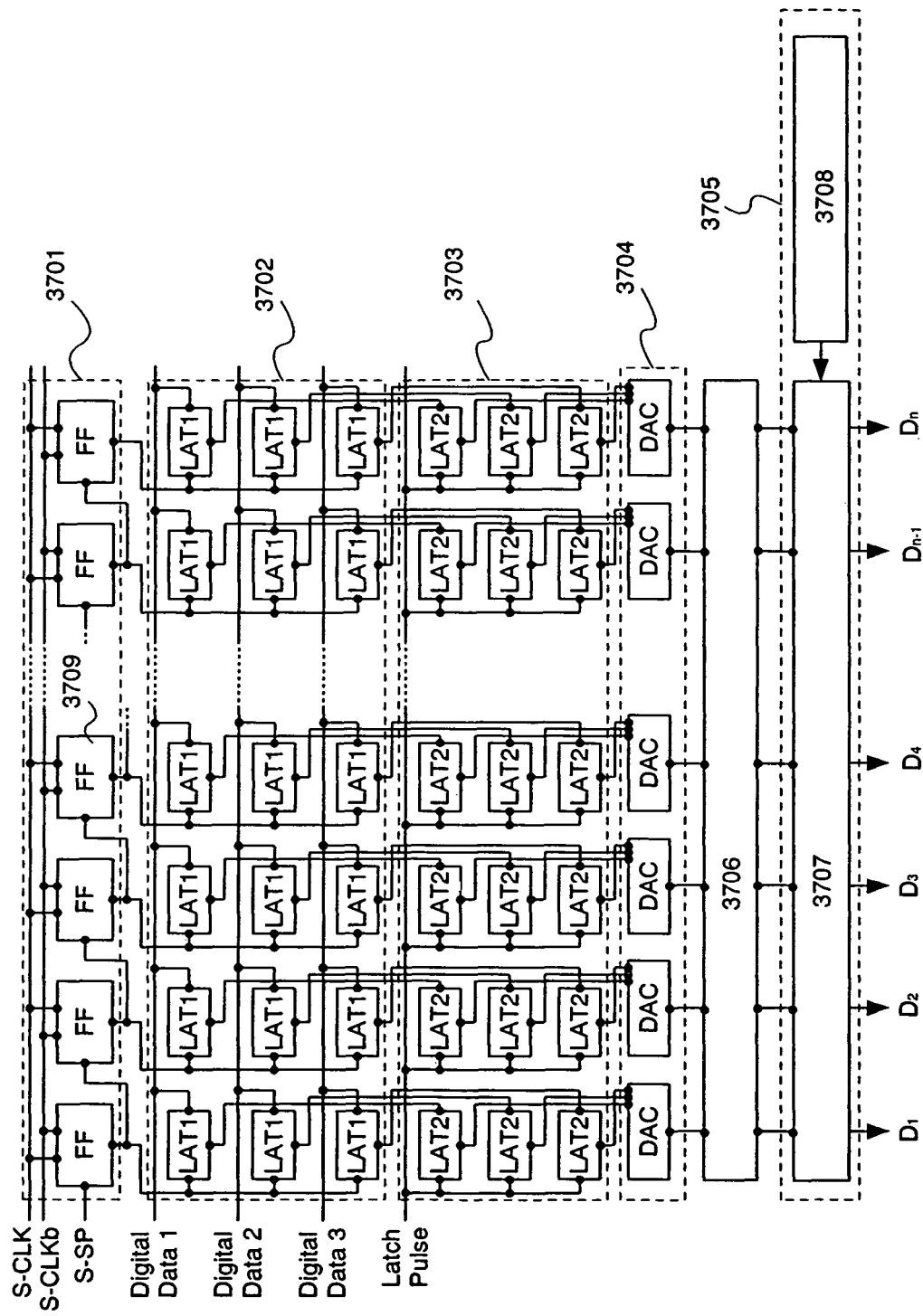
FIG. 37 shows an example of a signal line driver circuit applicable to a display device of the invention.
Figure 38:
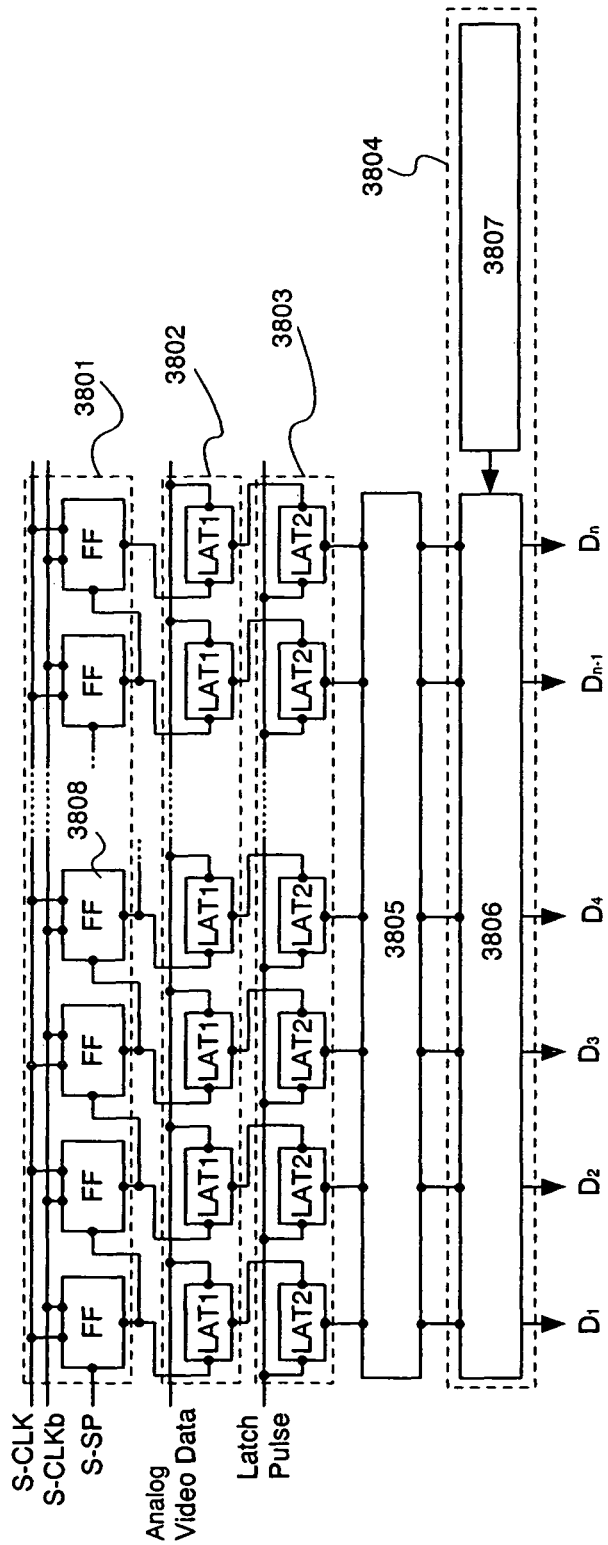
FIG. 38 shows an example of a signal line driver circuit applicable to a display device of the invention.

In addition, the impedance conversion may be performed prior to inputting the output of the D/A converter circuit to the writing period/light emitting period selection circuit. That is, in the constitution shown in FIG. 31*a*, constitution in which the output of the D/A converter circuit 3104 is input to the writing period/light emitting period selection circuit 3105 after converted its impedance can be adopted, which is shown in FIG. 35*a*. In that case, the constitution which shows the constitution of FIG. 35*a* in detail is shown in FIG. 37. Respective functions of a pulse output circuit 3701, a first latch circuit 3702, a second latch circuit 3703, a D/A converter circuit 3704, a writing period/light emitting period selection circuit 3705, an analog buffer circuit 3706, a switching circuit 3707, a triangular wave potential generating circuit 3708, and a flip-flop circuit 3709 and the like are same as those of the pulse output circuit 3301, the first latch circuit 3302, the second latch circuit 3303, the D/A converter circuit 3304, the writing period/light emitting period selection circuit 3305, the analog buffer circuit 3306, the switching circuit 3307, the triangular wave potential generating circuit 3308, and the flip-flop circuit 3309 in FIG. 33. Further, in the constitution shown in FIG. 31b, constitution in which the output of the D/A converter circuit 3104 is input to the writing period/light emitting period selection circuit 3105 after converted its impedance can be adopted, which is shown in FIG. 35b.

Description is made on the case where a digital video signal is input to the signal line driver circuit with reference to FIGS. 31a, 31b, and 33. The case where an analog video signal is input is described below with reference to FIGS. 32a, 32b, and 34. In that case, a D/A converter circuit may not be provided unlike those in FIGS. 31a and 31b. In addition, a first analog latch circuit and a second analog latch circuit for holding analog video signals may be provided for one bit in each stage. As shown in FIG. 32a, a pulse output circuit 3201, a first analog latch circuit 3202, a second analog latch circuit 3203, a writing period/light emitting period selection circuit 3204, and an analog buffer circuit 3205 are included.

Figure 34:
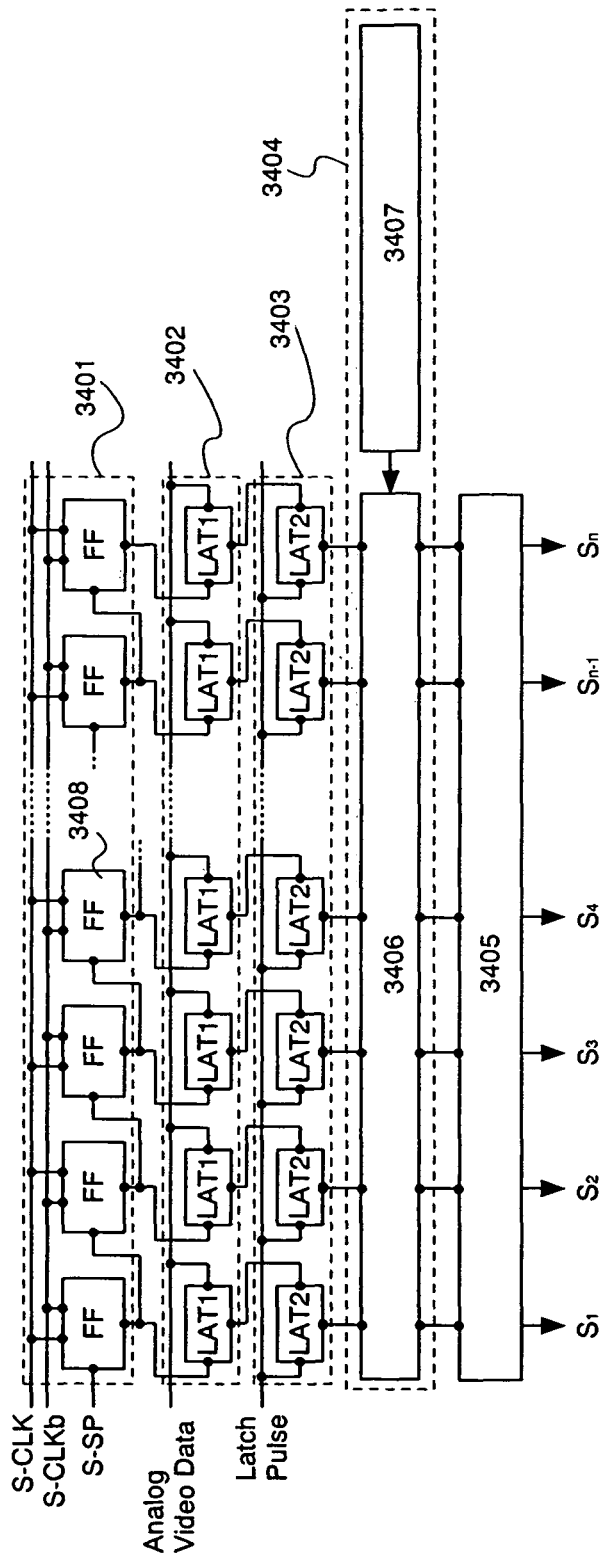
FIG. 34 shows an example of a signal line driver circuit applicable to a display device of the invention.

Operation of the signal line driver circuit shown in FIG. 32a is described using specific constitution shown in FIG. 34.

A pulse output circuit 3401 is constituted by a plurality of stages of flip-flop circuits (FFs) 3408 or the like, to which a clock signal (S-CLK), a clock inverted signal (S-CLKB), and a start pulse signal (S-SP) are input. A sampling pulse is output sequentially in accordance with the timing of these signals.

The sampling pulse output from the pulse output circuit 3401 is input to a first analog latch circuit 3402. An analog video signal is input to the first analog latch circuit 3402, and held in each stage at the timing that the sampling pulse is input. Here, the analog video signals are input by one bit for each stage. The video signal of one bit is held in the first analog latch circuit 3402 for each stage.

When the first analog latch circuit 3402 finishes to hold the analog video signals up to the last stage, a latch pulse (Latch Pulse) is input to a second analog latch circuit 3403 in a horizontal retrace period, and the analog video signals which have been held in the first analog latch circuit 3402 are transferred to the second analog latch circuit 3403 all at once. After that, the analog video signals held in the second analog latch circuit 3403 for one row are input to a switching circuit 3406 included in a writing period/light emitting period selection circuit 3404 simultaneously.

Then, in a writing period, the switching circuit 3406 inputs the video signals input from the second analog latch circuit 3403 to an analog buffer circuit 3405, and the analog buffer circuit 3405 converts its impedance and supplies respective analog signal potentials to signal lines D1 to Dn. Note that the signal lines D1 to Dn correspond to, for example, the signal lines D1 to Dn of the display device shown in FIG. 2 or 8.

While the analog signal potentials for one pixel row are being set to the signal lines D1 to Dn, the pulse output circuit 3401 again outputs sampling pulses. The above-described operation is repeated in the writing period to process video signals for one frame.

The writing period/light emitting period selection circuit 3404 also includes a triangular wave potential generating circuit 3407. In a light emitting period, a triangular wave potential generated by the triangular wave potential generating circuit 3407 is input to the switching circuit 3406. Impedance transformation is performed in the analog buffer circuit 3305 so that the same potential as the input triangular wave potential is set to the signal lines D1 to Dn in the light emitting period. That is, the current supply capability is improved in the analog buffer circuit.

In this manner, the switching circuit 3406 is input with the video signal from the second analog latch circuit 3403 in the writing period and input with the triangular wave potential from the triangular wave potential generating circuit 3407 in the light emitting period. Then, the switching circuit 3406 inputs the video signal in the writing period and inputs the triangular wave potential in the light emitting period to the analog buffer circuit 3405.

In the case where the external video signal is a digital video signal, the digital video signal may be input to the first analog latch circuit 3202 after converted to an analog video signal in a D/A converter circuit 3206 as shown in FIG. 32b.

Figure 36A:
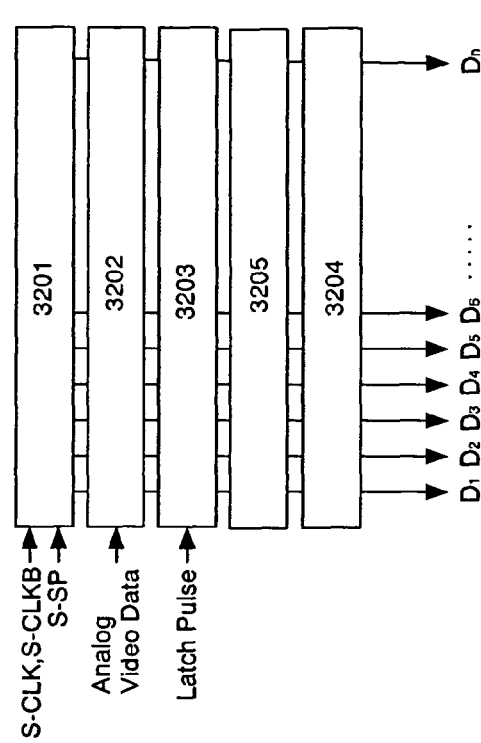
FIGS. 36a and 36b show examples of a signal line driver circuit applicable to a display device of the invention.
Figure 36B:
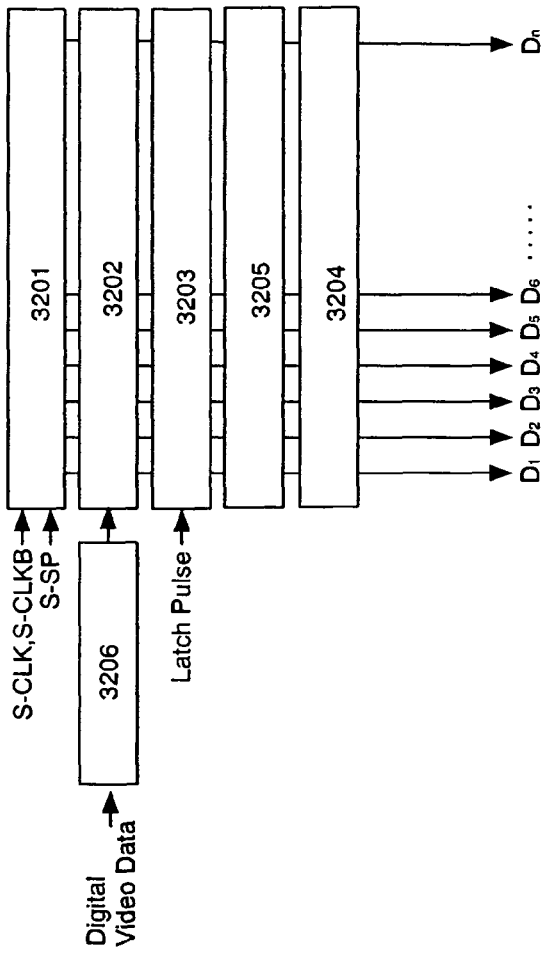

In addition, the impedance conversion may be performed prior to inputting the output of the second latch circuit to the writing period/light emitting period selection circuit. That is, in the constitution shown in FIG. 32a, constitution in which the output of the second analog latch circuit 3203 is input to the writing period/light emitting period selection circuit 3204 after converted its impedance can be adopted, which is shown in FIG. 36a. Respective functions of a pulse output circuit 3801, a first analog latch circuit 3802, a second analog latch circuit 3803, a writing period/light emitting period selection circuit 3804, an analog buffer circuit 3805, a switching circuit 3806, a triangular wave potential generating circuit 3806, and a flip-flop circuit 3807 are same as those of the pulse output circuit 3401, the first analog latch circuit 3402, the second analog latch circuit 3403, the writing period/light emitting period selection circuit 3404, the analog buffer circuit 3405, the switching circuit 3406, the triangular wave potential generating circuit 3407, and the flip-flop circuit 3408 in FIG. 34. Further, in the constitution shown in FIG. 32b, constitution in which the output of the second analog latch circuit 3203 is input to the writing period/light emitting period selection circuit 3204 after converted its impedance can be adopted, which is shown in FIG. 36b.

Figure 39:
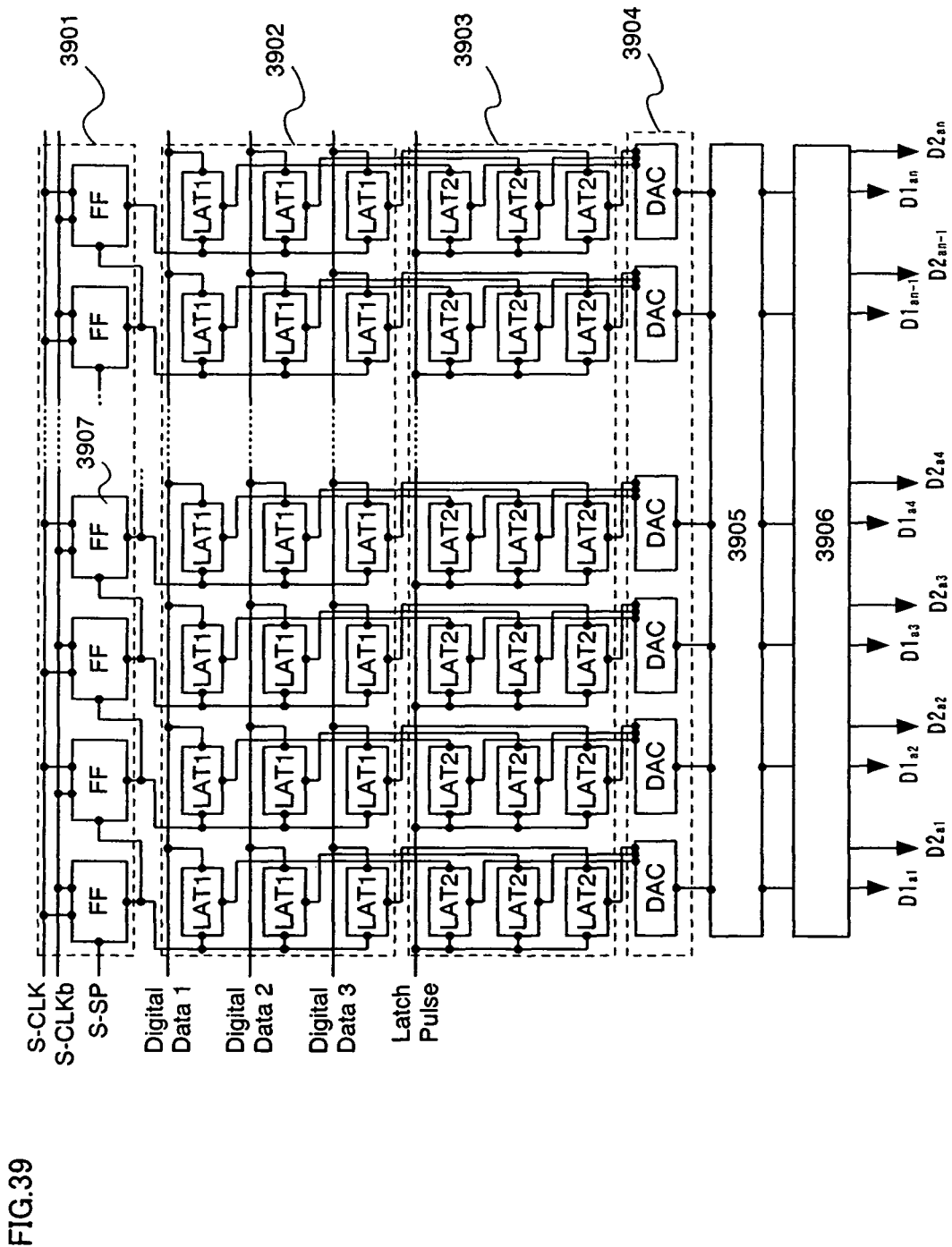
FIG. 39 shows an example of a signal line driver circuit applicable to a display device of the invention.
Figure 40:
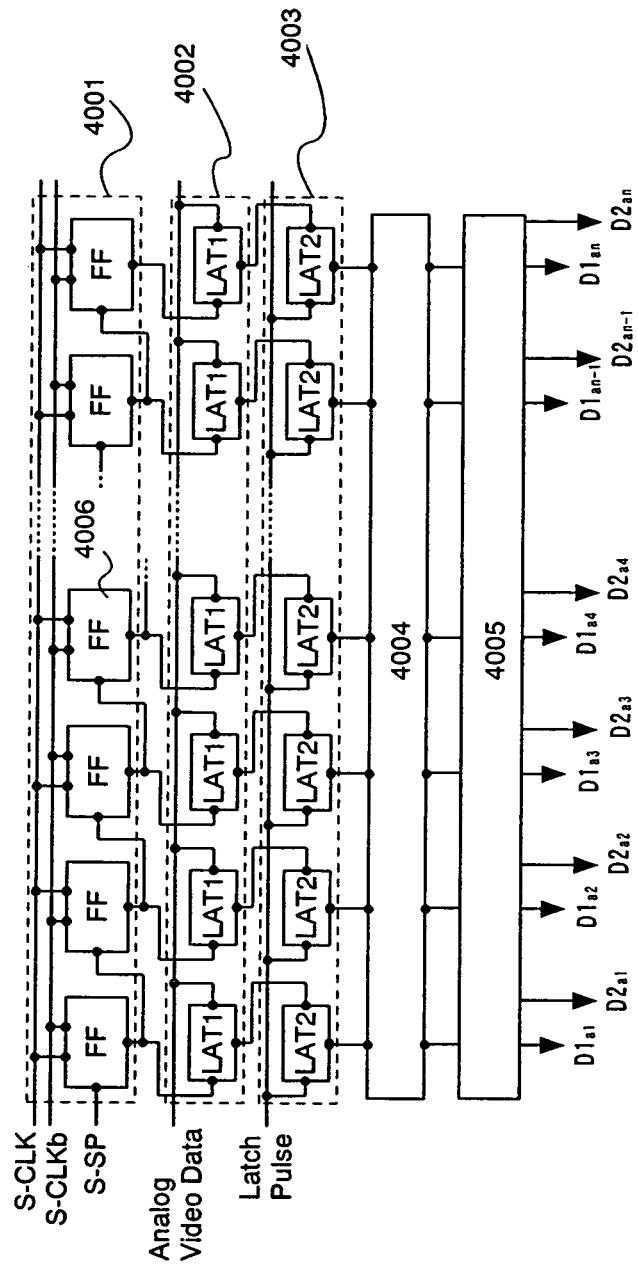
FIG. 40 shows an example of a signal line driver circuit applicable to a display device of the invention.

Described next with reference to FIGS. 39 and 40 are signal line driver circuits which can be applied in a display device having a pixel configuration in which an analog signal potential corresponding to a video signal and a potential varying in an analog manner for controlling on/off of a driving transistor are input through different signal lines to the pixel (e.g., the pixel configuration shown in FIG. 56).

First, constitution of FIG. 39 is described.

A pulse output circuit 3901 is constituted by a plurality of stages of flip-flop circuits (FFs) 3907 or the like, to which a clock signal (S-CLK), a clock inverted signal (S-CLKB), and a start pulse signal (S-SP) are input. A sampling pulse is output sequentially in accordance with the timing of these signals.

The sampling pulse output from the pulse output circuit 3901 is input to a first latch circuit 3902. A digital video signal is input to the first latch circuit 3902, and held in each stage at the timing that the sampling pulse is input. Here, the digital video signals are input by three bits for each stage. The video signal of each bit is held in each first digital latch circuit 3902. Three latch circuits of each stage in the first latch circuit 3902 are operated in parallel by one sampling pulse.

When the first latch circuit 3902 finishes to hold the analog video signals up to the last stage, a latch pulse (Latch Pulse) is input to a second analog latch circuit 3903 in a horizontal retrace period, and the digital video signals which have been held in the first latch circuit 3902 are transferred to the second analog latch circuit 3903 all at once. After that, the digital video signals which have been held in the second analog latch circuit 3903 for one row are input to a DAC (D/A converter circuit) 3904 simultaneously.

The DAC 3904 converts the input digital video signals into video signals having analog potential, and inputs them to an analog buffer circuit 3905.

Respective analog signal potentials are set to signal lines D1a1 to D1an from the analog buffer circuit 3905. At the same time, a triangular wave potential is set to signal lines D2a1 to D2an from a triangular wave potential generating circuit 3906. It is to be noted that each of the signal lines D1a1 to D1an corresponds to a first signal line 410 or a signal line 390 of a display device having the pixel shown in FIG. 4 or FIG. 7. Each of the signal lines D2a1 to D2an corresponds to a second signal line 411 or a second signal line 391 of the display device having the pixel shown in FIG. 4 or FIG. 7.

Next, constitution of FIG. 40 is described.

A pulse output circuit 4001 is constituted by a plurality of stages of flip-flop circuits (FFs) 4006 or the like, to which a clock signal (S-CLK), a clock inverted signal (S-CLKB), and a start pulse signal (S-SP) are input. A sampling pulse is output sequentially in accordance with the timing of these signals.

The sampling pulse output from the pulse output circuit 4001 is input to a first analog latch circuit 4002. An analog video signal (Analog Data) is input to the first analog latch circuit 4002, and held in each stage at the timing that the sampling pulse is input. Here, the analog video signals are input by one bit for each stage. The video signal of one bit is held in each the first analog latch circuit 4002 for each stage.

When the first analog latch circuit 4002 finishes to hold the analog video signals up to the last stage, a latch pulse (Latch Pulse) is input to a second analog latch circuit 4003 in a horizontal retrace period, and the digital video signals which have been held in the first analog latch circuit 4002 are transferred to the second analog latch circuit 4003 all at once. After that, the digital video signals which have been held in the second analog latch circuit 4003 for one row are input to an analog buffer curcit 4004 simultaneously.

Respective analog signal potentials are set to signal lines D1a1 to D1an from the analog buffer circuit 4004. At the same time, a triangular wave potential is set to signal lines D2a1 to D2an from a triangular wave potential generating circuit 4005.

Although the description is made on the signal line driver circuit in the case where signals are written to pixels of a selected row all at once (also called a line sequential method), a video signal input to a signal line driver circuit may be written to a pixel directly in accordance with a signal output from a pulse output circuit (also called a dot sequential method).

A signal line driver circuit employing a dot sequential method which can be applied for the pixel configuration described in Embodiment Mode 1 is described with reference to FIG. 41a. A pulse output circuit 4101, a first switch group 4102, and a second switch group 4103 are included. Each of the first switch group 4102 and the second switch group 4103 includes a plurality of stages of switches. The plurality of stages corresponds to signal lines respectively.

A switch of each stage in the first switch group 4102 has one terminal connected to a wire to which an analog video signal (Analog Video Data) corresponding to a video signal is input and the other terminal connected to a corresponding signal line. In addition, a switch of each stage in the second switch group 4103 has one terminal connected to a wire to which a triangular wave potential is set and the other terminal connected to a corresponding signal line.

In a signal writing period of pixels, a clock signal (S-CLK), a clock inverted signal (S-CLKB), and a start pulse signal (S-SP) are input to the pulse output circuit 4101. A sampling pulse is output sequentially in accordance with the timing of these signals. It is to be noted that, at this time, a control signal for controlling on/off of the second switch group 4103 is set so as to turn off the switches of all stages.

Then, the switches in the first switch group 4102 are turned on one stage by one stage in accordance with the output of the sampling pulse.

Therefore, in the writing period, Analog Video Data is input to a signal line corresponding to the stage of the switch turned on in the first switch group 4102. In this manner, the switch of each stage in the first switch group 4102 is sequentially turned on so that Analog Video Data is written to pixels of a selected row sequentially.

Subsequently, the next pixel row is selected and a signal is written to the pixels similarly. Signal writing is performed to pixels of all rows to complete the signal writing period.

A light emitting period follows the signal writing period of pixels. In the light emitting period of pixels, a sampling pulse is not output from the pulse output circuit 4101. That is, an output of the pulse output circuit 4101 may not be input to the first switch group 4102 or a start pulse signal (S-SP) may not be input to the pulse output circuit 4101; that is, switches in the first switch group 4102 are off.

In addition, a control signal is input so as to turn on all switches in the second switch group 4103. Consequently, a triangular wave potential is set to all signal lines. It is to be noted that, in the light emitting period, a triangular wave potential can be set to pixels of all rows since the pixels of all rows are selected. The triangular wave potential is input.

One frame period is completed when the light emitting period is terminated in this manner.

Next, a signal line driver circuit employing a dot sequential method which can be applied for the pixel configuration described in Embodiment Mode 2 is described with reference to FIG. 41b. A pulse output circuit 4111 and a switch group 4112 are included. The switch group 4112 includes a plurality of stages of switches. The plurality of stages correspond to first signal lines respectively.

A switch of each stage in the switch group 4112 has one terminal connected to a wire to which an analog video signal (Analog Video Data) corresponding to a video signal is input and the other terminal connected to a first signal line corresponding to a pixel column. In addition, a wire to which a triangular wave potential is set is connected to second signal lines corresponding to pixel columns respectively.

In a signal writing period of pixels, a clock signal (S-CLK), a clock inverted signal (S-CLKB), and a start pulse signal (S-SP) are input to the pulse output circuit 4111. A sampling pulse is output sequentially in accordance with the timing of these signals.

Then, switches in the switch group 4112 are turned on one stage by one stage in accordance with the output of the sampling pulse.

In the signal writing period of pixels, therefore, the analog video signal (Analog Video Data) is input to a signal line corresponding to the stage of the switch turned on in the switch group 4112. In this manner, the switch of each stage in the switch group 4112 is sequentially turned on so that the analog video signal (Analog Video Data) is written to pixels of a selected row sequentially.

It is to be noted that pixels of unselected rows are connected to the second signal lines and be in a light emitting period.

As described above, the constitution shown in FIG. 41b can be applied for such pixels described in Embodiment Mode 2 that a writing period is set for each pixel row and when one pixel row is in the writing period, the other pixel rows are in a light emitting period.

Described next is constitution of a scan line driver circuit and a potential supply line driver circuit.

A scan line driver circuit or a potential supply line driver circuit includes a pulse output circuit. In a writing period, a sampling pulse from the pulse output circuit is output to a scan line or a potential supply line. Then, in a light emitting period, output of the sampling pulse is stopped while to the scan line, a signal not to select all pixel rows is input. In addition, to a potential supply line, a potential for applying a forward voltage to a light emitting element is set.

By constituting the scan line driver circuit and the potential supply line driver circuit by one driver circuit, space of a driver circuit is reduced and frame size can be reduced.

Described next is constitution which can be applied to the D/A converter circuit in this embodiment mode.

Figure 17:
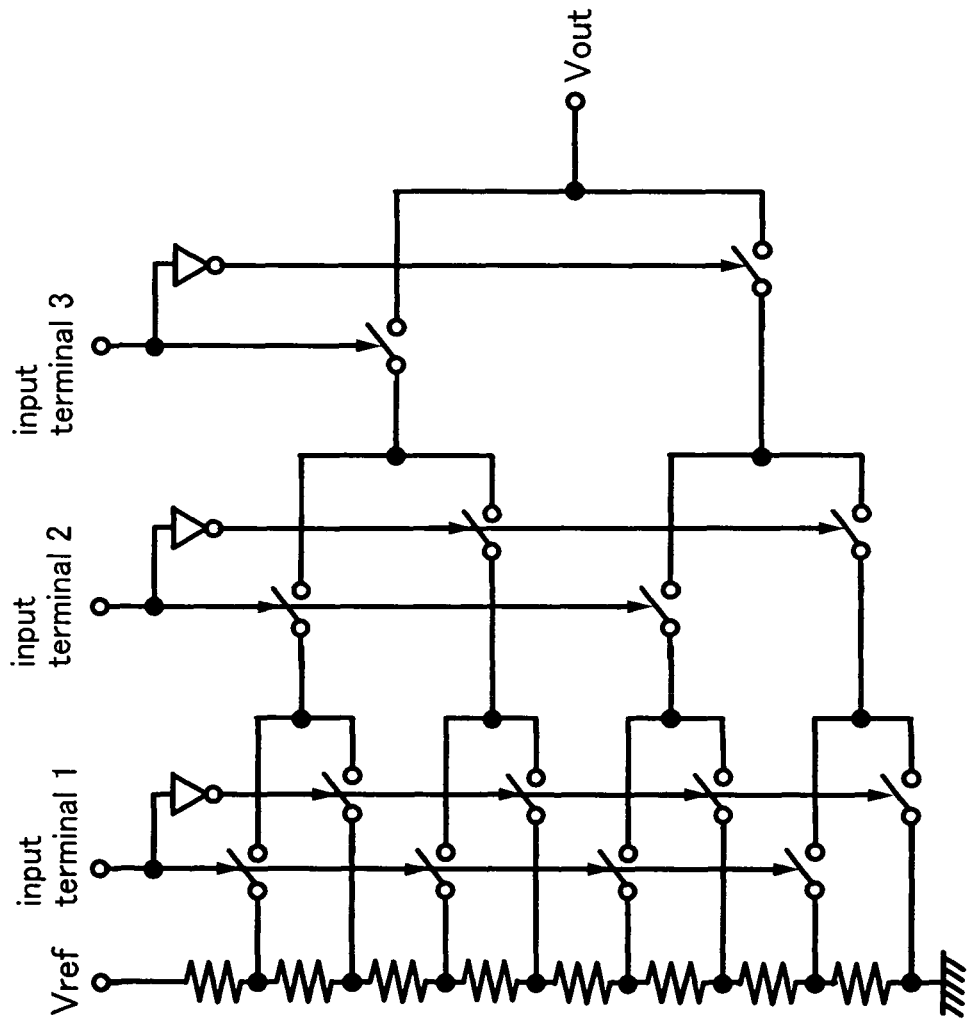
FIG. 17 is a diagram showing an example of a D/A converter circuit applicable to a display device having a pixel configuration of the invention.

FIG. 17 shows a resistor string D/A converter circuit which can convert a digital signal of three bits into an analog signal.

A plurality of resistors is connected in series. A reference power supply potential Vref is set to one terminal of the resistor group while a low power supply potential (e.g., GND) is set to the other terminal thereof. Current flows through the resistor group and respective potentials of both terminals of each resistor are different due to voltage drop. In accordance with signals input to an input terminal 1, an input terminal 2, and an input terminal 3 respectively, on/off of switches are selected to provide eight kinds of potential from an output terminal. In specific, either of a higher-potential group of four potentials and a lower-potential group of four potentials from eight kinds of potential is selected by a signal input to the input terminal 3. Then, either of a higher-potential group of two potentials and a lower-potential group of two potentials from the four potentials selected by the input terminal 3 is selected by a signal input to the input terminal 2. Further, either of a higher potential and a lower potential from the two potentials selected by the input terminal 2 is selected by a signal input to the input terminal 1. One potential is selected from eight kinds of potential in this manner. Therefore, a digital signal input to the input terminal 1, the input terminal 2, and the input terminal 3 can be converted into an analog signal potential.

Figure 18:
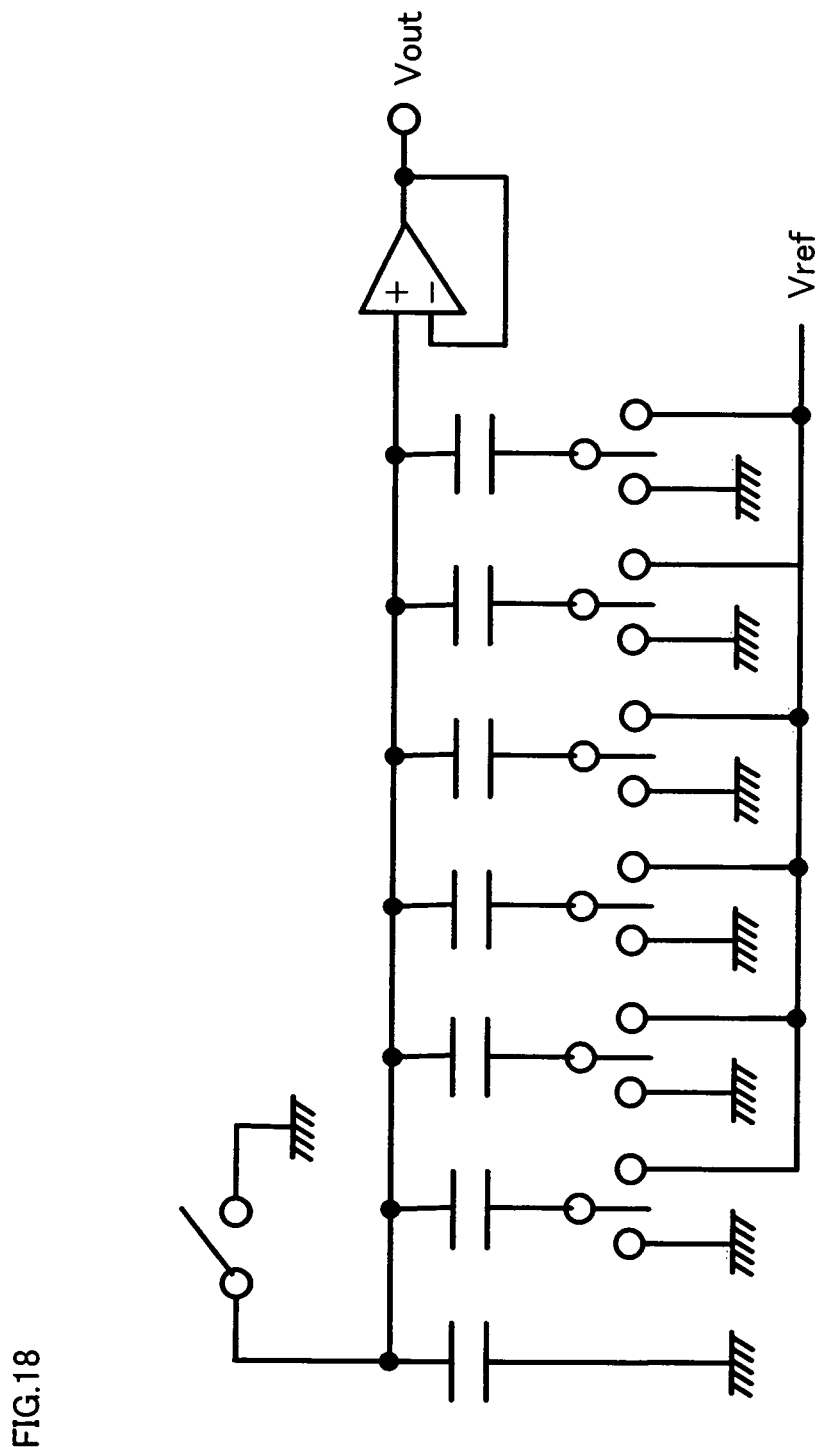
FIG. 18 is a diagram showing an example of a D/A converter circuit applicable to a display device having a pixel configuration of the invention.

FIG. 18 shows a capacitor array D/A converter circuit which can convert a digital signal of six bits into an analog signal.

A plurality of capacitors each having different electrostatic capacitance is connected in parallel. On/off of switches 1 to 6 are controlled in accordance with a digital signal so that an arbitrary capacitor from the capacitors stores a charge for a potential difference between a reference power supply potential Vref and a low power supply potential (e.g., GND). After that, the stored charge is distributed among the plurality of capacitors. Consequently, voltage of the plurality of capacitors is stabilized to be a certain value. By detecting one potential using an amplifier with this voltage, the digital signal can be converted into an analog signal potential.

In addition, a D/A converter circuit which combines a resistor string type and a capacitor array type with each other may be used as well. The above-described D/A converter circuits are only examples, and various D/A converter circuits can be used arbitrarily.

Embodiment Mode 10

In this embodiment mode, a structure of a display panel having the pixel configuration described in Embodiment Mode 1, Embodiment Mode 2, Embodiment Mode 3, Embodiment Mode 4, or Embodiment Mode 5 is described with reference to FIGS. 19a and 19b.

In this embodiment mode, a display panel which has the pixel configuration of the invention in a pixel region is described with reference to FIGS. 19a and 19b. FIG. 19a is a top view of the display panel, and FIG. 19b is a sectional view taken on line A-A' of FIG. 19a. A signal line driver circuit (Data line Driver) 1901, a pixel region 1902, a potential supply line driver circuit (Illumination line Driver) 1903, and a scan line driver circuit (Reset line Driver) 1906 which are shown by a dotted line are included. In addition, a sealing substrate 1904 and a sealant 1905 are provided. Inside surrounded by the sealant 1905 is a space 1907.

A wire 1908 is a wire for transmitting signals input to the potential supply line driver circuit 1903, the scan line driver circuit 1906, and the signal line driver circuit 1901. The wire 1908 receives a video signal, a clock signal, a start signal, or the like from an FPC (Flexible Printed Circuit) 1909 which is an external input terminal. Over a junctional region between the FPC 1909 and the display panel, an IC chip (a semiconductor chip provided with a memory circuit, a buffer circuit, or the like) 1919 is mounted by COG (Chip On Glass) or the like. Note that although only the FPC is shown here, a printed wiring board (PWB) may be attached to the FPC. The display device in this specification includes not only a main body of the display panel, but also the main body of the display panel provided with an FPC or a PWB, and besides, the main body of the display panel mounted with an IC chip or the like.

A sectional structure thereof is described with reference to FIG. 19b. The pixel region 1902 and peripheral driver circuits (the potential supply line driver circuit 1903, the scan line driver circuit 1906, and the signal line driver circuit 1902) are formed over the substrate 1910. The signal line driver circuit 1901 and the pixel region 1902 are illustrated here.

It is to be noted that the signal line driver circuit 1901 is constituted by transistors having the same conductivity type, such as an n-type TFT 1920 and an n-type TFT 1921. In addition, it is preferable that the potential supply line driver circuit 1903 and the scan line driver circuit 1906 be also constituted by n-type transistors. Note that a pixel can be constituted by transistors having the same conductivity type by applying the pixel configuration shown in FIG. 7 or 10, thus a display panel of a single conductivity type can be manufactured. It is needless to say that the transistors are not limited to have the same conductivity type and a CMOS circuit may be formed using a p-type transistor. Although the peripheral driver circuits are formed over the same substrate in the display panel in this embodiment mode, the invention is not limited to this and the whole or a part of the peripheral driver circuits may be formed on an IC chip or the like and then mounted by COG or the like. In that case, the driver circuit is not required to be a single conductivity type and a p-type transistor may be used in combination. In addition, although the buffer circuit 1301, the buffer circuit 1302, and the buffer circuit 1303 in the display device shown in FIG. 13 are not illustrated in the display panel described in this embodiment mode, respective buffer circuits are provided in the peripheral driver circuits.

The pixel region 1902 has a plurality of circuits each forming a pixel including a switching TFT 1911 and a driving TFT 1912. A source electrode of the driving TFT 1912 is connected to a first electrode 1913. In addition, an insulator 1914 is formed so as to cover end portions of the first electrode 1913; it is formed using a positive photosensitive acrylic resin film here.

In order to improve the coverage, the upper edge portion or the bottom edge portion of the insulator 1914 is formed to have a curved surface having curvature. For example, in the case where a positive photosensitive acrylic is used as a material for the insulator 1914, it is preferable that only the upper edge portion of the insulator 1914 be formed to have a curved surface having a radius of curvature (from 0.2 μm to 3 μm). Either a negative type resin that is insoluble in etchant due to photosensitive light or a positive type resin that is dissoluble in etchant due to light can be used as the insulator 1914.

On the first electrode 1913, a layer containing an organic compound 1916 and a second electrode 1917 are formed. The first electrode 1913 which functions as an anode is preferably formed using a material having a high work function. For example, a single-layer film such as an ITO (indium tin oxide) film, an indium zinc oxide (IZO) film, a titanium nitride film, a chromium film, a tungsten film, a Zn film, or a Pt film, a stacked layer of a titanium nitride film and a film containing aluminum as a main component, a three-layer structure of a titanium nitride film, a film containing aluminum as a main component and a titanium nitride film, or the like can be used. It is to be noted that a stacked structure makes it possible to reduce the resistance as a wire and realize a good ohmic contact, and to function as an anode.

The layer containing an organic compound 1916 is formed by vapor deposition using a vapor deposition mask or ink jetting. As the layer containing an organic compound 1916, a metal complex of the fourth group of the periodic system is partially used, and either a low molecular weight material or a high molecular weight material may be used in combination with such a metal complex. Generally, an organic compound is used as a single layer or a stacked layer in many cases as a material for the layer containing an organic compound; however, the structure in which an inorganic compound is used partially in a film formed of an organic compound is included in this embodiment mode. Moreover, a known triplet material can be used as well.

As a material for the second electrode (a cathode) 1917 formed on the layer containing an organic compound 1916, a material having a low work function (Al, Ag, Li, Ca, or an alloy of them such as MgAg, MgIn, AlLi, $CaF_2$, or CaN) can be used. In the case where light generated in the layer containing an organic compound 1916 is emitted through the second electrode 1917, a stacked layer of a metal thin film and a transparent conductive film (e.g., ITO (an alloy of indium oxide and tin oxide indium), an alloy of indium oxide and zinc oxide ($In_2O_3$—ZnO), or zinc oxide (ZnO)) is preferably used as the second electrode (the cathode) 1917.

Subsequently, the sealing substrate 1904 is attached to the substrate 1910 with the sealant 1905, so that a display element 1918 is provided in the space 1907 surrounded by the substrate 1910, the sealing substrate 1904, and the sealant 1905. Note that the space 1907 may be filled with an inert gas (e.g., nitride or argon) or the sealant 1905.

It is to be noted that an epoxy resin is preferably used for the sealant 1905. In addition, it is preferable that the material do not transmit moisture and oxygen as much as possible. As the sealing substrate 1904, a glass substrate, a quartz substrate, or a plastic substrate formed of FRP (Fiberglass-Reinforced Plastics), PVF (polyvinyl fluoride), mylar, polyester, acrylic, or the like can be used.

Accordingly, a display panel having the pixel configuration of the invention can be manufactured.

By forming the signal line driver circuit 1901, the pixel region 1902, the potential supply line driver circuit 1903, and the scan line driver circuit 1906 over the same substrate as shown in FIGS. 19a and 19b, cost reduction of a display device can be realized. In that case also, by using transistors having the same conductivity type for the signal line driver circuit 1901, the pixel region 1902, the potential supply line driver circuit 1903, and the scan line driver circuit 1906, manufacturing process can be simplified, thereby further cost reduction can be realized.

Figure 42A:
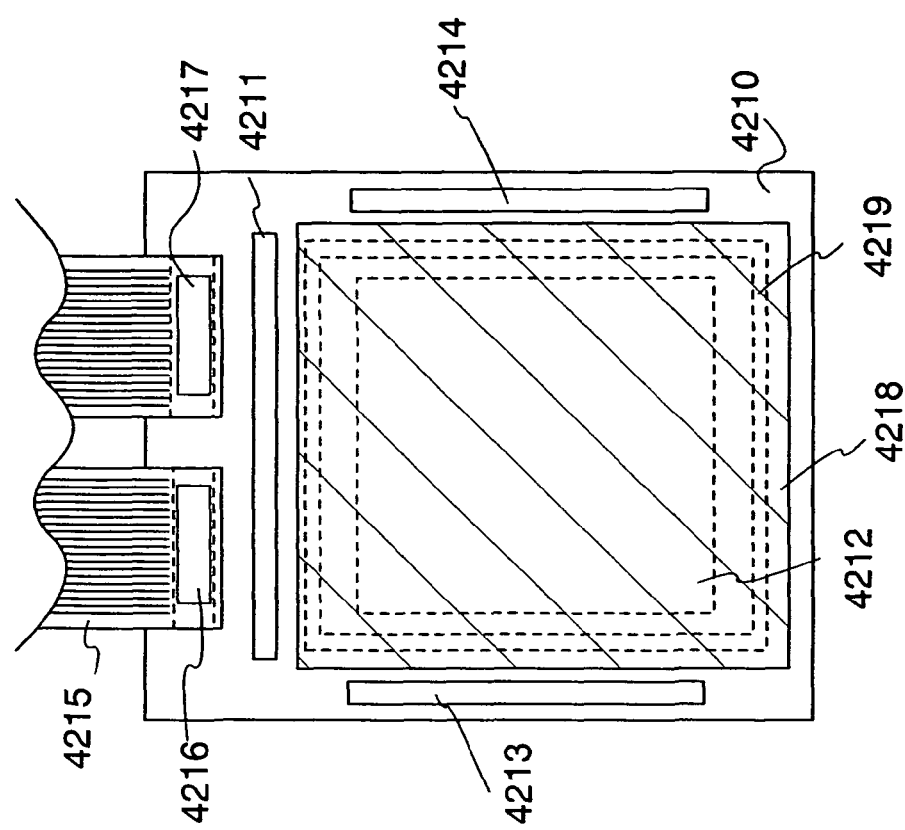
FIGS. 42a and 42b are diagrams each illustrating a display panel having a pixel configuration of the invention.
Figure 42B:
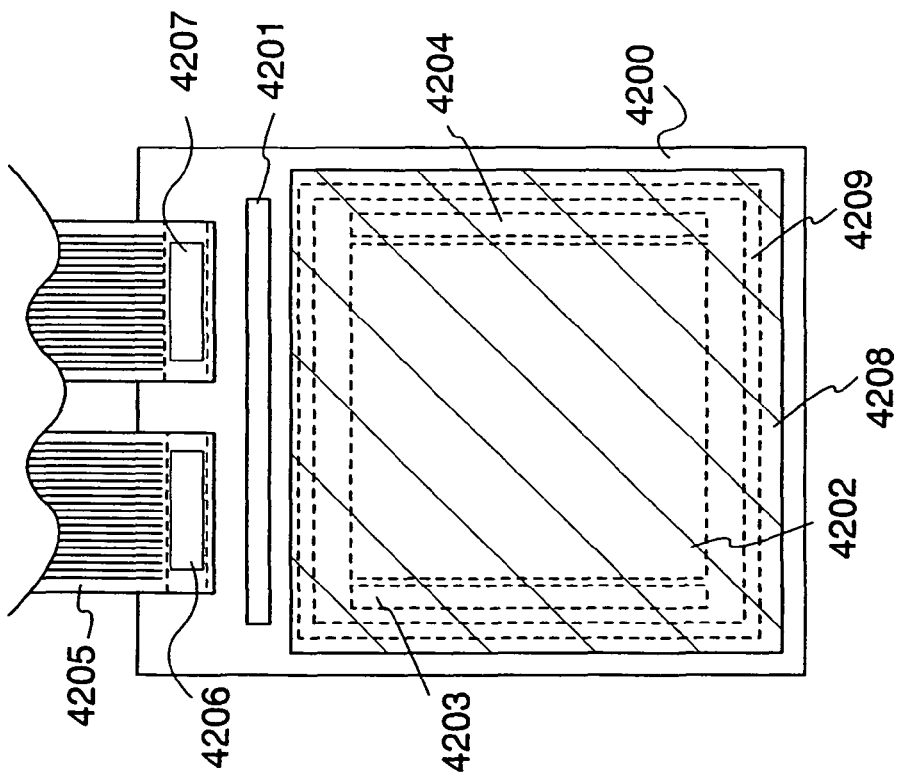

It is to be noted that constitution of the display panel is not limited to the constitution shown in FIG. 19a in which the signal line driver circuit 1901, the pixel region 1902, the potential supply line driver circuit 1903, and the scan line driver circuit 1906 are formed over the same substrate, and constitution in which a signal line driver circuit 4201 shown in FIGS. 42a and 42b corresponding to the signal line driver circuit 1901 is formed on an IC chip and mounted onto the display panel by COG or the like may be employed. Note that a substrate 4200, a pixel region 4202, a potential supply line driver circuit 4203, a scan line driver circuit 4204, an FPC 4205, an IC chip 4206, an IC chip 4207, a sealing substrate 4208, and a sealant 4209 in FIG. 42a correspond to the substrate 1910, the pixel region 1902, the potential supply line driver circuit 1903, the scan line driver circuit 1906, the FPC 1909, the IC chip 1918, the IC chip 1919, the sealing substrate 1904, and the sealant 1905 in FIG. 19a respectively.

That is, only a signal line driver circuit whose driver circuit is required to operate rapidly may be formed using a CMOS or the like on an IC chip in order to reduce power consumption. Moreover, by using a semiconductor chip such as a silicon wafer as the IC chip, further high-speed operation and low power consumption can be achieved.

In addition, by forming the scan line driver circuit 4204 and the potential supply line driver circuit 4203 over the same substrate as the pixel region 4202, cost reduction can be achieved. Moreover, by constituting the scan line driver circuit 4204, the potential supply line driver circuit 4203 and the pixel region 4202 by transistors having the same conductivity type, further cost reduction can be achieved. For a configuration of a pixel included in the pixel region 4202, the pixel described in Embodiment Mode 1, 2, 3, 4, or 5 can be applied. Therefore, a pixel having a high aperture ratio can be provided.

In this manner, cost reduction of a high-definition display device can be realized. In addition, by mounting an IC chip provided with a functional circuit (a memory circuit or a buffer circuit) onto a connecting portion between the FPC 4205 and the substrate 4200, substrate area can be utilized efficiently.

In addition, a signal line driver circuit 4211, a potential supply line driver circuit 4214, and a scan line driver circuit 4213 in FIG. 42b corresponding to the signal line driver circuit 1901, the potential supply line driver circuit 1903, and the scan line driver circuit 1906 in FIG. 19a respectively may be formed on an IC chip, and then mounted onto a display panel by COG or the like as well. In that case, the power consumption of a high-definition display device can be further reduced. Therefore, in order to further reduce the power consumption of the display device, it is preferable to use polysilicon for a semiconductor layer of a transistor used in a pixel region. Note that a substrate 4210, a pixel region 4212, an FPC 4215, an IC chip 4216, an IC chip 4217, a sealing substrate 4218, and a sealant 4219 in FIG. 42b correspond to the substrate 1910, the pixel region 1902, the FPC 1909, the IC chip 1918, the IC chip 1919, the sealing substrate 1904, and the sealant 1905 in FIG. 19a respectively.

Alternatively, by using amorphous silicon for the semiconductor layer of the transistor used in the pixel region 4212, cost reduction can be achieved. Further, a large display panel can be manufactured.

Figure 26B:
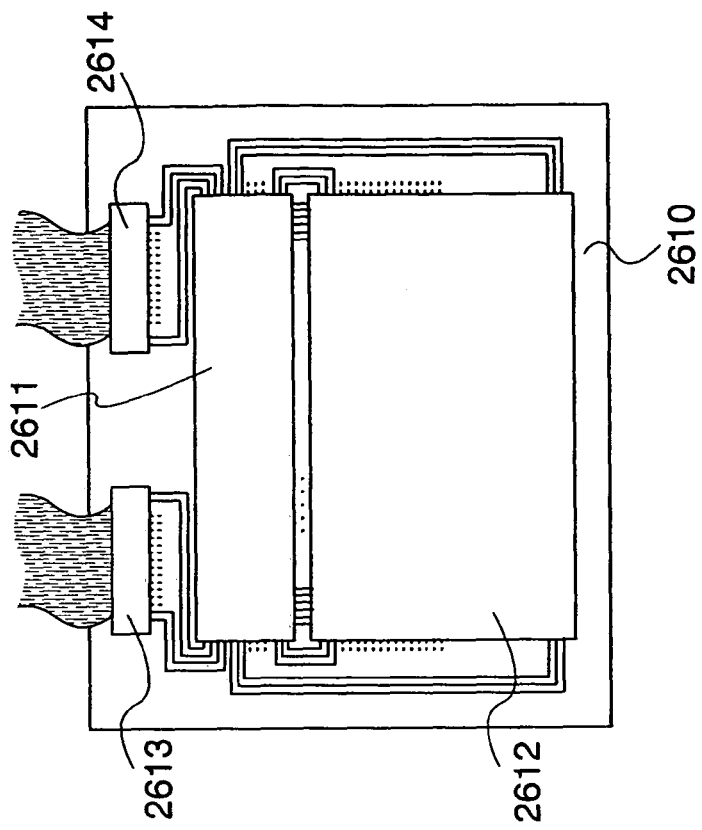
FIGS. 26a and 26b are diagrams each illustrating a display panel having a pixel configuration of the invention.
Figure 26A:
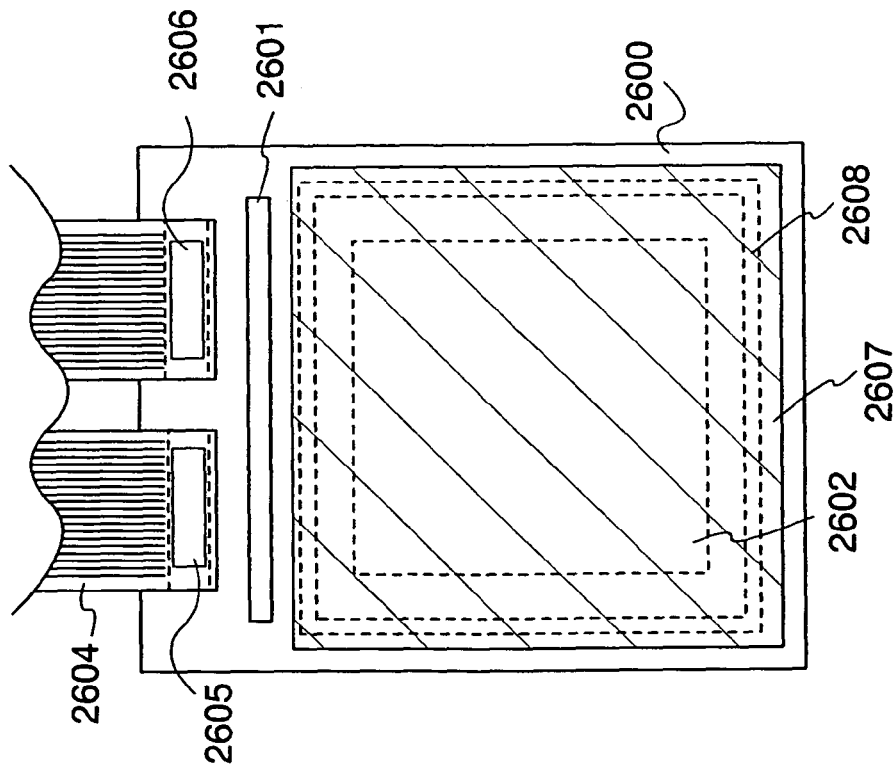

In addition, the scan line driver circuit, the potential supply line driver circuit and the signal line driver circuit may not be provided in the row direction and the column direction of pixels. For example, as shown in FIG. 26*a*, a peripheral driver circuit 2601 formed on an IC chip may have a function of the potential supply line driver circuit 4214, the scan line driver circuit 4213 and the signal line driver circuit 4211 shown in FIG. 42*b*. Note that a substrate 2600, a pixel region 2602, an FPC 2604, an IC chip 2605, an IC chip 2606, a sealing substrate 2607, and a sealant 2608 in FIG. 26*a* correspond to the substrate 1910, the pixel region 1902, the FPC 1909, the IC chip 1918, the IC chip 1919, the sealing substrate 1904, and the sealant 1905 in FIG. 19*a* respectively.

Connection of signal lines of the display device shown in FIG. 26*a* is described with reference to a pattern diagram of FIG. 26*b*. A substrate 2610, a peripheral driver circuit 2611, a pixel region 2612, an FPC 2613, and an FPC 2614 are included. An external signal and a power supply potential are input to the peripheral driver circuit 2611 through the FPC 2613. An output of the peripheral driver circuit 2611 is input to signal lines in the row direction and the column direction connected to pixels in the pixel region 2612 respectively.

Figure 20A:
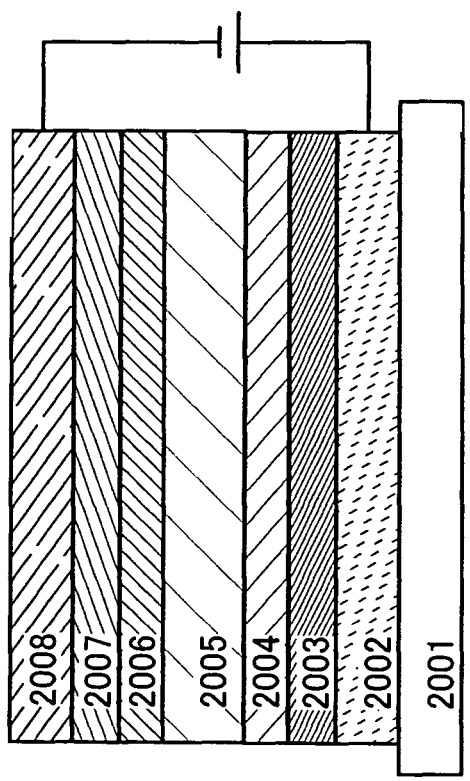
FIGS. 20a and 20b are diagrams each showing an example of a light emitting element applicable to a display device having a pixel configuration of the invention.
Figure 20B:
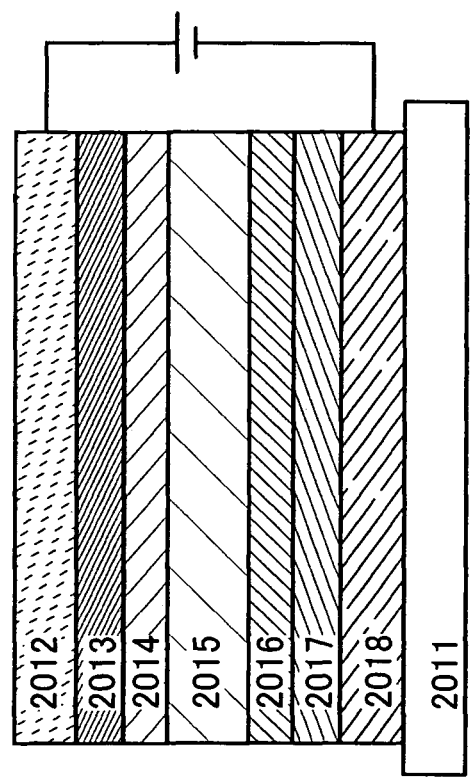

Examples of a light emitting element applicable to the light emitting element 1918 are shown in FIGS. 20*a* and 20*b*. That is, a structure of a light emitting element which can be applied in the pixel described in Embodiment Mode 1, Embodiment Mode 2, Embodiment Mode 3, Embodiment Mode 4, or Embodiment Mode 5 is described with reference to FIGS. 20*a* and 20*b*.

A light emitting element shown in FIG. 20*a* has an element structure in which an anode 2002, a hole injecting layer 2003 formed of a hole injecting material, a hole transporting layer 2004 formed of a hole transporting material, a light-emitting layer 2005, an electron transporting layer 2006 formed of an electron transporting material, an electron injecting layer 2007 formed of an electron injecting material, and a cathode 2008 are stacked on a substrate 2001 in this order. Here, the light-emitting layer 2005 is sometimes formed only of one kind of light emitting material, but may be formed of two or more materials. In addition, an element structure of the invention is not limited to this structure.

In addition to the stacked layer structure in which the functional layers are stacked as shown in FIG. 20*a*, various elements can be applied such as an element using a polymer compound or a high efficiency element in which a light emitting layer is formed using a triplet light emitting material emitted from a triplet excited state, which can be applied to a white light emitting element realized by dividing a light emitting region into two regions by controlling a carrier recombination region by a hole blocking layer, or the like.

In a manufacturing method of the element of the invention shown in FIG. 20*a*, the hole injecting material, the hole transporting material, and the light emitting material are deposited in this order on the substrate 2001 provided with the anode (ITO) 2002, first. Then, the electron transporting material and the electron injecting material are deposited, and the cathode 2008 is lastly formed by deposition.

Described below are materials suitable for the hole injecting material, the hole transporting material, the electron transporting material, the electron injecting material, and the light emitting material respectively.

As the hole injecting material, a porphyrin compound, phthalocyanine (hereinafter referred to as "$H_2Pc$"), copper phthalocyanine (hereinafter referred to as "CuPc"), or the like is efficient among organic compounds. In addition, a material that has a smaller value of an ionization potential than the hole transporting material to be used and has a hole transporting function can also be used as the hole injecting material. There is also a material of a conductive polymer chemically doped, which includes polyethylene dioxythiophene (hereinafter referred to as "PEDOT") doped with polystyrene sulfonate (hereinafter referred to as "PSS"), polyaniline, and the like. In addition, an insulating polymer is efficient in terms of planarization of an anode, and polyimide (hereinafter referred to as "PI") is often used. Further, an inorganic compound is also used, which includes an extra-thin film of aluminum oxide (hereinafter referred to as "alumina") as well as a thin film of a metal such as gold or platinum.

As the hole transporting material, it is an aromatic amine-based compound (that is, a compound having a bond of benzene ring-nitrogen) that is most widely used. The materials that are widely used include 4,4'-bis(diphenylamino)-biphenyl (hereinafter referred to as "TAD"), derivatives thereof such as 4,4'-bis[N-(3-methylphenyl)-N-phenyl-amino]-biphenyl (hereinafter referred to as "TPD") or 4,4'-bis[N-(1-naphthyl)-N-phenyl-amino]-biphenyl (hereinafter referred to as "a-NPD"), and besides, star burst aromatic amine compounds such as 4,4',4''-tris(N,N-diphenyl-amino)-triphenylamine (hereinafter referred to as "TDATA") and 4,4',4''-tris[N-(3-methylphenyl)-N-phenyl-amino]-triphenylamine (hereinafter referred to as "MTDATA").

As the electron transporting material, a metal complex is often used, which includes a metal complex having a quinoline skeleton or a benzoquinoline skeleton such as $Alq_3$, BAlq, tris(4-methyl-8-quinolinolato)aluminum (hereinafter referred to as "Almq"), or bis(10-hydroxybenzo[h]-quinolinato)beryllium (hereinafter referred to as "Bebq"), and besides, a metal complex having an oxazole-based or a thiazole-based ligand such as bis[2-(2-hydroxyphenyl)-benzoxazolato]zinc (hereinafter referred to as "$Zn(BOX)_2$") or bis[2-(2-hydroxyphenyl)-benzothiazolato]zinc (hereinafter referred to as "$Zn(BTZ)_2$"). Further, other than the metal complexes, oxadiazole derivatives such as 2-(4-biphenylyl)-5-(4-tert-butylphenyl)-1,3,4-oxadiazole (hereinafter referred to as "PBD") and OXD-7, triazole derivatives such as TAZ and 3-(4-tert-butylphenyl)-4-(4-ethylphenyl)-5-(4-biphenylyl)-2,0,4-triazole (hereinafter referred to as "p-EtTAZ"), and phenanthroline derivatives such as bathophenanthroline (hereinafter referred to as "BPhen") and BCP have an electron transporting property.

As the electron injecting material, the above-described electron transporting materials can be used. In addition, an extra-thin film of an insulator such as metal halide such as calcium fluoride, lithium fluoride or cesium fluoride, or alkali metal-oxide such as lithium oxide, is often used. Further, an alkali-metal complex such as lithium acetyl acetonate (hereinafter referred to as "Li(acac)") or 8-quinolinolato-lithium (hereinafter referred to as "Liq") is also efficient.

As the light emitting material, other than the above-described metal complexes such as $Alq_3$, Almq, BeBq, BAlq, $Zn(BOX)_2$, and $Zn(BTZ)_2$, various fluorescent pigments are efficient. The fluorescent pigments include 4,4'-bis(2,2-diphenyl-vinyl)-biphenyl which is blue, 4-(dicyanomethylene)-2-methyl-6-(p-dimethylaminostyryl)-4H-pyran which is red-orange, and the like. Also, a triplet light emitting material is available, which is mainly a complex with platinum or iridium as a central metal. As the triplet light emitting material, tris(2-phenylpyridine)iridium, bis(2-(4'-tryl)pyridinato-N,$C^2$)acetylacetonato iridium (hereinafter referred to as "acacIr(tpy)$_2$"), 2,3,7,8,20,13,17,18,-octaethyl-21H,23H porphyrin-platinum, and the like are known.

By combining the above-described materials that have respective functions, a light emitting element with high reliability can be manufactured.

In the case of the pixel shown in FIG. 4, 7 or 10 described in Embodiment Mode 1, in addition, a light emitting element as shown in FIG. 20b having the layers stacked in an order opposite to that in FIG. 20a can be used. That is, in the element structure, a cathode 2018, an electron injecting layer 2017 formed of an electron injecting material, an electron transporting layer 2016 formed of an electron transporting material, a light-emitting layer 2015, a hole transporting layer 2014 formed of a hole transporting material, a hole injecting layer 2013 formed of a hole injecting material, and an anode 2012 are stacked on a substrate 2011 in this order.

In addition, in order to take out light emission of a light emitting element, at least one of an anode and a cathode is required to be transparent. A TFT and a light emitting element are formed over a substrate; and there are light emitting elements having a top emission structure in which light emission is taken out through a surface opposite to the substrate, having a bottom emission structure in which light emission is taken out through a surface on the substrate side, and having a dual emission structure in which light emission is taken out through a surface opposite to the substrate and a surface on the substrate side, respectively. The pixel configuration of the invention can be applied for the light emitting element having any emission structure.

A light emitting element having a top emission structure is described with reference to FIG. 21a.

On a substrate 2100, a driver TFT 2101 is formed, and a first electrode 2102 is formed so as to contact a source electrode of the driver TFT 2101. A layer containing an organic compound 2103 and a second electrode 2104 are formed thereon.

The first electrode 2102 is an anode of a light emitting element while the second electrode 2104 is a cathode of the light emitting element. That is, a light emitting element is formed in a region where the layer containing an organic compound 2103 is sandwiched between the first electrode 2102 and the second electrode 2104.

The first electrode 2102 which functions as an anode is preferably formed using a material having a high work function. For example, a single-layer film such as a titanium nitride film, a chromium film, a tungsten film, a Zn film, or a Pt film, a stacked layer of a titanium nitride film and a film containing aluminum as a main component, or a three-layer structure of a titanium nitride film, a film containing aluminum as a main component and a titanium nitride film can be used. It is to be noted that a stacked-layer structure makes it possible to reduce the resistance as a wire and realize a good ohmic contact, and to function as an anode. By using a light-reflective metal film, an anode which does not transmit light can be formed.

The second electrode 2104 which functions as a cathode is preferably formed using a stacked layer of a metal thin film formed of a material having a low work function (Al, Ag, Li, Ca, or an alloy thereof such as MgAg, MgIn, AlLi, CaF$_2$, or CaN) and a transparent conductive film (indium tin oxide (ITO), indium zinc oxide (IZO), zinc oxide (ZnO), or the like). By using the thin metal film and the transparent conductive film as described above, a cathode which can transmit light can be formed.

Figure 21A:
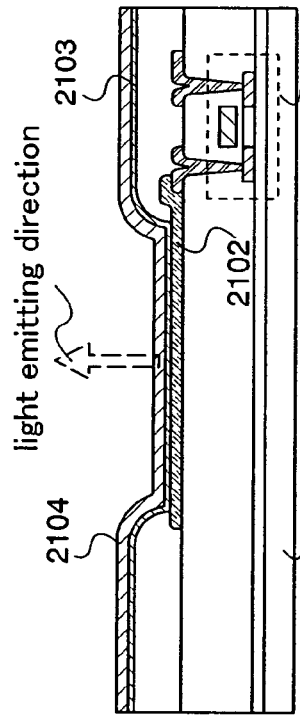
FIGS. 21a to 21c are views each illustrating a light emission structure of a light emitting element.

Accordingly, light of the light emitting element can be taken out from a top surface as shown by an arrow in FIG. 21a. That is, in the case where the light emitting element is applied in the display panel shown in FIGS. 19a and 19b, light is emitted toward the substrate 1910 side. Therefore, when a light emitting element having a top emission structure is used in the display device, a substrate which transmits light is used as the sealing substrate 1904.

In addition, if an optical film is provided, the optical film may be provided for the sealing substrate 1904.

It is to be noted that in the case of the pixel configuration shown in FIG. 4 described in Embodiment Mode 1, the first electrode 2102 may be formed using a metal film formed of a material having a low work function such as MgAg, MgIn, or AlLi to function as a cathode. In addition, the second electrode 2104 may be formed using a transparent conductive film such as an ITO (indium tin oxide) film or an indium zinc oxide (IZO) film. According to this structure, the transmissivity of the top emission can be improved.

Next, a light emitting element having a bottom emission structure is described with reference to FIG. 21b. The same reference numerals as FIG. 21a are used since a structure except for its emission structure of the light emitting element is the same.

The first electrode 2102 which functions as an anode is preferably formed using a material having a high work function. For example, a transparent conductive film such as an ITO (indium tin oxide) film or an indium zinc oxide (IZO) film can be used. By using a transparent conductive film, an anode which can transmit light can be formed.

The second electrode 2104 which functions as a cathode is preferably formed using a metal film formed of a material having a low work function (Al, Ag, Li, Ca, or an alloy thereof such as MgAg, MgIn, AlLi, CaF$_2$, or CaN). By using a light-reflective metal film as described above, a cathode which does not transmit light can be formed.

Figure 21B:
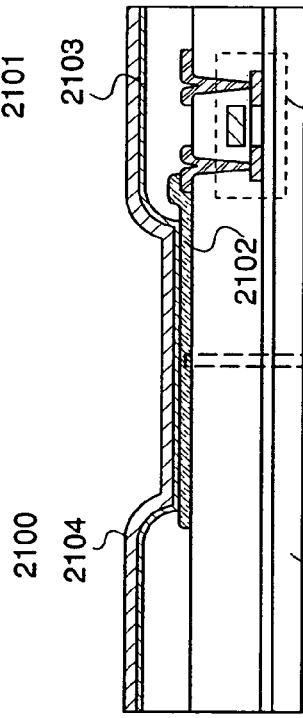

Accordingly, light of the light emitting element can be taken out from a bottom surface as shown by an arrow in FIG. 21b. That is, in the case where the light emitting element is applied in the display panel shown in FIGS. 19a and 19b, light is emitted toward the substrate 1910 side. Therefore, when a light emitting element having a bottom emission structure is used in the display device, a substrate which transmits light is used as the substrate 1910.

In addition, if an optical film is provided, the optical film may be provided for the substrate 1910.

A light emitting element having a dual emission structure is described with reference to FIG. 21c. The same reference numerals as FIG. 21a are used since a structure except for its emission structure of the light emitting element is the same.

The first electrode 2102 which functions as an anode is preferably formed using a material having a high work function. For example, a transparent conductive film such as an ITO (indium tin oxide) film or an indium zinc oxide (IZO) film can be used. By using a transparent conductive film, an anode which can transmit light can be formed.

The second electrode 2104 which functions as a cathode is preferably formed using a stacked layer of a metal thin film formed of a material having a low work function (Al, Ag, Li, Ca, or an alloy thereof such as MgAg, MgIn, AlLi, CaF$_2$, or CaN) and a transparent conductive film (indium tin oxide (ITO), an alloy of indium oxide and zinc oxide (In$_2$O$_3$—ZnO), zinc oxide (ZnO), or the like). By using the thin metal film and the transparent conductive film as described above, a cathode which can transmit light can be formed.

Figure 21C:
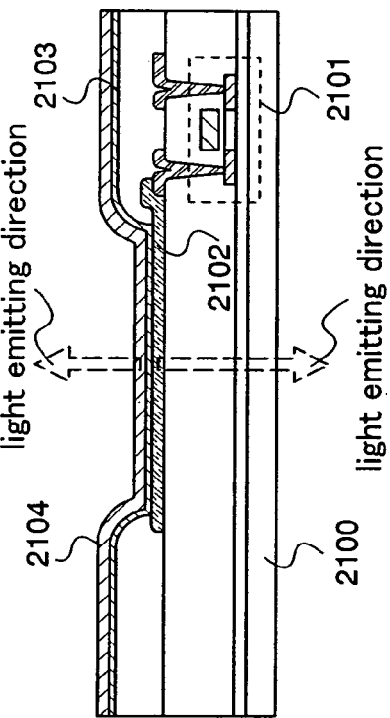

Accordingly, light of the light emitting element can be taken out from both surfaces as shown by arrows in FIG. 21c. That is, in the case where the light emitting element is applied in the display panel shown in FIGS. 19a and 19b, light is emitted toward the substrate 1910 side and the sealing substrate 1904 side. Therefore, when a light emitting element having a dual emission structure is used in the display device, substrates which transmit light are used as the substrate 1910 and the sealing substrate 1904 respectively.

In addition, if an optical film is provided, the optical films may be provided for the substrate 1910 and the sealing substrate 1904 respectively.

In addition, the invention can also be applied in a display device which achieves full-color display by using a white light emitting element and a color filter.

Figure 22:
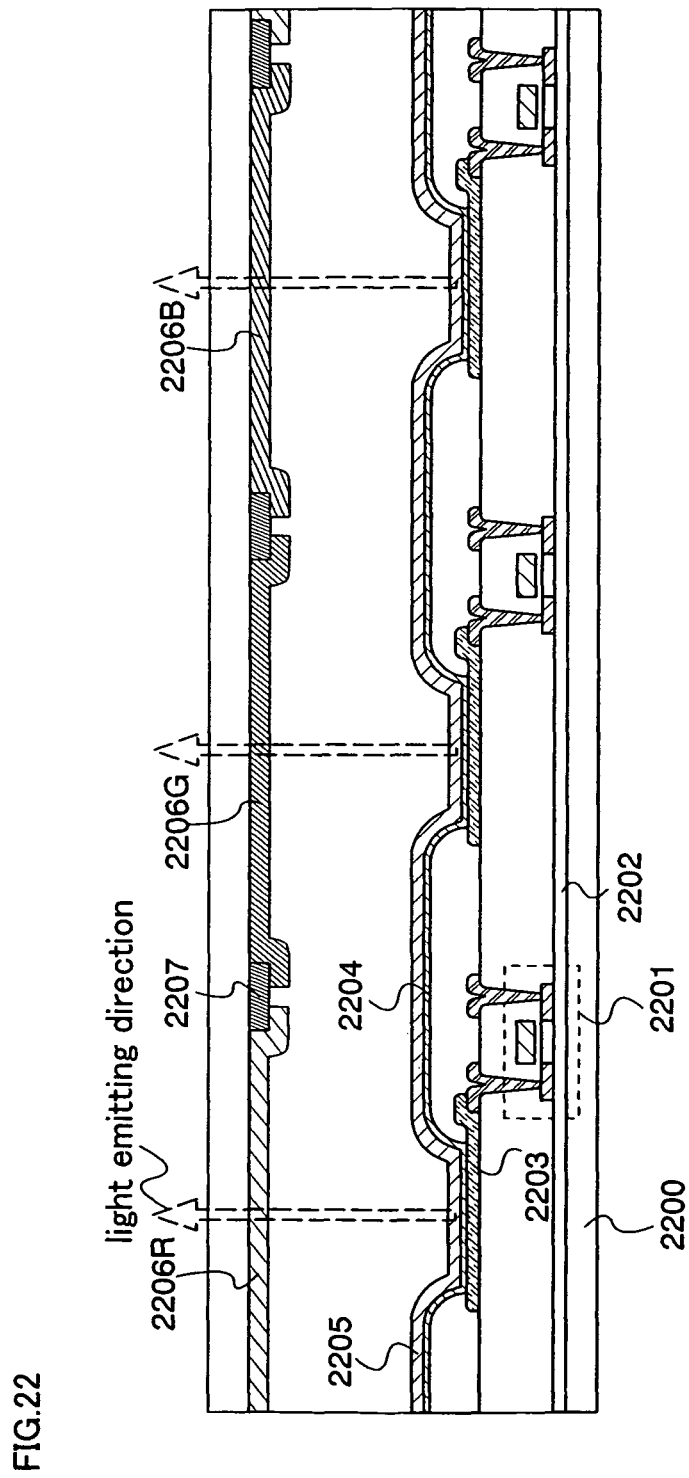
FIG. 22 is a cross sectional view of a display panel for performing full color display using a color filter.

As shown in FIG. 22, on a substrate 2200, a base film 2202 and a driver TFT 2201 are formed, and a first electrode 2203 is formed so as to contact a source electrode of the driver TFT 2201. A layer containing an organic compound 2204 and a second electrode 2205 are formed thereon.

The first electrode 2203 is an anode of a light emitting element while the second electrode 2205 is a cathode of the light emitting element. That is, a light emitting element is formed in a region where the layer containing an organic compound 2204 is sandwiched between the first electrode 2203 and the second electrode 2205. White light is emitted by the structure shown in FIG. 22. A red color filter 2206R, a green color filter 2206G, and a blue color filter 2206B are provided above the light emitting elements respectively to perform full-color display. In addition, a black matrix (also called a "BM") 2207 for separating these color filters is provided.

The above-described structures of a light emitting element can be used in combination and can be applied in a display device having the pixel configuration of the invention. Note that the constitution of a display panel and the light emitting elements described above are only examples, and it is needless to say that the pixel configuration of the invention can be applied in a display device having another constitution.

Described next is a partial cross sectional view of a pixel region of a display panel.

First, a case where a polysilicon (p-Si) film is used as a semiconductor layer of a transistor is described with reference to FIGS. 23a, 23b, 24a, and 24b.

For example, in order to form the semiconductor layer, an amorphous silicon (a-Si) film is formed on a substrate by a known film formation method here. It is to be noted that any semiconductor film having an amorphous structure (including a microcrystalline semiconductor film) may be used other than the amorphous silicon film. Further, a compound semiconductor film having an amorphous structure such as an amorphous silicon germanium film may be used as well.

Subsequently, the amorphous silicon film is crystallized by a laser crystallization method, a thermal crystallization method using RTA or an annealing furnace, or a thermal crystallization method using a metal element for promoting crystallization. It is needless to say that the above-described methods may be performed in combination.

As a result of the above-described crystallization, a crystallized region is formed partially in the amorphous semiconductor film.

Next, the crystalline semiconductor film in which the crystallinity is partially enhanced is patterned into a desired shape to form an island-shaped semiconductor film from the crystallized region. This semiconductor film is used as a semiconductor layer of a transistor.

As shown in FIGS. 23a and 23b, a base film 23102 is formed on a substrate 23101, and a semiconductor layer is formed thereon. The semiconductor layer includes a channel forming region 23103, an impurity region 23105 to form a source region or a drain region of a driving transistor 23118, a channel forming region 23106 to form a bottom electrode of a capacitor 23119, an LDD region 23107, and an impurity region 23108. It is to be noted that channel doping may be performed to the channel forming region 23103 and the channel forming region 23106.

As the substrate, a glass substrate, a quartz substrate, a ceramic substrate, or the like can be used. The base film 23102 can be formed using a single layer of aluminum nitride (AlN), silicon oxide ($SiO_2$), silicon oxynitride ($SiO_xN_y$), or the like, or a stacked layer thereof.

A gate electrode 23110 and a top electrode 23111 of the capacitor are formed over the semiconductor layer with a gate insulating film 23109 interposed therebetween.

An interlayer insulating film 23112 is formed to cover the driving transistor 23118 and the capacitor 23119. A contact hole is opened in the interlayer insulating film 23112, through which a wire 23113 contacts the impurity region 23105. A pixel electrode 23114 is formed to contact the wire 23113, and a second interlayer insulator 23115 is formed to cover an end portion of the pixel electrode 23114 and the wire 23113; it is formed using a positive photosensitive acrylic resin film here. Then, a layer containing an organic compound 23116 and an opposing electrode 23117 are formed on the pixel electrode 23114. A light emitting element 23120 is formed in a region where the layer containing an organic compound 23116 is sandwiched between the pixel electrode 23114 and the opposing electrode 23117.

In addition, as shown in FIG. 23b, an LDD region 23202, which forms a part of the bottom electrode of the capacitor 23119, may be provided so as to overlap the top electrode 23111. Note that the same reference numerals as FIG. 23a are used for the same portions, and description thereof is omitted.

In addition, as shown in FIG. 24a, a second top electrode 23301 may be provided which is formed in the same layer as the wire 23113 contacting the impurity region 23105 of the driving transistor 23118. Note that the same reference numerals as FIG. 23a are used for the same portions, and description thereof is omitted. A second capacitor is formed by sandwiching the interlayer insulating film 23112 between the second top electrode 23301 and the top electrode 23111. In addition, the second top electrode 23301 contacts the impurity region 23108, so that a first capacitor in which the gate insulating film 23102 is sandwiched between the top electrode 23111 and the channel forming region 23106 and the second capacitor in which the interlayer insulating film 23112 is sandwiched between the top electrode 23111 and the second top electrode 23301 are connected in parallel to form a capacitor 23302 constituted by the first capacitor and the second capacitor. The capacitor 23302 has synthesis capacity of capacity of the first capacitor and the second capacitor, thereby the capacitor having large capacity can be formed in a small area. That is, by using the capacitor in the pixel configuration of the invention, the aperture ratio can be further improved.

Further alternatively, a structure of a capacitor as shown in FIG. 24b may be adopted as well. A base film 24102 is formed on a substrate 24101, and a semiconductor layer is formed thereon. The semiconductor layer includes a channel forming region 24103 and an impurity region 24105 to form a source region or a drain region of a driving transistor 24118. It is to be noted that channel doping may be performed to the channel forming region 24103.

As the substrate, a glass substrate, a quartz substrate, a ceramic substrate, or the like can be used. The base film 23102 can be formed using a single layer of aluminum nitride (AlN), silicon oxide ($SiO_2$), silicon oxynitride ($SiO_xN_y$), or the like, or a stacked layer thereof.

A gate electrode 24107 and a first electrode 24108 are formed over the semiconductor layer with a gate insulating film 24106 interposed therebetween.

A first interlayer insulating film 24109 is formed to cover the driving transistor 24118 and the first electrode 24108. A contact hole is opened in the first interlayer insulating film 24109, through which a wire 24110 contacts the impurity region 24105. In addition, a second electrode 24111 is formed in the same layer formed of the same material as the wire 24110.

Then, a second interlayer insulating film 24112 is formed to cover the wire 24110 and the second electrode 24111. A contact hole is opened in the second interlayer insulating film 24112, through which a pixel electrode 24113 is formed to contact the wire 24110. A third electrode 24114 is formed in the same layer formed of the same material as the pixel electrode 24113. Accordingly, a capacitor 24119 is constituted by the first electrode 24108, the second electrode 24111, and the third electrode 24114.

An insulator 24115 is formed so as to cover an end portion of the pixel electrode 24113 and the third electrode 24114. Then, a layer containing an organic compound 24116 and an opposing electrode 24117 are formed on the pixel electrode 24113 and the third electrode 24114. A light emitting element 24120 is formed in a region where the layer containing an organic compound 24116 is sandwiched between the pixel electrode 24113 and the opposing electrode 24117.

As set forth above, there are the structures shown in FIGS. 23*a*, 23*b*, 24*a*, and 24*b* as a structure of a transistor using a crystalline semiconductor film as its semiconductor layer. It is to be noted that FIGS. 23*a*, 23*b*, 24*a*, and 24*b* are transistors having a top gate structure. That is, the transistor may be either a p-type or an n-type. In the case of an n-type transistor, the LDD region may overlap the gate electrode or may not overlap the gate electrode, or the LDD region may partially overlap the gate electrode. Further, the gate electrode may have a tapered shape and the LDD region may be provided under the tapered portion of the gate electrode in a self-aligned manner. In addition, the number of gate electrodes is not limited to two, a multi-gate structure having three or more gate electrodes may be employed, or a single gate structure may be employed.

By using a crystalline semiconductor film as a semiconductor layer (e.g., a channel forming region, a source region, and a drain region) of a transistor constituting the pixel of the invention, the potential supply line driver circuit 201, the scan line driver circuit 202, and the signal line driver circuit 203 can be easily formed over the same substrate as the pixel region 204 in FIG. 2, for example. Further, in the constitution shown in FIG. 13, the buffer circuits 1301, 1302, and 1303 can also be formed easily over the substrate. In addition, a part of the signal line driver circuit 203 in FIG. 13 may be formed over the same substrate as the pixel region 204, and the other part thereof may be formed on an IC chip to be mounted by COG or the like as is in the display panel shown in FIGS. 19*a* and 19*b*. In this manner, manufacturing cost can be reduced.

Next, as for a structure of a transistor using a polysilicon (p-Si) as its semiconductor layer, FIGS. 27*a* and 27*b* are partial cross sectional views each of a display panel in which a transistor having a structure in which a gate electrode is sandwiched between a substrate and a semiconductor layer, namely a bottom gate structure in which a gate electrode is disposed under a semiconductor layer is adopted.

A base film 2702 is formed on a substrate 2701. Then, a gate electrode 2703 is formed on the base film 2702. A first electrode 2704 is formed in the same layer formed of the same material as the gate electrode. As a material for the gate electrode 2703, phosphorus-added polycrystalline silicon can be used. Other than polycrystalline silicon, silicide that is a compound of metal and silicon may be used as well.

Then, a gate insulating film 2705 is formed to cover the gate electrode 2703 and the first electrode 2704. The gate insulating film 2705 is formed using a silicon oxide film, a silicon nitride film, or the like.

On the gate insulating film 2705, a semiconductor layer is formed. The semiconductor layer includes a channel forming region 2706, an LDD region 2707 and an impurity region 2708 to form a source region or a drain region of a driving transistor 2722, and a channel forming region 2709 to form a second electrode, an LDD region 2710 and an impurity region 2711 of a capacitor 2723. It is to be noted that channel doping may be performed to the channel forming region 2706 and the channel forming region 2709.

As the substrate, a glass substrate, a quartz substrate, a ceramic substrate, or the like can be used. The base film 2702 can be formed using a single layer of aluminum nitride (AlN), silicon oxide ($SiO_2$), silicon oxynitride ($SiO_xN_y$), or the like, or a stacked layer thereof.

A first interlayer insulating film 2712 is formed to cover the semiconductor layer. A contact hole is opened in the first interlayer insulating film 2712, through which a wire 2713 contacts the impurity region 2708. A third electrode 2714 is formed in the same layer formed of the same material as the wire 2713. The capacitor 2723 is constituted by the first electrode 2704, the second electrode, and the third electrode 2714.

In addition, an opening 2715 is formed in the first interlayer insulating film 2712. A second interlayer insulating film 2716 is formed so as to cover the driving transistor 2722, the capacitor 2723, and the opening 2715. A pixel electrode 2717 is formed through a contact hole on the second interlayer insulating film 2716. Then, an insulator 2718 is formed so as to cover end portions of the pixel electrode 2717. For example, a positive photosensitive acrylic resin film can be used. Subsequently, a layer containing an organic compound 2719 and an opposing electrode 2720 are formed on the pixel electrode 2717, and a light emitting element 2721 is formed in a region where the layer containing an organic compound 2719 is sandwiched between the pixel electrode 2717 and the opposing electrode 2720. The opening 2715 is disposed under the light emitting element 2721; that is, in the case where light emission from the light emitting element 2721 is taken out from the substrate side, transmissivity can be improved due to the existence of the opening 2715.

Furthermore, a fourth electrode 2724 may be formed in the same layer formed of the same material as the pixel electrode 2717 in FIG. 27*a*, which is shown in FIG. 27*b*. In that case, a capacitor 2725 can be constituted by the first electrode 2704, the second electrode, the third electrode 2714, and the fourth electrode 2724.

Figure 28A:
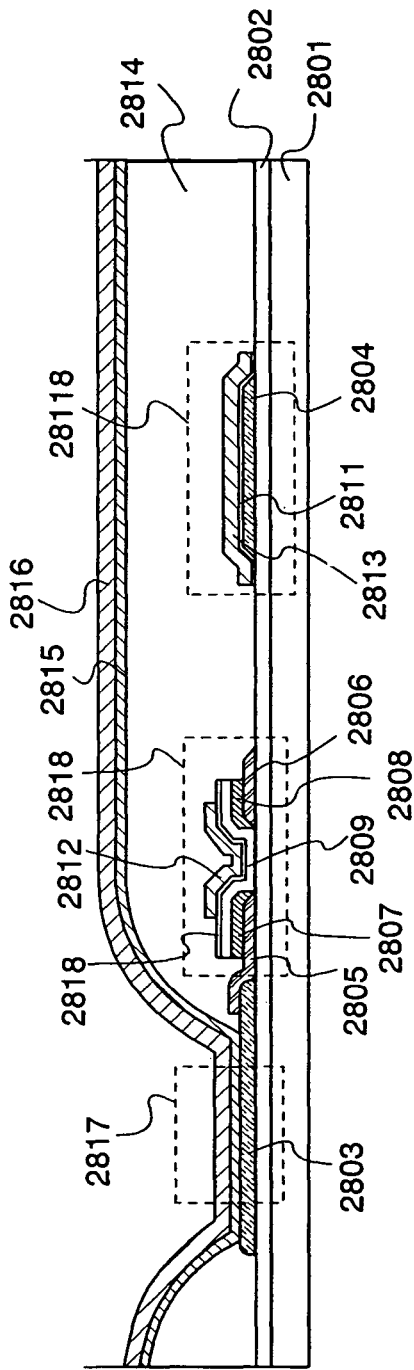
FIGS. 28a and 28b are partial cross sectional views respectively of a display panel.
Figure 28B:
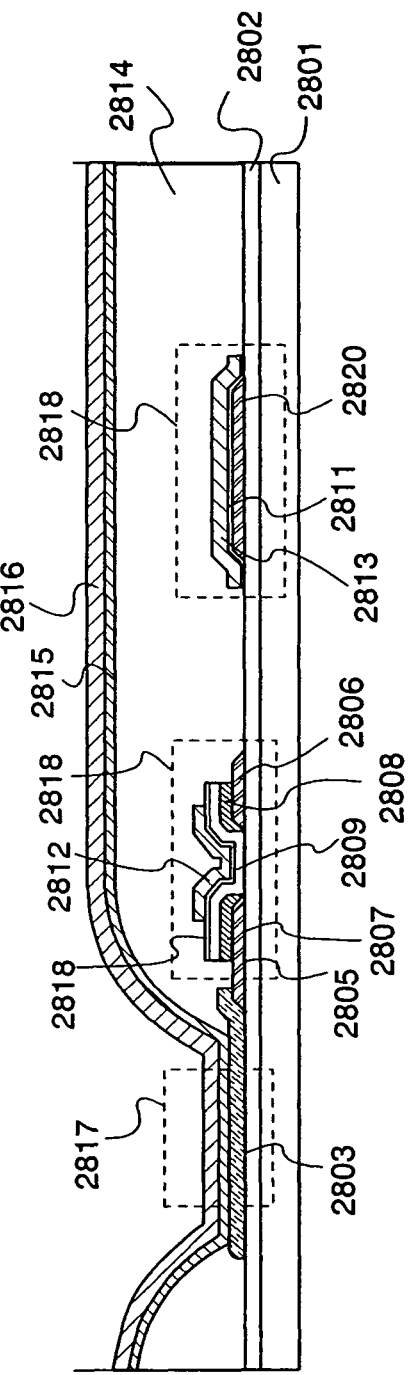

Described next is a case where an amorphous silicon (a-Si: H) film is used as a semiconductor layer of a transistor. FIGS. 28*a* and 28*b* show transistors each having a top gate structure while FIGS. 29*a*, 29*b*, 30*a*, and 30*b* show transistors each having a bottom gate structure.

FIG. 28*a* is a cross sectional view of a transistor having a top gate structure using amorphous silicon as its semiconductor layer. As shown in FIG. 28*a*, a base film 2802 is formed on a substrate 2801. On the base film 2802, a pixel electrode 2803 is formed. In addition, a first electrode 2804 is formed in the same layer formed of the same material as the pixel electrode 2803.

As the substrate, a glass substrate, a quartz substrate, a ceramic substrate, or the like can be used. The base film 2802 can be formed using a single layer of aluminum nitride (AlN), silicon oxide (SiO$_2$), silicon oxynitride (SiO$_x$N$_y$), or the like, or a stacked layer thereof.

A wire 2805 and a wire 2806 are formed on the base film 2802, and an end portion of the pixel electrode 2803 is covered with the wire 2805. On the wire 2805 and the wire 2806, an n-type semiconductor layer 2807 and an n-type semiconductor layer 2808 having n-type conductivity are formed respectively. In addition, a semiconductor layer 2809 is formed between the wire 2805 and the wire 2806 on the base film 2802, which is partially extended to the n-type semiconductor layer 2807 and the n-type semiconductor layer 2808. It is to be noted that this semiconductor layer is formed using an amorphous semiconductor film such as amorphous silicon (a-Si:H) or a microcrystalline semiconductor (μ-Si:H). Then, a gate insulating film 2810 is formed on the semiconductor layer 2809, and an insulating film 2811 is formed in the same layer formed of the same material as the gate insulating film 2810, on the first electrode 2804. It is to be noted that a silicon oxide film, a silicon nitride film, or the like is used as the gate insulating film 2810.

On the gate insulating film 2810, a gate electrode 2812 is formed. In addition, a second electrode 2813 is formed in the same layer formed of the same material as the gate electrode, over the first electrode 2804 with the insulating film 2811 sandwiched therebetween. A capacitor 2819 is formed by sandwiching the insulating film 2811 between the first electrode 2804 and the second electrode 2813. An interlayer insulating film 2814 is formed to cover an end portion of the pixel electrode 2803, a driving transistor 2818, and the capacitor 2819.

On the interlayer insulating film 2814 and the pixel electrode 2803 corresponding to an opening of the interlayer insulating film 2814, a layer containing an organic compound 2815 and an opposing electrode 2816 are formed. A light emitting element 2817 is formed in a region where the layer containing an organic compound 2815 is sandwiched between the pixel electrode 2803 and the opposing electrode 2816.

It is to be noted that as described in FIG. 22, a non-white light emitting element may be employed. That is, by providing color filters of R (red), G (green), and B (blue) for light emitting elements of R (red), G (green), and B (blue) respectively, unnecessary frequency component of light obtained from the light emitting elements of R (red), G (green), and B (blue) is cut so that color purity can be improved. Accordingly, a display device having faithful color reproducibility can be provided. By providing a color filter, in addition, reflected light can be reduced so that external light is prevented from coming out even if a polarizer is not provided. Accordingly, occurrence of reduction of the transmissivity by providing a polarizer separately is prevented, and besides, to come out external light can be suppressed.

The first electrode 2804 in FIG. 28a may be a first electrode 2820 as shown in FIG. 28b. The first electrode 2820 is formed in the same layer formed of the same material as the wires 2805 and 2806.

FIGS. 29a and 29b are cross sectional views each of a display panel using a transistor having a bottom gate structure using amorphous silicon as its semiconductor layer.

A base film 2902 is formed on a substrate 2901. On the base film 2902, a gate electrode 2903 is formed. In addition, a first electrode 2904 is formed in the same layer formed of the same material as the gate electrode 2903. As a material for the gate electrode 2903, phosphorus-added polycrystalline silicon can be used. Other than polycrystalline silicon, silicide that is a compound of metal and silicon may be used as well.

Then, a gate insulating film 2905 is formed to cover the gate electrode 2903 and the first electrode 2904. The gate insulating film 2905 is formed using a silicon oxide film, a silicon nitride film, or the like.

A semiconductor layer 2906 is formed on the gate insulating film 2905. In addition, a semiconductor layer 2907 is formed in the same layer formed of the same material as the semiconductor layer 2906.

As the substrate, a glass substrate, a quartz substrate, a ceramic substrate, or the like can be used. The base film 2902 can be formed using a single layer of aluminum nitride (AlN), silicon oxide (SiO$_2$), silicon oxynitride (SiO$_x$N$_y$), or the like, or a stacked layer thereof.

N-type semiconductor layers 2908 and 2909 having n-type conductivity are formed on the semiconductor layer 2906 while an n-type semiconductor layer 2910 is formed on the semiconductor layer 2907.

Wires 2911 and 2912 are formed on the n-type semiconductor layers 2908 and 2909 respectively while a conductive layer 2913 is formed in the same layer formed of the same material as the wires 2911 and 2912, on the n-type semiconductor layer 2910.

The semiconductor layer 2907, the n-type semiconductor layer 2910, and the conductive layer 2913 constitute a second electrode. It is to be noted that a capacitor 2920 is formed by sandwiching the gate insulating film 2905 between the second electrode and the first electrode 2904.

One end portion of the wire 2911 is extended, and a pixel electrode 2914 is formed on the extended wire 2911.

In addition, an insulator 2915 is formed so as to cover end portions of the pixel electrode 2914 and the driving transistor 2919 and the capacitor 2920.

A layer containing an organic compound 2916 and an opposing electrode 2917 are formed on the pixel electrode 2914 and the insulator 2915, and a light emitting element 2918 is formed in a region in which the layer containing an organic compound 2916 is sandwiched between the pixel electrode 2914 and the opposing electrode 2917.

The semiconductor layer 2907 and the n-type semiconductor layer 2910 which form a part of the second electrode of the capacitor may not be provided. That is, the second electrode may be constituted only by the conductive layer 2913, so that a capacitor 2922 may be formed by sandwiching the gate insulating film 2905 between the first electrode 2904 and the conductive layer 2913.

In addition, the pixel electrode 2914 may be formed prior to forming the wire 2911 in FIG. 29a, the capacitor 2922 can be formed by sandwiching the gate insulating film 2905 between a second electrode 2921 which is formed of the pixel electrode 2914 and the first electrode 2904 as shown in FIG. 29b.

It is to be noted that FIGS. 29a and 29b show inversely staggered, channel etch type transistors; however, a channel protective type transistor may be used. The case of a channel protective type transistor is described with reference to FIGS. 30a and 30b.

A channel protective type transistor shown in FIG. 30a is different from a driving transistor of the channel etch type 2919 shown in FIG. 29a in that an insulator 3001 which is an etching mask is provided on the channel forming region in the semiconductor layer 2906. The other portions identical to FIG. 29a are denoted by the same reference numerals.

Similarly, a channel protective type transistor shown in FIG. 30b is different from the driving transistor of the channel etch type 2919 shown in FIG. 29b in that the insulator 3001 which is an etching mask is provided on the channel forming region in the semiconductor layer 2906. The other portions identical to FIG. 29*b* are denoted by the same reference numerals.

By using an amorphous semiconductor film as a semiconductor layer (e.g., a channel forming region, a source region and a drain region) of a transistor constituting the pixel of the invention, manufacturing cost can be reduced. For example, by employing the pixel configuration shown in FIG. 7, the amorphous semiconductor film can be applied.

It is to be noted that a structure of a transistor and a structure of a capacitor applicable to the pixel configuration of the invention are not limited to the above-described structures, and various structures can be used.

Embodiment Mode 11

The invention can be applied in various electronic apparatuses, specifically a display portion of electronic apparatuses. The electronic apparatuses include a video camera, a digital camera, a goggle-type display, a navigation system, a sound reproduction apparatus (e.g., a car audio system and an audio component system), a computer, a game machine, a portable information terminal (e.g., a mobile computer, a mobile phone, a portable game machine, and an electronic book), an image reproduction apparatus provided with a recording medium (specifically, an apparatus which can reproduce a recording medium such as a digital versatile disc (DVD), and comprises a display for displaying it) and the like.

Figure 44A:
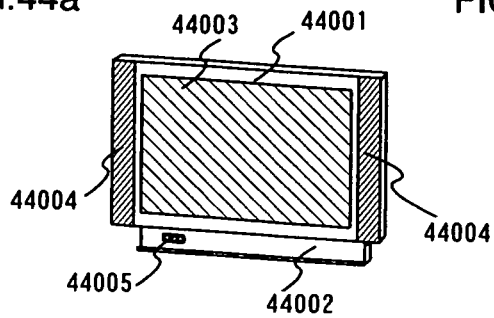
FIGS. 44a to 44h are views showing examples of an electronic apparatus in which a display device having a pixel configuration of the invention is applicable to a pixel region.

FIG. 44*a* shows a display which includes a housing 44001, a supporting base 44002, a display portion 44003, a speaker portion 44004, a video input terminal 44005, and the like. A display device having the pixel configuration of the invention can be used in the display portion 44003. It is to be noted that the display means all display devices for displaying information, including ones for a personal computer, for TV broadcasting reception, and for advertisement.

In recent years, the need to increase the size of a display has been increased. In accordance with the enlargement of a display, there has occurred a problem of a price advance. Therefore, it is an object that the manufacturing cost is reduced and a high quality product is provided at low price.

For example, by using the pixel configuration of FIG. 7 in the pixel region of the display panel, the display panel can be constituted by transistors having the same conductivity type. Consequently, the number of steps can be reduced and the manufacturing cost can be reduced.

In addition, by forming the pixel region and the peripheral driver circuit over the same substrate as shown in FIG. 19*a*, the display panel can be constituted by circuits including transistors having the same conductivity type. By using this display panel in the display portion of a large display, manufacturing cost of the display can be reduced.

In addition, by using an amorphous semiconductor (e.g., amorphous silicon (a-Si:H)) as a semiconductor layer of a transistor in a circuit constituting the pixel region, manufacturing process can be simplified and further cost reduction can be realized. In that case, it is preferable that a driver circuit in the periphery of the pixel region be formed on an IC chip and mounted onto the display panel by COG or the like as shown in FIG. 42*b*. In this manner, the size of the display can be easily increased by using an amorphous semiconductor.

Figure 44B:
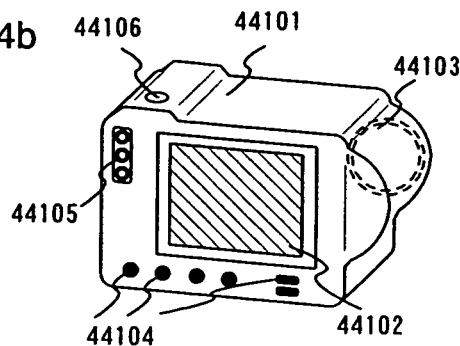

FIG. 44*b* shows a camera which includes a main body 44101, a display portion 44102, an image receiving portion 44103, operating keys 44104, an external connection port 44105, a shutter 44106, and the like.

In recent years, in accordance with functional advance of a digital camera and the like, competitive manufacturing thereof has been heated. Thus, it is a problem that a high functional product is provided at low price.

By using the pixel configuration of FIG. 7 in the pixel region, the pixel region can be constituted by transistors having the same conductivity type. In addition, as shown in FIG. 42*b*, by forming a signal line driver circuit whose operating speed is high on an IC chip, and forming a scan line driver circuit and a potential supply line driver circuit whose operating speed is relatively low constituted by transistors having the same conductivity type over the same substrate as the pixel region, high function can be realized and cost reduction can be achieved. In addition, by using an amorphous semiconductor such as amorphous silicon for a semiconductor layer of a transistor in the pixel region and the scan line driver circuit formed over the same substrate as the pixel region, further cost reduction can be achieved.

Figure 44C:
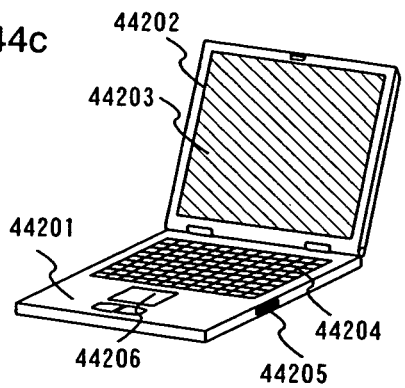

FIG. 44*c* shows a computer which includes a main body 44201, a housing 44202, a display portion 44203, a keyboard 44204, an external connection port 44205, a pointing mouse 44206, and the like. Aperture ratio of a pixel is increased in the computer using the invention in the display portion 44203 and high definition display can be performed. In addition, cost reduction can be achieved.

Figure 44D:
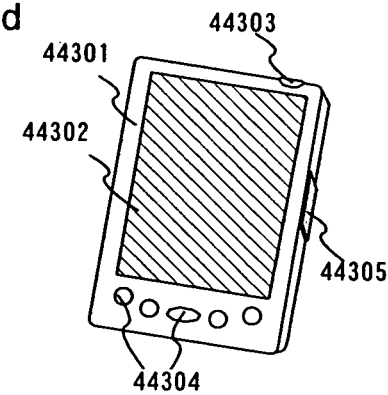

FIG. 44*d* shows a mobile computer which includes a main body 44301, a display portion 44302, a switch 44303, operating keys 44304, an infrared port 44305, and the like. Aperture ratio of a pixel is increased in the mobile computer using the invention in the display portion 44302 and high definition display can be performed. In addition, cost reduction can be achieved.

Figure 44E:
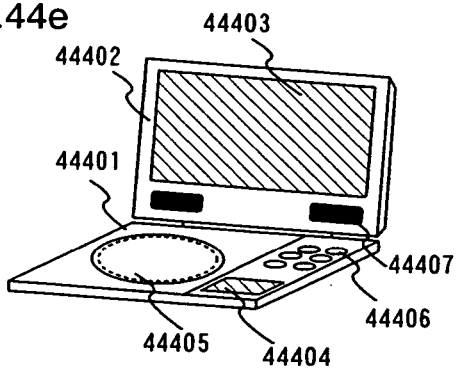

FIG. 44*e* shows a portable image reproducing device provided with a recording medium (specifically, a DVD player), which includes a main body 44401, a housing 44402, a display portion A 44403, a display portion B 44404, a recording medium (DVD or the like) reading portion 44405, an operating key 44406, a speaker portion 44407, and the like. The display portion A 44403 mainly displays image information and the display portion B 44404 mainly displays text information. Aperture ratio of a pixel is increased in the image reproducing device using the invention in the display portion A 44403 and the display portion B 44404, and high definition display can be performed. In addition, cost reduction can be achieved.

Figure 44F:
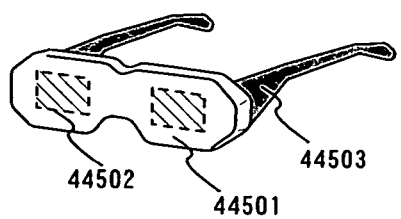

FIG. 44*f* shows a goggle-type display which includes a main body 44501, a display portion 44502, and an arm portion 44503. Aperture ratio of a pixel is increased in the goggle-type display using the invention in the display portion 44502, and high definition display can be performed. In addition, cost reduction can be achieved.

Figure 44G:
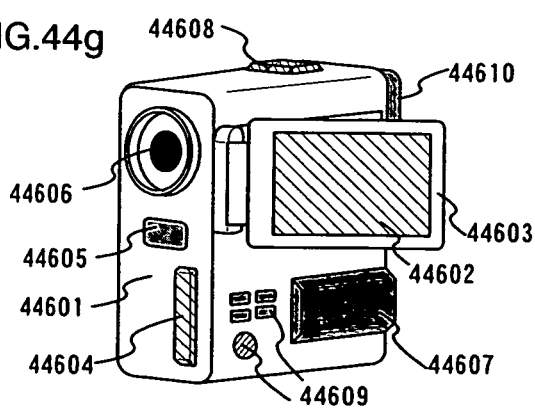

FIG. 44*g* shows a video camera which includes a main body 44601, a display portion 44602, a housing 44603, an external connection port 44604, a remote control receiving portion 44605, an image receiving portion 44606, a battery 44607, an audio input portion 44608, operating keys 44609, an eye piece 44610, and the like. Aperture ratio of a pixel is increased in the video camera using the invention in the display portion 44602, and high definition display can be performed. In addition, cost reduction can be achieved.

Figure 44H:
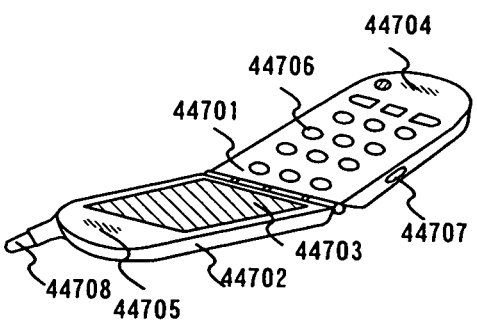

FIG. 44*h* shows a mobile phone which includes a main body 44701, a housing 44702, a display portion 44703, an audio input portion 44704, an audio output portion 44705, operating keys 44706, an external connection port 44707, an antenna 44708, and the like.

In recent years, a mobile phone is provided with a game function, a camera function, an electronic money function, or the like, and the need of a high-value added mobile phone has been increased. Further, a high-definition display has been demanded. Aperture ratio of a pixel is increased in the mobile phone using the invention in the display portion 44703, and high definition display can be performed. In addition, cost reduction can be achieved.

For example, by applying the pixel configuration of FIG. 7 in the pixel region, aperture ratio of a pixel can be improved. In specific, by using an n-type transistor as a driving transistor for driving a light emitting element, aperture ratio of the pixel is increased. Consequently, a mobile phone having a high-definition display portion can be provided.

In addition, since the aperture ratio is improved, a high-value added mobile phone having a high-definition display portion can be provided by applying the display device having a dual emission structure as shown in FIG. 21c in the display portion.

While a mobile phone has been multifunctional and frequency of use thereof has been increased, the life per charge has been required to be long.

For example, by forming a peripheral driver circuit on an IC chip as shown in FIG. 42b and using a CMOS or the like, power consumption can be reduced.

As set forth above, the invention can be applied to various electronic apparatuses.

Embodiment 1

In this embodiment, one example of a driving method of a display device having the pixel configuration of the invention is described further in detail. Only one pixel is shown in a pixel configuration of this embodiment shown in FIG. 49, however, actually a plurality of pixels is arranged in matrix in the row direction and the column direction in a pixel region of a display device.

The pixel includes a driving transistor 4901, a capacitor 4902, a switch 4903, a light emitting element 4909, a potential supply line (Illumination line) 4905, and a signal line (Data line) 4906. It is to be noted that a p-type transistor is used as the driving transistor 4901.

A first terminal (a source terminal or a drain terminal) of the driving transistor 4901 is connected to the potential supply line 4905, a gate terminal thereof is connected to the signal line 4906 through the capacitor 4902, and a second terminal (the source terminal or the drain terminal) thereof is connected to an anode (a pixel electrode) of the light emitting element 4904. In addition, the gate terminal and the second terminal (the source terminal or the drain terminal) of the driving transistor 4901 are connected to each other through the switch 4903. Therefore, when the switch 4903 is on, a portion between the gate terminal and the second terminal (the source terminal or the drain terminal) of the driving transistor 4901 becomes conductive. Then, when the switch 4903 is turned off, the portion between the gate terminal and the second terminal (the source terminal or the drain terminal) of the driving transistor 4901 becomes non-conductive, and a potential difference (a voltage) between a potential of the gate terminal (or the second terminal) of the driving transistor 4901 at this moment and a potential of the signal line 4906 can be held in the capacitor 4902. Note that a cathode of the light emitting element 4904 is connected to a wire (Cathode) 4908 to which a potential of a low power supply potential Vss has been set. It is to be noted that Vss is, taking as a criterion a power supply potential Vdd which is set to the potential supply line 4905 in a light emitting period of a pixel, a potential satisfying Vss<Vdd. In this embodiment, Vss is 0 V.

Figure 49:
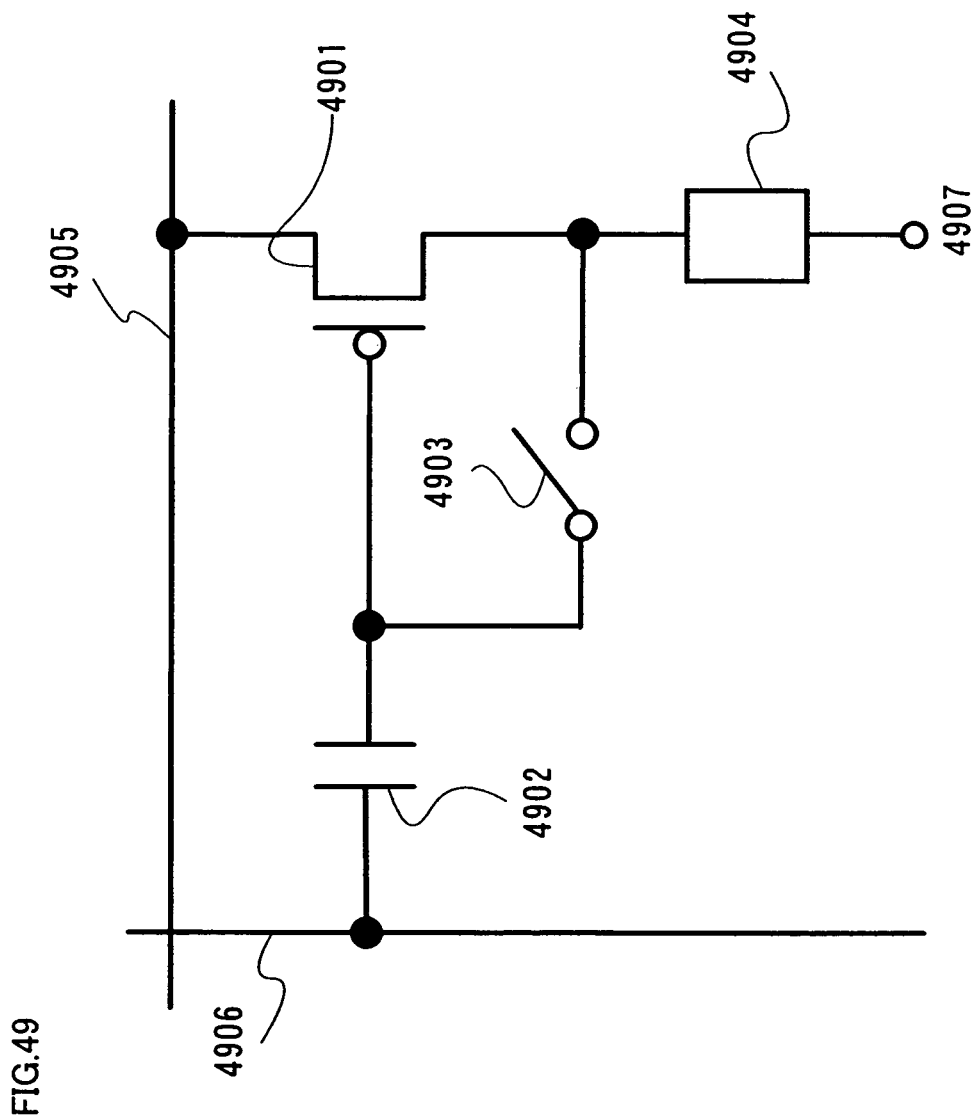
FIG. 49 is a diagram showing a pixel configuration of the invention.

Operation in the pixel configuration of FIG. 49 is described with reference to FIGS. 50a to 50d, and FIG. 55. In this embodiment, a power supply potential Vdd is 8 V. An analog signal potential $V_{sig}$ is set to the signal line 4906 so as to express eight gradations in the pixel.

In a signal writing period of the pixel, a value of the analog signal potential $V_{sig}$ which is set to the signal line 4906 is 0 V in the case of a gradation level of 0, 1 V in the case of a gradation level of 1, 2 V in the case of a gradation level of 2, 3 V in the case of a gradation level of 3, 4 V in the case of a gradation level of 4, 5 V in the case of a gradation level of 5, 6 V in the case of a gradations level of 6, and 7 V in the case of a gradation level of 7 here. In addition, an analog signal potential $V_{sup}$ which is set to the signal line 4906 in a light emitting element of the pixel is an analog signal potential varying regularly and periodically.

Described here is a case where a signal for expressing a gradation level of 3 ($V_{sig}$=3 V) is written to the pixel through the signal line 4906. Note that a voltage value, a potential, and a gradation level described specifically in this embodiment are specific examples, and the invention is not limited thereto.

First, the switch 4903 is turned on. The power supply potential Vdd=8 V is set to the potential supply line 4905. Consequently, current flows to the capacitor 4902, the driving transistor 4901, and the light emitting element 4904 as shown by an arrow in FIG. 50a.

Here, the light emitting element 4904 can be considered as a resistance element therefore, during the power supply potential Vdd has been set to the potential supply line 4905 connected to the first terminal of the driving transistor 4901, the driving transistor 4901 and the light emitting element 4904 constitutes an inverter. That is, when a signal of H level (a potential to turn off the driving transistor 4901 sufficiently) is input to the gate terminal of the driving transistor 4901 (an input terminal of the inverter), the second terminal of the driving transistor 4901 (an output terminal of the inverter) outputs a signal of L level (a threshold voltage of the light emitting element 4904). Meanwhile, when a signal of L level (a potential to turn on the driving transistor 4901 sufficiently) is input to the gate terminal of the driving transistor 4901 (the input terminal of the inverter), the second terminal of the driving transistor 4901 (the output terminal of the inverter) outputs a signal of H level (the power supply potential Vdd).

Figure 55:
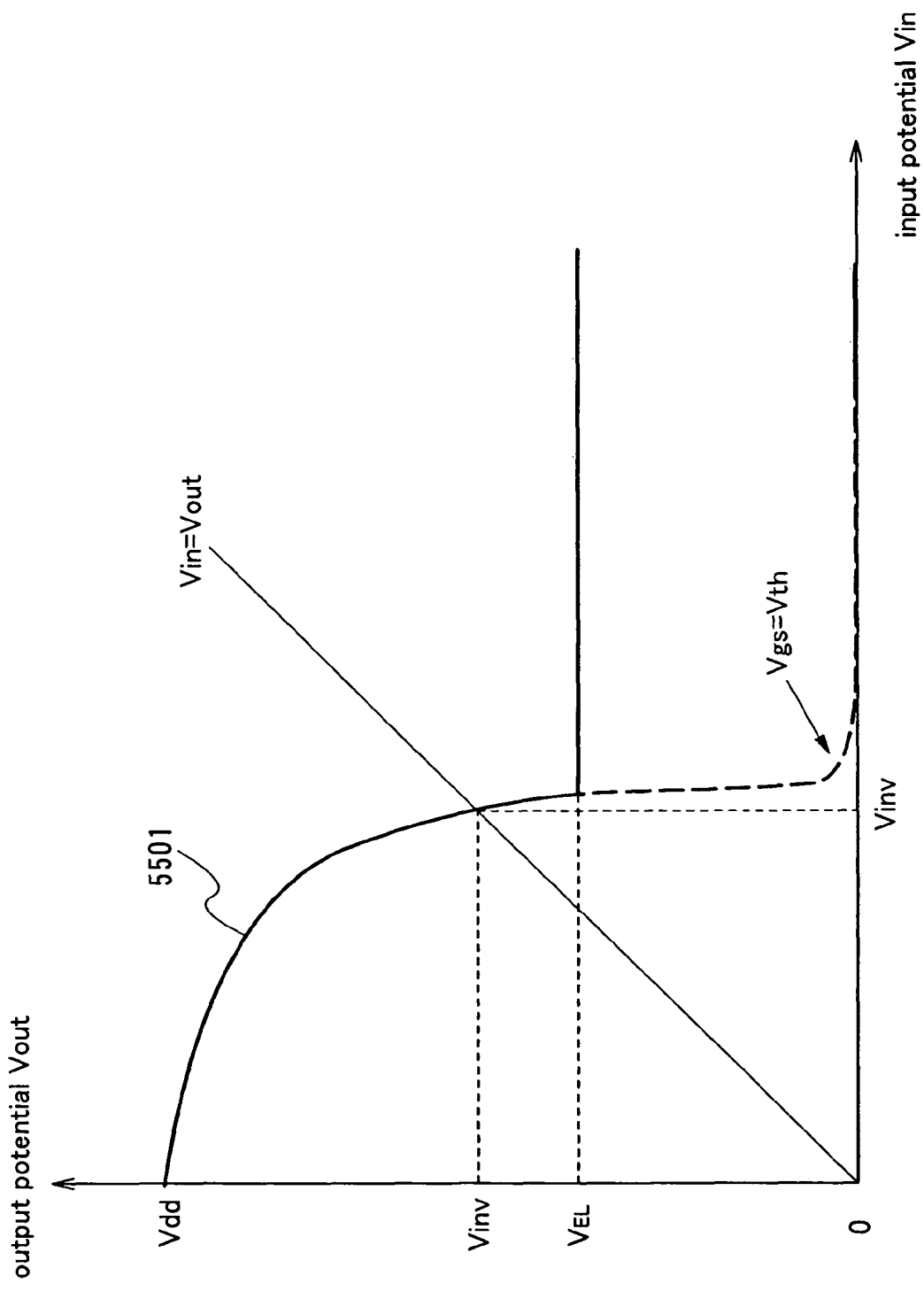
FIG. 55 is a diagram showing characteristics of an inverter.

Here, as a characteristic of the inverter, a line 5501 shown in FIG. 55 is obtained where an abscissa axis indicates an input potential Vin and an ordinate axis indicates an output potential Vout. Here, if the light emitting element 4904 does not have a forward threshold voltage, an output of L level of the inverter is 0 V as shown by a dotted line, however, the light emitting element 4904 has a threshold voltage $V_{EL}$ so that current stops flowing to the light emitting element 4904 when a potential of the anode of the light emitting element 4904 reaches $V_{EL}$. Therefore, a potential of the output of L level of the inverter is a threshold voltage $V_{EL}$=4 V of the light emitting element 4904 and a potential of H level thereof is the power supply potential Vdd=8 V. Further, a logic threshold value $V_{inv}$=6 V of the inverter is defined by a potential equal between the input potential Vin and the output potential Vout. It is to be noted that a point indicated by an arrow is a point at which a gate-source voltage Vgs of the driving transistor 4901 is approximately a threshold value Vth.

Thus, a portion between the input terminal and the output terminal of the inverter becomes conductive when the switch 4903 is on so that offset cancellation of the potentials of the input terminal and the output terminal of the inverter is performed. Note that potentials of the input terminal and the output terminal of the inverter when the offset cancellation is performed is the logic threshold voltage $V_{inv}$=6 V of the inverter.

Figure 50B:
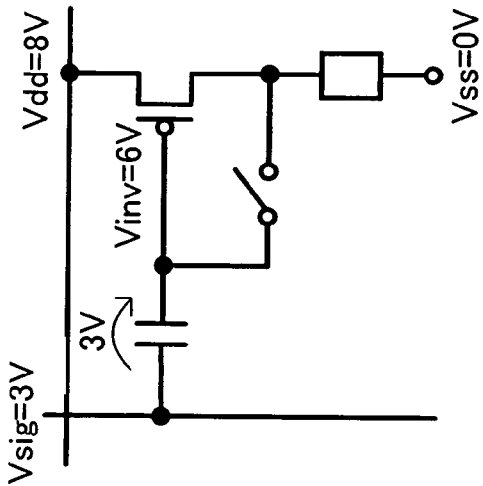
FIGS. 50a to 50d are diagrams illustrating operation of a pixel configuration of the invention.

Consequently, a video signal is written to the pixel as shown in FIG. 50b, and the switch 4903 is turned off so that the capacitor 4902 holds a potential difference Vp=3 V between the potential $V_{inv}$=6 V of the gate terminal of the driving transistor 4901 and the analog signal potential $V_{sig}$=3 V. In this manner, video signal writing to the pixel is completed.

With that state (with the state of keeping the potential difference Vp=3 V in the capacitor 4902), if the potential of the signal line 4906 connected to one electrode of the capacitor 4902 varies even if only slightly, the potential of the gate terminal of the driving transistor 4901 connected to the other electrode of the capacitor 4902 also varies accordingly. That is, the potential of the input terminal of the inverter varies.

Figure 50D:
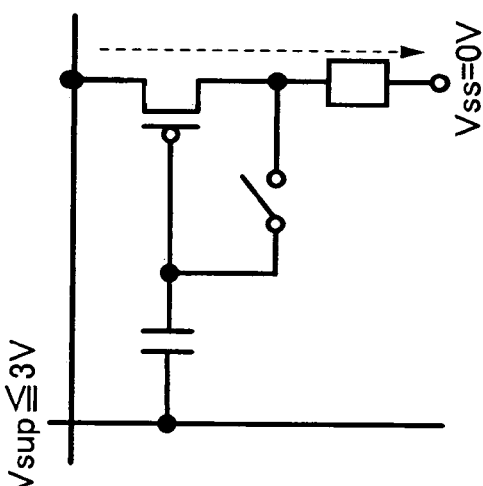
Figure 50A:
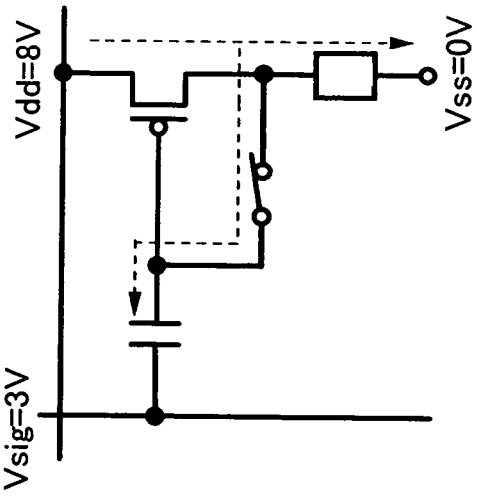
Figure 50C:
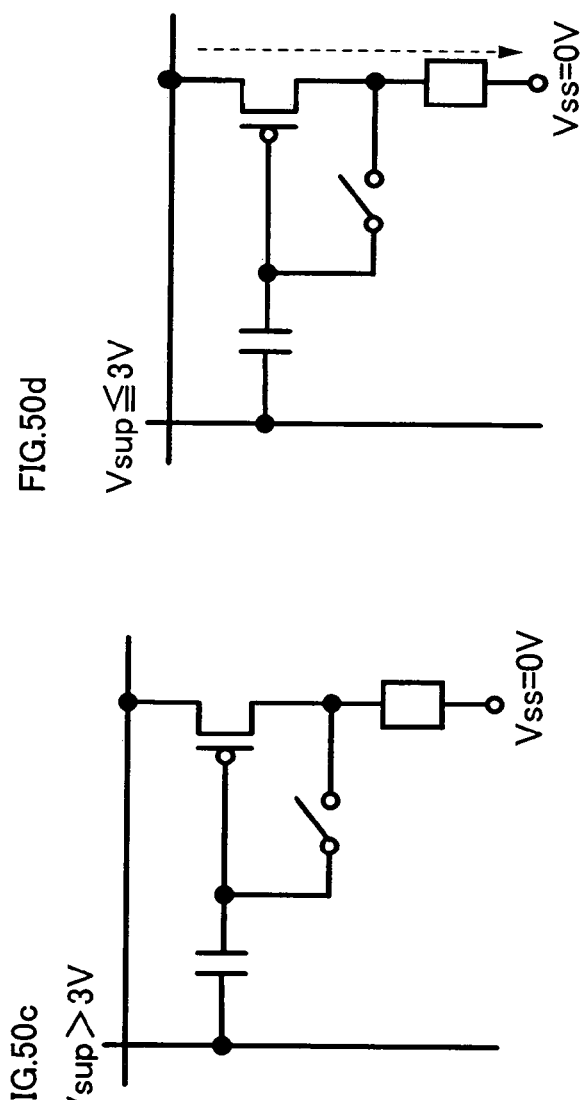

Accordingly, as shown in FIG. 50c, with a state in which the power supply potential Vdd=8 V has been set to the potential supply line 4905, if the potential $V_{sup}$ of the signal line 4906 is higher than the analog signal potential $V_{sig}$=3 V which has been set in writing, the input potential of the inverter is higher than the logic threshold value $V_{inv}$=6 V and the output of the inverter is L level.

On the other hand, as shown in FIG. 50d, with a state in which the power supply potential Vdd=8 V has been set to the potential supply line 4905, if the potential $V_{sup}$ of the signal line 4906 is lower than the analog signal potential $V_{sig}$=3 V which has been set in writing, the input potential of the inverter is lower than the logic threshold value $V_{inv}$=6 V and the output of the inverter is H level.

Therefore, by setting an analog signal potential $V_{sup}$ varying regularly and periodically to the signal line 4906 in a light emitting period of a pixel, a non-light emission state as shown in FIG. 50c and a light emission state as shown in FIG. 50d can be controlled.

It is to be noted that as the analog signal potential $V_{sup}$, as shown in FIGS. 43a to 43g in Embodiment Mode 1, the waveform 4301, the waveform 4302, the waveform 4303, the waveform 4304, the waveform 4305, the waveform 4306, or the waveform 4307 may be set or a plurality of them may be set in succession.

By setting the waveform in succession, light emitting time can be dispersed within one frame. Consequently, the frame frequency appears to be improved and screen flicker can be prevented.

In addition, according to the pixel configuration described in this embodiment mode, the number of transistors and wires can be reduced, thereby aperture ratio of a pixel can be increased and high definition display can be performed.

In addition, when the same luminosity is obtained in a pixel having a high aperture ratio and a pixel having a low aperture ratio, luminance of the light emitting element can be reduced in the pixel having the high aperture ratio as compared to the pixel having the low aperture ratio so that reliability of the light emitting element can be improved. In particular, in the case where an EL element is used as the light emitting element, reliability of the EL element can be improved.

Embodiment 2

In this embodiment, a layout of the pixel configuration shown in FIG. 6 is described with reference to FIG. 54.

A circuit of the pixel includes a driving transistor 5401, a capacitor 5402a and a capacitor 5402b which are connected in parallel, a switching transistor 5403, a pixel electrode 5404, a potential supply line (Illumination line) 5405, a signal line (Data line) 5406, and a scan line (Reset line) 5407. It is to be noted that a p-type transistor is used as the driving transistor 5401 and an n-type transistor is used as the switching transistor 5403.

Note that the pixel electrode 5404 corresponds to the anode of the light emitting element 604 of the pixel shown in FIG. 6. Thus, when a layer containing an organic matter and an opposing electrode (corresponds to the cathode of the light emitting element 604) are formed on the pixel electrode 5404, the light emitting element 604 is formed in a region where the layer containing an organic matter is sandwiched between the pixel electrode 5404 and the opposing electrode.

A first terminal (a source terminal or a drain terminal) of the driving transistor 5401 is connected to the potential supply line 5405, a gate terminal thereof is connected to the signal line 5406 through the capacitor 5402, and a second terminal (the source terminal or the drain terminal) thereof is connected to the pixel electrode 5404. In addition, the gate terminal and the second terminal (the source terminal or the drain terminal) of the driving transistor 5401 are connected to each other through the switching transistor 5403. Therefore, when the switching transistor 5403 is on, a portion between the gate terminal and the second terminal (the source terminal or the drain terminal) of the driving transistor 5401 becomes conductive. Then, when the switching transistor 5403 is turned off, the portion between the gate terminal and the second terminal (the source terminal or the drain terminal) of the driving transistor 5401 becomes non-conductive, and a potential difference (a voltage) between a potential of the gate terminal (or the second terminal) of the driving transistor 5401 at this moment and a potential of the signal line 5406 can be held in the capacitor 5402.

It is to be noted that to the potential supply line 5405, in pixels of one row, current for making a light emitting element in any pixel to which a video signal for light emission is input, emit light. Therefore, wire resistance of the potential supply line 5405 is high, voltage drop affects so that a desired potential can not be set to a pixel which is far from a driver circuit for setting a potential to the potential supply line 5405. Thus, copper (Cu) is preferably used as a material of the potential supply line 5405 to form a low-resistance wire.

Since the driving transistor 5401 is a p-type transistor, mobility of carrier u thereof is generally low as compared to an n-type transistor. Therefore, in the case where a p-type transistor is used for the driving transistor 5401, a ratio W/L between the channel width W and the channel length L of the driving transistor is required to be large in order to supply a suitable current to the light emitting element. On the other hand, since the switching transistor 5403 is an n-type transistor, the mobility of carrier μ is large, therefore, W/L can be reduced. In addition, an LDD region may be formed to reduce off-current and besides the switching transistor 5403 may be a multi-gate transistor to reduce gate leakage current. Therefore, a channel length thereof is increased. Accordingly, the switching transistor 5403 is preferably formed to have a small W/L. Note that the switching transistor 5403 has a triple-gate structure in this embodiment, however, it may have a double-gate structure and the number of gates is not limited.

Therefore, the driving transistor 5401 and the switching transistor 5403 are preferably, in consideration of the ratio W/L between the channel width W and the channel length L, arranged in directions such that respective directions of current flowing to the transistors are perpendicular to each other. As a result of this, in the layout of a pixel, efficient arrangement can be performed such that an area of an element (a transistor or a capacitor) or a wire constituting a pixel which are a black matrix is small.

Furthermore, considering that the channel width W of the driving transistor 5401 is increased, since an impurity region to be a first terminal thereof connected to the potential supply line 5405 is increased in area, it is preferably arranged so as to overlap the potential supply line 5405. That is, the driving transistor 5401 is preferably arranged such that a direction of current flowing to the potential supply line 5405 and a direction of current flowing to the driving transistor 5401 are perpendicular to each other.

In addition, an analog signal potential corresponding a video signal is input to the signal line 5406, therefore, the signal line 5406 is preferably formed of the same material as a source electrode and a drain electrode of the transistor of which wire resistance is low. In addition, since the signal line 5406 extends in a direction of one side of a pixel and as in this pixel layout, extends in a direction of a long side in a pixel having a rectangular shape, an area thereof becomes large. Therefore, the signal line 5406 is used for a top electrode of the capacitor. A bottom electrode thereof is formed of the same material as a gate electrode of the transistor. Consequently, the capacitor 5402a and the capacitor 5402b are formed in which an interlayer insulating film of the transistor is sandwiched between the top electrode and the bottom electrode. The respective top electrodes of the capacitor 5402a and the capacitor 5402b are connected to each other and the respective bottom electrodes thereof are connected to each other, therefore, it results in that the capacitor 5402a and the capacitor 5402b are connected in parallel. Thus, they can be considered as one capacitor 5402 having synthetic capacitance obtained by simply adding respective electrostatic capacitance of the capacitor 5402a and the capacitor 5402b. The capacitor 5402a and the capacitor 5402b therefore correspond to the capacitor 602 of the pixel shown in FIG. 6.

It is to be noted that the capacitor 602 is required to hold a voltage for a certain period. Therefore, a capacitor having a large capacitance value that can accumulate large charge quantity is required. In order to increase a capacitance value of the capacitor 602, although a dielectric sandwiched between electrodes forming the capacitor 602 may be formed of a high dielectric constant material or a film thickness thereof may be thin, which requires to change a manufacturing process so that there is a limit. On the other hand, by increasing an area of the electrodes of the capacitor 602, the capacitance value can be easily increased.

Figure 54:
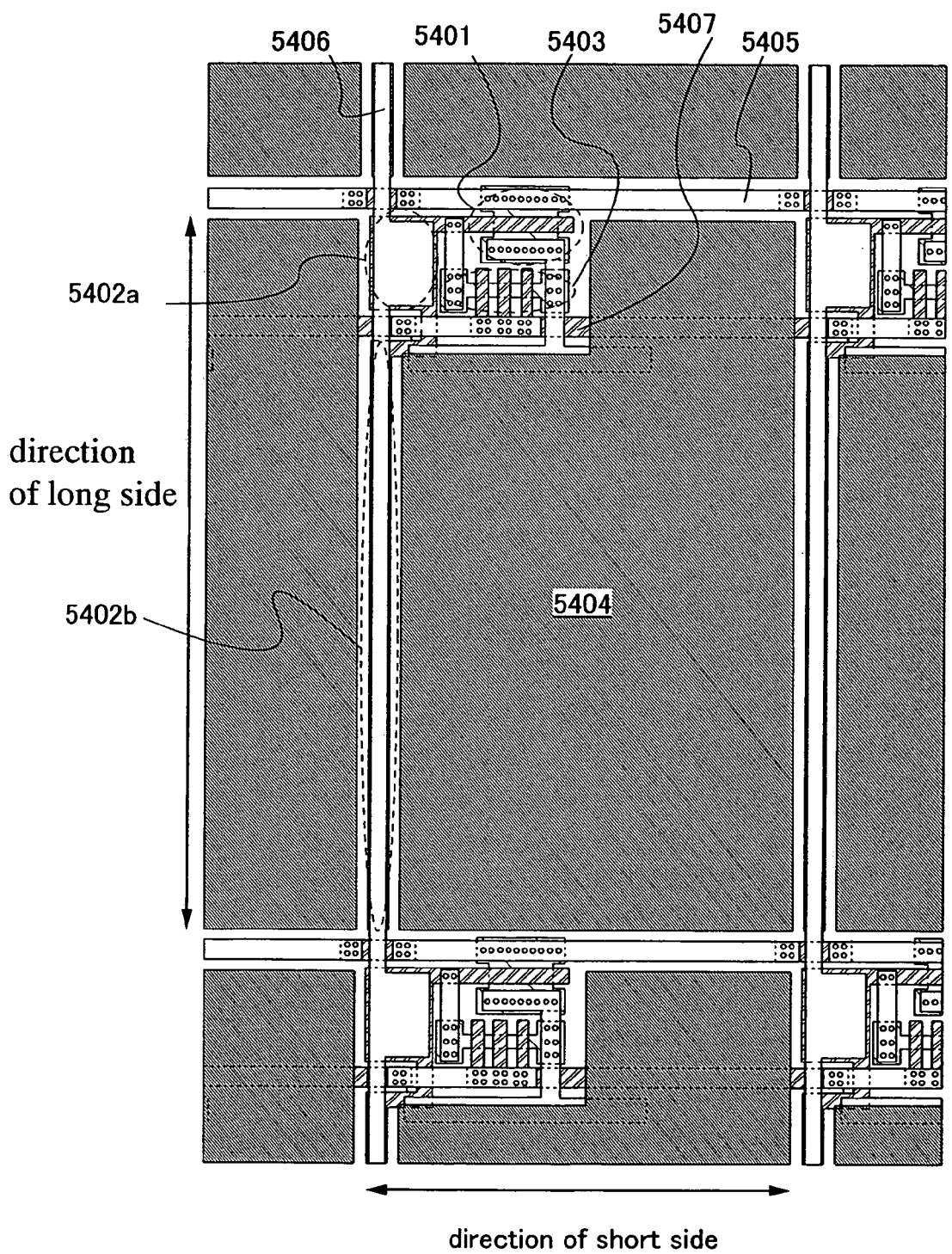
FIG. 54 is a diagram illustrating a layout of a pixel.

Here, in a display device having the pixel shown in FIG. 54, pixels are arranged in matrix corresponding to potential supply lines arranged in a column direction and signal lines arranged in a row direction, and the signal line 5406 at the same length as a length in a column direction (a long side direction) of the pixel functions as a top electrode of the capacitor 5402 of each pixel.

That is, the capacitor 5402 having a large capacitance value can be achieved by the signal line 5406 which is a black matrix basically so that a region for providing separately to form the capacitor 5402 can be reduced. Accordingly, aperture ratio can be drastically increased.

In addition, since the capacitor 5402 holds a voltage for a certain period, it is necessary to prevent an stored charge from discharging. Therefore, leakage current (off current or gate leakage current) of the switching transistor 5403 is preferably decreased. The switching transistor 5403 in the pixel in this embodiment is provided with a low-concentration impurity region (also called an "LDD") and a multi-gate structure is employed so that the leakage current of the switching transistor 5403 can be reduced.

In addition, in the pixel of this embodiment, the switching transistor 5403 and the driving transistor 5401 are arranged in directions in which respective channel length directions are perpendicular to each other, so that elements constituting the pixel can be arranged efficiently in a region to be a black matrix of the pixel.

In addition, by forming a capacitor to be approximately the same length as the long side direction of the pixel as in the pixel of this embodiment, a capacitor having sufficiently high voltage-holding capability can be achieved. In addition, by using the signal line 5406 as a top electrode, the capacitor 5402 is formed in a region of a wire to be a black matrix so that aperture ratio of the pixel can be extremely increased.

Embodiment 3

Figure 47:
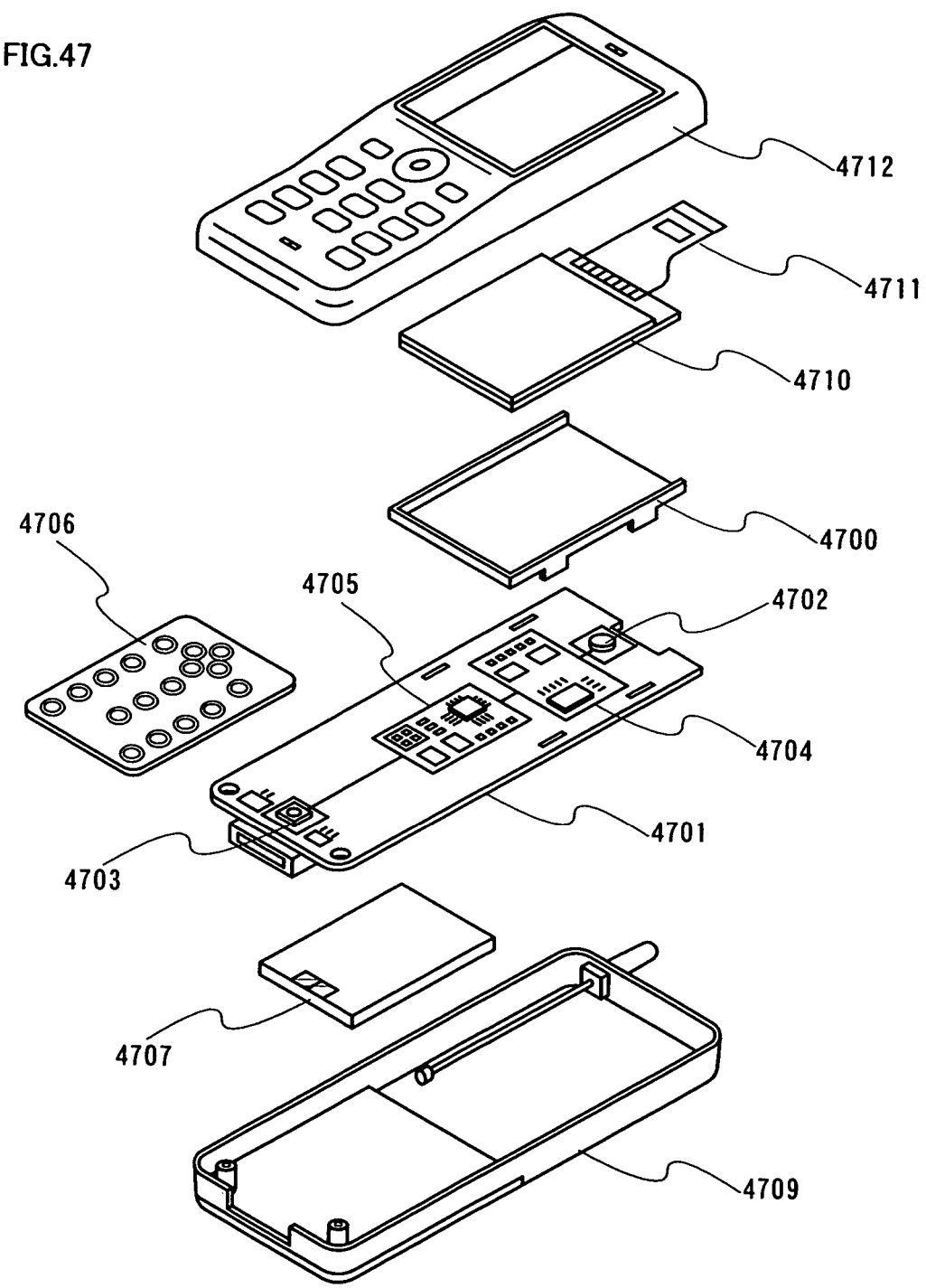
FIG. 47 illustrates an example of a mobile phone to which the invention can be applied.

In this embodiment, described is an example of a structure of a mobile phone which has a display portion employing a display device using the pixel configuration of the invention with reference to FIG. 47.

A display panel 4710 is incorporated in a housing 4700 so as to be detachable. Form and size of the housing 4700 can be changed arbitrarily in accordance with the size of the display panel 4710. The housing 4700 provided with the display panel 4710 is fitted in a printed circuit board 4701 to constitute a module.

The display panel 4710 is connected to the printed circuit board 4701 through an FPC 4711. On the printed circuit board 4701, a speaker 4702, a microphone 4703, a transmitting and receiving circuit 4704, and a signal processing circuit 4705 including a CPU, a controller, and the like are formed. Such a module, an inputting means 4706, and a battery 4707 are combined, which is stored in a case 4709. A pixel region of the display panel 4710 is disposed so as to be seen from a window formed in a case 4712.

The display panel 4710 may be formed by that a pixel region and a part of peripheral driver circuits (a driver circuit of which operation frequency is low among a plurality of driver circuits) are formed using TFTs over the same substrate, a part of the peripheral driver circuits (a driver circuit of which operation frequency is high among the plurality of driver circuits) is formed on an IC chip, and the IC chip is mounted onto the display panel 4710 by COG (Chip On Glass). The IC chip may be, alternatively, connected to a glass substrate by using TAB (Tape Auto Bonding) or a printed circuit board. It is to be noted that FIG. 42a shows an example of constitution of such a display panel that a part of peripheral driver circuits is formed over the same substrate as a pixel region and an IC chip provided with the other part of the peripheral driver circuits is mounted by COG or the like. By employing the above-described constitution, power consumption of a display device can be reduced and the life per charge of a mobile phone can be long. In addition, cost reduction of the mobile phone can be achieved.

To the pixel region, the pixel configurations described in Embodiment Modes 1 to 6 can be arbitrarily applied.

For example, by applying the pixel configuration of FIG. 7 described in Embodiment Mode 3, the manufacturing process can be reduced by constituting the pixel region and the peripheral driver circuit formed over the same substrate as the pixel region by transistors having the same conductivity type in order to achieve cost reduction.

Alternatively, by applying the pixel configuration of FIG. 56 described in Embodiment Mode 2, the light emitting time can be made long, so that the moment luminance of the light emitting element can be reduced and reliability of the light emitting element can be improved.

In addition, by converting the impedance of a signal set to a scan line or a signal line by using a buffer circuit to improve the current supply capability, signal delay is prevented and a writing time of pixels of one row can be shortened. Accordingly, a high-definition display device can be provided.

In addition, in order to further reduce the power consumption, the pixel region may be formed using TFTs over a substrate, all of the peripheral driver circuits may be formed on an IC chip, and the IC chip may be mounted onto the display panel by COG (Chip On Glass) or the like as shown in FIG. 42b.

It is to be noted that the constitution described in this embodiment is an example of a mobile phone, and the pixel configuration of the invention can be applied not only to a mobile phone having the above-described constitution but also to mobile phones having various constitution.

Embodiment 4

Figure 45:
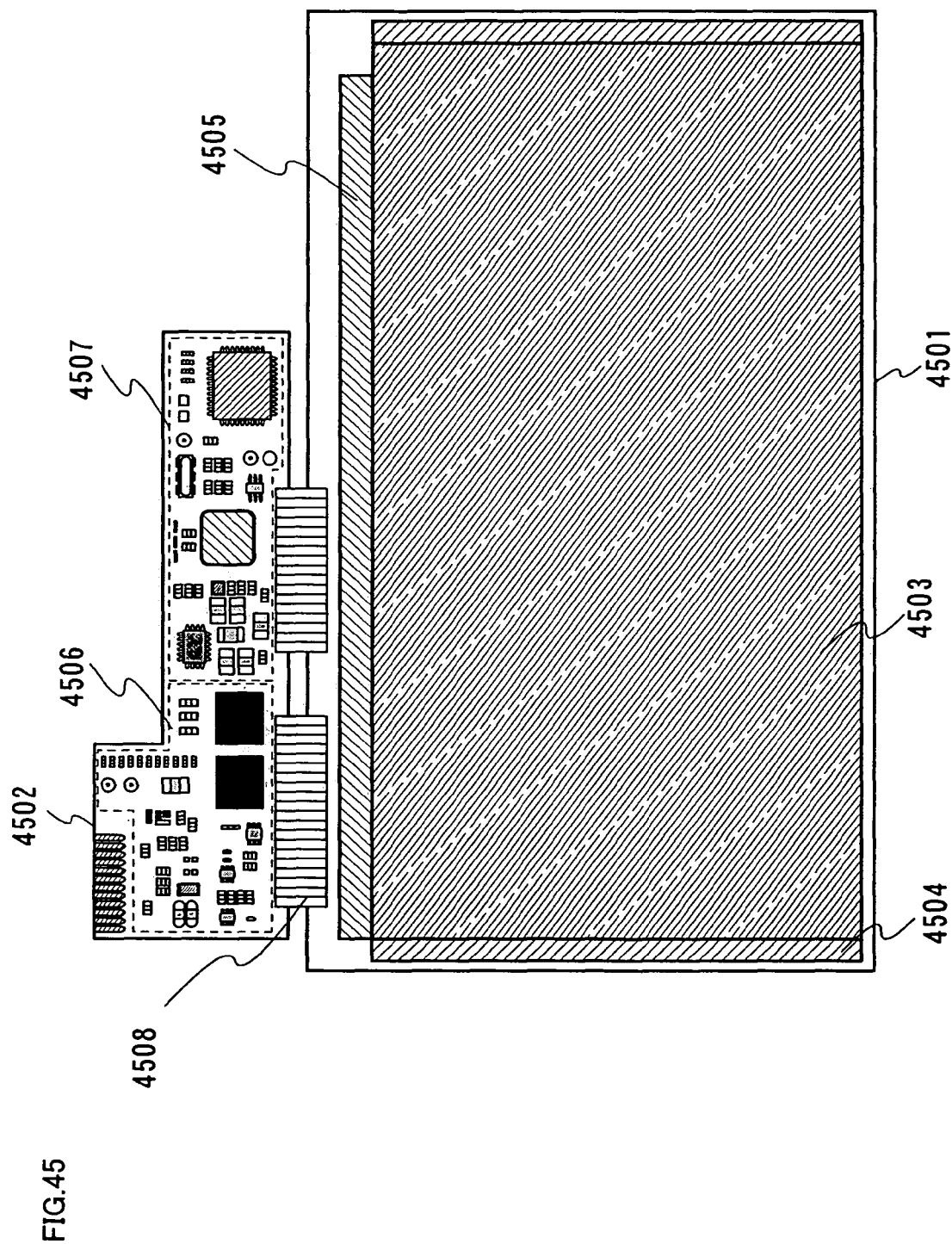
FIG. 45 shows an example of an EL module.

FIG. 45 shows an EL module combining a display panel 4501 and a circuit board 4502. The display panel 4501 includes a pixel region 4503, a scan line driver circuit 4504, and a signal line driver circuit 4505. Over the circuit board 4502, a control circuit 4506, a signal dividing circuit 4507, and the like are formed. The display panel 4501 and the circuit board 4502 are connected to each other by a connecting wire 4508. As the connecting wire, an FPC or the like can be used.

The display panel 4501 may be formed by that a pixel region and a part of peripheral driver circuits (a driver circuit of which operation frequency is low among a plurality of driver circuits) are formed using TFTs over the same substrate, a part of the peripheral driver circuits (a driver circuit of which operation frequency is high among the plurality of driver circuits) is formed on an IC chip, and the IC chip is mounted onto the display panel 4501 by COG (Chip On Glass) or the like. The IC chip may be, alternatively, mounted onto the display panel 4501 by using TAB (Tape Auto Bonding) or a printed circuit board. It is to be noted that FIG. 42a shows an example of constitution that a part of peripheral driver circuits is formed over the same substrate as a pixel region and an IC chip provided with the other part of the peripheral driver circuits is mounted by COG or the like.

In the pixel region, the pixel configurations described in Embodiment Modes 1 to 6 can be arbitrarily applied.

For example, by applying the pixel configuration of FIG. 7 described in Embodiment Mode 3, the manufacturing process can be reduced by constituting the pixel region and the peripheral driver circuit formed over the same substrate as the pixel region by transistors having the same conductivity type in order to achieve cost reduction.

Alternatively, by applying the pixel configuration of FIG. 56 described in Embodiment Mode 2, the light emitting time can be made long, so that the moment luminance of the light emitting element can be reduced and reliability of the light emitting element can be improved.

In addition, by converting the impedance of a signal set to a scan line or a signal line by using a buffer circuit to improve the current supply capability, signal delay is prevented and a writing time of pixels of one row can be shortened. Accordingly, a high-definition display device can be provided.

In addition, in order to further reduce the power consumption, the pixel region may be formed using TFTs over a substrate, all of the peripheral driver circuits may be formed on an IC chip, and the IC chip may be mounted onto the display panel by COG (Chip On Glass) or the like.

In addition, by applying the pixel configuration of FIG. 7 described in Embodiment Mode 3, pixels can be constituted only by n-type transistors, so that a non-crystalline semiconductor (e.g., amorphous silicon) can be used as a semiconductor layer of a transistor. That is, a large display device where it is difficult to form a uniform crystalline semiconductor film can be manufactured. By using a non-crystalline semiconductor film as a semiconductor layer of a transistor constituting a pixel, in addition, the manufacturing process can be reduced and reduction of the manufacturing cost can be achieved.

It is preferable that, in the case where a non-crystalline semiconductor film is applied to a semiconductor layer of a transistor constituting a pixel, the pixel region be formed using TFTs over a substrate, all of the peripheral driver circuits be formed on an IC chip, and the IC chip be mounted onto the display panel by COG (Chip On Glass). FIG. 42b shows an example of such constitution that a pixel region is formed over a substrate and an IC chip provided with a peripheral driver circuit is mounted onto the substrate by COG or the like.

Figure 46:
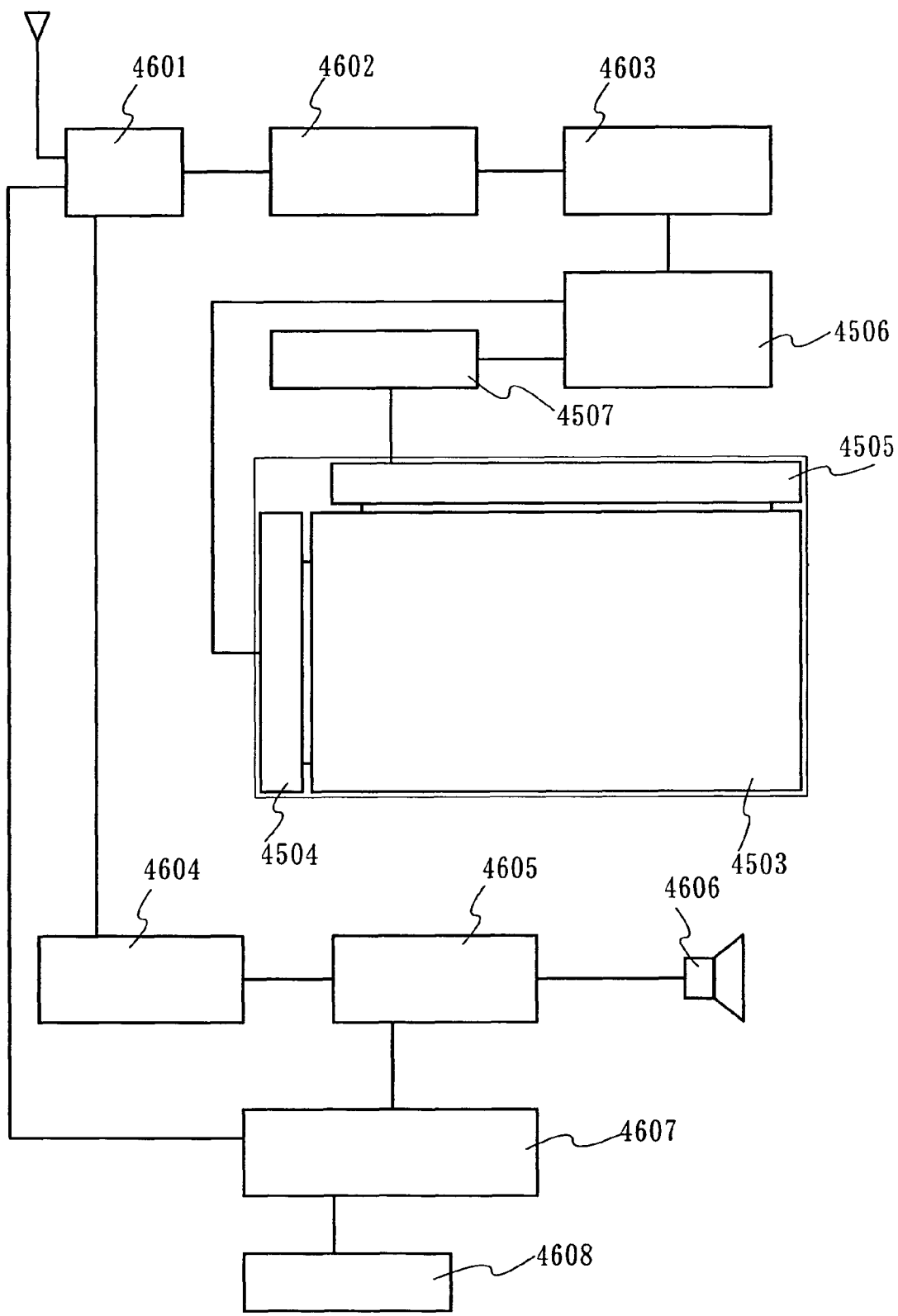
FIG. 46 is a block diagram showing main constitution of an EL TV receiver.

An EL TV receiver can be completed with the above-described EL module. FIG. 46 is a block diagram showing main constitution of an EL TV receiver. A tuner 4601 receives a video signal and an audio signal. The video signals are processed by a video signal amplifier circuit 4602, a video signal processing circuit 4603 for converting a signal output from the video signal amplifier circuit 4602 into a color signal corresponding to each color of red, green and blue, and the control circuit 4506 for converting the video signal into the input specification of a driver circuit. The control circuit 4506 outputs a signal to each of the scan line side and the signal line side. In the case of driving in digital manner, constitution in which the signal dividing circuit 4507 is provided on the signal line side to supply an input digital signal while dividing into m signals may be adopted.

An audio signal received by the tuner 4601 is transmitted to an audio signal amplifier circuit 4604, an output of which is supplied to a speaker 4606 through an audio signal processing circuit 4605. A control circuit 4607 receives receiving station (received frequency) data and volume control data from an input portion 4608, and transmits signals to the tuner 4601 and the audio signal processing circuit 4605.

By incorporating the EL module shown in FIG. 45 into the housing 44001, a TV receiver can be completed as shown in FIG. 44A. The display portion 44003 is constituted by the EL module. In addition, the speaker portion 44004, the video input terminal 44005, and the like are provided arbitrarily.

It is needless to say that the invention can be applied to various apparatuses other than the TV receiver, such as a monitor of a personal computer, and in particular a large display medium such as an information display panel at the station or the airport, and an advertisement board on the street.

This application is based on Japanese Patent Application serial no. 2005080214 filed in Japan Patent Office on 18, Mar. 2005, and the entire contents of which are hereby incorporated by reference.

What is claimed is:
1. A display device comprising:
a signal line driver;
a scan line driver;
a power supply line driver;
a first wire and a second wire each electrically connected to the signal line driver;
a third wire electrically connected to the power supply line driver;
a fourth wire electrically connected to the scan line driver; and
a first pixel and a second pixel each comprising:

a first transistor comprising a gate terminal, a first terminal and a second terminal;
a light emitting element including a cathode, an anode, and a light emitting layer interposed between the anode and the cathode, the light emitting element being electrically connected to the second terminal of the first transistor;
a capacitor comprising a first electrode and a second electrode, the first electrode being electrically connected to the gate terminal of the first transistor; and
a second transistor comprising a gate terminal, a first terminal and a second terminal, the first terminal of the second transistor being electrically connected to the gate terminal of the first transistor, and the second terminal of the second transistor being electrically connected to the second terminal of the first transistor,
wherein the first terminal of the first transistor of the first pixel and the first terminal of the first transistor of the second pixel are electrically connected to the power supply line driver through the third wire,
wherein the second electrode of the capacitor of the first pixel is electrically connected to the first wire,
wherein the second electrode of the capacitor of the second pixel is electrically connected to the second wire,
wherein the gate terminal of the second transistor of the first pixel and the gate terminal of the second transistor of the second pixel are electrically connected to the scan line driver through the fourth wire,
wherein the signal line driver is configured to supply video signals to the first wire and the second wire during a writing period,
wherein the signal line driver is configured to supply analog potentials having a waveform to the first wire and the second wire during a light emitting period following the writing period, and
wherein a maximal amplitude of a video signal supplied to the first wire is different from a maximal potential width of a video signal supplied to the second wire, so that a first length of light emission of the light emitting element of the first pixel is different from a second length of light emission of the light emitting element of the second pixel in a case where the first pixel and the second pixel are configured to emit lights of different colors,
wherein an analog potential having a waveform supplied to the first wire and an analog potential having a waveform supplied to the second wire have a same amplitude regardless of colors of light emission of the light emitting element of the first pixel and of light emission of the light emitting element of the second pixel.

2. The display device according to claim 1, wherein the first transistors of the first pixel and the second pixel include a-InGaZnO.

3. The display device according to claim 1, wherein the first transistors of the first pixel and the second pixel include a microcrystalline semiconductor.

4. The display device according to claim 1, further comprising:
a first potential generating circuit and a second potential generating circuit,
wherein the first and the second potential generating circuits are configured to be connected to the first wire and the second wire, respectively.

5. The display device according to claim 1, further comprising:
a first switch provided between the signal line driver and the first wire; and
a second switch provided between the signal line driver and the second wire.

6. An electronic apparatus wherein the display device according to claim 1 is included in a display portion.

7. The display device according to claim 1, wherein the first pixel and the second pixel are formed over a flexible substrate.

8. The display device according to claim 1,
wherein a pixel portion includes the first pixel and the second pixel, and
wherein the pixel portion is provided between the scan line driver and the power supply line driver.

9. A display device comprising:
a signal line driver;
a scan line driver;
a power supply line driver;
a first wire and a second wire each electrically connected to the signal line driver;
a third wire electrically connected to the power supply line driver;
a fourth wire electrically connected to the scan line driver; and
a first pixel and a second pixel each comprising:
a first transistor comprising a gate terminal, a first terminal and a second terminal;
a light emitting element including a cathode, an anode, and a light emitting layer interposed between the anode and the cathode, the light emitting element being electrically connected to the second terminal of the first transistor;
a capacitor comprising a first electrode and a second electrode, the first electrode being electrically connected to the gate terminal of the first transistor; and
a second transistor comprising a gate terminal, a first terminal and a second terminal, the first terminal of the second transistor being electrically connected to the gate terminal of the first transistor, and the second terminal of the second transistor being electrically connected to the second terminal of the first transistor;
wherein the first terminal of the first transistor of the first pixel and the first terminal of the first transistor of the second pixel are electrically connected to the power supply line driver through the third wire,
wherein the second electrode of the capacitor of the first pixel is electrically connected to the first wire,
wherein the second electrode of the capacitor of the second pixel is electrically connected to the second wire,
wherein the gate terminal of the second transistor of the first pixel and the gate terminal of the second transistor of the second pixel are electrically connected to the scan line driver through the fourth wire,
wherein the signal line driver is configured to supply video signals to the first wire and the second wire during a writing period,
wherein the signal line driver is configured to supply analog potentials having a waveform to the first wire and the second wire during a light emitting period following the writing period, and
wherein an amplitude of an analog potential having a waveform supplied to the first wire is different from an amplitude of an analog potential having a waveform supplied to the second wire, so that a first length of light emission of the light emitting element of the first pixel is different from a second length of light emission of the light emitting element of the second pixel in a case where the first pixel and the second pixel are configured to emit lights of different colors.

10. The display device according to claim 9,
wherein the first transistors of the first pixel and the second pixel include a-InGaZnO.

11. The display device according to claim 9,
wherein the first transistors of the first pixel and the second pixel include a microcrystalline semiconductor.

12. The display device according to claim 9, further comprising:
a first potential generating circuit and a second potential generating circuit,
wherein the first and the second potential generating circuits are configured to supply the analog potentials having a waveform to the first wire and the second wire, respectively.

13. The display device according to claim 9, further comprising:
a first switch provided between the signal line driver and the first wire; and
a second switch provided between the signal line driver and the second wire.

14. An electronic apparatus wherein the display device according to claim 9 is included in a display portion.

15. The display device according to claim 9, wherein the first pixel and the second pixel are formed over a flexible substrate.

16. The display device according to claim 1,
wherein the display device is configured to supply a first fixed potential to the cathode of the light emitting element of each of the first pixel and the second pixel in the writing period;
wherein the display device is configured to supply a second fixed potential to the cathode of the light emitting element of each of the first pixel and the second pixel in the light emitting period; and
wherein the first fixed potential is higher than the second fixed potential.

17. The display device according to claim 9,
wherein the display device is configured to supply a first fixed potential to the cathode of the light emitting element of each of the first pixel and the second pixel in the writing period;
wherein the display device is configured to supply a second fixed potential to the cathode of the light emitting element of each of the first pixel and the second pixel in the light emitting period; and
wherein the first fixed potential is higher than the second fixed potential.

18. The display device according to claim 9,
wherein a maximal amplitude of a video signal supplied to the first wire and a maximal amplitude of a video signal supplied to the second wire have a same value regardless of colors of light emission of the light emitting element of the first pixel and of light emission of the light emitting element of the second pixel.

19. The display device according to claim 1, further comprising:
a fifth wiring parallel to the first wiring and the second wiring; and
in each of the first pixel and the second pixel:
a third transistor comprising a gate terminal, a first terminal, and a third terminal, the first terminal being directly connected to one of the cathode and the anode of the light emitting element;
a fourth transistor comprising a gate terminal, a first terminal, and a third terminal, the first terminal being directly connected to the second electrode of the capacitor;
a fifth transistor comprising a gate terminal, a first terminal, and a third terminal, the first terminal being directly connected to the second electrode of the capacitor;
wherein the second terminal of the fourth transistor of the first pixel is directly connected to the first wiring, and
wherein the second terminal of the fifth transistor of the first pixel is directly connected to the fifth wiring.

20. The display device according to claim 19, further comprising:
a sixth transistor comprising a gate electrode, a first terminal, and a third terminal, the first terminal being directly connected to the first terminal of the first transistor and to the second terminal of the second transistor, the second terminal being directly connected to the one of the cathode and the anode of the light emitting element.

21. The display device according to claim 1,
wherein the analog potential having a waveform supplied to the first wire and the analog potential having a waveform supplied to the second wire are supplied for a same period of time.

22. The display device according to claim 9,
wherein the analog potential having a waveform supplied to the first wire and the analog potential having a waveform supplied to the second wire are supplied for a same period of time.

23. The display device according to claim 1,
wherein the analog potential having a waveform supplied to the first wire and the analog potential having a waveform supplied to the second wire have an amplitude greater than or equal to the maximal amplitude of a video signal supplied to the first wire and to the maximal amplitude of a video signal supplied to the second wire.

24. The display device according to claim 9,
wherein the analog potential having a waveform supplied to the first wire and the analog potential having a waveform supplied to the second wire have an amplitude greater than or equal to maximal amplitudes of the video signals.

* * * * *